US 011276726B2

(12) United States Patent
Moriwaki et al.

(10) Patent No.: US 11,276,726 B2
(45) Date of Patent: Mar. 15, 2022

(54) IMAGING ELEMENT, STACKED IMAGING ELEMENT, AND SOLID-STATE IMAGING APPARATUS

(71) Applicants: SONY CORPORATION, Tokyo (JP); SONY SEMICONDUCTOR SOLUTIONS CORPORATION, Kanagawa (JP)

(72) Inventors: Toshiki Moriwaki, Kanagawa (JP); Yukio Kaneda, Kanagawa (JP)

(73) Assignees: Sony Corporation, Tokyo (JP); Sony Semiconductor Solutions Corporation, Kanagawa (JP)

( * ) Notice: Subject to any disclaimer, the term of this patent is extended or adjusted under 35 U.S.C. 154(b) by 122 days.

(21) Appl. No.: 16/499,917

(22) PCT Filed: Apr. 17, 2018

(86) PCT No.: PCT/JP2018/015838
§ 371 (c)(1),
(2) Date: Oct. 1, 2019

(87) PCT Pub. No.: WO2018/194051
PCT Pub. Date: Oct. 25, 2018

(65) Prior Publication Data
US 2020/0119078 A1    Apr. 16, 2020

(30) Foreign Application Priority Data

Apr. 21, 2017  (JP) .............................. JP2017-084495
Aug. 16, 2017  (JP) .............................. JP2017-157157

(51) Int. Cl.
*H01L 27/146*    (2006.01)

(52) U.S. Cl.
CPC .. *H01L 27/14647* (2013.01); *H01L 27/14603* (2013.01); *H01L 27/14609* (2013.01);
(Continued)

(58) Field of Classification Search
CPC ......... H01L 27/14647; H01L 27/14603; H01L 27/14609; H01L 27/14636; H01L 27/14638; H01L 27/1464
See application file for complete search history.

(56) References Cited

U.S. PATENT DOCUMENTS

2006/0278869 A1* 12/2006 Hioki .................... H01L 51/424
257/40
2007/0181177 A9*  8/2007 Sager .................. H01L 51/4253
136/263
(Continued)

FOREIGN PATENT DOCUMENTS

JP    2009-272528    11/2009
JP    2011-138927    7/2011
(Continued)

OTHER PUBLICATIONS

International Search Report prepared by the Japan Patent Office dated Jun. 27, 2018, for International Application No. PCT/JP2018/015838.

*Primary Examiner* — Fernando L Toledo
*Assistant Examiner* — Neil R Prasad
(74) *Attorney, Agent, or Firm* — Sheridan Ross P.C.

(57) ABSTRACT

An imaging element includes a photoelectric conversion unit including a first electrode, a photoelectric conversion layer, and a second electrode that are stacked, in which an inorganic oxide semiconductor material layer is formed between the first electrode and the photoelectric conversion layer, and the inorganic oxide semiconductor material layer includes at least two types of elements selected from the group consisting of indium, tungsten, tin, and zinc. Alternatively, a LUMO value $E_1$ of a material included in a part of the photoelectric conversion layer positioned near the inorganic oxide semiconductor material layer and a LUMO value $E_2$ of a material included in the inorganic oxide semiconductor (Continued)

material layer satisfy $E_1-E_2<0.2$ eV. Alternatively, the mobility of a material included in the inorganic oxide semiconductor material layer is equal to or greater than 10 cm$^2$/V·s.

19 Claims, 81 Drawing Sheets

(52) U.S. Cl.
CPC .. *H01L 27/14636* (2013.01); *H01L 27/14638* (2013.01); *H01L 27/1464* (2013.01)

(56) References Cited

U.S. PATENT DOCUMENTS

| | | | | |
|---|---|---|---|---|
| 2009/0223566 | A1* | 9/2009 | Mitsui | H01L 51/0047 136/263 |
| 2016/0013424 | A1* | 1/2016 | Yamamoto | H01L 51/0073 257/40 |
| 2017/0338431 | A1* | 11/2017 | Ro | H01L 51/0072 |
| 2019/0364191 | A1* | 11/2019 | Takahashi | H01L 51/0061 |

FOREIGN PATENT DOCUMENTS

| | | |
|---|---|---|
| JP | 2016-063165 | 4/2016 |
| JP | 2018-046039 | 3/2018 |
| JP | 2018-060910 | 4/2018 |
| WO | WO 2017/061174 | 4/2017 |

\* cited by examiner

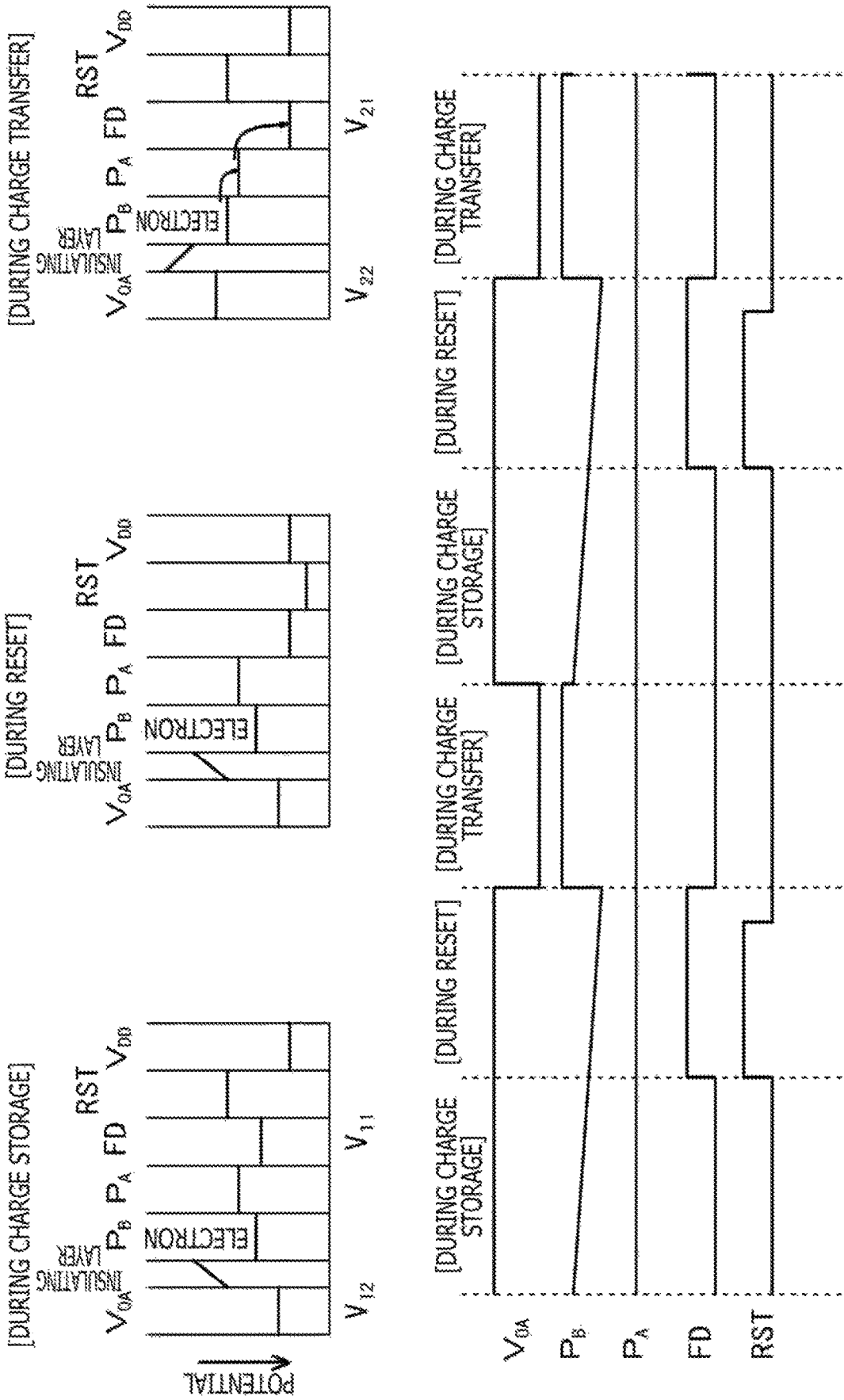

IMAGING ELEMENT, STACKED IMAGING ELEMENT, AND SOLID-STATE IMAGING APPARATUS

CROSS REFERENCE TO RELATED APPLICATIONS

This application is a national stage application under 35 U.S.C. 371 and claims the benefit of PCT Application No. PCT/JP2018/015838 having an international filing date of 17 Apr. 2018, which designated the United States, which PCT application claimed the benefit of Japanese Patent Application Nos. 2017-084495 filed 21 Apr. 2017 and 2017-157157 filed 16 Aug. 2017, the entire disclosures of each of which are incorporated herein by reference.

TECHNICAL FIELD

The present disclosure relates to an imaging element, a stacked imaging element, and a solid-state imaging apparatus.

BACKGROUND ART

In recent years, a stacked imaging element is drawing attention as an imaging element included in an image sensor or the like. The stacked imaging element has a structure including a photoelectric conversion layer (light receiving layer) placed between two electrodes. In addition, the stacked imaging element needs to have a structure for storing and transferring signal charge generated in the photoelectric conversion layer based on photoelectric conversion. In a structure in the past, a structure for storing the signal charge in an FD (Floating Drain) electrode and transferring the signal charge is necessary, and fast transfer is necessary to prevent delay of the signal charge.

An imaging element (photoelectric conversion element) for solving the problem is disclosed in, for example, Japanese Patent Laid-Open No. 2016-63165. The imaging element includes:

a storage electrode formed on a first insulating layer;
a second insulating layer formed on the storage electrode;
a semiconductor layer formed to cover the storage electrode and the second insulating layer;
a collection electrode formed to be is contact with the semiconductor layer and formed away from the storage electrode;
a photoelectric conversion layer formed on the semiconductor layer; and
an upper electrode formed on the photoelectric conversion layer.

An imaging element using an organic semiconductor material for the photoelectric conversion layer can photoelectrically convert a specific color (wavelength band). Furthermore, in a case of using the imaging element in a solid-state imaging apparatus, the feature allows to obtain a structure including stacked subpixels (stacked imaging elements) that is impossible in a solid-state imaging apparatus in the past. In the structure, the subpixel includes a combination of as on-chip color filter layer (OCCF) and the imaging element, and the subpixels are two-dimensionally arrayed (for example, see Japanese Patent Laid-Open No. 2011-138927). There is also as advantage that demosaicing is not necessary, and a false color is not generated. In the following description, an imaging element including a photoelectric conversion unit provided on the semiconductor substrate or on an upper side of the semiconductor substrate may be referred to as an "imaging element of first type" for convenience. The photoelectric conversion element included in the imaging element of first type may be referred to as a "photoelectric conversion unit of first type" for convenience. An imaging element provided in the semiconductor substrate may be referred to as an "imaging element of second type" for convenience. A photoelectric conversion unit included in the imaging element of second type may be referred to as a "photoelectric conversion unit of second type" for convenience.

FIG. 81 illustrates a configuration example of a stacked imaging element (stacked solid-state imaging apparatus) is the past. In the example illustrated in FIG. 81, a third photoelectric conversion unit 343A and a second photoelectric conversion unit 341A, which are photoelectric conversion units of second type included in a third imaging element 343 and in a second imaging element 341 that are imaging elements of second type, are stacked and formed in a semiconductor substrate 370. In addition, a first photoelectric conversion unit 310A that is a photoelectric conversion unit of first type is arranged on an upper side of the semiconductor substrate 370 (specifically, upper side of second imaging element 341). Here, the first photoelectric conversion unit 310A includes a first electrode 321, a photoelectric conversion layer 323 including an organic material, and a second electrode 322. The first photoelectric conversion unit 310A is included in a first imaging element 310 that is an imaging element of first type. The second photoelectric conversion unit 341A and the third photoelectric conversion unit 343A photoelectrically convert, for example, blue light and red light, respectively, based on the difference in absorption coefficients. In addition, the first photoelectric conversion unit 310A photoelectrically converts, for example, green light.

The charge generated by the photoelectric conversion in the second photoelectric conversion unit 341A and the third photoelectric conversion unit 343A is temporarily stored in the second photoelectric conversion unit 341A and the third photoelectric conversion unit 343A. Subsequently, a vertical transistor (gate portion 345 is illustrated) and a transfer transistor (gate portion 346 is illustrated) transfer the charge to a second floating diffusion layer (Floating Diffusion) $FD_2$ and a third floating diffusion layer $FD_3$, respectively. The charge is further output to an external reading circuit (not illustrated). The transistors and the floating diffusion layers $FD_2$ and $FD_3$ are also formed on the semiconductor substrate 370.

The charge generated by the photoelectric conversion in the first photoelectric conversion unit 310A is stored in a first floating diffusion layer $FD_1$ formed on the semiconductor substrate 370 through a contact hole portion 361 and a wiring layer 362. In addition, the first photoelectric conversion unit 310A is also connected to a gate portion 352 of an amplification transistor that converts the charge amount into voltage through the contact hole portion 361 and the wiring layer 362. Furthermore, the first floating diffusion layer $FD_1$ is part of a reset transistor (gate portion 351 is illustrated). Reference number 371 denotes an element separation region. Reference number 372 denotes an oxide film formed on the surface of the semiconductor substrate 370. Reference numbers 376 and 381 denote interlayer insulating layers. Reference number 383 denotes an insulating layer. Reference number 314 denotes an on-chip micro lens.

CITATION LIST

Patent Literature

[PTL 1]
  Japanese Patent Laid-Open No. 2016-63165
[PTL 2]
  Japanese Patent Laid-Open No. 2011-138927

SUMMARY

Technical Problems

However, in the technique disclosed in Japanese Patent Laid-Open No. 2016-63165, there is a restriction that the storage electrode and the second insulating layer formed on the storage electrode need to be formed in the same length, and there are detailed regulations regarding the interval between the storage electrode and the collection electrode and the like. Therefore, the production process may become complicated, and the manufacturing yield may be reduced. Furthermore, although there are some references regarding the materials included in the semiconductor layer, more specific compositions and configurations of the materials are not mentioned. In addition, a correlation equation of the mobility of the semiconductor layer and the stored charge is mentioned. However, matters regarding improvement in the transfer of charge, such as a matter regarding the mobility of the semiconductor layer and a matter regarding the relationship in energy level between the semiconductor layer and the part of the photoelectric conversion layer adjacent to the semiconductor layer, that are important in transferring the generated charge are not mentioned.

Therefore, an object of the present disclosure is to provide an imaging element, a stacked imaging element, and a solid-state imaging apparatus with excellent transfer characteristics of charge stored in a photoelectric conversion layer in spite of simple configuration and structure.

Solution to Problems

Imaging elements according to a first aspect, a second aspect, and a third aspect of the present disclosure for attaining the object include:

a photoelectric conversion unit including a first electrode, a photoelectric conversion layer, and a second electrode that are stacked, in which an inorganic oxide semiconductor material layer is formed between the first electrode and the photoelectric conversion layer. Furthermore, in the imaging element according to the first aspect of the present disclosure, the inorganic oxide semiconductor material layer includes at least two types of elements selected from the group consisting of indium, tungsten, tin, and zinc. Furthermore, in the imaging element according to the second aspect of the disclosure, a LUMO value $E_1$ of a material included in a part of the photoelectric conversion layer positioned near the inorganic oxide semiconductor material layer and a LUMO value $E_2$ of a material included in the inorganic oxide semiconductor material layer satisfy the following expression. Note that the values of the following expression may be zero or negative values.

$$E1-E2<0.2 \text{ eV}$$

Furthermore, in the imaging element according to the third aspect of the disclosure, the mobility of a material included in the inorganic oxide semiconductor material layer is equal to or greater than 10 $cm^2/V \cdot s$.

A stacked imaging element of the present disclosure for attaining the object includes at least one imaging element according to the first to third aspects of the present disclosure.

A solid-state imaging apparatus according to a first aspect of the present disclosure for attaining the object includes a plurality of imaging elements according to the first to third aspects of the present disclosure. In addition, a solid-state imaging apparatus according to a second aspect of the present disclosure for attaining the object includes a plurality of stacked imaging elements of the present disclosure.

Note that in the following description, the imaging element according to the first aspect of the present disclosure, the imaging element according to the first aspect of the present disclosure included in the stacked imaging element of the present disclosure, the imaging element according to the first aspect of the present disclosure included in the solid-state imaging apparatuses according to the first and second aspects of the present disclosure may be collectively referred to as "imaging element and the like according to the first aspect of the present disclosure." In addition, the imaging element according to the second aspect of the present disclosure, the imaging element according to the second aspect of the present disclosure included in the stacked imaging element of the present disclosure, and the imaging element according to the second aspect of the present disclosure included in the solid-state imaging apparatuses according to the first and second aspects of the present disclosure may be collectively referred to as "imaging element and the like according to the second aspect of the present disclosure." Furthermore, the imaging element according to the third aspect of the present disclosure, the imaging element according to the third aspect of the present disclosure included in the stacked imaging element of the present disclosure, and the imaging element according to the third aspect of the present disclosure included in the solid-state imaging apparatuses according to the first and second aspects of the present disclosure may be collectively referred to as "imaging element and the like according to the third aspect of the present disclosure."

Advantageous Effects of Invention

In the imaging element and the like according to the first aspect of the present disclosure, the materials included in the inorganic oxide semiconductor material layer are defined. Furthermore, in the imaging element and the like according to the second aspect of the present disclosure, a predetermined relationship between the LUMO value $E_1$ of the material included in the part of the photoelectric conversion layer positioned near the inorganic oxide semiconductor material layer and the LUMO value $E_2$ of the material included in the inorganic oxide semiconductor material layer is defined. Furthermore, in the imaging element and the like according to the third aspect of the present disclosure, the mobility of the material included in the inorganic oxide semiconductor material layer is defined. Therefore, an imaging element with excellent transfer characteristics of charge stored in the photoelectric conversion layer can be provided in spite of simple configuration and structure. Furthermore, the imaging element and the like according to the first to third aspects of the present disclosure have a two-layer structure of the inorganic oxide semiconductor material layer and the photoelectric conversion layer, and this can prevent recombination during charge storage. The transfer efficiency of the charge stored in the photoelectric conversion layer to the first electrode can be increased, and the generation of dark current can be suppressed. Note that the advantageous effects described in the present specification are illustrative only and are not limited. In addition, there may also be additional advantageous effects.

BRIEF DESCRIPTION OF DRAWINGS

FIG. 5 is a diagram schematically illustrating a state of potential in each section during operation of the imaging element of Embodiment 1.

DESCRIPTION OF EMBODIMENTS

Hereinafter, the present disclosure will be described based on Embodiments with reference to the drawings. However, the present disclosure is not limited to Embodiments, and various values and materials in Embodiments are illustrative. Note that the present disclosure will be described in the following order.

1. Description Regarding Imaging Elements According to First to Third Aspects of Present Disclosure, Stacked imaging Element of Present Disclosure, and Solid-State Imaging Apparatuses According to First and Second Aspects of Present Disclosure in General 2. Embodiment 1 (Imaging Elements According to First to Third Aspects of Present Disclosure, Stacked imaging Element of Present Disclosure, and Solid-State Imaging Apparatus According to Second Aspect of Present Disclosure)

3. Embodiment 2 (Modification of Embodiment 1)

4. Embodiment 3 (Modification of Embodiments 1 and 2 and Solid-State imaging Apparatus According to First Aspect of Present Disclosure)

5. Embodiment 4 (Modification of Embodiments 1 to 3 and imaging Element Including Transfer Control Electrode)

6. Embodiment 5 (Modification of Embodiments 1 to 4 and imaging Element including Discharge Electrode)

7. Embodiment 6 (Modification of Embodiments 1 to 5 and Imaging Element including a Plurality of Charge Storage Electrode Segments)

8. Embodiment 7 (Imaging Elements of First and Sixth Configurations)

9. Embodiment 8 (Imaging Elements of Second and Sixth Configurations of Present Disclosure)

10. Embodiment 9 (Imaging Element of Third Configuration)

11. Embodiment 10 (Imaging Element of Fourth Configuration)

12. Embodiment 11 (Imaging Element of Fifth Configuration)

13. Embodiment 12 (Imaging Element of Sixth Configuration)

14. Embodiment 13 (Solid-State Imaging Apparatuses of First and Second Configurations)

15. Embodiment 14 (Modification of Embodiment 13) 16. Etc.

<Description Regarding imaging Elements According to First to Third Aspects of Present Disclosure, Stacked Imaging Element of Present Disclosure, and Solid-State Imaging Apparatuses According to First and Second Aspects of Present Disclosure in General>

The imaging element and the like according to the second aspect of the present disclosure can be in a mode where the LUMO value $E_1$ of the material included in the part of the photoelectric conversion layer positioned near the inorganic oxide semiconductor material layer and the LUMO value $E_2$ of the material included in the inorganic oxide semiconductor material layer satisfy the following expression.

$$E1-E2<0.1 \text{ eV}$$

Furthermore, the imaging element and the like according to the second aspect of the present disclosure including the preferred mode can be in a mode where the mobility of the material included in the inorganic oxide semiconductor material layer and the like is equal to or greater than 10 $cm^2/V \cdot s$.

Figure 81:
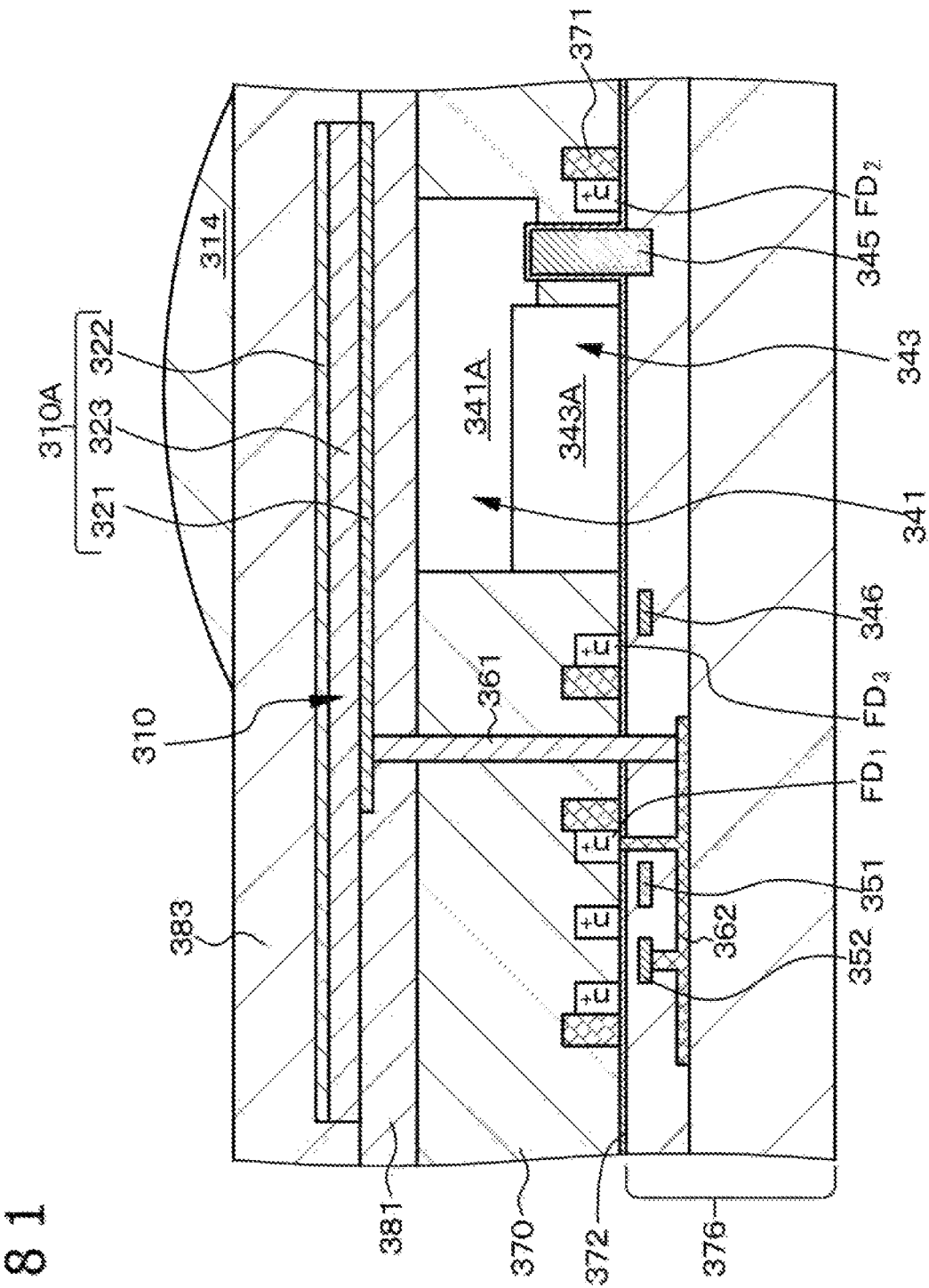
FIG. 81 is a conceptual diagram of a stacked imaging element (stacked solid-state imaging apparatus) in the past.

In the imaging element in the past illustrated in FIG. 81, the charge generated by the photoelectric conversion in the second photoelectric conversion unit 341A and the third photoelectric conversion unit 343A is temporarily stored in the second photoelectric conversion unit 341A and the third photoelectric conversion unit 343A. The charge is then transferred to the second floating diffusion layer $FD_2$ and the third floating diffusion layer $FD_3$. Therefore, the second photoelectric conversion unit 341A and the third photoelectric conversion unit 343A can be fully depleted. However, the charge generated by the photoelectric conversion in the first photoelectric conversion unit 310A is directly stored in the first floating diffusion layer $FD_1$. Therefore, it is difficult to fully deplete the first photoelectric conversion unit 310A. Consequently, this may degrade the random noise due to an increase in kTC noise, and the imaging quality may be reduced.

The imaging element and the like according to the first aspect of the present disclosure, the imaging element and the like according to the second aspect of the present disclosure including the preferred mode, or the imaging element and the like according to the third aspect of the present disclosure can be in a mode where the photoelectric conversion unit further includes the insulating layer and the charge storage electrode arranged apart from the first electrode and arranged to face the inorganic oxide semiconductor material layer through the insulating layer.

In this way, the charge storage electrode arranged apart from the first electrode and arranged to face the inorganic oxide semiconductor material layer through the insulating layer is provided. Therefore, in the photoelectric conversion unit after the light is applied to the photoelectric conversion unit, the charge can be stored in the inorganic oxide semiconductor material layer (in the inorganic oxide semiconductor material layer and the photoelectric conversion layer depending on the case). Therefore, the charge storage portion can be fully depleted to delete the charge at the start of exposure. This can suppress the phenomenon of reduction in imaging quality caused by the degradation of random noise due to an increase in kTC noise. Note that in the following description, the inorganic oxide semiconductor material or the inorganic oxide semiconductor material layer and the photoelectric conversion layer may be collectively referred to as "inorganic oxide semiconductor material layer and the like."

Furthermore, in the imaging element and the like according to the first aspect of the present disclosure including the preferred mode, in the imaging element and the like according to the second aspect of the present disclosure including the preferred mode, or in the imaging element and the like according to the third aspect of the present disclosure including the preferred mode, the inorganic oxide semiconductor material layer may not contain gallium atoms.

Alternatively, in the imaging element and the like according to the first aspect of the present disclosure including the preferred mode, in the imaging element and the like according to the second aspect of the present disclosure including the preferred mode, or in the imaging element and the like according to the third aspect of the present disclosure including the preferred mode, the inorganic oxide semiconductor material layer can include indium-tungsten oxide (IWO) that is a material obtained by adding tungsten (W) to indium oxide, indium-tungsten-zinc oxide (IWZO) that is a material obtained by adding tungsten R) and zinc (Zn) to indium oxide, indium-tin-zinc oxide (ITZO) that is a material obtained by adding tin (Sn) and zinc (Zn) to indium oxide, or zinc-tin oxide (ZTO). Note that in a case where the inorganic oxide semiconductor material layer includes zinc-tin oxide (ZTO), a very small amount of ZnO may be deposited when an annealing process is applied to a ZTO film during the formation of the ZTO film. Even in such a case, it will be stated that the inorganic oxide semiconductor material layer includes zinc-tin oxide (ZTO). Specifically, the inorganic oxide semiconductor material layer includes In—W oxide or includes In—Sn oxide, In—Zn oxide, W—Sn oxide, W—Zn oxide, Sn—Zn oxide, In—W—Sn oxide, In—W—Zn In—Sn—Zn oxide, or In—W—Sn—Zn oxide. In IWO, it is preferable that the mass ratio of the tungsten oxide be 10 to 30% by mass, where the total mass of the indium oxide and the tungsten oxide is 100% by mass. Furthermore, in IWZO, it is preferable that the mass ratio of the tungsten oxide be 2 to 15% by mass and the mass ratio of the Zn oxide be 1 to 3% by mass, where the total mass of the indium oxide, the tungsten oxide, and the Zn oxide is 100% by mass. In addition, in ITZO, it is preferable that the mass ratio of the tungsten oxide be 3 to 10% by mass and the mass ratio of the tin oxide be 10 to 17% by mass, where the total mass of the indium oxide, the Zn oxide, and the Sn oxide is 100% by, mass. However, the values are not limited to these.

The inorganic oxide semiconductor material layer may have a single-layer configuration or a multi-layer configuration. In addition, the material included in the inorganic oxide semiconductor material layer positioned on the upper side of the charge storage electrode and the material included in the inorganic oxide semiconductor material layer positioned on the upper side of the first electrode may be different.

The inorganic oxide semiconductor material layer can be deposited based on, for example, a sputtering method. Specifically, a parallel plate sputtering apparatus or a DC magnetron sputtering apparatus can be used as a sputtering apparatus. An argon (Ar) gas can be used as a process gas, and a desirable sintered body, such as an InZnO sintered body, an InWO sintered body, and a ZTO sintered body, can be used as the target in the sputtering method.

Note that the oxygen gas introduction amount (oxygen gas partial pressure) in forming the inorganic oxide semiconductor material layer based on the sputtering method can be controlled to control the energy level of the inorganic oxide semiconductor material layer. Specifically, it is preferable that oxygen gas partial pressure<=($O_2$ gas pressure)/ (total pressure of Ar gas and $O_2$ gas)>be 0.005 to 0.02 in forming the layer based on the sputtering method. Furthermore, the imaging element and the like of the present disclosure can be in a mode where the content rate of oxygen in the inorganic oxide semiconductor material layer is lower than the oxygen content rate of stoichiometric composition. Here, the energy level of the inorganic oxide semiconductor material layer can be controlled based on the content rate of oxygen. The lower the content rate of oxygen with respect to the oxygen content rate of stoichiometric composition, that is, the higher the oxygen deficiency, the deeper the energy level can be.

Alternatively, in the imaging element and the like according to the first aspect of the present disclosure including the preferred mode, in the imaging element and the like according to the second aspect of the present disclosure including the preferred mode, or in the imaging element and the like according to the third aspect of the present disclosure including the preferred mode, the inorganic oxide semiconductor material layer can include indium-tungsten-zinc oxide (IWZO).

Alternatively, in the imaging element and the like according to the first aspect of the present disclosure including the preferred mode, in the imaging element and the like according to the second aspect of the present disclosure including the preferred mode, or in the imaging element and the like according to the third aspect of the present disclosure including the preferred mode, the inorganic oxide semiconductor material layer can include indium-tungsten oxide (IWO).

In the imaging element and the like according to the first aspect of the present disclosure including various preferred modes and configurations described above, it is desirable that the LUMO value $E_1$ of the material included in the part of the photoelectric conversion layer positioned near the inorganic oxide semiconductor material layer and the LUMO value $E_2$ of the material included in the inorganic oxide semiconductor material layer satisfy $E_1 - E_2 < 0.2$ eV, preferably, $E_1 - E_2 < 0.1$ eV.

Here, "the part of the photoelectric conversion layer positioned near the inorganic oxide semiconductor material layer" denotes a part of the photoelectric conversion layer positioned in the region corresponding to equal to or smaller than 10% of the thickness of the photoelectric conversion layer (that is, region from 0% to 10% of the thickness of the photoelectric conversion layer) with respect to the interface between the inorganic oxide semiconductor material layer and the photoelectric conversion layer. This similarly applies to the imaging element according to the second aspect of the present disclosure. The LUMO value $E_1$ of the material included in the part of the photoelectric conversion layer positioned near the inorganic oxide semiconductor material layer is an average value at the part of the photoelectric conversion layer positioned near the inorganic oxide semiconductor material layer, and the LUMO value $E_2$ of the material included in the inorganic oxide semiconductor material layer is an average value in the inorganic oxide semiconductor material layer.

Furthermore, in the imaging element and the like according to the first aspect of the present disclosure including various preferred modes and configurations described above, it is preferable that the mobility of the material included in the inorganic oxide semiconductor material layer be equal to or greater than. 10 $cm^2/V \cdot s$.

Furthermore, the imaging element and the like according to the first to third aspects of the present disclosure including the preferred modes and configurations described above can be in a mode where the inorganic oxide semiconductor material layer is amorphous (for example, amorphous material not locally including crystal structure). Whether or not the inorganic oxide semiconductor material layer is amorphous can be determined based on. X-ray diffraction analysis.

Furthermore, the imaging element and the like according to the first to third aspects of the present disclosure including the preferred modes and configurations described above can be in a mode where the thickness of the inorganic oxide semiconductor material layer is $1 \times 10^{-8}$ m to $1.5 \times 10^{-7}$ m, preferably, $2 \times 10^{-8}$ m to $1.0 \times 10^{-7}$ m, more preferably, $3 \times 10^{-8}$ m to $1.0 \times 10^{-7}$ m.

Furthermore, the imaging element and the like according to the first to third aspects of the present disclosure including the preferred modes and configurations described above can be in a mode where the light is incident from the second electrode, surface roughness Ra of the inorganic oxide semiconductor material layer at the interface between the photoelectric conversion layer and the inorganic oxide semiconductor material layer is equal to or smaller than 1.5 nm, and the value of a root mean square roughness Rq of the inorganic oxide semiconductor material layer is equal to or smaller than 2.5 nm. The surface roughness Ra and the surface roughness Rq are based on the provision of JIS B0601:2013. The smoothness of the inorganic oxide semiconductor material layer at the interface between the photoelectric conversion layer and the inorganic oxide semiconductor material layer can suppress surface scattering reflection in the inorganic oxide semiconductor material layer, and the bright current characteristics in the photoelectric conversion can be improved. The surface roughness Ra of the charge storage electrode can be equal to or smaller than 1.5 nm, and the value of the root mean square roughness Rq of the charge storage electrode can be equal to or smaller than 2.5 nm.

The imaging element and the like according to the first to third aspects of the present disclosure including the preferred modes and configurations described above may be referred to as "imaging element and the like of the present disclosure" for convenience. The imaging element that is the imaging element and the like according to the first to third aspects of the present disclosure including the preferred modes and configurations described above and that includes the charge storage electrode may be referred to as imaging element and the like including the charge storage electrode of the present disclosure" for convenience.

In the imaging element and the like including the charge storage electrode of the present disclosure, it is preferable that the light transmittance of the inorganic oxide semiconductor material layer with respect to the light at wavelengths of 400 to 660 nm be equal to or greater than 65%. In addition, it is preferable that the light transmittance of the charge storage electrode with respect to the light at wavelengths of 400 to 660 nm be also equal to or greater than 65%. It is preferable that a sheet resistance value of the charge storage electrode be $3 \times 10$ $\Omega/\square$ to $1 \times 10^3 \Omega/\square$.

The imaging element and the like including the charge storage electrode of the present disclosure can further include
a semiconductor substrate, in which
the photoelectric conversion unit is arranged on the upper side of the semiconductor substrate. Note that the first electrode, the charge storage electrode, and the second electrode are connected to a drive circuit described later.

The second electrode positioned on the light incident side may be shared by a plurality of imaging elements. That is, the second electrode can be a so-called solid electrode. The photoelectric conversion layer may be shared by a plurality of imaging elements. That is, one photoelectric conversion layer may be formed for a plurality of imaging elements. The photoelectric conversion layer may be provided for each imaging element. Although it is preferable to provide the inorganic oxide semiconductor material layer for each imaging element, the inorganic oxide semiconductor material layer may be shared by a plurality of imaging elements and the like depending on the case. That is, for example, a charge movement control electrode described later may be provided between as imaging element and the like and the imaging element and the like to thereby form one inorganic oxide semiconductor material layer for a plurality of imaging elements and the like.

Furthermore, the imaging element and the like including the charge storage electrode of the present disclosure including various preferred modes and configurations described above can be in a mode where the first electrode extends in an opening portion provided on the insulating layer, and the first electrode is connected to the inorganic oxide semiconductor material layer. Alternatively, the imaging element and the like can be in a mode where the inorganic oxide semiconductor material layer extends in an opening portion provided on the insulating layer, and the inorganic oxide semiconductor material layer is connected to the first electrode. In this case,
an edge portion of a top surface of the first electrode can be covered by the insulating layer,
the first electrode can be exposed on a bottom surface of the opening portion, and
a side surface of the opening portion can be sloped to extend from a first surface toward a second surface where the first surface is a surface of the insulating layer in contact with the top surface of the first electrode, and the second surface is a surface of the insulating layer in contact with the part of the inorganic oxide semiconductor material layer facing the charge storage electrode. Furthermore, the side surface of the opening portion sloped to extend from the first surface toward the second surface can be positioned on the charge storage electrode side.

Furthermore, the imaging element and the like including the charge storage electrode of the present disclosure including various preferred modes and configurations described above can further include
a control unit provided on the semiconductor substrate and including a drive circuit, in which
the first electrode and the charge storage electrode are connected to the drive circuit,
in a charge storage period, the drive circuit applies a potential $V_{11}$ to the first electrode and applies a potential $V_{12}$ to the charge storage electrode, and charge is stored in the inorganic oxide semiconductor material layer (or in the inorganic oxide semiconductor material layer and the photoelectric conversion layer), and
in a charge transfer period, the drive circuit applies a potential $V_{21}$ to the first electrode and applies a potential $V_{22}$ to the charge storage electrode, and the charge stored in the inorganic oxide semiconductor material layer (or in the inorganic oxide semiconductor material layer and the photoelectric conversion layer) is read out to the control unit through the first electrode. Here, the potential of the first electrode is higher than the potential of the second electrode, and $V_{12} \geq V_{11}$ and $V_{22} < V_{21}$ hold.

Furthermore, the imaging element and the like including the charge storage electrode of the present disclosure including various preferred modes and configurations described above can further include a transfer control electrode (charge transfer electrode) arranged between the first electrode and the charge storage electrode, arranged apart from the first electrode and the charge storage electrode, and arranged to face the inorganic oxide semiconductor material layer through the insulating layer. The imaging element and the like including the charge storage electrode of the present disclosure in such a mode will be referred to as "imaging element and the like including the transfer control electrode of the present disclosure" for convenience.

In addition, the imaging element and the like including the transfer control electrode of the present disclosure can further include
a control unit provided on the semiconductor substrate and including the drive circuit, in which
the first electrode, the charge storage electrode, and the transfer control circuit are connected to the drive circuit,
in the charge storage period, the drive circuit applies the potential $V_{11}$ to the first electrode, applies the potential $V_{12}$ to the charge storage electrode, and applies a potential $V_{13}$ to the transfer control electrode, and charge is stored in the inorganic oxide semiconductor material layer (or in the inorganic oxide semiconductor material layer and the photoelectric conversion layer), and in the charge transfer period, the drive circuit applies the potential $V_{21}$ to the first electrode, applies the potential $V_{22}$ to the charge storage electrode, and applies a potential $V_{23}$ to the transfer control electrode, and the charge stored in the inorganic oxide semiconductor material layer (or in the inorganic oxide semiconductor material layer and the photoelectric conversion layer)) is read out to the control unit through the first electrode. Here, the potential of the first electrode is higher than the potential of the second electrode, and $V_{12} > V_{13}$ and $V_{22} \leq V_{21}$ hold.

Furthermore, the imaging element and the like including the charge storage electrode of the present disclosure including various preferred modes and configurations described above can further include a discharge electrode connected to the inorganic oxide semiconductor material layer and arranged apart from the first electrode and the charge storage electrode. The imaging element and the like including the charge storage electrode of the present disclosure in such a mode will be referred to as "imaging element and the like including the discharge electrode of the present disclosure" for convenience. In addition, the imaging element and the like including the discharge electrode of the present disclosure can be in a mode where the discharge electrode is arranged to surround the first electrode and the charge storage electrode (that is, in a frame shape). The discharge electrode can be shared (standardized) by a plurality of imaging elements. Furthermore, in this case, the inorganic oxide semiconductor material layer can extend in a second opening portion provided on the insulating layer and can be connected to the discharge electrode, an edge portion of a top surface of the discharge electrode can be covered by the insulating layer, the discharge electrode can be exposed on a bottom surface of the second opening portion, and a side surface of the second opening portion can be sloped to extend from a third surface toward a second surface, where the third surface is a surface of the insulating layer in contact with the top surface of the discharge electrode, and the second surface is a surface of the insulating layer in contact with the part of the inorganic oxide semiconductor material layer facing the charge storage electrode.

Furthermore, the imaging element and the like including the discharge electrode of the present disclosure can further include a control unit provided on the semiconductor substrate and including the drive circuit, in which the first electrode, the charge storage electrode, and the discharge electrode are connected to the drive circuit, in the charge storage period, the drive circuit applies the potential $V_{11}$ to the first electrode, applies the potential $V_{12}$ to the charge storage electrode, and applies a potential $V_{14}$ to the discharge electrode, and charge is stored in the inorganic oxide semiconductor material layer (or in the inorganic oxide semiconductor material layer and the photoelectric conversion layer), and in the charge transfer period, the drive circuit applies the potential $V_{21}$ to the first electrode, applies the potential $V_{22}$ to the charge storage electrode, and applies a potential $V_{24}$ to the discharge electrode, and the charge stored in the inorganic oxide semiconductor material layer (or in the inorganic oxide semiconductor material layer and the photoelectric conversion layer) is read out to the control unit through the first electrode. Here, the potential of the first electrode is higher than the potential of the second electrode, and $V_{14} > V_{11}$ and $V_{24} < V_{21}$ hold.

Furthermore, in various preferred modes and configurations described above regarding the imaging element and the like including the charge storage electrode of the present disclosure, the charge storage electrode can include a plurality of charge storage electrode segments. The imaging element and the like including the charge storage electrode of the present disclosure in such as a mode will be referred to as "imaging element and the like including a plurality of charge storage electrode segments of the present disclosure" for convenience. The number of charge storage electrode segments can be two or more. Furthermore, there are cases where different potentials are applied to N charge storage electrode segments in the imaging element and the like including the plurality of charge storage electrode segments of the present disclosure.

In a case where the potential of the first electrode is higher than the potential of the second electrode, the potential applied to a charge storage electrode segment (first photoelectric conversion unit segment) positioned at a place closest to the first electrode can be higher than the potential applied to a charge storage electrode segment (Nth photoelectric conversion unit segment) positioned at a place farthest from the first electrode in the charge transfer period, and in a case where the potential of the first electrode is lower than the potential of the second electrode, the potential applied to the charge storage electrode segment (first photoelectric conversion unit segment) positioned at the place closest to the first electrode can be lower than the potential applied to the charge storage electrode segment (Nth photoelectric conversion unit segment) positioned at the place farthest from the first electrode in the charge transfer period.

In the imaging element and the like including the charge storage electrode of the present disclosure including various preferred modes and configurations described above, at least a floating diffusion layer and an amplification transistor included in the control unit can be provided on the semiconductor substrate, and the first electrode can be connected to the floating diffusion layer and a gate portion of the amplification transistor. In addition, in this case, furthermore, a reset transistor and a selection transistor included in the control unit can be further provided on the semiconductor substrate, the floating diffusion layer can be connected to one source/drain region of the reset transistor, one source/drain region of the amplification transistor can be connected to one source/drain region of the selection transistor, and another source/drain region of the selection transistor can be connected to a signal line.

Furthermore, the imaging element and the like including the charge storage electrode of the present disclosure including various preferred modes and configurations described above can be in a mode where the size of the charge storage electrode is larger than the first electrode. Although not limited, it is preferable to satisfy $$4 \leq S_1'/S_1,$$

where $S_1'$ is the area of the charge storage electrode, and $S_1$ is the area of the first electrode.

Alternatively, examples of modified examples of the imaging element and the like of the present disclosure including various preferred modes described above include imaging elements of first to sixth configurations described below. That is, in the imaging elements of the first to sixth configurations in the imaging element and the like of the present disclosure including various preferred modes described above, the photoelectric conversion unit includes N (where N≥2) photoelectric conversion unit segments, the inorganic oxide semiconductor material layer and the photoelectric conversion layer include N photoelectric conversion layer segments, the insulating layer includes N insulating layer segments, the charge storage electrode includes N charge storage electrode segments in the imaging elements of the first to third configurations, the charge storage electrode includes N charge storage electrode segments arranged apart from each other in the imaging elements of the fourth and fifth configurations, an nth (where n=1, 2, 3, ... N) photoelectric conversion unit segment includes an nth charge storage electrode segment, an nth insulating layer segment, and an nth photoelectric conversion layer segment, and.

the larger the value of n of the photoelectric conversion unit segment, the farther the position of the photoelectric conversion unit segment from the first electrode. Here, the "photoelectric conversion layer segment" denotes a segment including the photoelectric conversion layer and the inorganic oxide semiconductor material layer that are stacked.

Furthermore, in the imaging element of the first configuration, the thicknesses of the insulating layer segments gradually change from the first photoelectric conversion unit segment to the Nth photoelectric conversion unit segment. In addition, in the imaging element of the second configuration, the thicknesses of the photoelectric conversion layer segments gradually change from the first photoelectric conversion unit segment to the Nth photoelectric conversion unit segment. Note that in the photoelectric conversion layer segment, the thickness of the part of the photoelectric conversion layer may be changed, and the thickness of the part of the inorganic oxide semiconductor material layer may be maintained to change the thickness of the photoelectric conversion layer segment. The thickness of the part of the photoelectric conversion layer may be maintained, and the thickness of the part of the inorganic oxide semiconductor material layer may be changed to change the thickness of the photoelectric conversion layer segment. The thickness of the part of the photoelectric conversion layer may be changed, and the thickness of the part of the inorganic oxide semiconductor material layer may be changed to change the thickness of the photoelectric conversion layer segment. Furthermore, in the imaging element of the third configuration, the materials included in the insulating layer segments vary between adjacent photoelectric conversion unit segments. In addition, in the imaging element of the fourth configuration, the materials included in the charge storage electrode segments vary between adjacent photoelectric conversion unit segments. Furthermore, in the imaging element of the fifth configuration, the areas of the charge storage electrode segments gradually decrease from the first photoelectric conversion unit segment to the Nth photoelectric conversion unit segment. The areas may be continuously decrease or may decrease step-wise.

Alternatively, in the imaging element of the sixth configuration in the imaging element and the like of the present disclosure including various preferred modes described above, the cross-sectional area of the stacked part of the charge storage electrode, the insulating layer, the inorganic oxide semiconductor material layer, and the photoelectric conversion layer when the stacked part is cut in a YZ virtual plane changes in accordance with the distance from the first electrode, where the Z direction is a stacking direction of the charge storage electrode, the insulating layer, the inorganic oxide semiconductor material layer, and the photoelectric conversion layer, and the X direction is a direction away from the first electrode. The change in the cross-sectional area may be continuous change or may be step-wise change.

In the imaging elements of the first and second configurations, the N photoelectric conversion layer segments are continuously provided. The N insulating layer segments are also continuously provided, and the N charge storage electrode segments are also continuously provided. In the imaging elements of the third to fifth configurations, the N photoelectric conversion layer segments are continuously provided. Furthermore, in the imaging elements of the fourth and fifth configurations, the N insulating layer segments are continuously provided. On the other hand, in the imaging element of the third configuration, the N insulating layer segments are provided to correspond to the photoelectric conversion unit segments, respectively. Furthermore, in the imaging elements of the fourth and fifth configurations and in the imaging element of the third configuration depending on the case, the N charge storage electrode segments are provided to correspond to the photoelectric conversion unit segments, respectively. Furthermore, in the imaging elements of the first to sixth configurations, the same potential is applied to all of the charge storage electrode segments. Alternatively, in the imaging elements of the fourth and fifth configurations and in the imaging element of the third configuration depending on the case, different potentials may be applied to the N charge storage electrode segments.

In the imaging element and the like of the present disclosure including the imaging elements of the first to sixth configurations, the thicknesses of the insulating layer segments are defined. Alternatively, the thicknesses of the photoelectric conversion layer segments are defined. Alternatively, the materials included in the insulating layer segments are different. Alternatively, the materials included in the charge storage electrode segments are different. Alternatively, the areas of the charge storage electrode segments are defined. Alternatively, the cross-sectional areas of the stacked parts are defined. Therefore, a kind of charge transfer gradient is formed, and the charge generated by the photoelectric conversion can be more easily and certainly transferred to the first electrode. In addition, as a result, generation of residual image or transfer leftover can be prevented.

In the imaging elements of the first to fifth configurations, the larger the value of n of the photoelectric conversion unit segment, the farther the position of the photoelectric conversion unit segment from the first electrode. Whether or not the photoelectric conversion unit segment is positioned away from the first electrode is determined on the basis of X direction. In addition, the direction away from the first electrode is the X direction in the imaging element of the sixth configuration, and the "X direction" is defined as follows. That is, the pixel region including a plurality of arrayed imaging elements or stacked imaging elements includes a plurality of pixels arranged in a two-dimensional array, that is, systematically arranged in the X direction and the Y direction. In a case where the plane shape of the pixels is rectangle, the extending direction of the side closest to the first electrode is the Y direction, and the direction orthogonal to the Y direction is the X direction. Alternatively, in a case where the plane shape of the pixels is an arbitrary shape, the overall direction including the line segment or curve closest to the first electrode is the Y direction, and the direction orthogonal to the Y direction is the X direction.

Hereinafter, a case where the potential of the first electrode is higher than the potential of the second electrode will be described regarding the imaging elements of the first to sixth configurations.

In the imaging element of the first configuration, the thicknesses of the insulating layer segments gradually change from the first photoelectric conversion unit segment to the Nth photoelectric conversion unit segment. It is preferable that the thicknesses of the insulating layer segments gradually increase, and as a result, a kind of charge transfer gradient is formed. Furthermore, when the state shifts to $|V_{12}| \geq |V_{11}|$ in the charge storage period, the nth photoelectric conversion unit segment can store more charge than the (n+1)th photoelectric conversion unit segment, and a strong electric field is applied. This can certainly prevent the flow of charge from the first photoelectric conversion unit segment to the first electrode. In addition, when the state shifts to $|V_{22}| < |V_{21}|$ in the charge transfer period, the flow of charge from the first photoelectric conversion unit segment to the first electrode and the flow of charge from the (n+1)th photoelectric conversion unit segment to the nth photoelectric conversion unit segment can be certainly secured.

In the imaging element of the second configuration, the thicknesses of the photoelectric conversion layer segments can gradually change from the first photoelectric conversion unit segment to the Nth photoelectric conversion unit segment. It is preferable that the thicknesses of the photoelectric conversion layer segments gradually increase, and as a result, a kind of charge transfer gradient is formed. Furthermore, when the state shifts to $V_{12} \geq V_{11}$ in the charge storage period, a stronger electric field is applied to the nth photoelectric conversion unit segment than to the (n+1)th photoelectric conversion unit segment. This can certainly prevent the flow of charge from the first photoelectric conversion unit segment to the first electrode.

Furthermore, when the state shifts to $V_{22} < V_{21}$ in the charge transfer period, the flow of charge from the first photoelectric conversion unit segment to the first electrode and the flow of charge from the (n+1)th photoelectric conversion unit segment to the nth photoelectric conversion unit segment can be certainly secured.

In the imaging element of the third configuration, the materials included in the insulating layer segments vary between adjacent photoelectric conversion unit segments. As a result, a kind of charge transfer gradient is formed. It is preferable that the values of dielectric constant of the materials included in the insulating layer segments gradually decrease from the first photoelectric conversion unit segment to the Nth photoelectric conversion unit segment. In addition, when the state shifts to $V_{12} \geq V_{11}$ in the charge storage period by adopting the configuration, the nth photoelectric conversion unit segment can store more charge than the (n+1)th photoelectric conversion unit segment. Furthermore, when the state shifts to $V_{22} < V_{21}$ in the charge transfer period, the flow of charge from the first photoelectric conversion unit segment to the first electrode and the flow of charge from the (n+1)th photoelectric conversion unit segment to the nth photoelectric conversion unit segment can be certainly secured.

In the imaging element of the fourth configuration, the materials included in the charge storage electrode segments vary between adjacent photoelectric conversion unit segments. As a result, a kind of charge transfer gradient is formed. It is preferable that the values of work function of the materials included in the insulating layer segments gradually increase from the first photoelectric conversion unit segment to the Nth photoelectric conversion unit segment. In addition, by adopting the configuration, a potential gradient advantageous for the signal charge transfer can be formed regardless of whether the voltage is positive or negative.

In the imaging element of the fifth configuration, the areas of the charge storage electrode segments gradually decrease from the first photoelectric conversion unit segment to the Nth photoelectric conversion unit segment. As a result, a kind of charge transfer gradient is formed. Therefore, when the state shifts to $V_{12} \geq V_{11}$ in the charge storage period, the nth photoelectric conversion unit segment can store more charge than the (n+1)th photoelectric conversion unit segment. Furthermore, when the state shifts to $V_{22} < V_{21}$ in the charge transfer period, the flow of charge from the first photoelectric conversion unit segment to the first electrode and the flow of charge from the (n+1)th photoelectric conversion unit segment to the nth photoelectric conversion unit segment can be certainly secured.

In the imaging element of the sixth configuration, the cross-sectional areas of the stacked parts change in accordance with the distance from the first electrode. As a result, a kind of charge transfer gradient, is formed. Specifically, the thicknesses of the cross sections of the stacked parts can be constant, and the widths of the cross sections of the stacked parts can decrease with an increase in the distance from the first electrode. By adopting the configuration, a region near the first electrode can store more charge than a far region when the state shifts to $V_{12} \geq V_{11}$ in the charge storage period as described in the imaging element of the fifth configuration. Therefore, when the state shifts to $V_{22} < V_{21}$ in the charge transfer period, the flow of charge from the region near the first electrode to the first electrode and the flow of charge from the far region to the near region can be certainly secured. On the other hand, the widths of the cross sections of the stacked parts can be constant, and the thicknesses of the cross sections of the stacked parts, specifically, the thicknesses of the insulating layer segments, can be gradually increased. By adopting the configuration, a region near the first electrode can store more charge than a far region when the state shifts to $V_{12} \geq V_{11}$ in the charge storage period as described in the imaging element of the first configuration. In addition, a strong electric field is applied, and this can certainly prevent the flow of charge from the region near the first electrode to the first electrode. Furthermore, when the state shifts to $V_{22} < V_{21}$ in the charge transfer period, the flow of charge from the region near the first electrode to the first electrode and the flow of charge from the far region to the near region can be certainly secured. In addition, by adopting the configuration of gradually increasing the thicknesses of the photoelectric conversion layer segments, a stronger electric field is applied to the region near the first electrode than to the far region when the state shifts to $V_{12} \geq V_{11}$ in the charge storage period, and the flow of charge from the region near the first electrode to the first electrode can be certainly prevented as described in the imaging element of the second configuration. Furthermore, when the state shifts to $V_{22} < V_{21}$ in the charge transfer period, the flow of charge from the region near the first electrode to the first electrode and the flow of charge from the far region to the near region can be certainly secured.

A solid-state imaging apparatus as a modified example of the solid-state imaging apparatus according to the first and second aspects of the present disclosure can include a plurality of imaging elements of the first to sixth configurations, in which the plurality of imaging elements are included in an imaging element block, and the first electrode is shared by the plurality of imaging elements included in the imaging element block. The solid-state imaging apparatus configured in this way will be referred to as a "solid-state imaging apparatus of first configuration" for convenience. Alternatively, a solid-state imaging apparatus as a modification of the solid-state imaging apparatus according to the first and second aspects of the present disclosure can include a plurality of imaging elements of the first to sixth configurations or a plurality of stacked imaging elements including at least one imaging element of the first to sixth configurations, in which the plurality of imaging elements or stacked imaging elements are included in an imaging element block, and the first electrode is shared by the plurality of imaging elements or s tacked imaging elements included in the imaging element block. The solid-state imaging apparatus configured in this way will be referred to as a "solid-state imaging apparatus of second configuration" for convenience. In addition, the first electrode can be shared by the plurality of imaging elements included in the imaging element block to simplify and miniaturize the configuration and the structure in the pixel region including a plurality of arrayed imaging elements.

In the solid-state imaging apparatuses of the first and second configurations, one floating diffusion layer is provided for a plurality of imaging elements (one imaging element block). Here, the plurality of imaging elements provided for one floating diffusion layer may include a plurality of imaging elements of first type described later or may include at least one imaging element of first type and one or two or more imaging elements of second type described later. In addition, the timing of the charge transfer period can be appropriately controlled to allow the plurality of imaging elements to share one floating diffusion layer. The plurality of imaging elements operate together and are connected as an imaging element block to a drive circuit described later. That is, the plurality of imaging elements included in the imaging element block are connected to one drive circuit. However, the charge storage electrode is controlled for each imaging element. In addition, the plurality of imaging elements can share one contact hole portion. As for the arrangement relationship between the first electrode shared by the plurality of imaging elements and the charge storage electrode of each imaging element, the first electrode may be arranged adjacent to the charge storage electrode of each imaging element. Alternatively, the first electrode may be arranged adjacent to the charge storage electrodes of part of the plurality of imaging elements and not arranged adjacent to the charge storage electrodes of the rest of the plurality of imaging elements. In this case, the movement of charge from the rest of the plurality of imaging elements to the first electrode is movement through part of the plurality of imaging elements. It is preferable that the distance between the charge storage electrode included in the imaging element and the charge storage electrode included in the imaging element (referred to as "distance A" for convenience) be longer than the distance between the first electrode and the charge storage electrode in the imaging element adjacent to the first electrode (referred to as "distance B" for convenience) in order to certainly move the charge from each imaging element to the first electrode. In addition, it is preferable that the farther the position of the imaging element from the first electrode, the larger the value of the distance A.

Furthermore, the imaging element and the like of the present disclosure including various preferred modes and configurations described above can be in a mode where the light is incident from the second electrode side, and a light shielding layer is formed on the light incident side closer to the second electrode. Alternatively, the light may be incident from the second electrode side, and the light may not be incident on the first electrode (first electrode and transfer control electrode depending on the case). Furthermore, in this case, the light shielding layer can be formed on the light incident side closer to the second electrode and on the upper side of the first electrode (first electrode and transfer control electrode depending on the case). Alternatively, an on-chip micro lens can be provided on the upper side of the charge storage electrode and the second electrode, and the light incident on the on-chip micro lens can be collected by the charge storage electrode. Here, the light shielding layer may be arranged on the upper side of the surface on the light incident side of the second electrode or may be arranged on the surface on the light incident side of the second electrode. The light shielding layer may be formed on the second electrode depending on the case. Examples of the materials included in the light shielding layer include chromium (Cr), copper (Cu), aluminum (Al), tungsten (W), and a light-proof resin (for example, polyimide resin).

Specific examples of the imaging element and the like of the present disclosure include: an imaging element (referred to as "blue light imaging element of first type" for convenience) sensitive to blue light including a photoelectric conversion layer or a photoelectric conversion unit (referred to as "blue light photoelectric conversion layer of first type" or "blue light photoelectric conversion unit of first type" for convenience) that absorbs blue light (light at 425 to 495 nm); an imaging element (referred to as "green light imaging element of first type" for convenience) sensitive to green light including a photoelectric conversion layer or a photoelectric conversion unit ("referred to as green light photoelectric conversion layer of first type" or "green light photoelectric conversion unite, of first type" for convenience) that absorbs green light (light at 495 to 570 nm); and an imaging element (referred to as "red light imaging element of first type" for convenience) sensitive to red light including a photoelectric conversion layer or a photoelectric conversion unit (referred to as "red light photoelectric conversion layer of first type" or "red light photoelectric conversion unit of first type" for convenience) that absorbs red light (light at 620 to 750 nm). In addition, an imaging element sensitive to blue light that is an element in the past not including the charge storage electrode will be referred to as a "blue light imaging element of second type" for convenience. An imaging element in the past sensitive to green light will be referred to as a "green light imaging element of second type" for convenience. An imaging element in the past sensitive to red light will be referred to as a "red light imaging element of second type" for convenience. A photoelectric conversion layer or a photoelectric conversion unit included in the blue light imaging element of second type will be referred to as a "blue light photoelectric conversion layer of second type" or a "blue light photoelectric conversion unit of second type" for convenience. A photoelectric conversion layer or a photoelectric conversion unit included in the green light imaging element of second type will be referred to as a "green light photoelectric conversion layer of second type" or a "green light photoelectric conversion unit of second type" for convenience. A photoelectric conversion layer or a photoelectric conversion unit included in the red light imaging element of second type will be referred to as a "red light photoelectric conversion layer of second type" or a "red light photoelectric conversion unit of second type" for convenience.

Specific examples of the configuration and the structure of the stacked imaging element including the charge storage electrode include:

[A] a configuration and a structure in which the blue light photoelectric conversion unit of first type, the green light photoelectric conversion unit of first type, and the red light photoelectric conversion unit of first type are stacked in the vertical direction, and control units of the blue light imaging element of first type, the green light imaging element of first type, and the red light imaging element of first type are provided on the semiconductor substrate;

[B] a configuration and a structure in which the blue light photoelectric conversion unit of first type and the green light photoelectric conversion unit of first type are stacked in the vertical direction, the red light photoelectric conversion unit of second type is arranged on the lower side of these two layers of photoelectric conversion units of first type, and control units of the blue light imaging element of first type, the green light imaging element of first type, and the red light imaging element of second type are provided on the semiconductor substrate;

[C] a configuration and a structure in which the blue light photoelectric conversion unit of second type and the red light photoelectric conversion unit of second type are arranged on the lower side of the green light photoelectric conversion unit of first type, and control units of the green light imaging element of first type, the blue light imaging element of second type, and the red light imaging element of second type are provided on the semiconductor substrate; and

[D] a configuration and a structure in which the green light photoelectric conversion unit of second type and the red light photoelectric conversion unit of second type are arranged on the lower side of the blue light photoelectric conversion unit of first type, and control units of the blue light imaging element of first type, the green light imaging element of second type, and the red light imaging element of second type are provided on the semiconductor substrate.

It is preferable that the arrangement order of the photoelectric conversion units of the imaging elements in the vertical direction be the blue light photoelectric conversion unit, the green light photoelectric conversion unit, and the red light photoelectric conversion unit from the light incident direction or the green light photoelectric conversion unit, the blue light photoelectric conversion unit, and the red light photoelectric conversion unit from the light incident direction. This is because the light at a shorter wavelength is efficiently absorbed on the incident surface side. Red has the longest wavelength among the three colors, and it is preferable to position the red light photoelectric conversion unit in the lowest layer as viewed from the light incident surface. The stacked structure of the imaging elements provide one pixel. In addition, a near-infrared photoelectric conversion unit (or infrared photoelectric conversion unit) of first type may be included. Here, it is preferable that the photoelectric conversion layer of the infrared photoelectric conversion unit of first type include, for example, organic materials and be arranged in the lowest layer of the stacked structure of the imaging elements of first type, above the imaging element of second type. Alternatively, a near-infrared photoelectric conversion unit of second type (or infrared photoelectric conversion unit) may be included on the lower side of the photoelectric conversion units of first type.

In the imaging element of first type, the first electrode is formed on, for example, an interlayer insulating layer provided on the semiconductor substrate. The imaging element formed on the semiconductor substrate can be a back illuminated type or a front illuminated type.

In a case where the photoelectric conversion layer includes organic materials, the photoelectric conversion layer can be in one of the following four modes.

(1) The photoelectric conversion layer includes a p-type organic semiconductor.

(2) The photoelectric conversion layer includes a n-type organic semiconductor.

(3) The photoelectric conversion layer includes a stacked structure of p-type organic semiconductor layer/n-type organic semiconductor layer. The photoelectric conversion layer includes a stacked structure of p-type organic semiconductor layer/mixed layer (bulk hetero structure) of p-type organic semiconductor and n-type organic semiconductor/n-type organic semiconductor layer. The photoelectric conversion layer includes a stacked structure of p-type organic semiconductor layer/mixed layer (bulk hetero structure) of p-type organic semiconductor and n-type organic semiconductor. The photoelectric conversion layer includes a stacked structure of n-type organic semiconductor/mixed layer (bulk hetero structure) of p-type organic semiconductor and n-type organic semiconductor.

(4) The photoelectric conversion layer includes a mixture (bulk hetero structure) of p-type organic semiconductor and n-type organic semiconductor.

Here, the order of stacking can be arbitrarily switched.

Examples of the p-type organic semiconductor include a naphthalene derivative, an anthracene derivative, a phenanthrene derivative, a pyrene derivative, a perylene derivative, a tetracene derivative, a pentacene derivative, a quinacridone derivative, a thiophene derivative, a thienothiophene derivative, a benzothiophene derivative, a benzothienobenzothiophene derivative, a triallylamine derivative, a carbazole derivative, a perylene derivative, a picene derivative, a chrysene derivative, a fluoranthene derivative, a phthalocyanine derivative, a subphthalocyanine derivative, a subporphyrazine derivative, a metal complex including heterocyclic compounds as ligands, a polythiophene derivative, a polybenzothiadiazole derivative, and a polyfluorene derivative. Examples of the n-type organic semiconductor include a fullerene and a fullerene derivative <for example, fullerene (higher fullerene), such as C60, C70, and C74, endohedral fullerene, or the like) or fullerene derivative (for example, fullerene fluoride, PCBM fullerene compound, fullerene multimer, or the like)>, an organic semiconductor with larger (deeper) HOMO and LUMO than the p-type organic semiconductor, and transparent inorganic metal oxide. Specific examples of the n-type organic semiconductor include organic molecules including, as part of molecular framework, a heterocyclic compound containing nitrogen atoms, oxygen atoms, and sulfur atoms, such as a pyridine derivative, a pyrazine derivative, a pyrimidine derivative, a triazine derivative, a quinoline derivative, a quinoxaline derivative, an isoquinoline derivative, an acridine derivative, a phenazine derivative, a phenanthroline derivative, a tetrazole derivative, a pyrazole derivative, an imidazole derivative, a thiazole derivative, an oxazole derivative, an imidazole derivative, a benzimidazole derivative, a benzotriazole derivative, a benzoxazole derivative, a carbazole derivative, a benzofuran derivative, a dibenzofuran derivative, a subporphyrazine derivative, a polyphenyiene vinylene derivative, a polybenzothiadiazole derivative, and a polyfluorene derivative, an organic metal complex, and a subphthalocyanine derivative. Examples of groups and the like included in the fullerene derivative include: halogen atoms; a straight-chain, branched, or cyclic alkyl group or phenyl group; a group including a straight-chain or condensed aromatic compound; a group including halide; a partial fluoroalkyl group; a perfluoroalkyl group; a silylalkyl group; a silylalkoxy group; an arylsilyl group; an arylsulfanyl group; an alkylsulfanyl group; an arylsulfonyl group; an alkylsulfonyl group; an arylsulfide group; an alkylsulfide group; an amino group; an alkylamino group; an acylamino group; a hydroxy group; an alkoxy group; an acylamino group; an acyloxy group; a carbonyl group; a carboxy group; a carboxamide group; a carboalkoxy group; an acyl group; a sulfonyl group; a cyano group; a nitro group; a group including chalcogenide; a phosphine group; a phosphon group; and derivatives of these. Although the thickness of the photoelectric conversion layer including the organic materials (referred to as "organic photoelectric conversion layer" in some cases) is not limited, the thickness can be, for example, $1\times^{-8}$ m to $5\times10^{-7}$ m, preferably, $2.5\times10^{-8}$ m to $3\times10^{-7}$ m, more preferably, $2.5\times10^{-8}$ m to $2\times10^{-7}$ m, further preferably, $1\times10^{-7}$ m to $1.8\times10^{-7}$ m. Note that the organic semiconductors are often classified into p-type and re-type. The p-type denotes that the electron holes can be easily transported, and the n-type denotes that the electrons can be easily transported. The organic semiconductor is not limited to the interpretation that the electron holes or the electrons are included as thermally excited majority carriers as in an inorganic semiconductor.

Alternatively, examples of the materials included in the organic photoelectric conversion layer for photoelectric conversion of green light include a rhodamine dye, a merocyanine dye, a quinacridone derivative, and a subphthalocyanine dye (subphthalocyanine derivative). Examples of the materials included in the organic photoelectric conversion layer for photoelectric conversion of blue light include a coumaric acid dye, tris-8-hydroxyquinoline aluminum (Alq3), and a merocyanine dye. Examples of the materials included in the organic photoelectric conversion layer for photoelectric conversion of red light include a phthalocyanine dye and a subphthalocyanine dye (subphthalocyanine derivative).

Alternatively, examples of the inorganic materials included in the photoelectric conversion layer include crystalline silicon, amorphous silicon, microcrystalline silicone, crystalline selenium, amorphous selenium, chalcopyrite compounds, such as CIGS (CuInGaSe), CIS ($CuInSe_2$), $CuInS_2$, $CuAlS_2$, $CuAlSe_2$, $CuGaS_2$, $CuGaSe_2$, $AgAlS_2$, $AgAlSe_2$, $AgInS_2$, and $AgInSe_2$, group III-V compounds, such as GaAs, InP, AlGaAs, InGaP, AlGaInP, and InGaAsP, and compound semiconductors of CdSe, CdS, $Bi_2Se_3$, $Bi_2S_3$, ZnSe, ZnS, PbSe, PbS, and the like. In addition, quantum dots including these materials can also be used for the photoelectric conversion layer.

The solid-state imaging apparatuses according to the first and second aspects of the present disclosure and the solid-state imaging apparatuses of the first and second configurations can provide single-plate color solid-state imaging apparatuses.

In the solid-state imaging apparatuses according to the second aspect of the present disclosure including the stacked imaging elements, the imaging elements sensitive to light at a plurality of types of wavelengths in the light incident direction within the same pixel are stacked to provide one pixel, unlike in the solid-state imaging apparatuses including imaging elements of Bayer array (that is, not using a color filter layer to separate blue, green, and red). Therefore, the sensitivity can be improved, and the pixel density per unit volume can be improved. In addition, the absorption coefficients of the organic materials are high, and the film thickness of the organic photoelectric conversion layer can be thinner than a Si-based photoelectric conversion layer in the past. This reduces light leakage from adjacent pixels and alleviates restrictions on light incident angle. Furthermore, in the Si-based imaging elements in the past, an interpolation process is executed for the pixels of three colors to create color signals, and therefore, false colors are generated. In the solid-state imaging apparatus according to the second aspect of the present disclosure including the stacked imaging elements, the generation of the false colors is suppressed. The organic photoelectric conversion layer also functions as a color filter layer, and the colors can be separated without arranging the color filter layer.

On the other hand, in the solid-state imaging apparatus according to the first aspect of the present disclosure, the color filter layer can be used to alleviate the requirements for the spectral characteristics of blue, green, and red, and the mass productivity is high. Examples of the array of the imaging elements in the solid-state imaging apparatus according to the first aspect of the present disclosure include the Bayer array, as well as an interline array, a G stripe RB checkered array, a G stripe RB full checkered array, a checkered complementary color array, a stripe array, a diagonal stripe array, a primary color difference array, a field color difference sequential array, a frame color difference sequential array, a MOS array, an improved. MOS array, a frame interleave array, and a field interleave array. Here, one imaging element provides one pixel (or subpixel).

Examples of the color filter layers (wavelength selection means) include filter layers that transmit not only red, green, and blue, but also specific wavelengths, such as cyan, magenta, and yellow, depending on the case. The color filter layer can include not only a color filter layer of organic materials using organic compounds, such as pigments and dyes, but also a thin film including inorganic materials, such as photonic crystal, a wavelength selection element using plasmon (color filter layer with conductor grid structure including grid hole structure in conductor thin film, see, for example, Japanese Patent Laid-Open No. 2008-177191), and amorphous silicon.

The pixel region provided with the plurality of arrayed imaging elements and the like of the present disclosure includes a plurality of pixels systematically arranged in a two-dimensional array. The pixel region usually includes: an effective pixel region in which the light is actually received to generate signal charge through photoelectric conversion, and the signal charge is amplified and read out to the drive circuit; and a black reference pixel region (also called optical black pixel region (OPB)) for outputting optical black as a standard for black level. The black reference pixel region is usually arranged on the periphery of the effective pixel region.

In the imaging element and the like of the present disclosure including various preferred modes and configurations described above, the light is applied, and photoelectric conversion occurs in the photoelectric conversion layer. Carrier separation of electron holes (holes) and electrons is conducted. In addition, the electrode from which the electron holes are extracted is an anode, and the electrode from which the electrons are extracted is a cathode. The first electrode provides the cathode, and the second electrode provides the anode.

The first electrode, the charge storage electrode, the transfer control electrode, the discharge electrode, and the second electrode can include transparent conductive materials. The first electrode, the charge storage electrode, the transfer control electrode, and the discharge electrode will be collectively referred to as "first electrode and the like" in some cases. Alternatively, in a case where the imaging element and the like of the present disclosure are arranged on a plane as in, for example, a Bayer array, the second electrode can include a transparent conductive material, and the first electrode and the like can include a metal material. In this case, specifically, the second electrode positioned on the light incident side can include a transparent conductive material, and the first electrode and the like can include, for example, Al—Nd. (alloy of aluminum and neodymium) or ASC (alloy of aluminum, samarium, and copper). An electrode including a transparent conductive material will be referred to as a "transparent electrode" in some cases. Here, Here, it is desirable that the band-gap energy of the transparent conductive material be equal to or greater than 2.5 eV, preferably, equal to or greater than 3.1 eV. An example of the transparent conductive material included in the transparent electrode includes conductive metal oxide. Specifically, examples of the transparent conductive material include indium oxide, indium-tin oxide (including ITO, Indium Tin Oxide, Sn-doped $In_2O_3$, crystalline ITO, and amorphous ITO), indium-zinc oxide (IZO, Indium Zinc Oxide) obtained by adding indium as a dopant to zinc oxide, indium-gallium oxide (IGO) obtained by adding indium as a dopant to gallium oxide, indium-gallium-zinc oxide (IGZO, In—$GaZnO_4$) obtained by adding indium and gallium as dopants to zinc oxide, indium-tin-zinc oxide (ITZO) obtained by adding indium and tin as dopants to zinc oxide, IFO (F-doped $In_2O_3$), tin oxide ($SnO_2$), ATO (Sb-doped $SnO_2$), FTO (F-doped $SnO_2$) zinc oxide (including ZnO doped with other elements), aluminum-zinc oxide (AGO) obtained by adding aluminum as a dopant to zinc oxide, gallium-zinc oxide (GZO) obtained by adding gallium as a dopant to zinc oxide, titanium oxide ($TiO_2$), niobium-titanium oxide (TNO) obtained by adding niobium as a dopant to titanium oxide, antimony oxide, spinel oxide, and oxide with $YbFe_2O_4$ structure. Alternatively, the transparent electrode can include gallium oxide, titanium oxide, niobium oxide, nickel oxide or the like as a mother layer. An example of the thickness of the transparent electrode includes $2\times10^{-8}$ m to $2\times10^{-7}$ m, preferably, $3\times10^{-8}$ m to $1\times10^{-7}$ m. In a case where the first electrode needs to be transparent, it is preferable that the discharge electrode also include a transparent conductive material from the viewpoint of simplification of the manufacturing process.

Alternatively, in a case where transparency is not necessary, it is preferable to use a conductive material with a low work function (for example, $\phi=3.5$ eV to 4.5 eV) as a conductive material included in the cathode with a function of an electrode for extracting the electrons. Specifically, examples of the conductive material include alkali metal (for example, Li, Na, K, or the like) and fluoride or oxide of the alkali metal, alkaline earth metal (for example, Mg, Ca, or the like) and fluoride or oxide of the alkaline earth metal, aluminum (Al), zinc (Zn), tin (Sn), thallium (Tl), a sodium-potassium alloy, an aluminum-lithium alloy, a magnesium-silver alloy, indium, rare earth metal such as ytterbium, and alloys of these. Alternatively, examples of the material included in the cathode include metal, such as platinum (Pt), gold (Au), palladium (Pd), chromium (Cr), nickel (Ni), aluminum (Al), silver (Ag), tantalum (Ta), tungsten. (W), copper (Cu), titanium (Ti), indium (in), tin (Sn), iron (Fe), cobalt (Co), and molybdenum (Mo), alloys containing these metal elements, conductive particles including these metals, conductive particles of alloys containing these metals, polysilicon containing impurities, a carbon material, an oxide semiconductor material, a carbon nanotube, and a conductive material such as graphene. The cathode can also have a stacked structure of layers containing these elements. Furthermore, examples of the material included in the cathode also include organic materials (conductive polymers) such as poly(3,4-ethylenedioxythiophene-poly(styrenesulfonate) [PEDOT/PSS]. In addition, these conductive materials may be mixed with a binder (polymer) to obtain a paste or an ink, and the paste or the ink may be cured and used as an electrode.

A dry method or a wet method can be used as a deposition method of the first electrode and the like or the second electrode (cathode or anode). Examples of the dry method include a physical vapor deposition method (PVD method) and a chemical vapor deposition method (CVD method). Examples of the deposition method using the principle of PVD method include a vacuum evaporation method using resistance heating or radio frequency heating, an EB (electron beam) evaporation method, various sputtering methods (magnetron sputtering method, RE-DC coupled bias sputtering method, ECR sputtering method, facing target sputtering method, and RE sputtering method), an ion plating method, a laser ablation method, a molecular beam epitaxy method, and a laser transfer method. In addition, examples of the CVD method include a plasma CVD method, a thermal CVD method, an organic metal (MO) CVD method, and an optical CVD method. On the other hand, examples of the wet method include methods, such as an electroplating method, an electroless plating method, a spin coating method, an inkjet method, a spray coating method, a stamping method, a microcontact printing method, a flexographic printing method, an offset printing method, a gravure printing method, and a dipping method. Examples of a patterning method include chemical etching, such as a shadow mask, laser transfer, and photolithography, and physical etching using ultraviolet light, laser, or the like. Examples of a planarization method of the first electrode and the like and the second electrode include a laser planarization method, a reflow method, and a CMP (Chemical Mechanical Polishing) method.

Examples of the materials included in the insulating layer include not only inorganic insulating materials like metal oxide high dielectric insulating materials such as: a silicon oxide material; a silicon nitride ($SiN_y$) and aluminum oxide ($Al_2O_3$), but also organic insulating materials (organic polymers) such as: polymethyl methacrylate (PMMA); polyvinyl phenol (PVP) polyvinyl alcohol (PVA); polyimide; polycarbonate (PC) polyethylene terephthalate (PET); polystyrene; a silanol derivative (silane coupling agent) such as N-(2-aminoethyl)-3-aminopropyltrimethoxysilane (AEAPTMS), 3-mercaptopropyltrimethoxysilane (MPTMS), and octadecyltrichlorosilane (OTS); a novolac phenolic resin; a fluororesin; and straight chain hydrocarbons, such as octadecanethiol and dodecyl isocyanate, including, on one end, a functional group that can be combined with a control electrode. A combination of these can also be used. Examples of the silicon oxide material include silicon oxide ($SiO_x$), BPSG, PSG, BSG, AsSG, PbSG, silicon oxynitride (SiON), SOG (spin on glass), and low dielectric insulating materials (for example, polyarylether, cycloperfluorocarbon polymer, benzocyclobutene, cyclic fluororesin, polytetrafluoroethylene, fluorinated aryl ether, fluorinated polyimide, amorphous carbon, and organic SOG). The insulating layer can have a single-layer configuration, or a plurality of layers (for example two layers) can be stacked. In the latter case, an insulating layer/lower layer can be formed at least over the charge storage electrode and in the area between the charge storage electrode and the first electrode. A planarization process can be applied to the insulating layer/lower layer to leave the insulating layer/lower layer at least in the region between the charge storage electrode and the first electrode. An insulating layer/upper layer can be formed over the insulating layer/lower layer and the charge storage electrode. In this way, the insulating layer can be certainly planarized. These materials is also only required to be appropriately selected for the materials included in various interlayer insulating layers and insulating material films.

The configurations and the structures of the floating diffusion layer, the amplification transistor, the reset transistor, and the selection transistor included in the control unit can be similar to the configurations and the structures of the floating diffusion layer, amplification transistor, reset transistor, and selection transistor in the past. The drive circuit can also have well-known configuration and structure.

The first electrode is connected to the floating diffusion layer and a gate portion of the amplification transistor, and a contact hole portion is only required to be formed for the connection of the first electrode to the floating diffusion layer and the gate portion of the amplification transistor. Examples of the materials included in the contact hole portion include polysilicon doped with impurities, high melting point metal and metal silicide, such as tungsten, Ti, Pt, Pd, Cu, TiW, TiN, TiNW, $WSi_2$, and $MoSi_2$ or the like, and a stacked structure of layers including these materials (for example, Ti/TiN/W).

A first carrier blocking layer may be provided between the inorganic oxide semiconductor material layer and the first electrode, and a second carrier blocking layer may be provided between the organic photoelectric conversion layer and the second electrode. In addition, a first charge injection layer may be provided between the first carrier blocking layer and the first electrode, and a second charge injection layer may be provided between the second carrier blocking layer and the second electrode. For example, examples of the materials included in the electron injection layer include alkali metal, such as lithium (Li), sodium (Na), and potassium (K), fluoride or oxide of the alkali metal, alkaline earth metal, such as magnesium (Mg) and calcium (Ca), and fluoride or oxide of the alkaline earth metal.

Examples of the deposition method of various organic layers include a dry deposition method and a wet deposition method. Examples of the dry deposition method include a vacuum evaporation method using resistance heating, radio frequency heating, or electron beam heating, a flash evaporation method, a plasma deposition method, an NB evaporation method, various sputtering methods (bipolar sputtering method, DC sputtering method, DC magnetron sputtering method, RE sputtering method, magnetron sputtering method, RF-DC coupled bias sputtering method, NCR sputtering method, facing target sputtering method, RE sputtering method, and ion beam sputtering method), a DC (Direct Current) method, an RE method, a multi-cathode method, an activation reaction method, an electric field evaporation method, various ion plating methods, such as an RF ion plating method and a reactive ion plating method, a laser ablation method, a molecular beam epitaxy method, a laser transfer method, and a molecular beam epitaxy method (TBE method). In addition, examples of the CVD method include a plasma CVD method, a thermal CVD method, an MOCVD method, and an optical CVD method. On the other hand, specific examples of the wet method include: a spin coating method; a dipping method; a casting method; a microcontact printing method; a drop casting method; various printing methods, such as a screen printing method, an inkjet printing method, an offset printing method, a gravure printing method, and a flexographic printing method; a stamping method; a spraying method; and various coating methods, such as an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, and a calendar coater method. In the coating method, examples of the solvent include nonpolar or low-polarity organic solvents, such as toluene, chloroform, hexane, and ethanol. Examples of the patterning method include chemical etching, such as a shadow mask, laser transfer, and photolithography, and physical etching using ultraviolet light, laser, or the like. A laser planarization method, a reflow method, and the like can be used as planarization techniques of various organic layers.

Two or more types of imaging elements of the first to sixth configurations described above can be appropriately combined as necessary.

As described above, the on-chip micro lens and the light shielding layer may be provided on the imaging element or the solid-state imaging apparatus as necessary, and the drive circuit and the wire for driving the imaging element are provided. A shutter for controlling the light incident on the imaging element may be arranged as necessary, and an optical cut filter may be provided according to the purpose of the solid-state imaging apparatus.

In addition, the solid-state imaging apparatus of the first and second configurations can be in a mode where one on-chip micro lens is arranged on the upper side of one imaging element and the like of the present disclosure. Alternatively, two imaging elements and the like of the present disclosure can be included in the imaging element block, and one on-chip micro lens can be arranged on the upper side of the imaging element block.

For example, in a case of stacking the solid-state imaging apparatus and a readout integrated circuit (ROIC), a drive substrate, which is provided with the readout integrated circuit and a connection portion containing copper (Cu), and the imaging element, which is provided with a connection portion, can be placed on top of each other so that the connection portions are in contact with each other. In this way, the connection portions can be bonded to stack the solid-state imaging apparatus and the readout integrated circuit. Solder bumps or the like can also be used to bond the connection portions.

Furthermore, a driving method for driving the solid-state imaging apparatuses according to the first and second aspects of the present disclosure can be a driving method of the solid-state imaging apparatus repeating the steps of:

releasing the charge in the first electrodes all at once to the outside of the system while storing the charge in the inorganic oxide semiconductor material layers (or the inorganic oxide semiconductor material layers and the photoelectric conversion layers) in all of the imaging elements; and subsequently, transferring the charge stored in the inorganic oxide semiconductor material layers (or the inorganic oxide semiconductor material layers and the photoelectric conversion layers) all at once to the first electrodes in all of the imaging elements, and after the completion of the transfer, sequentially reading the charge transferred to the first electrodes in the imaging elements, In the driving method of the solid-state imaging apparatus, the light incident from the second electrode side is not incident on the first electrode in each imaging element. The charge in the first electrodes is released to the outside of the system ail at once while the charge is stored in the inorganic oxide semiconductor material layer and the like in all of the imaging elements. Therefore, the first electrodes can be certainly reset at the same time in all of the imaging elements. In addition, subsequently, the charge stored in the inorganic oxide semiconductor material layers and the like is transferred all at once to the first electrodes in all of the imaging elements. After the completion of the transfer, the imaging elements sequentially read the charge transferred to the first electrodes. Therefore, a so-called global shutter function can be easily realized.

Examples of the imaging element of the present disclosure include a CCD element, a CMOS image sensor, a CIS (Contact Image Sensor), and a CMD (Charge Modulation Device) signal-amplification image sensor. The solid-state imaging apparatuses according to the first and second aspects of the present disclosure and the solid-state imaging apparatuses of the first and second configurations can be included in, for example, a digital still camera, a video camera, a camcorder, a surveillance camera, an on-vehicle camera, a smartphone camera, a user interface camera for gaming, and a biometric authentication camera.

Embodiment 1

Figure 1:
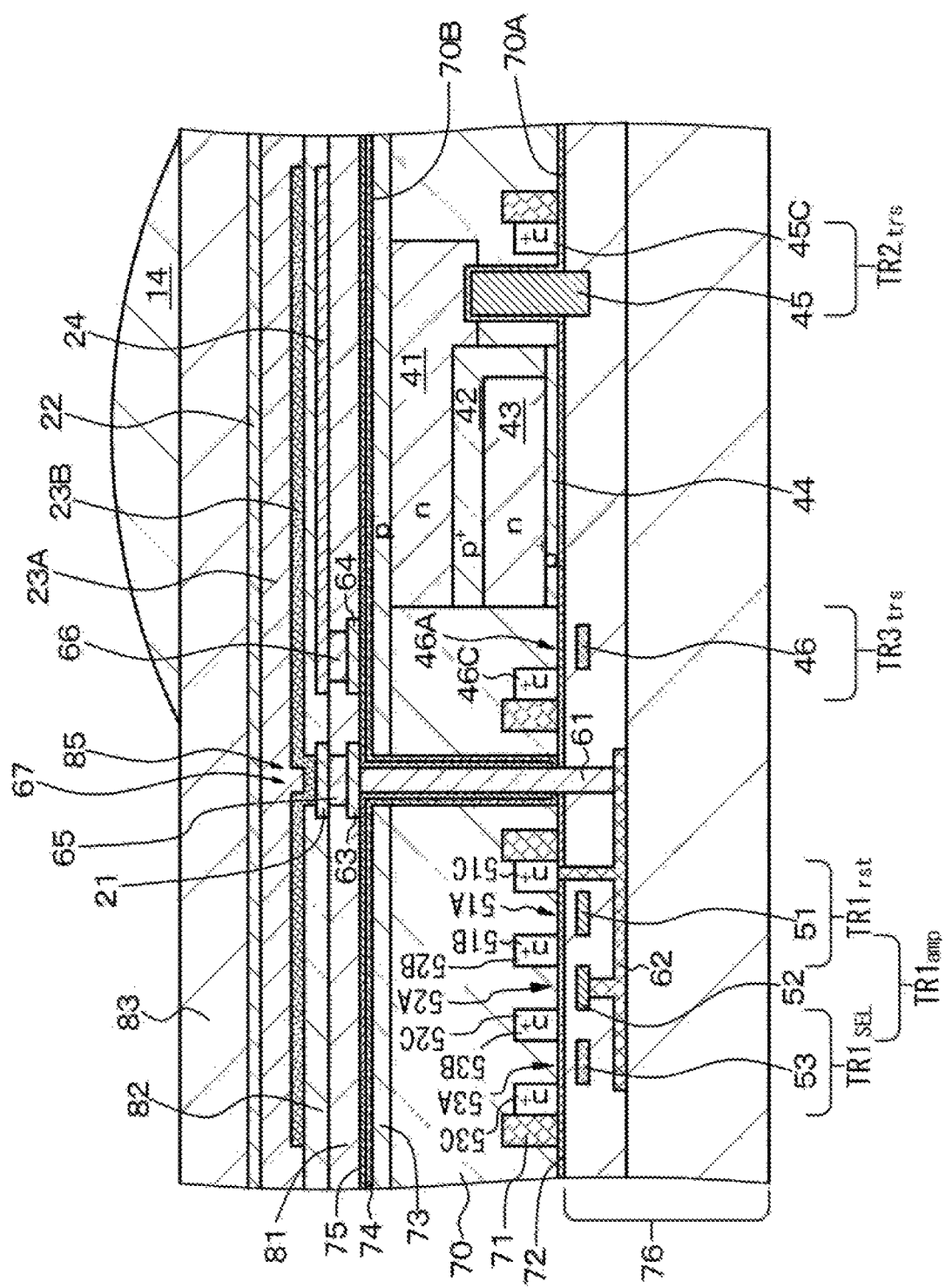
FIG. 1 is a schematic partial cross-sectional view of an imaging element of Embodiment 1.
Figure 2:
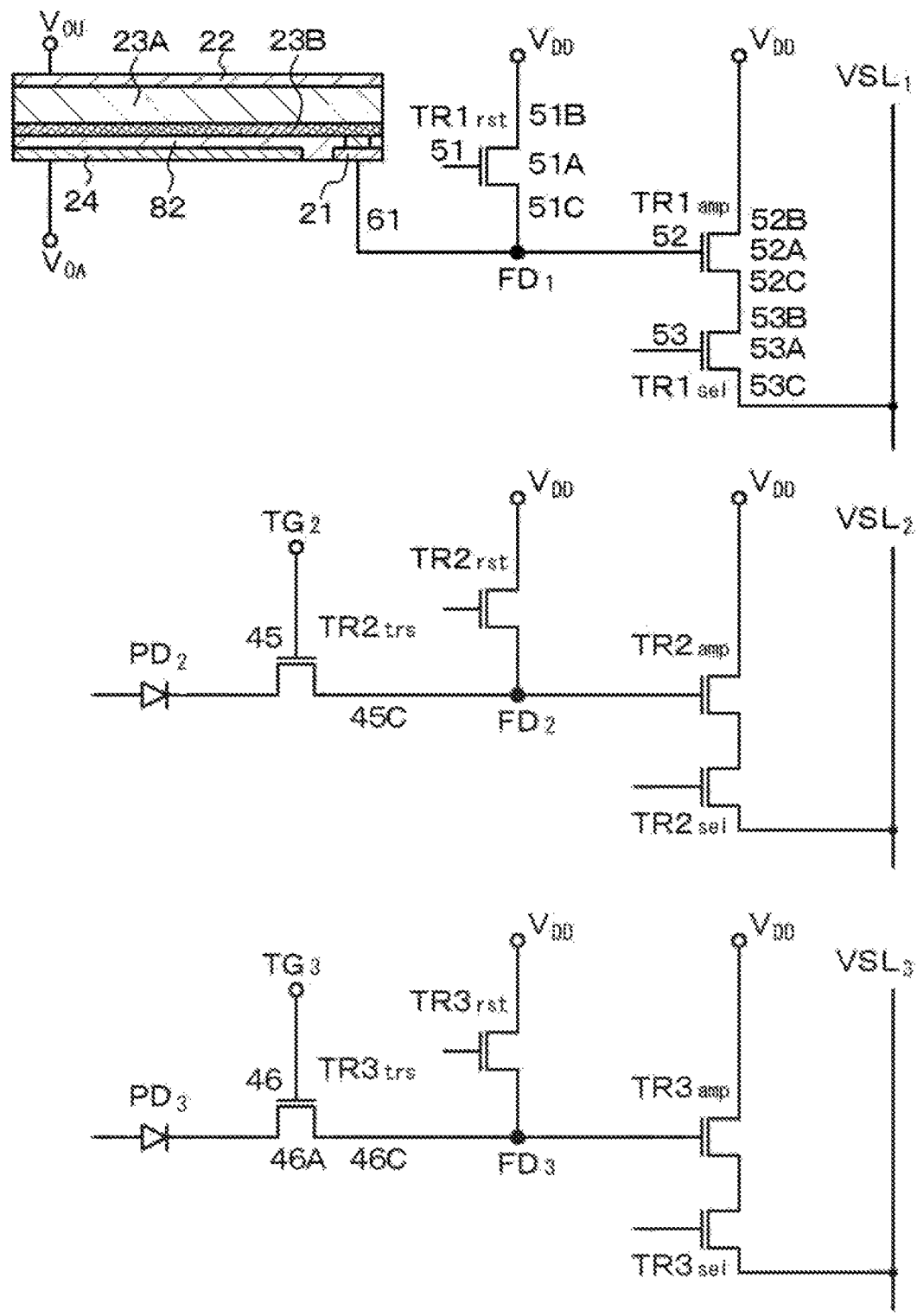
FIG. 2 is an equivalent circuit diagram of the imaging element of Embodiment 1.
Figure 3:
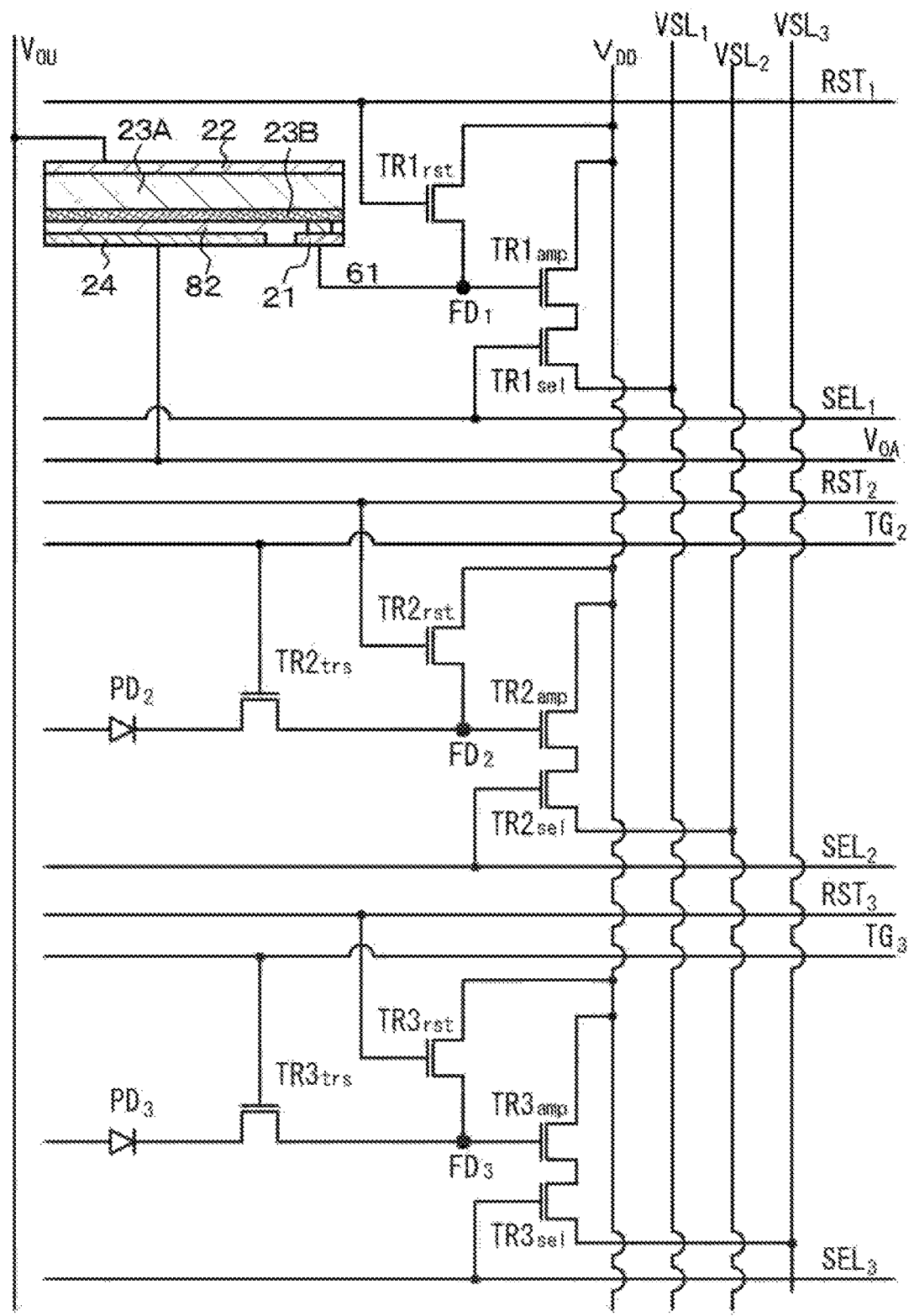
FIG. 3 is an equivalent circuit diagram of the imaging element of Embodiment 1.
Figure 4:
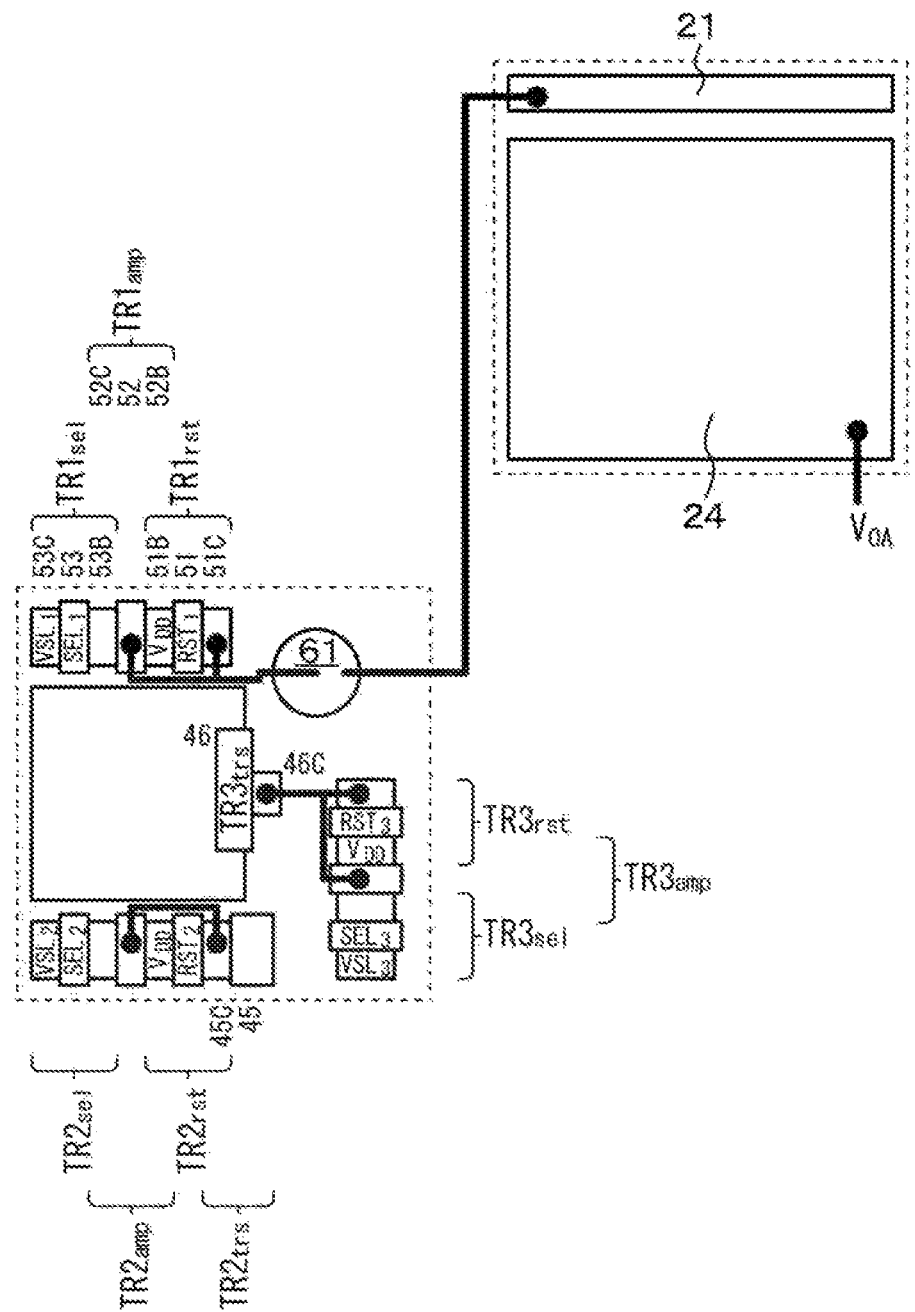
FIG. 4 is a schematic layout drawing of a first electrode, a charge storage electrode, and transistors of a control unit included in the imaging element of Embodiment 1.
Figure 6A:
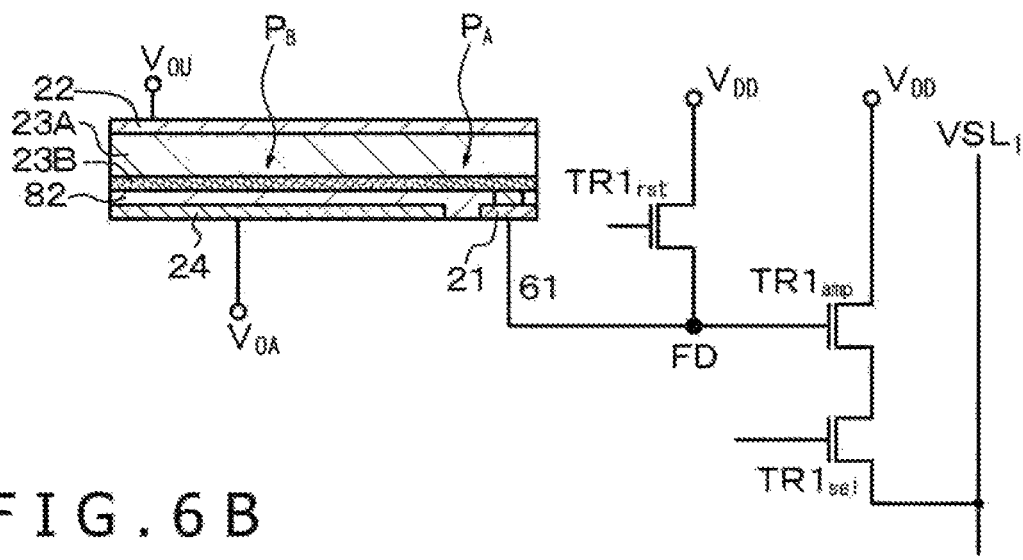
FIGS. 6A, 6B, and 6C are equivalent circuit diagrams of imaging elements of Embodiments 1, Embodiment 4, and Embodiment 6 for describing each section of FIG. 5 (Embodiment 1), FIGS. 20 and 21 (Embodiment 4), and FIGS. 32 and 33 (Embodiment 6).
Figure 7:
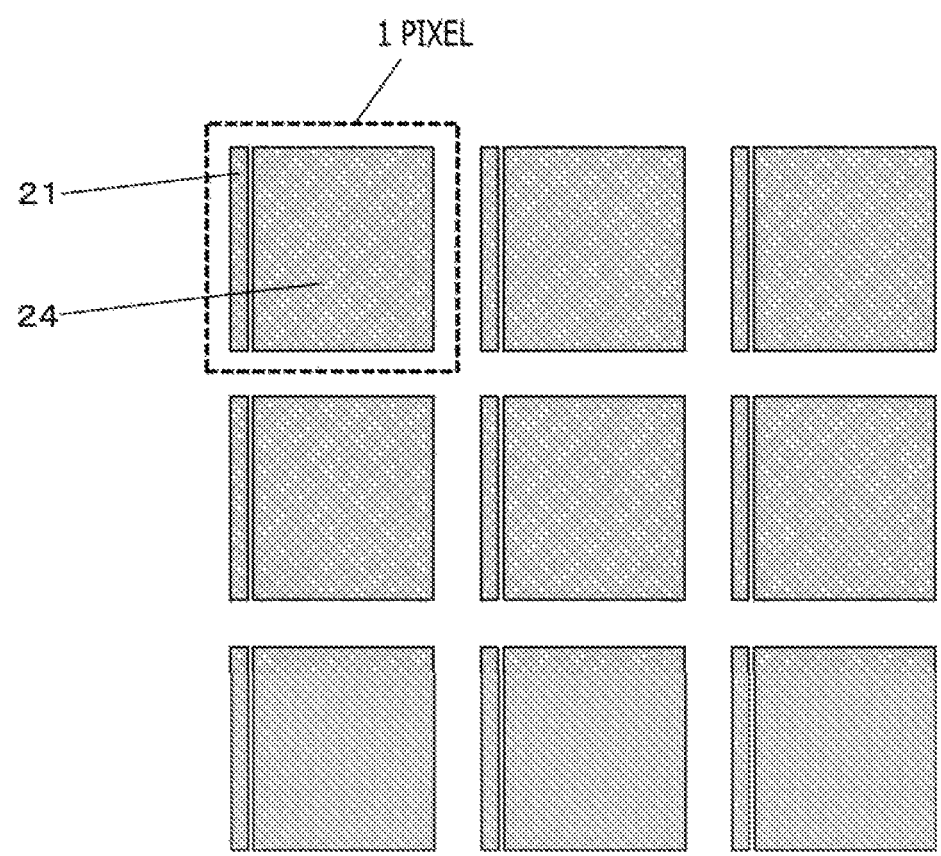
FIG. 7 is a schematic layout drawing of the first electrode and the charge storage electrode included in the imaging element of Embodiment 1.
Figure 8:
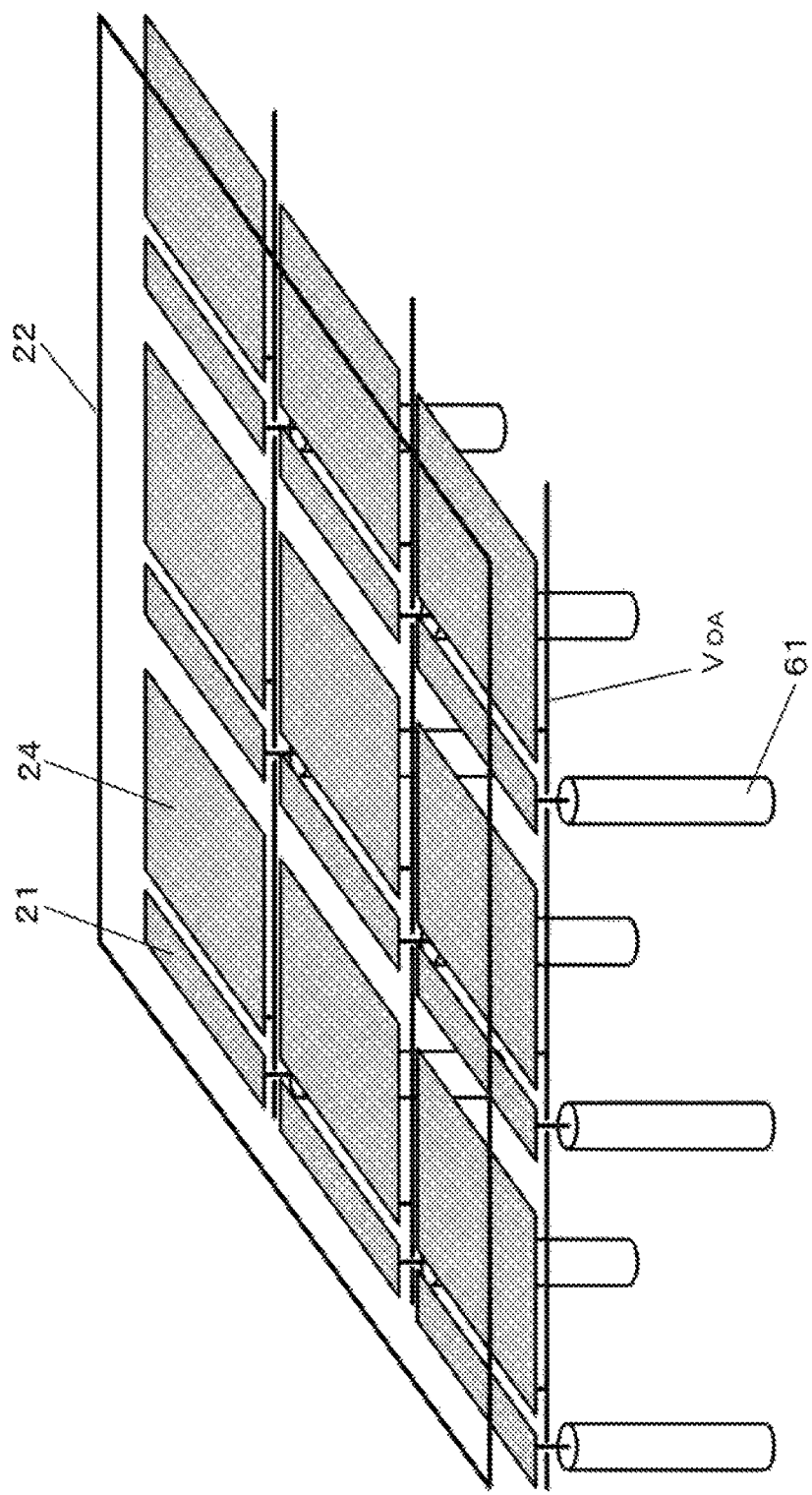
FIG. 8 is a schematic perspective view of the first electrode, the charge storage electrode, a second electrode, and a contact hole portion included in the imaging element of Embodiment 1.
Figure 79:
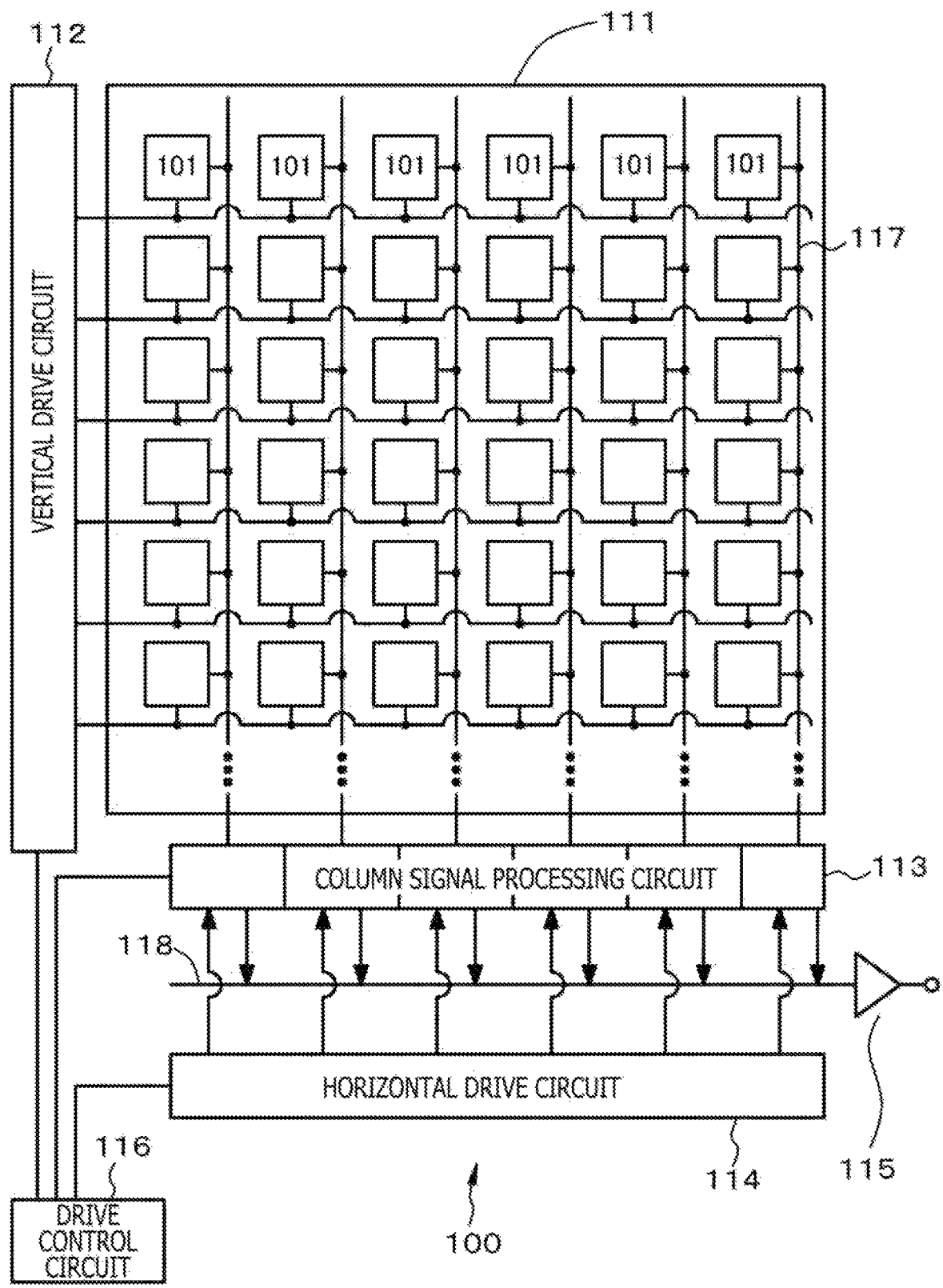
FIG. 79 is a conceptual diagram of a solid-state imaging apparatus of Embodiment 1.

Embodiment 1 relates to the imaging elements according to the first to third aspects of the present disclosure, the stacked imaging element of the present disclosure, and the solid-state imaging apparatus according to the second aspect of the present disclosure. FIG. 1 illustrates a schematic partial cross-sectional view of the imaging element and the stacked imaging element (hereinafter, simply referred to as "imaging element") of Embodiment 1. FIGS. 2 and 3 illustrate equivalent circuit diagrams of the imaging element of Embodiment 1. FIG. 4 illustrates a schematic layout drawing of a first electrode and a charge storage electrode included in a photoelectric conversion unit and transistors of a control unit included in the imaging element, of Embodiment 1. FIG. 5 schematically illustrates a state of potential in each section during operation of the imaging element of Embodiment 1. FIG. 6A illustrates an equivalent circuit diagram for describing each section of the imaging element of Embodiment 1. In addition, FIG. 7 illustrates a schematic layout drawing of the first electrode and the charge storage electrode included in the photoelectric conversion unit of the imaging element of Embodiment 1. FIG. 8 illustrates a schematic perspective view of the first electrode, the charge storage electrode, a second electrode, and a contact hole portion. Furthermore, FIG. 79 illustrates a conceptual diagram of the sold-state imaging apparatus of Embodiment 1.

The imaging element of Embodiment 1 includes a photoelectric conversion unit including a first electrode 21, a photoelectric conversion layer 23A, and a second electrode 22 that are stacked, and an inorganic oxide semiconductor material layer 23B is formed between the first electrode 21 and the photoelectric conversion layer 23A. In addition, the inorganic oxide semiconductor material layer 23B includes at least two types of elements selected from the group consisting of indium, tungsten, tin, and zinc. Alternatively, a LUMO value $E_1$ of the material included in the part of the photoelectric conversion layer 23A positioned near the inorganic oxide semiconductor material layer 23B and a LUMO value $E_2$ of the material included in the inorganic oxide semiconductor material layer 23B satisfy the following Expression (A), preferably, the following Expression (B).

$$E1-E2<0.2 \text{ eV} \quad (A)$$

$$E1-E2<0.1 \text{ eV} \quad (B)$$

Alternatively, the mobility of the material included in the inorganic oxide semiconductor material layer 23B is equal to or greater than 10 cm²/V·s.

The imaging element of Embodiment 1 corresponding to the imaging element according to the first aspect of the present disclosure also satisfies Expression (A), preferably, Expression (B). In addition, the mobility of the material included in the inorganic oxide semiconductor material layer 23B is also equal to or greater than 10 cm²/V·s in the imaging element of Embodiment 1 corresponding to the imaging elements according to the first and second aspects of the present disclosure.

In addition, the photoelectric conversion unit in the imaging element of Embodiment 1 further includes an insulating layer 82 and a charge storage electrode 24 arranged apart from the first electrode 21 and arranged to face the inorganic oxide semiconductor material layer 231B through the insulating layer 82. Note that the light is incident from the second electrode 22.

The stacked imaging element of Embodiment 1 includes at least one imaging element of Embodiment 1. In addition, the solid-state imaging apparatus of Embodiment 1 includes a plurality of stacked imaging elements of Embodiment 1. Furthermore, the solid-state imaging apparatus of Embodiment 1 is included in, for example, a digital still camera, a video camera, a camcorder, a surveillance camera, an on-vehicle (car-mounted camera), a smartphone camera, a user interface camera for gaming, a biometric authentication camera, and the like.

Hereinafter, various characteristics of the imaging element of Embodiment 1 will be described first, and then the imaging element and the solid-state imaging apparatus of Embodiment 1 will be described in detail.

An oxygen gas introduction amount (oxygen gas partial pressure) in forming the inorganic oxide semiconductor material layer 23B based on the sputtering method can be controlled to control the energy level of the inorganic oxide semiconductor material layer 23B. It is preferable to set the oxygen gas partial pressure to 0.005 (0.5%) to 0.02 (2%).

The film thickness of the inorganic oxide semiconductor material layer 23B is set to 50 nm, and IWO is used to form the inorganic oxide semiconductor material layer 23B. The following Table 1 indicates results of obtaining a relationship between the oxygen gas partial pressure and the energy level obtained by inverse photoelectron spectroscopy. In the imaging element of Embodiment 1, the oxygen gas introduction amount (oxygen gas partial pressure) in forming the inorganic oxide semiconductor material layer 23B based on the sputtering method can be controlled to control the energy level of the inorganic oxide semiconductor material layer 23B. Note that the content rate of oxygen is lower than the oxygen content rate of stoichiometric composition in the inorganic oxide semiconductor material layer 23B.

TABLE 1

| Oxygen gas partial pressure | Energy level |
|---|---|
| 0.5% | 4.3 eV |
| 2.0% | 4.5 eV |

Next, regarding the photoelectric conversion layer 23A and the inorganic oxide semiconductor material layer 23B, the energy level of the inorganic oxide semiconductor material layer 23B, the energy level difference ($E_1-E_2$) between the photoelectric conversion layer 23A and the inorganic oxide semiconductor material layer 23B, and the mobility of the material included in the inorganic oxide semiconductor material layer 23B are checked. The conditions are divided into three conditions as illustrated in Table 2. Here, the LUMO value $E_1$ of the material included in the part of the photoelectric conversion layer 23A positioned near the inorganic oxide semiconductor material layer 23B is set to 4.5 eV. In a first condition, there is an energy level difference ($E_1-E_2$) of 0.2 eV. In a second condition, the energy level difference ($E_1-E_2$) is improved compared to the first condition. In a third condition, the mobility is further improved compared to the second condition. The transfer characteristics under these three conditions are evaluated in a device simulation based on the imaging element with the structure illustrated in FIG. 1.

Note that in the first condition, IGZO is used as the material included in the inorganic oxide semiconductor material layer 23B. In the second condition, ZTO or ITZO is used as the material included in the inorganic oxide semiconductor material layer 23B. In the third condition, IWZO or IWO is used as the material included in the inorganic oxide semiconductor material layer 23B. In addition, the film thickness of the inorganic oxide semiconductor material layer 23B is 50 nm. Furthermore, the photoelectric conversion layer 23A includes quinacridone, and the thickness is 0.1 μm.

TABLE 2

|  | First condition | Second condition | Third condition |
|---|---|---|---|
| Inorganic oxide semiconductor material layer | 4.3 eV | 4.5 eV | 4.5 eV |
| Energy level difference ($E_1 - E_2$) | 0.2 eV | 0 eV | 0 V |
| Mobility (Unit: cm²/V · s) | 9 | 10 | 30 |

Figure 76:
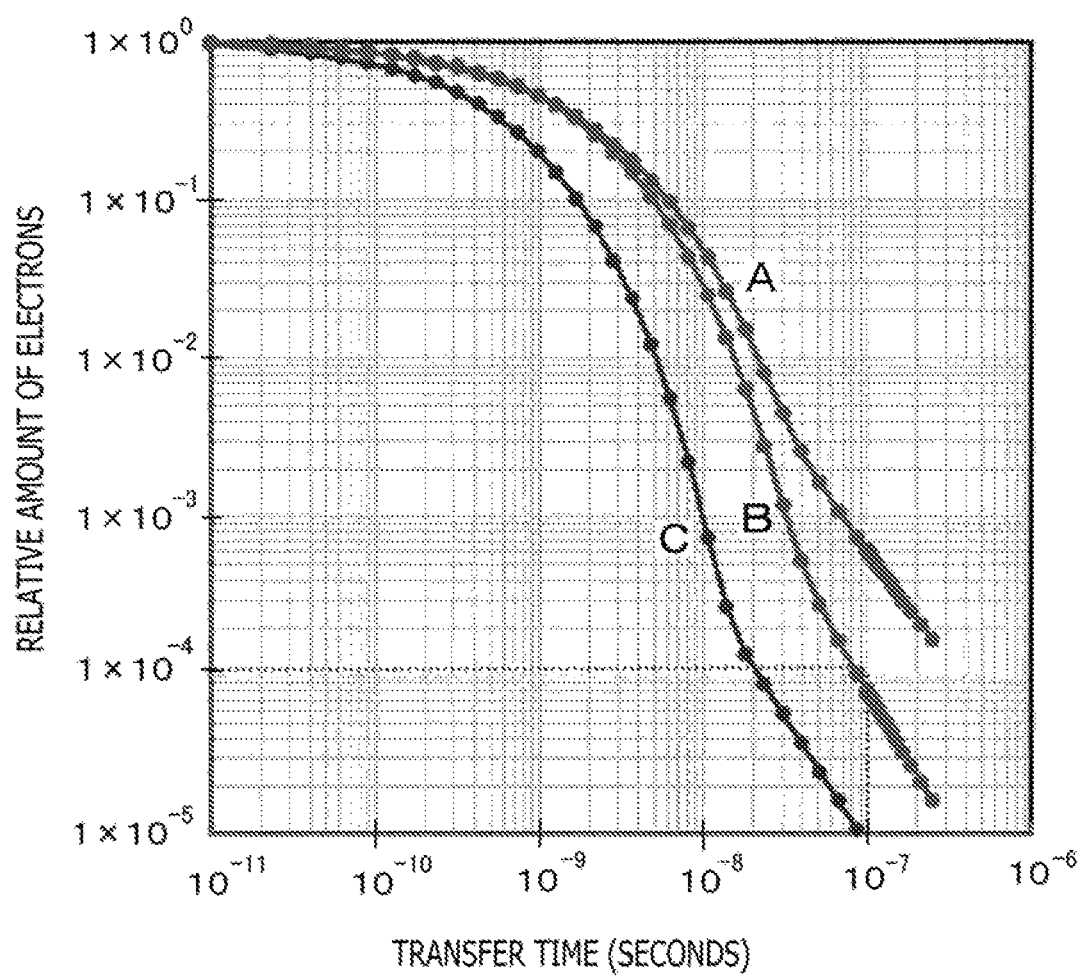
FIG. 76 is a graph illustrating evaluation results of transfer characteristics in the imaging element of Embodiment 1.

FIG. 76 illustrates evaluation results of the transfer characteristics. A relative amount of electrons in a state in which the electrons are attracted to an upper side of the charge storage electrode 24 is $1\times10^0$ in FIG. 76. In addition, a relative amount of electrons in a state in which all of the electrons attracted to the upper side of the charge storage electrode 24 are transferred to the first electrode 21 is $1\times10^{-4}$ in FIG. 76. The time of transfer (referred to as "transfer time") of all of the electrons attracted to the upper side of the charge storage electrode 24 to the first electrode 21 is indicated on the horizontal axis of FIG. 76. In FIG. 76, "A" indicates evaluation results of the transfer characteristics under the first condition, "B" indicates evaluation results of the transfer characteristics under the second condition, and "C" indicates evaluation results of the transfer characteristics under the third condition. The transfer time is shorter in the second condition than is the first condition and shorter in the third condition than in the second condition.

To satisfy characteristics without remaining transfer charge that are required for the imaging element, appropriate transfer time for the relative amount of electrons to reach $1\times10^{-4}$ is $1\times10^{-7}$ seconds. The second condition is excellent is satisfying the transfer time, and the third condition is more excellent. That is, the inorganic oxide semiconductor material layer 23B includes at least two types of elements selected from the group consisting of indium, tungsten, tin, and zinc. In addition, the LUMO value $E_1$ of the material included in the part of the photoelectric conversion layer 23A positioned near the inorganic oxide semiconductor material layer 23B and the LUMO value $E_2$ of the material included in the inorganic oxide semiconductor material layer 23B satisfy $E1 \times E2 < 0.2$ eV, preferably, $E1 - E2 < 0.1$ eV.

Furthermore, the mobility of the material included in the inorganic oxide semiconductor material layer 23B is equal to or greater than 10 cm²/V·s.

Figure 77:
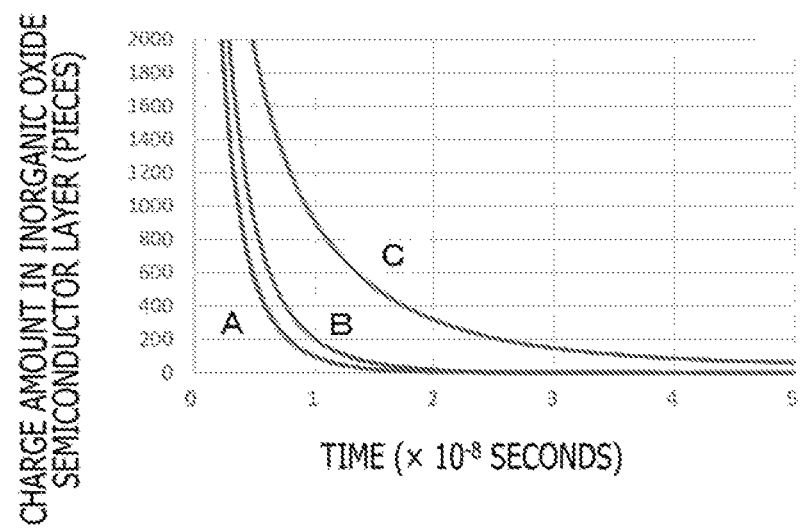
FIG. 77 is a graph illustrating results of evaluation of influence on transfer characteristics influenced by a LUMO value $E_1$ of the photoelectric conversion layer and a LUMO value $E_2$ of the material included in the inorganic oxide semiconductor material layer in the imaging element of Embodiment 1.

FIG. 77 illustrates results of evaluation of the transfer characteristics where the LUMO value $E_1$ of the photoelectric conversion layer 23A is 4.5 eV, and the LUMO value $E_2$ of the material included in the inorganic oxide semiconductor material layer 23B 4.4 eV (see "C" of FIG. 77), 4.5 eV (see "B" of FIG. 77), 4.6 eV (see "A" of FIG. 77), or 4.7 eV (see "A" of FIG. 77). Note that the data of 4.6 eV and the data of 4.7 eV overlap. The results indicate that the higher the LUMO value $E_2$, the more excellent the transfer characteristics. Therefore, the results indicate that forming the layers so that the LUMO value $E_2$ of the inorganic oxide semiconductor material layer 23B is greater than the LUMO value $E_1$ of the photoelectric conversion layer 23A is a more preferable factor for further improving the transfer characteristics.

Figure 78A:
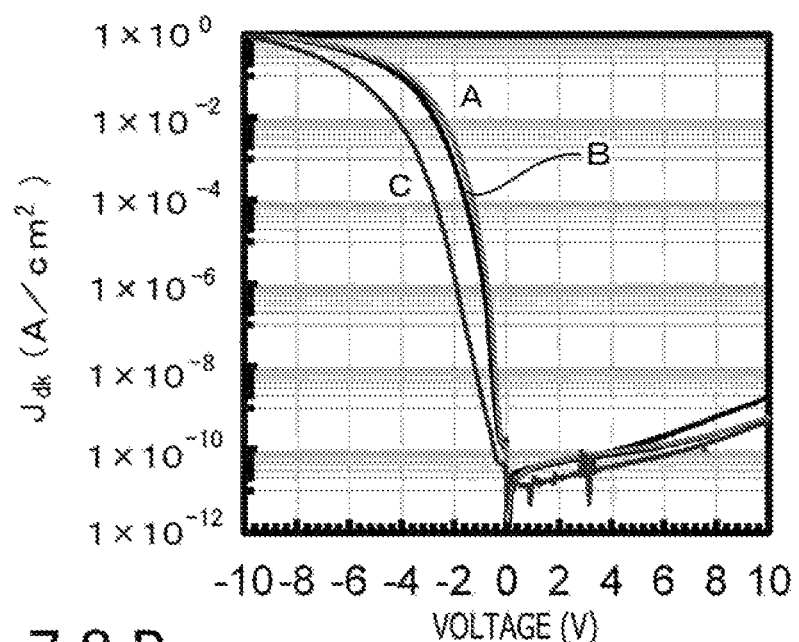
FIGS. 78A and 78B are graphs indicating evaluation results of dark current characteristics and external quantum efficiency, respectively, evaluated by using evaluation samples and a comparison sample in Embodiment 1.
Figure 78B:
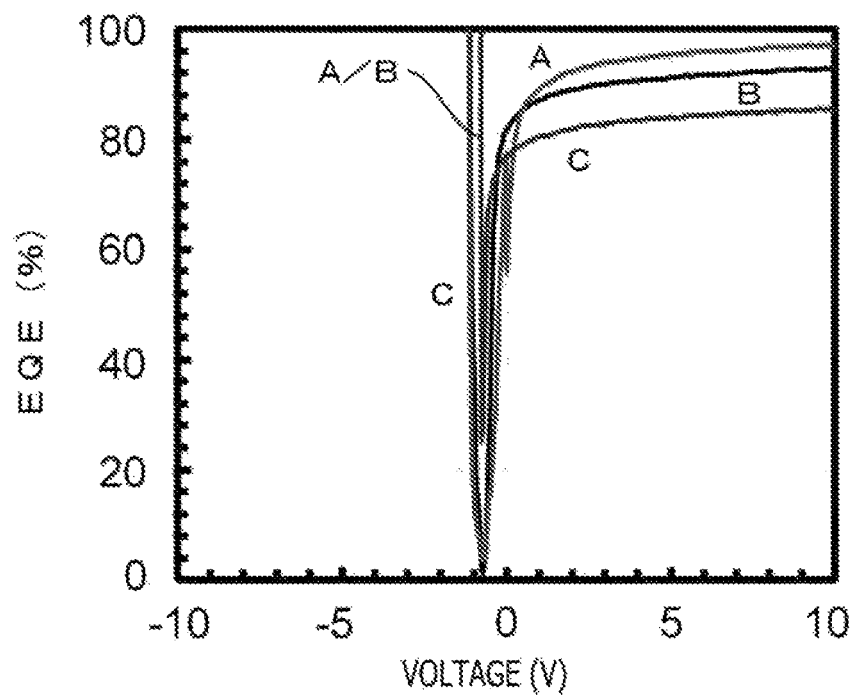

In addition, FIGS. 78A and 78B illustrate evaluation results of dark current characteristics ($J_{dk}$) at 60° C. at the time of photoelectric conversion in the photoelectric conversion layer 23A and external quantum efficiency characteristics (EQE) at room temperature (25° C.), where ZTO is included in the inorganic oxide semiconductor material layer 23B.

The evaluation sample has a structure in which a first electrode including ITO is formed on a substrate, and an inorganic oxide semiconductor material layer, a photoelectric conversion layer, a buffer layer including $MoO_x$, and a second electrode are sequentially stacked on the first electrode. Here, the thickness of the inorganic oxide semiconductor material layer is 20 nm or 100 nm. In addition, a comparison sample has a structure in which a first electrode including ITO is formed on a substrate, and a photoelectric conversion layer, a buffer layer including $MoO_x$, and a second electrode are sequentially stacked on the first electrode. That is, the inorganic oxide semiconductor material layer is not formed in the comparison sample. Regarding the dark current characteristics ($J_{dk}$), it is understood that the evaluation sample has a performance correspond to the comparison sample (see "C" of FIG. 78A). Note that see "A" of FIGS. 78A and 78B for the data where the thickness of the inorganic oxide semiconductor material layer is 100 nm. In addition, see "B" of FIGS. 78A and 78B for the data where the thickness of the inorganic oxide semiconductor material layer is 20 nm. In FIG. 78A, graphs (data of "A" and "B") of the dark current characteristics of two types of evaluation samples mostly overlap. In addition, when a positive bias of 1 volt is applied, the external quantum efficiency characteristics (EQE) of the comparison sample (see "C" of FIG. 78B) are 80%, while the evaluation sample indicates a higher value. In this way, it is confirmed that in a case where the inorganic oxide semiconductor material is formed, the characteristics are correspond to or more excellent than the characteristics of a case where the inorganic oxide semiconductor material layer is not formed.

In addition, more specifically, the inorganic oxide semiconductor material layer 23B does not contain gallium atoms, and the inorganic oxide semiconductor material layer 23B includes IWO, IWZG, ITZO, or ZTO. Here, it is understood from X-ray diffraction results that the inorganic oxide semiconductor material layer 23B is amorphous (for example, amorphous material not locally including crystal structure). Furthermore, surface roughness Ra of the inorganic oxide semiconductor material layer 23B at the interface between the photoelectric conversion layer 23A and the inorganic oxide semiconductor material layer 23B is equal to or smaller than 1.5 nm, and a value of root means square roughness Rq of the inorganic oxide semiconductor material layer is equal to or smaller than 2.5 nm. Specifically, the values are as follows.
Ra=0.8 nm
Rq=2.1 nm In addition, the surface roughness Ra of the charge storage electrode 24 is equal to or smaller than 1.5 nm, and a value of the root means square roughness Rq of the charge storage electrode 24 is equal to or smaller than 2.5 nm. Specifically, the values are as follows.
Ra=0.7 nm
Rq=2.3 nm Furthermore, the light transmittance of the inorganic oxide semiconductor material layer 23B with respect to the light at wavelengths of 400 to 660 nm is equal to or greater than 65% (specifically, 80%), and the light transmittance of the charge storage electrode 24 with respect to the light at wavelengths of 400 to 660 nm is also equal to or greater than 65% (specifically, 75%). A sheet resistance value of the charge storage electrode 24 is $3\times10\ \Omega/\square$ to $1\times10^3\ \Omega/\square$ (specifically, $84\ \Omega/\square$).

Hereinafter, the imaging element and the solid-state imaging apparatus of Embodiment 1 will be described in detail.

The imaging element of Embodiment 1 further includes a semiconductor substrate (more specifically, silicon semiconductor layer) 70, and the photoelectric conversion unit is arranged on the upper side of the semiconductor substrate 70. In addition, the imaging element further includes a control unit provided on the semiconductor substrate 70 and including a drive circuit connected to the first electrode 21 and the second electrode 22. Here, the light incident surface in the semiconductor substrate 70 is the upper side, and the opposite side of the semiconductor substrate 70 is the lower side 2 wiring layer 62 including a plurality of wires is provided on the lower side of the semiconductor substrate 70.

At least a floating diffusion layer $FD_1$ and an amplification transistor $TR1_{amp}$ included in the control unit are provided on the semiconductor substrate 70, and the first electrode 21 is connected to the floating diffusion layer $FD_1$ and a gate portion of the amplification transistor $TR1_{amp}$. A reset transistor $TR1_{rst}$ and a selection transistor $TR1_{sel}$ included in the control unit are further provided on the semiconductor substrate 70. The floating diffusion layer $FD_1$ is connected to one source/drain region of the reset transistor $TR1_{rst}$. One source/drain region of the amplification transistor $TR1_{amp}$ is connected to one source/drain region of the selection transistor $TR1_{sel}$. The other source/drain region of the selection transistor $TR1_{sel}$ is connected to a signal line $VSL_1$. The amplification transistor $TR1_{amp}$, the reset transistor $TR1_{rst}$, and the selection transistor $TR1_{sel}$ are included in the drive circuit.

Specifically, the imaging element of Embodiment 1 is a back illuminated type imaging element. The imaging element has a stacked structure of three imaging elements including: a green light imaging element of first type in Embodiment 1 (hereinafter, referred to as "first imaging element") sensitive to green light, the green light imaging element including a green light photoelectric conversion layer of first type for absorbing green light; a blue light imaging element in the past of second type (hereinafter, referred to as "second imaging element") sensitive to blue light, the blue light imaging element including a blue light photoelectric conversion layer of second type for absorbing blue light; and a red light imaging element in the past of second type (hereinafter, referred to as "third imaging element") sensitive to red light, the red light imaging element including a red light photoelectric conversion layer of second type for absorbing red light. Here, the red light imaging element (third imaging element) and the blue light imaging element (second imaging element) are provided in the semiconductor substrate 70, and the second imaging element is positioned on the light incident side with respect to the third imaging element. In addition, the green light imaging element (first imaging element) is provided on the upper side of the blue light imaging element (second imaging element). The stacked structure of the first imaging element, the second imaging element, and the third imaging element is included in one pixel. Color filter layers are not provided.

In the first imaging element, the first electrode 21 and the charge storage electrode 24 are formed apart from each other on an interlayer insulating layer 81. The interlayer insulating layer 81 and the charge storage electrode 24 are covered by the insulating layer 82. The inorganic oxide semiconductor material layer 23B and the photoelectric conversion layer 23A are formed on the insulating layer 82, and the second electrode 22 is formed on the photoelectric conversion layer 23A. An insulating layer 83 is formed over the entire surface including the second electrode 22, and an on-chip micro lens 14 is provided on the insulating layer 83. Color filter layers are not provided. The first electrode 21, the charge storage electrode 24, and the second electrode 22 include, for example, transparent electrodes containing ITO (work function: approximately 4.4 eV). The inorganic oxide semiconductor material layer 23B contains, for example, IWZO, IWO, ZTO, or ITZO. The photoelectric conversion layer 23A includes a layer containing a well-known organic photoelectric conversion material sensitive to at least green light (for example, organic material such as rhodamine dye, merocyanine dye, and quinacridone). The interlayer insulating layer 81 and the insulating layers 82 and 83 include a well-known insulating material (for example, $SiO_2$ or SiN). The inorganic oxide semiconductor material layer 23B and the first electrode 21 are connected through a connection portion 67 provided on the insulating layer 82. The inorganic oxide semiconductor material layer 23B extends in the connection portion 67. That is, the inorganic oxide semiconductor material layer 23B extends in an opening portion 85 provided on the insulating layer 82 and is connected to the first electrode 21.

The charge storage electrode 24 is connected to the drive circuit. Specifically, the charge storage electrode 24 is connected to a vertical drive circuit 112 included in the drive circuit through a connection hole 66, a pad portion 64, and a wire $V_{OA}$ provided in the interlayer insulating layer 81.

The size of the charge storage electrode 24 is larger than the first electrode 21. Although not limited, it is preferable to satisfy $$4 \leq S_1'/S_1,$$

where $S_1'$ is the area of the charge storage electrode 24, and $S_1$ is the area of the first electrode 21. Although not limited, $$S_1'/S_1=8$$

is set in Embodiment 1, for example. Note that in Embodiments 7 to 10 described later, the sizes of three photoelectric conversion unit segments $10'_1$, $10'_2$, and $10'_3$ are the same size, and the plane shapes are also the same.

An element separation region 71 is formed on the side of a first surface (front surface) 70A of the semiconductor substrate 70, and an oxide film 72 is formed on the first surface 70A of the semiconductor substrate 70. Furthermore, the reset transistor $TR1_{rst}$, the amplification transistor $TR1_{amp}$, and the selection transistor $TR1_{sel}$ included in the control unit of the first imaging element are provided on the first surface side of the semiconductor substrate 70, and the first floating diffusion layer $FD_1$ is further provided.

The reset transistor $TR1_{rst}$ includes a gate portion 51, a channel formation region 51A, and source/drain regions 51B and 51C. The gate portion 51 of the reset transistor $TR1_{rst}$ is connected to a reset line $RST_1$. One source/drain region 51C of the reset transistor $TR1_{rst}$ also serves as the first floating diffusion layer $FD_1$, and the other source/drain region 51B is connected to a power source $V_{DD}$.

The first electrode 21 is connected to one source/drain region 51C (first floating diffusion layer $FD_1$) of the reset transistor $TR1_{rst}$ through a connection hole 65 and a pad portion 63 provided in the interlayer insulating layer 81, through a contact hole portion 61 formed on the semiconductor substrate 70 and an interlayer insulating layer 76, and through the wiring layer 62 formed on the interlayer insulating layer 76.

The amplification transistor $TR1_{amp}$ includes a gate portion 52, a channel formation region 52A, and source/drain regions 52B and 52C. The gate portion 52 is connected to the first electrode 21 and one source/drain region 51C (first floating diffusion layer $FD_1$) of the reset transistor $TR1_{rst}$ through the wiring layer 62. In addition, one source/drain region 52B is connected to the power source $V_{DD}$.

The selection transistor $TR1_{sel}$ includes a gate portion 53, a channel formation region 53A, and source/drain regions 53B and 53C. The gate portion 53 is connected to a selection line $SEL_1$. In addition, one source/drain region 53B shares the region with the other source/drain region 52C included in the amplification transistor $TR1_{amp}$, and the other source/drain region 53C is connected to the signal line (data output line) $VSL_1$ (117).

The second imaging element includes an n-type semiconductor region 41 as a photoelectric conversion layer provided on the semiconductor substrate 70. A gate portion 45 of a transfer transistor $TR2_{trs}$ including a vertical transistor extends to the n-type semiconductor region 41 and is connected to a transfer gate line $TG_2$. In addition, a second floating diffusion layer $FD_2$ is provided in a region 45C of the semiconductor substrate 70 near the gate portion 45 of the transfer transistor $TR2_{trs}$. The charge stored in the n-type semiconductor region 41 is read out to the second floating diffusion layer $FD_2$ through a transfer channel formed along the gate portion 45.

The second imaging element is further provided with a reset transistor $TR2_{rst}$, an amplification transistor $TR2_{amp}$, and a selection transistor $TR2_{sel}$ included in the control unit of the second imaging element on the first surface side of the semiconductor substrate 70.

The reset transistor $TR2_{rst}$ includes a gate portion, a channel formation region, and source/drain regions. The gate portion of the reset transistor $TR2_{rst}$ is connected to a reset line $RST_2$. One source/drain region of the reset transistor $TR2_{rst}$ is connected to the power source $V_{DD}$. The other source/drain region also serves as the second floating diffusion layer $FD_2$.

The amplification transistor $TR2_{amp}$ includes a gate portion, a channel formation region, and source/drain regions. The gate portion is connected to the other source/drain region (second floating diffusion layer $FD_2$) of the reset transistor $TR2_{rst}$. In addition, one source/drain region is connected to the power source $V_{DD}$.

The selection transistor $TR2_{sel}$ includes a gate portion, a channel formation region, and source/drain regions. The gate portion is connected to a selection line $SEL_2$. In addition, one source/rain region shares the region with the other source/drain region included in the amplification transistor $TR2_{amp}$, and the other source/drain region is connected to a signal line (data output line) $VSL_2$.

The third imaging element includes an n-type semiconductor region 43 as a photoelectric conversion layer provided on the semiconductor substrate 70. A gate portion 46 of a transfer transistor $TR3_{trs}$ is connected to a transfer gate line $TG_3$. In addition, a third floating diffusion layer $FD_3$ is provided in a region 46C of the semiconductor substrate 70 near the gate portion 46 of the transfer transistor $TR3_{trs}$. The charge stored in the n-type semiconductor region 43 is read out to the third floating diffusion layer $FD_3$ through a transfer channel 46A formed along the gate portion 46.

In the third imaging element, a reset transistor $TR3_{rst}$, an amplification transistor $TR3_{amp}$, and a selection transistor $TR3_{sel}$ included in the control unit of the third imaging element are further provided on the first surface side of the semiconductor substrate 70.

The reset transistor $TR3_{rst}$ includes a gate portion, a channel formation region, and source/drain regions. The gate portion of the reset transistor $TR3_{rst}$ is connected to a reset line $RST_3$. One source/drain region of the reset transistor $TR3_{rst}$ is connected to the power source $V_{DD}$. The other source/drain region also serves as the third floating diffusion layer $FD_3$.

The amplification transistor $TR3_{amp}$ includes a gate portion, a channel formation region, and source/drain regions. The gate portion is connected to the other source/drain region (third floating diffusion layer $FD_3$) of the reset transistor $TR3_{rst}$. In addition, one source/drain region is connected to the power source $V_{DD}$.

The selection transistor $TR3_{sel}$ includes a gate portion, a channel formation region, and source/drain regions. The gate portion is connected to a selection line $SEL_3$. In addition, one source/drain region shares the region with the other source/drain region included in the amplification transistor $TR3_{amp}$, and the other source/drain region is connected to a signal line (data output line) $VSL_3$.

The reset lines $RST_1$, $RST_2$, and $RST_3$ the selection lines $SEL_1$, $SEL_2$, and $SEL_3$, and the transfer gate lines $TG_2$ and $TG_3$ are connected to the vertical drive circuit 112 included in the drive circuit. The signal lines (data output lines) $VSL_1$, $VSL_2$, and $VSL_3$ are connected to a column signal processing circuit 113 included in the drive circuit.

A $p^+$ layer 44 is provided between the n-type semiconductor region 43 and the front surface 70A of the semiconductor substrate 70 to suppress generation of dark current. A $p^+$ layer 42 is formed between the n-type semiconductor region 41 and the n-type semiconductor region 43, and furthermore, part of the side surface of the n-type semiconductor region 43 is surrounded by the $p^+$ layer 42. A $p^+$ layer 73 is formed on the side of a back surface 70B of the semiconductor substrate 70, and a $HfO_2$ film 74 and an insulating material film 75 include the $p^+$ layer 73 to a part where the contact hole portion 61 inside of the semiconductor substrate 70 is to be formed. In the interlayer insulating layer 76, wires are formed across a plurality of layers that are not illustrated.

The $HfO_2$ film 74 is a film with negative fixed charge, and the film can be provided to suppress the generation of dark current. In place of the $HfO_2$ film, an aluminum oxide ($Al_2O_3$) film, a zirconium oxide ($ZrO_2$) film, a tantalum oxide ($Ta_2O_3$) film, a titanium oxide ($TiO_2$) film, a lanthanum oxide ($La_2O_3$) film, a praseodymium oxide ($Pr_2O_3$) film, a cerium oxide ($CeO_2$) film, a neodymium oxide ($Nd_2O_3$) film, a promethium oxide ($Pm_2O_3$) film, a samarium oxide ($Sm_2O_3$) film, an europium oxide ($Eu_2O_3$) film, a gadolinium oxide (($Gd_2O_3$) film, a terbium oxide ($Tb_2O_3$) film, a dysprosium oxide ($Dy_2O_3$) film, a holmium oxide ($Ho_2O_3$) film, a thulium oxide ($Tm_2O_3$) film, an ytterbium oxide ($Yb_2O_3$) film, a lutetium oxide ($Lu_2O_3$) film, an yttrium oxide ($Y_2O_3$) film, a hafnium nitride film, an aluminum nitride film, a hafnium oxynitride film, or an aluminum oxynitride film can also be used. Examples of a deposition method of these films include a CVD method, a PVD method, and an ALD method.

Hereinafter, an operation of the stacked imaging element (first imaging element) including the charge storage electrode of Embodiment 1 will be described with reference to FIGS. 5 and 6A. Here, the potential of the first electrode 21 is higher than the potential of the second electrode 22. That is, for example, the first electrode 21 is set to a positive potential, and the second electrode 22 is set to a negative potential Electrons generated by the photoelectric conversion in the photoelectric conversion layer 23A are read out to the floating diffusion layer. This similarly applies to other Embodiments.

Figure 20:
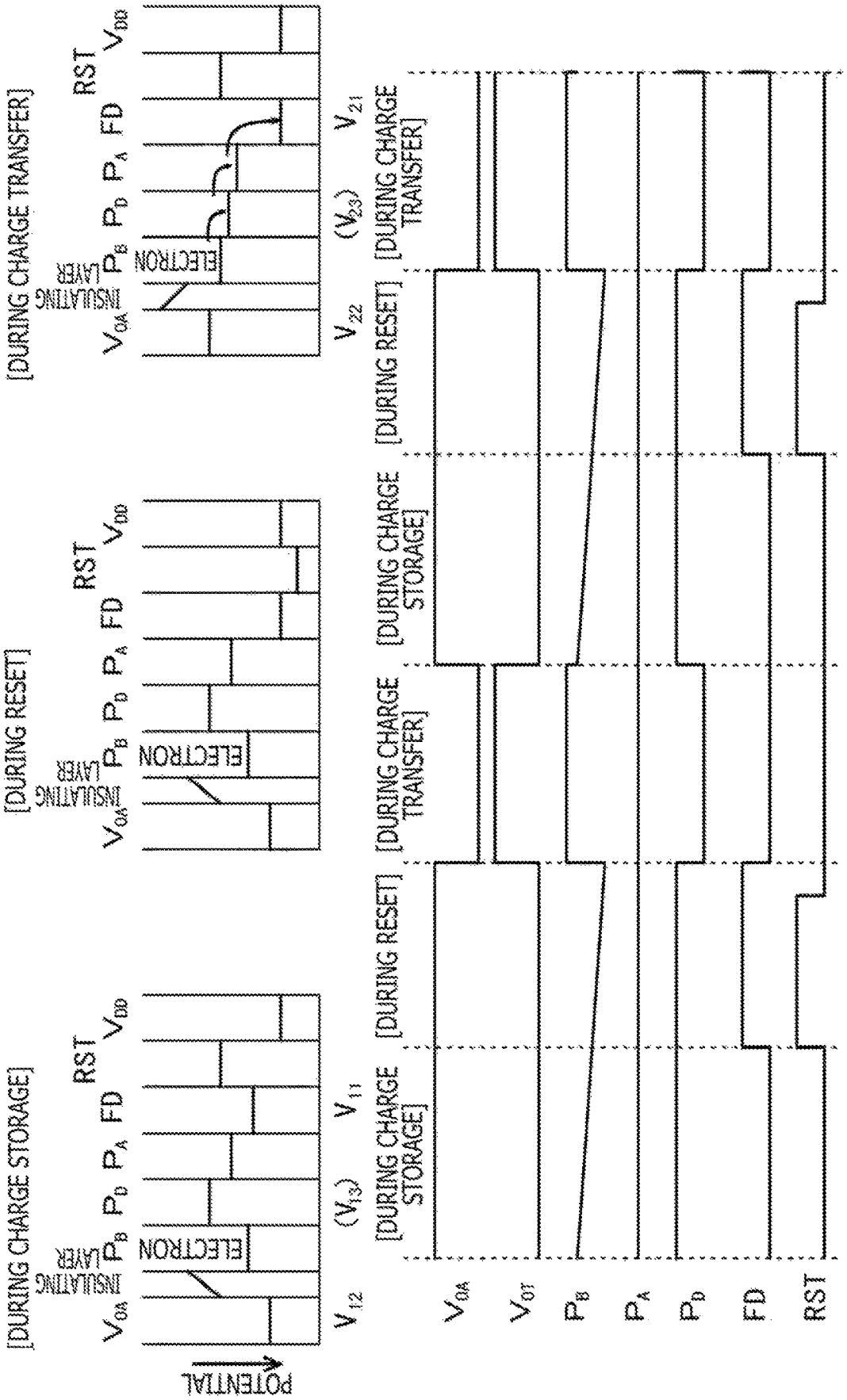
FIG. 20 is a diagram schematically illustrating a state of potential is each section during operation of the imaging element of Embodiment 4.
Figure 21:
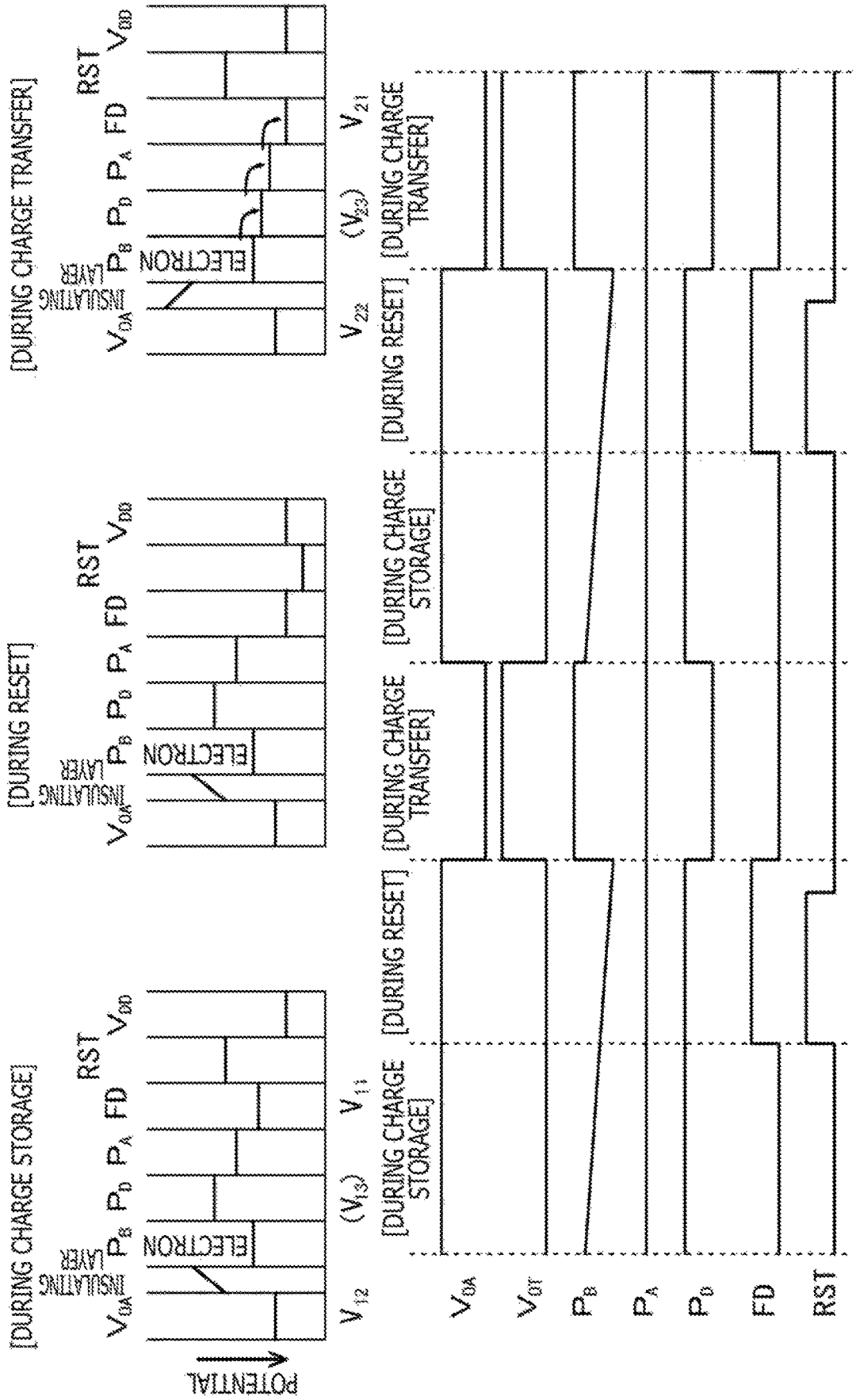
FIG. 21 is a diagram schematically illustrating a state of potential in each section during another operation of the imaging element of Embodiment 4.

The signs used in FIG. 5, FIGS. 20 and 21 in Embodiment 4 described later, and FIGS. 32 and 33 in Embodiment 6 are as follows.

| | |
|---|---|
| $P_A$ | ... Potential at a point $P_A$ of the inorganic oxide semiconductor material layer 23B facing a region positioned in the middle of the charge storage electrode 24 and the first electrode 21 or in the middle of a transfer control electrode (charge transfer electrode) 25 and the first electrode 21 |
| $P_B$ | ... Potential at a point $P_B$ of the region of the inorganic oxide semiconductor material layer 23B facing the charge storage electrode 24 |
| $P_{C1}$ | ... Potential at a point $P_{C1}$ of the region of the inorganic oxide semiconductor material layer 23B facing a charge storage electrode segment 24A |
| $P_{C3}$ | ... Potential at a point $P_{C3}$ of the region of the inorganic oxide semiconductor material layer 23B facing a charge storage electrode segment 24C |
| $P_D$ | ... Potential at a point $P_D$ of the region of the inorganic oxide semiconductor material layer 23B facing a transfer control electrode (charge transfer electrode) 25 |
| FD | ... Potential of the first floating diffusion layer $FD_1$ |
| $V_{OA}$ | ... Potential of the charge storage electrode 24 |
| $V_{OA-A}$ | ... Potential of the charge storage electrode segment 24A |
| $V_{OA-B}$ | ... Potential of the charge storage electrode segment 24B |
| $V_{OA-C}$ | ... Potential of the charge storage electrode segment 24C |
| $V_{OT}$ | ... Potential of the transfer control electrode (charge transfer electrode) 25 |
| RST | ... Potential of the gate portion 51 of the reset transistor $TR1_{rst}$ |
| $V_{DD}$ | ... Potential of the power source |
| $VSL_1$ | ... Signal line (data output line) $VSL_1$ |
| $TR1_{rst}$ | ... Reset transistor $TR1_{rst}$ |
| $TR1_{amp}$ | ... Amplification transistor $TR1_{amp}$ |
| $TR1_{sel}$ | ... Selection transistor $TR1_{sel}$ |

In a charge storage period, the drive circuit applies a potential $V_{11}$ to the first electrode 21 and applies a potential $V_{12}$ to the charge storage electrode 24. The light incident on the photoelectric conversion layer 23A causes photoelectric conversion in the photoelectric conversion layer 23A. Electron holes generated by the photoelectric conversion are sent from the second electrode 22 to the drive circuit through a wire you. On the other hand, the potential of the first electrode 21 is higher than the potential of the second electrode 22. That is, for example, a positive potential is applied to the first electrode 21, and a negative potential is applied to the second electrode 22. Therefore, the potentials are set so that $V_{12} \geq V_{11}$, preferably, $V_{12} > V_{11}$, holds. As a result, the electrons generated by the photoelectric conversion are attracted to the charge storage electrode 24, and the electrons stop at the inorganic oxide semiconductor material layer 23B facing the charge storage electrode 24 or in a region of the inorganic oxide semiconductor material layer 23B and the photoelectric conversion layer 23A (hereinafter, they will be collectively referred to as "inorganic oxide semiconductor material layer 23B and the like"). That is, the charge is stored in the inorganic oxide semiconductor material layer 23B and the like $V_{11}$ is greater than $V_{11}$, and therefore, the electrons generated inside of the photoelectric conversion layer 23A do not move toward the first electrode 21. In the time course of the photoelectric conversion, the potential in the region of the inorganic oxide semiconductor material layer 23B and the like facing the charge storage electrode 24 becomes a more negative value.

A reset operation is performed later in the charge storage period. This resets the potential of the first floating diffusion layer $FD_1$, and the potential of the first floating diffusion layer $FD_1$ shifts to the potential $V_{DD}$ of the power source.

After the completion of the reset operation, the charge is read out. That is, in a charge transfer period, the drive circuit applies a potential $V_{21}$ to the first electrode 21 and applies a potential 2 to the charge storage electrode 24. Here, the potentials are set so that $V_{22} < V_{21}$ holds. As a result, the electrons stopped in the region of the inorganic oxide semiconductor material layer 23B and the like facing the charge storage electrode 24 are read out to the first electrode 21 and further to the first floating diffusion layer $FD_1$. That is, the charge stored in the inorganic oxide semiconductor material layer 23B and the like is read out to the control unit.

This completes the series of operations including the charge storage, the reset operation, and the charge transfer.

The operations of the amplification transistor $TR1_{amp}$ and the selection transistor $TR1_{sel}$ after the electrons are read out to the first floating diffusion layer $FD_1$ are the same as the operations of transistors in the past. In addition, the series of operations including the charge storage, the reset operation, and the charge transfer of the second imaging element and the third imaging element are similar to the series of operations including the charge storage, the reset operation, and the charge transfer in the past. In addition, the reset noise of the first floating diffusion layer $FD_1$ can be removed in a correlated double sampling (GDS) process as in a technique in the past.

As described, the charge storage electrode arranged apart from the first electrode and arranged to face the photoelectric conversion layer through the insulating layer is provided in Embodiment 1. Therefore, in the photoelectric conversion layer after the light is applied to the photoelectric conversion layer, a kind of capacitor is formed by the inorganic oxide semiconductor material layer and the like, the insulating layer, and the charge storage electrode. The charge can be stored in the inorganic oxide semiconductor material layer and the like. Therefore, the charge storage portion can be fully depleted to delete the charge at the start of exposure. This can suppress the phenomenon of reduction in image quality caused by the degradation of random noise due to an increase in kTC noise. In addition, all pixels can be reset at once, and a so-called global shutter function can be realized.

FIG. 79 illustrates a conceptual diagram of the solid-state imaging apparatus of Embodiment 1. A solid-state imaging apparatus 100 of Embodiment 1 includes an imaging region 111 including stacked imaging elements 101 arranged in a two-dimensional array, the vertical drive circuit 112 as a drive circuit (peripheral circuit) of the stacked imaging elements 101, the column signal processing circuit 113, a horizontal drive circuit 114, an output circuit 115, a drive control circuit 116, and the like. The circuits can include well-known circuits, or other circuit configurations (for example, various circuits used in a CCD imaging apparatus or CMOS imaging apparatus in the past) can be obviously used to provide the circuits. In FIG. 79, reference number "101" is displayed in only one line of the stacked imaging elements 101.

The drive control circuit 116 generates a clock signal and a control signal as references for the operation of the vertical drive circuit 112, the column signal processing circuit 113, and the horizontal drive circuit 114 based on a vertical synchronization signal, a horizontal synchronization signal, and a master clock. In addition, the generated clock signal and control signal are input to the vertical drive circuit 112, the column signal processing circuit 113, and the horizontal drive circuit 114.

The vertical drive circuit 112 includes, for example, a shift register and sequentially selects and scans the stacked imaging elements 101 of the imaging region 111 row by row in the vertical direction. In addition, a pixel signal (image signal) based on a current (signal) generated according to an amount of light reception in each stacked imaging element 101 is transmitted to the column signal processing circuit 113 through the signal line (data output line) 117, VSL.

The column signal processing circuit 113 is arranged for, for example, each column of the stacked imaging elements 101 and is configured to use signals from black reference pixels (although not illustrated, formed around effective pixel regions) to apply, for each imaging element, signal processing, such as noise removal and signal amplification, to the image signals output from the stacked imaging elements 101 of one line. A horizontal selection switch (not illustrated) is connected and provided between an output stage of the column signal processing circuit 113 and a horizontal signal line 118.

The horizontal drive circuit 114 includes, for example, a shift register and sequentially outputs horizontal scan pulses to sequentially select the column signal processing circuits 113. The horizontal drive circuit 114 outputs the signal from each column signal processing circuit 113 to the horizontal signal line 118.

The output circuit 115 applies signal processing to the signals sequentially supplied from the column signal processing circuits 113 through the horizontal signal line 118 and outputs the signals.

Figure 9:
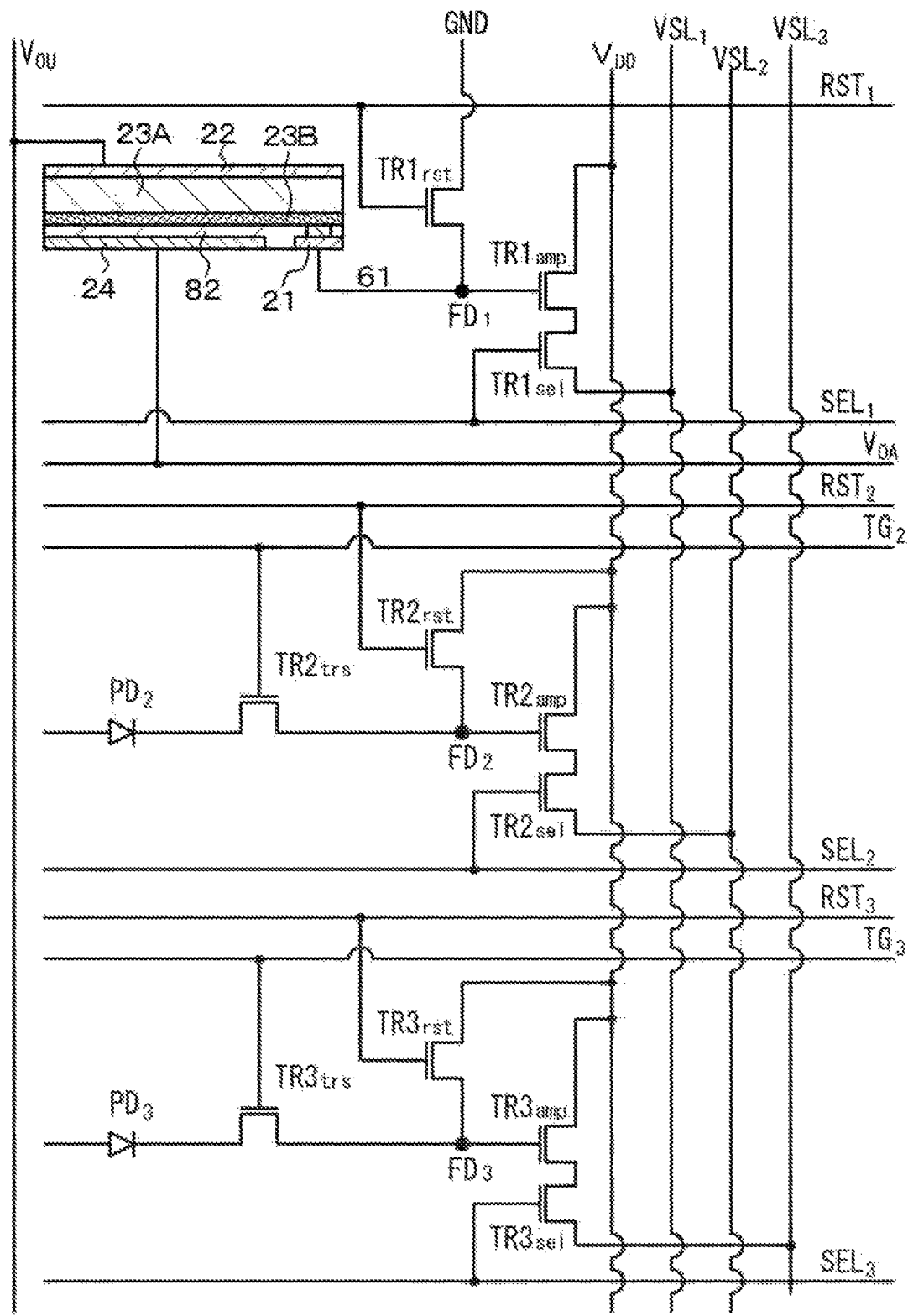
FIG. 9 is an equivalent circuit diagram of a modified example of the imaging element of Embodiment 1.
Figure 10:
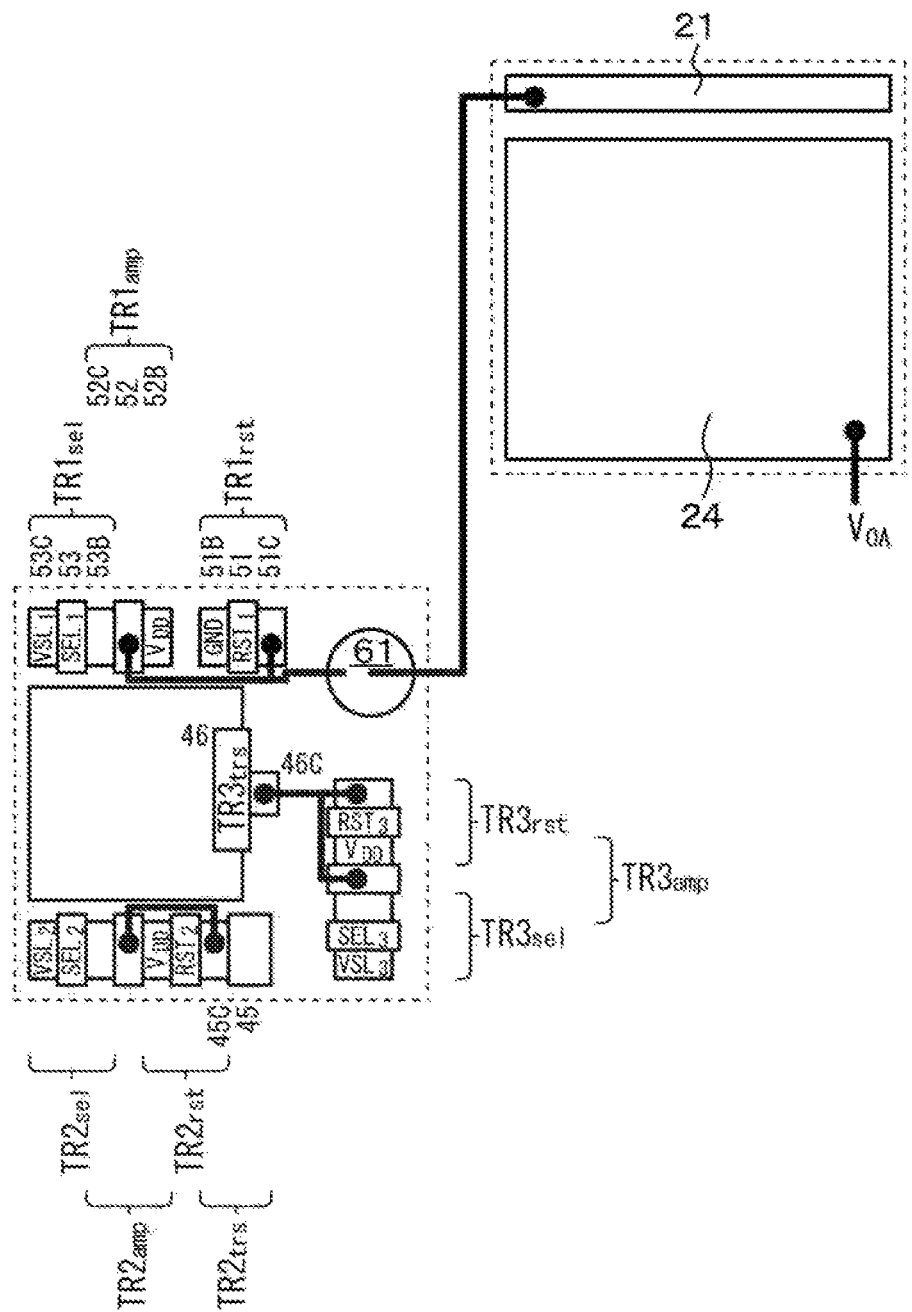
FIG. 10 is a schematic layout drawing of the first electrode, the charge storage electrode, and the transistors of the control unit included in the modified example of the imaging element of Embodiment 1 illustrated in FIG. 9.

FIG. 9 illustrates an equivalent circuit diagram of a modified example of the imaging element of Embodiment 1, and FIG. 10 illustrates a schematic layout drawing of the first electrode, the charge storage electrode, and the transistors included in the control unit. In this way, the other source/drain region 51B of the reset transistor $TR1_{rst}$ may be grounded, instead of connecting the other source/drain region 51B to the power source $V_{DD}$.

The imaging element of Embodiment 1 can be produced by, for example, the following method. That is, an SOI substrate is first prepared. A first silicon layer is then formed on the surface of the SOI substrate based on an epitaxial growth method, and the p$^+$ layer 73 and the n-type semiconductor region 41 are formed on the first silicon layer. Next, a second silicon layer is formed on the first silicon layer based on the epitaxial growth method, and the element separation region 71, the oxide film 72, the p$^+$ layer 42, the n-type semiconductor region 43, and the p$^+$ layer 44 are formed on the second silicon layer. In addition, various transistors and the like included in the control unit of the imaging element are formed on the second silicon layer, and the wiring layer 62, the interlayer insulating layer 76, and various wires are further formed on top of that. The interlayer insulating layer 76 and a support substrate (not illustrated) are then pasted together. Subsequently, the SOI substrate is removed to expose the first silicon layer. The surface of the second silicon layer corresponds to the front surface 70A of the semiconductor substrate 70, and the surface of the first silicon layer corresponds to a back surface 70B of the semiconductor substrate 70. In addition, the first silicon layer and the second silicon layer are collectively expressed as the semiconductor substrate 70. Next, an opening portion for forming the contact hole portion 61 is formed on the back surface 70B side of the semiconductor substrate 70, and the HfO$_2$ film 74, the insulating material film 75, and the contact hole portion 61 are formed. Furthermore, the pad portions 63 and 64, the interlayer insulating layer 81, the connection holes 65 and 66, the first electrode 21, the charge storage electrode 24, and the insulating layer 82 are formed. Next, the connection portion 67 is opened, and the inorganic oxide semiconductor material layer 23B, the photoelectric conversion layer 23A, the second electrode 22, the insulating layer 83, and the on-chip microlens 14 are formed. In this way, the imaging element of Embodiment 1 can be obtained.

In addition, although not illustrated, the insulating layer 82 may have a two-layer configuration including an insulating layer/lower layer and an insulating layer/upper layer. That is, the insulating layer/lower layer can be formed at least over the charge storage electrode 24 and in the area between the charge storage electrode 24 and the first electrode 21 (more specifically, the insulating layer/lower layer can be formed on the interlayer insulating layer 81 including the charge storage electrode 24). A planarization process can be applied to the insulating layer/lower layer, and then the insulating layer/upper layer can be formed over the insulating layer/lower layer and the charge storage electrode 24. As a result, the insulating layer 82 can be certainly planarized. Furthermore, the connection portion. 67 is only required to be opened in the insulating layer 82 obtained in this way.

Embodiment 2

Figure 11:
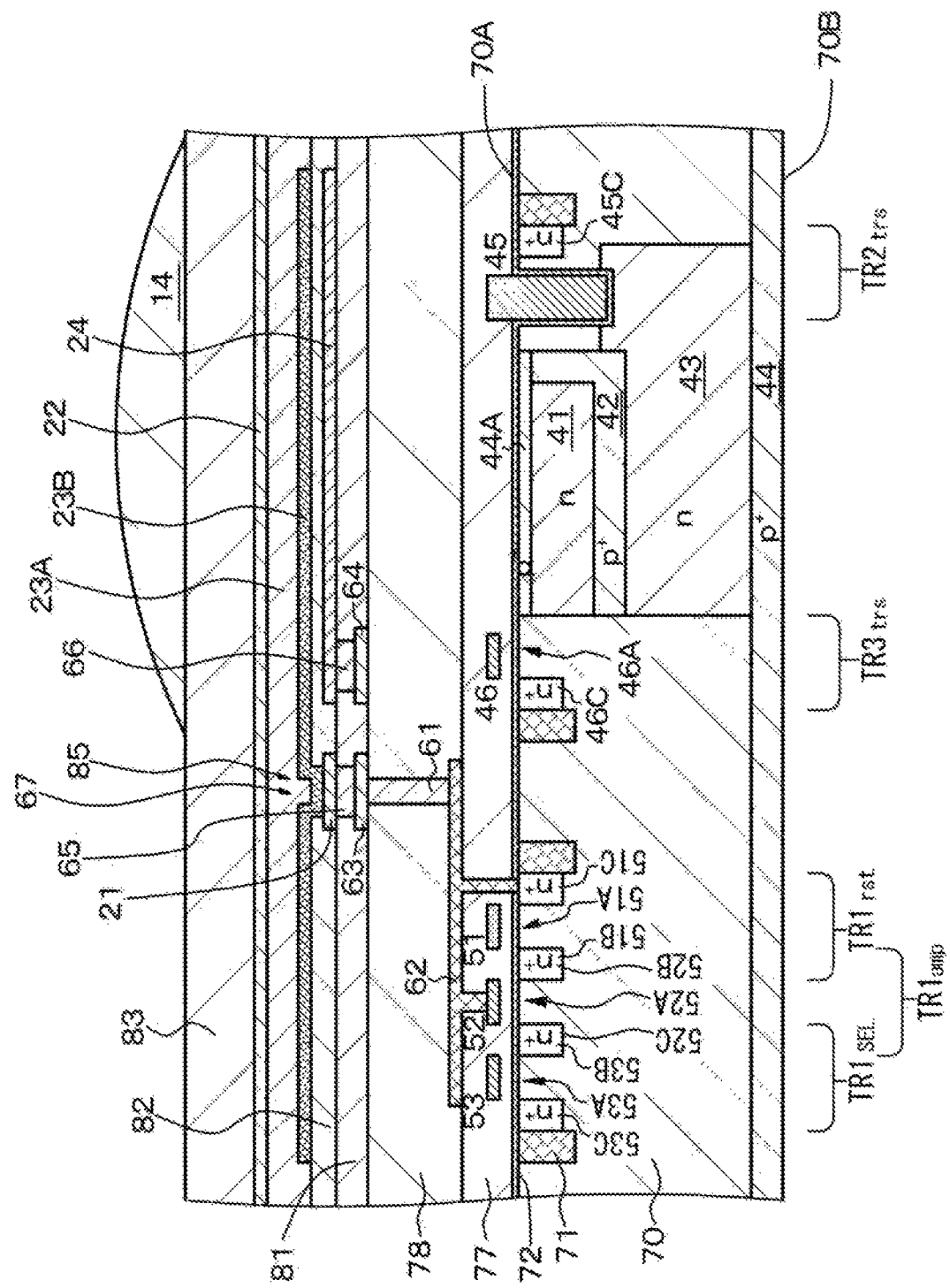
FIG. 11 is a schematic partial cross-sectional view of an imaging element of Embodiment 2.

Embodiment 2 is a modification of Embodiment 1. An imaging element of Embodiment 2 illustrated in a schematic partial cross-sectional view of FIG. 11 is a front illuminated type imaging element. The imaging element has a stacked structure of three imaging elements including: a green light imaging element of first type in Embodiment 1 (first imaging element) sensitive to green the green light imaging element including a green light photoelectric conversion layer of first type for absorbing green light; a blue light imaging element in the past of second type (second imaging element) sensitive to blue light, the blue light imaging element including a blue light photoelectric conversion layer of second type for absorbing blue light; and a red light imaging element in the past of second type (third imaging element) sensitive to red light, the red light imaging element including a red light photoelectric conversion layer of second type for absorbing red light. Here, the red light imaging element (third imaging element) and the blue light imaging element (second imaging element) are provided in the semiconductor substrate 70, and the second imaging element is positioned on the light incident side with respect to the third imaging element. In addition, the green light imaging element (first imaging element) is provided on the upper side of the blue light imaging element (second imaging element).

Various transistors included. In the control unit are provided. On the front surface 70A side of the semiconductor substrate 70 as in Embodiment 1. The transistors can have configurations and structures substantially similar to the transistors described in Embodiment 1. In addition, the second imaging element and the third imaging element are provided on the semiconductor substrate 70, and the imaging elements can also have configurations and structures substantially similar to the second imaging element and the third imaging element described in Embodiment 1.

The interlayer insulating layer 81 is formed on the upper side of the front surface 70A of the semiconductor substrate 70, and the photoelectric conversion unit (first electrode 21, inorganic oxide semiconductor material layer 23B, photoelectric conversion layer 23A, second electrode 22, charge storage electrode 24, and the like) including the charge storage electrode included in the imaging element of Embodiment 1 is provided on the upper side of the interlayer insulating layer 81.

In this way, the configuration and the structure of the imaging element of Embodiment 2 can be similar to the configuration and the structure of the imaging element of Embodiment 1 except that the imaging element of Embodiment 2 is a front illuminated type. Therefore, the details will not be described.

Embodiment 3

Embodiment 3 is a modification of Embodiment 1 and Embodiment 2.

Figure 12:
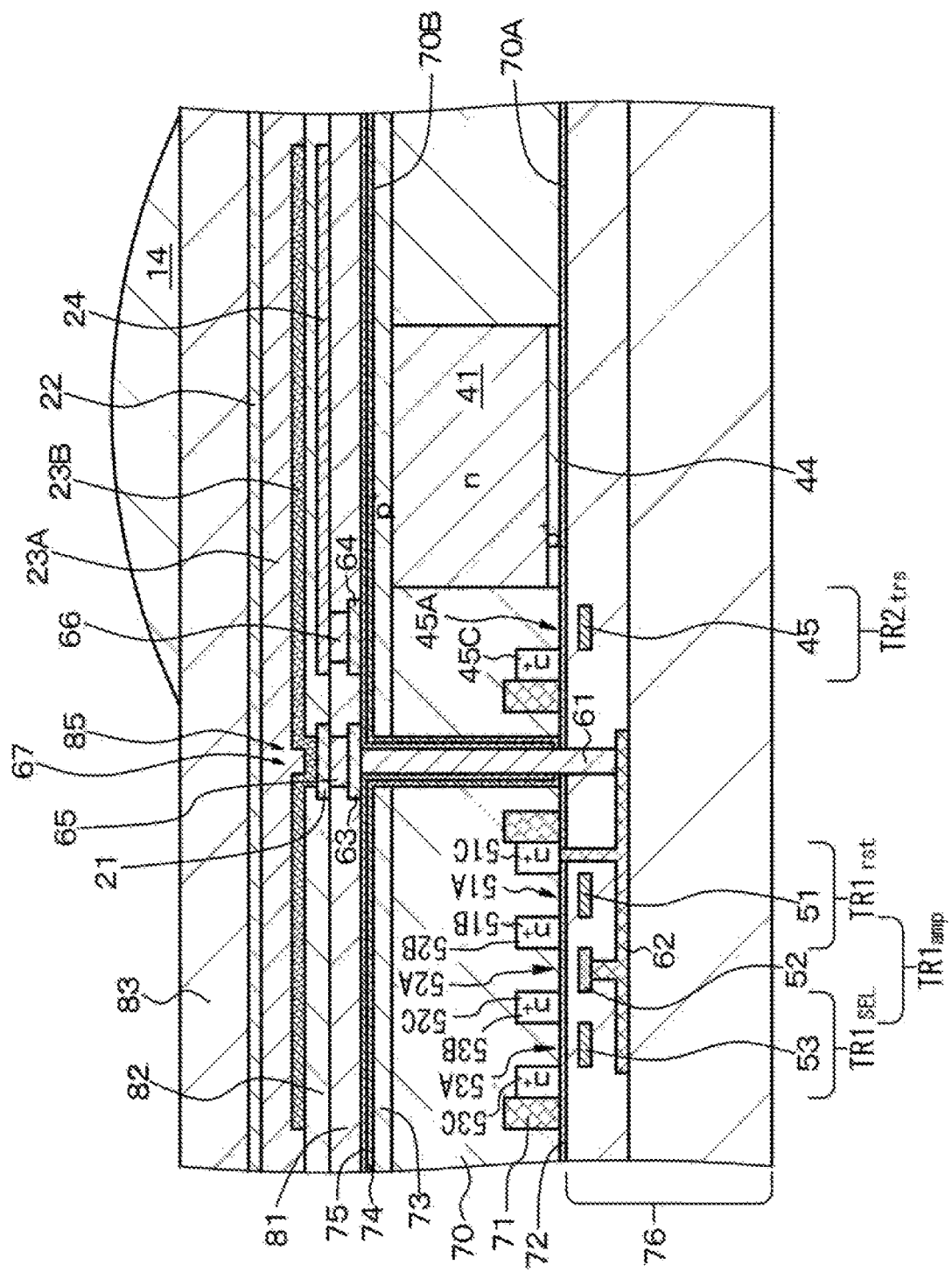
FIG. 12 is a schematic partial cross-sectional view of an imaging element of Embodiment 3.
Figure 13:
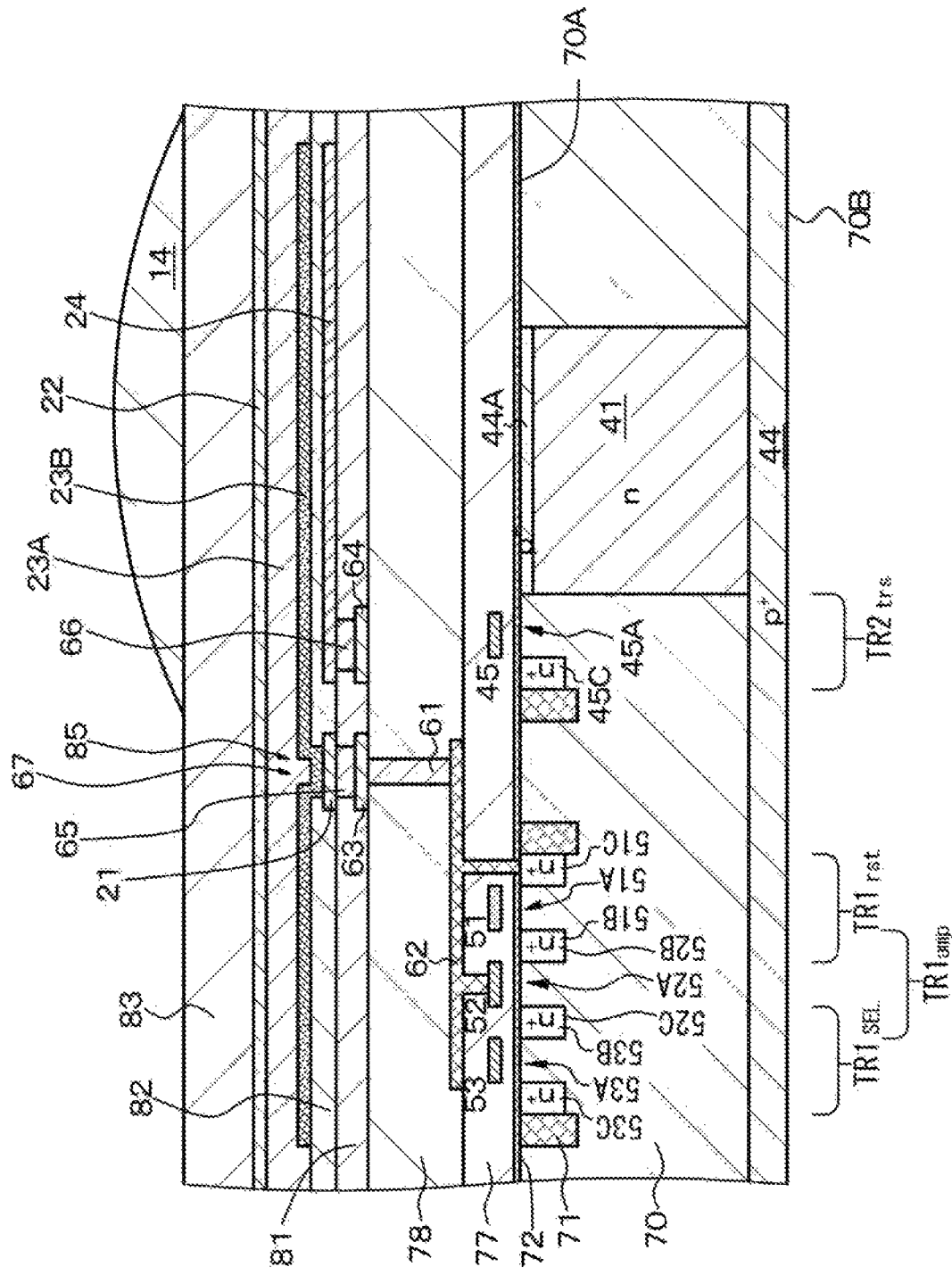
FIG. 13 is a schematic partial cross-sectional view of a modified example of the imaging element of Embodiment 3.

An imaging element of Embodiment 3 illustrated in a schematic partial cross-sectional view of FIG. 12 is a back illuminated type imaging element. The imaging element has a stacked structure of two imaging elements including the first imaging element of first type in Embodiment 1 and the second imaging element of second type. In addition, a modified example of the imaging element of Embodiment 3 illustrated in a schematic partial cross-sectional view of FIG. 13 provides a front illuminated type imaging element. The imaging element has a stacked structure of two imaging elements including the first imaging element of first type in Embodiment 1 and the second imaging element of second type. Here, the first imaging element absorbs light of primary colors, and the second imaging element absorbs light of complementary colors. Alternatively, the first imaging element absorbs white light, and the second imaging element absorbs infrared rays.

Figure 14:
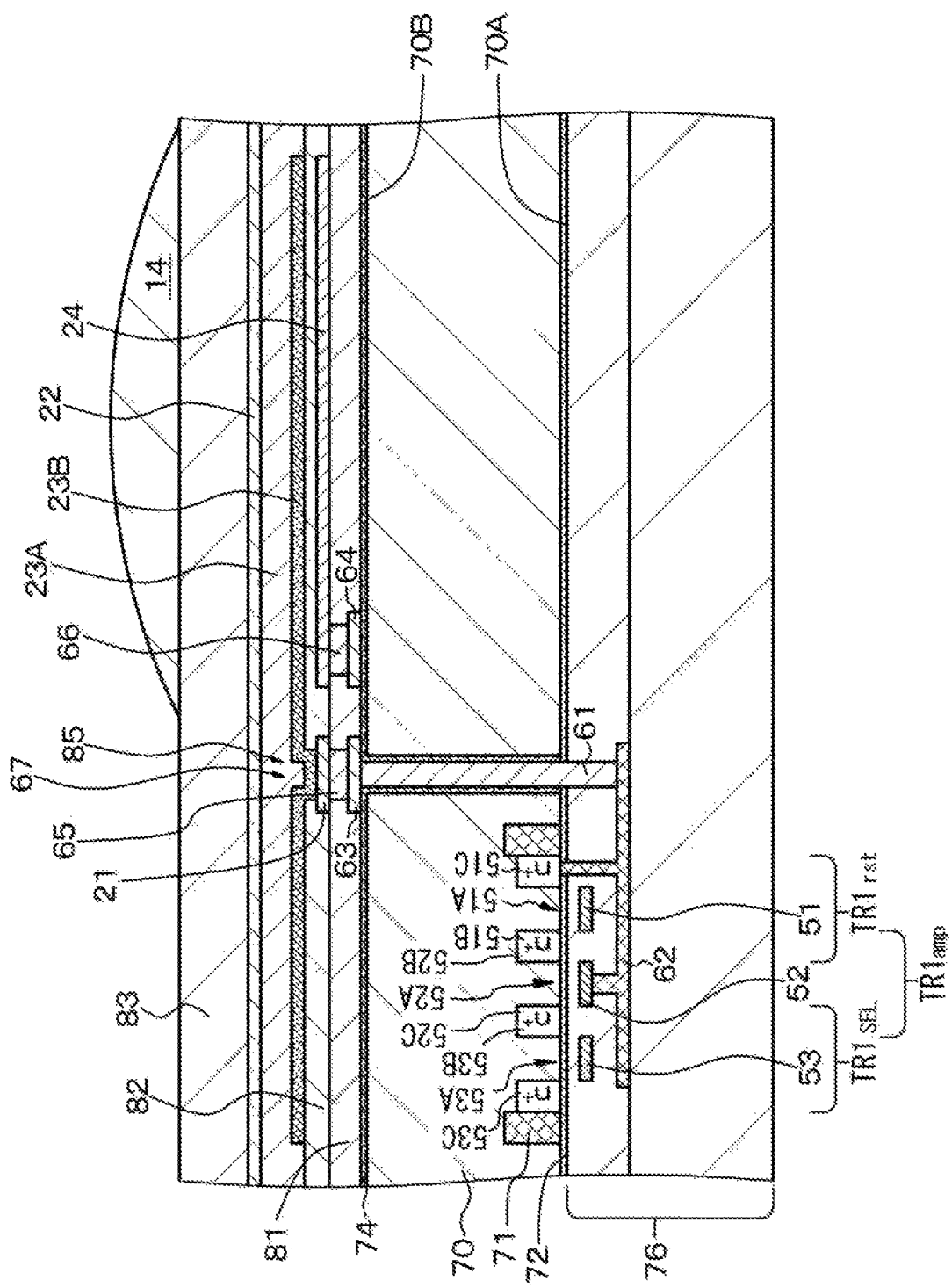
FIG. 14 is a schematic partial cross-sectional view of another modified example of the imaging element in Embodiment 3.
Figure 15:
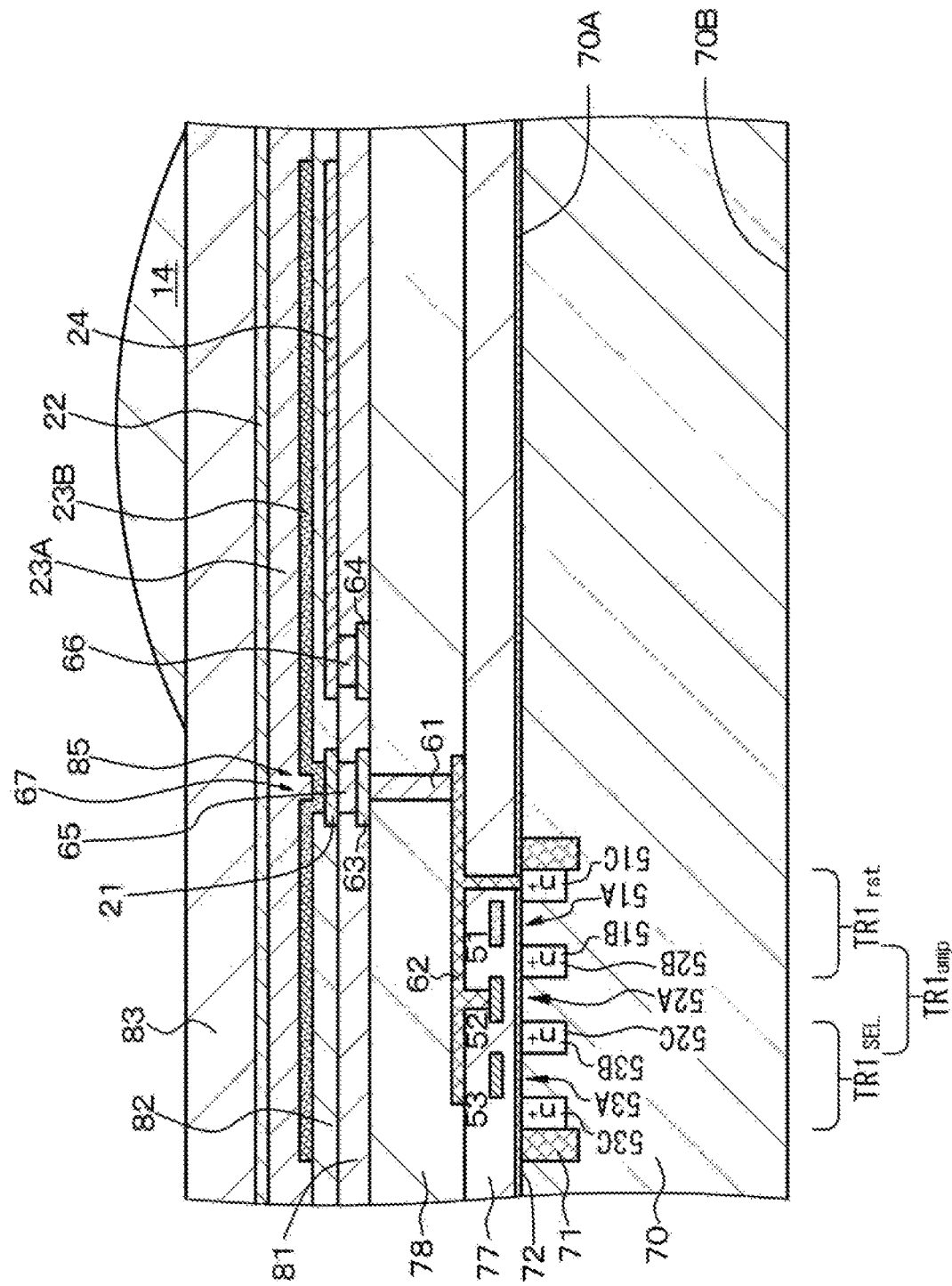
FIG. 15 is a schematic partial cross-sectional view of yet another modified example of the imaging element in Embodiment 3.

A modified example of the imaging element of Embodiment 3 illustrated in a schematic partial cross-sectional view of FIG. 14 is a back illuminated type imaging element. The imaging element includes the first imaging element of first type in Embodiment 1. In addition, a modified example of the imaging element of Embodiment 3 illustrated in a schematic partial cross-sectional view of FIG. 15 is a front illuminated type imagining element. The imaging element includes the first imaging element of first type in Embodiment 1. Here, the first imaging element includes three types of imaging elements including an imaging element that absorbs red light, an imaging element that absorbs green light, and an imaging element that absorbs blue light. Furthermore, the plurality of imaging elements are included in the solid-state imaging apparatus according to the first aspect of the present disclosure. An example of the arrangement of the plurality of imaging elements includes a Bayer array. Color filter layers for separating blue, green, and red are arranged on the light incident side of the imaging elements as necessary.

Instead of providing one photoelectric conversion unit including the charge storage electrode of first type in Embodiment 1, two photoelectric conversion units can be stacked (that is, two photoelectric conversion units including the charge storage electrodes are stacked, and a control unit of the two photoelectric conversion units is provided. On the semiconductor substrate), or three photoelectric conversion units can be stacked (that is, three photoelectric conversion units including the charge storage electrodes are stacked, and a control unit of the three photoelectric conversion units is provided on the semiconductor substrate). The following table illustrates examples of the stacked structures of the imaging element of first type and the imaging element of second type.

|  | First type | Second type |
| --- | --- | --- |
| Back illuminated type and front illuminated type | 1 | 2 |
|  | Green | Blue + Red |
|  | 1 | 1 |
|  | Primary color | Complementary color |
|  | 1 | 1 |
|  | White | Infrared |
|  | 1 | 0 |
|  | Blue, Green, or Red |  |
|  | 2 | 2 |
|  | Green + Infrared | Blue + Red |
|  | 2 | 1 |
|  | Green + Blue | Red |
|  | 2 | 0 |
|  | White + Infrared |  |
|  | 3 | 2 |
|  | Green + Blue + Red | Blue-Green (Emerald) + Infrared |
|  | 3 | 1 |
|  | Green + Blue + Red | Infrared |
|  | 3 | 0 |
|  | Blue + Green + Red |  |

Embodiment 4

Figure 6B:
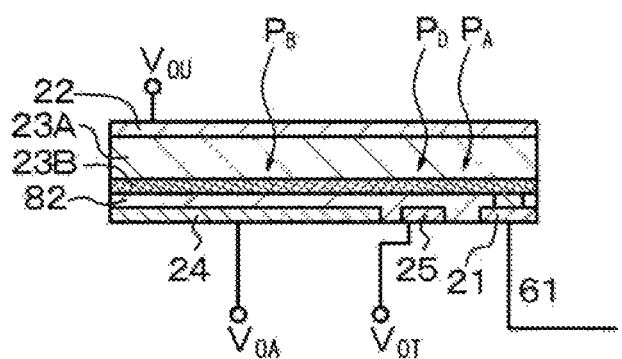
Figure 16:
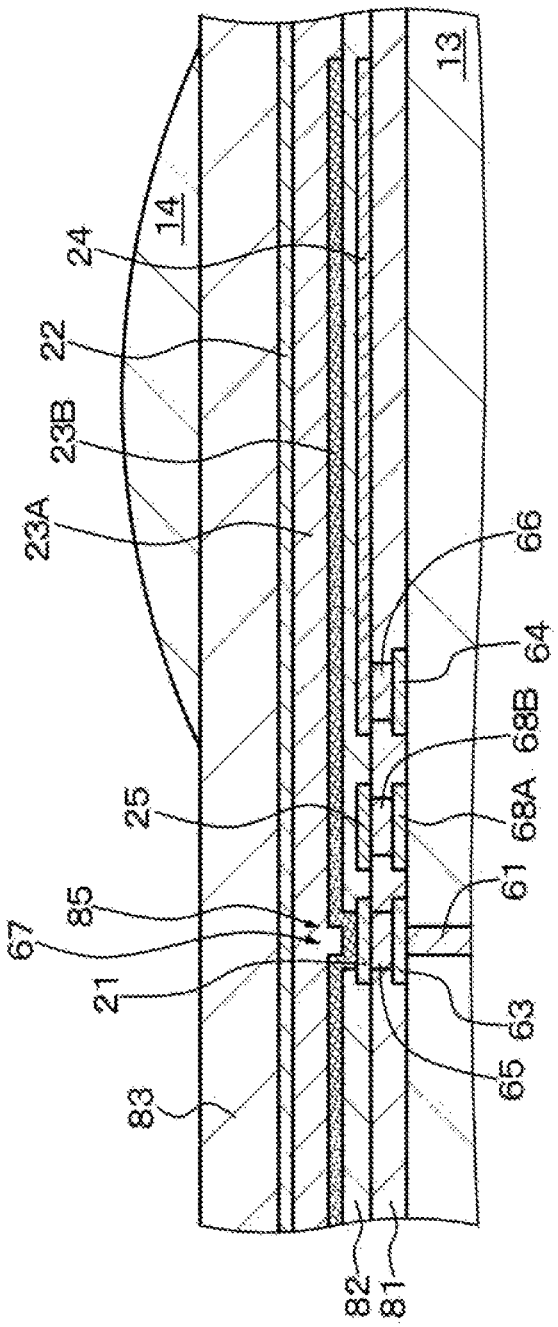
FIG. 16 is a schematic partial cross-sectional view of part of the imaging element of Embodiment 4.
Figure 17:
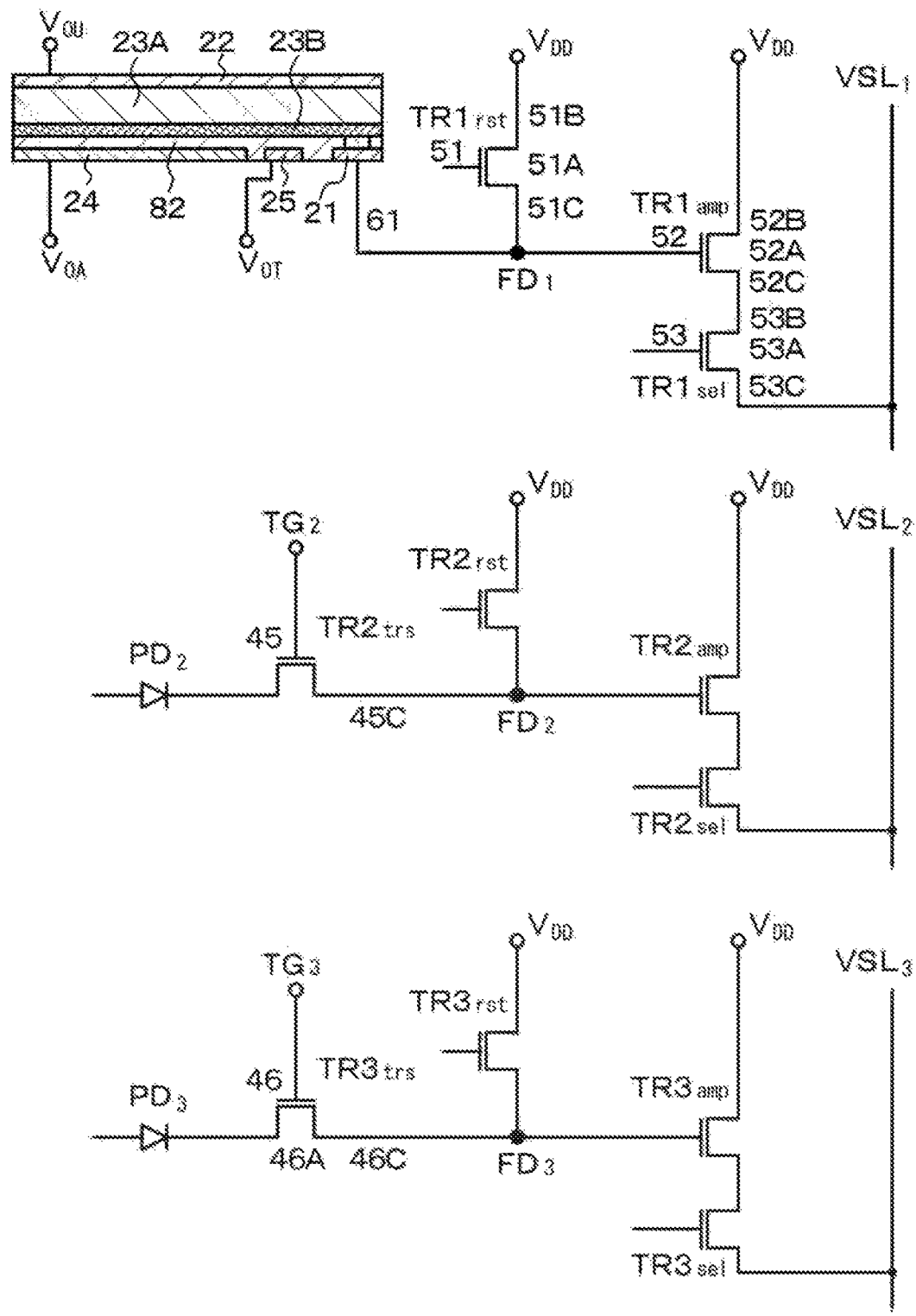
FIG. 17 is an equivalent circuit diagram of the imaging element of Embodiment 4.
Figure 18:
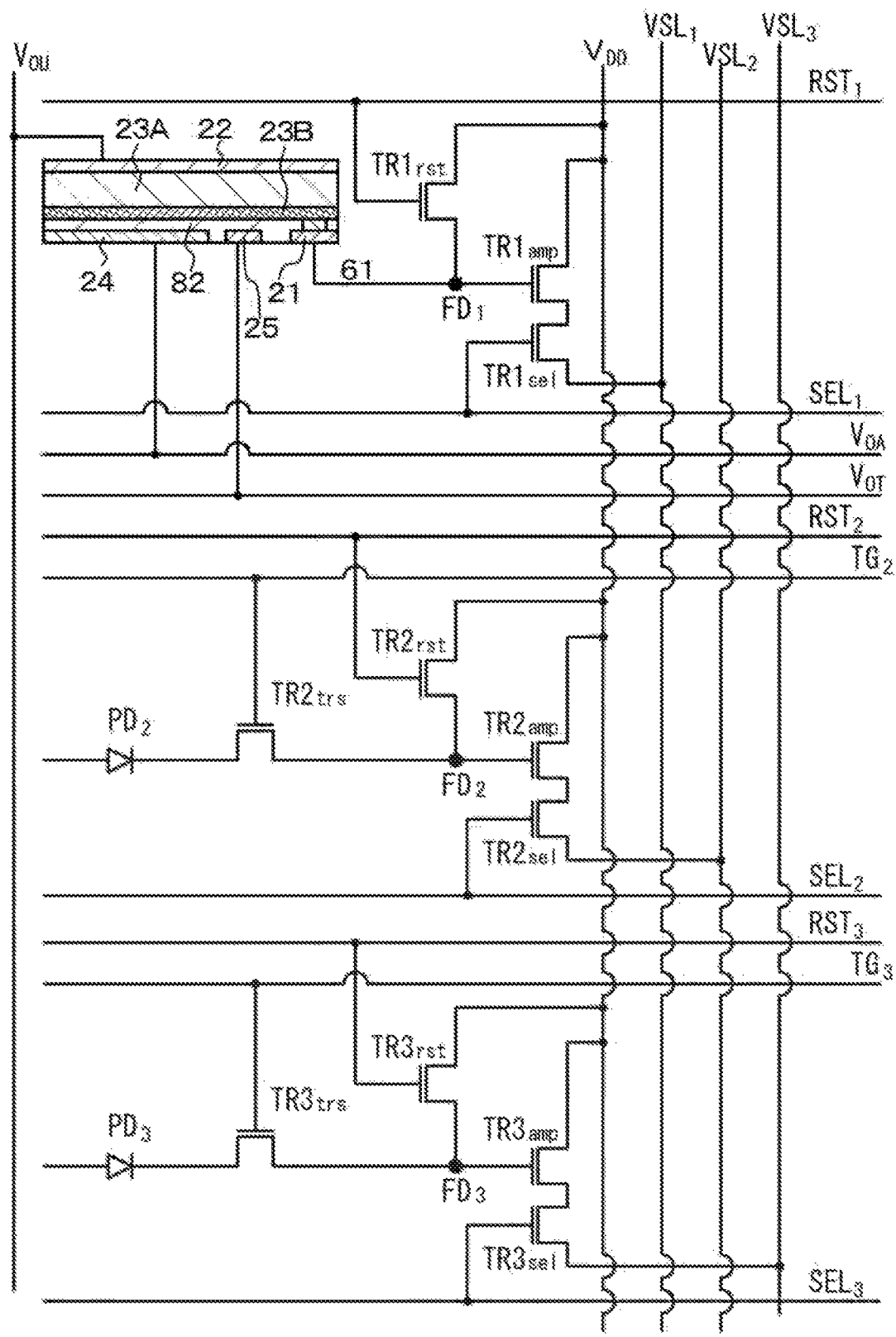
FIG. 18 is an equivalent circuit diagram of the imaging element of Embodiment 4.
Figure 19:
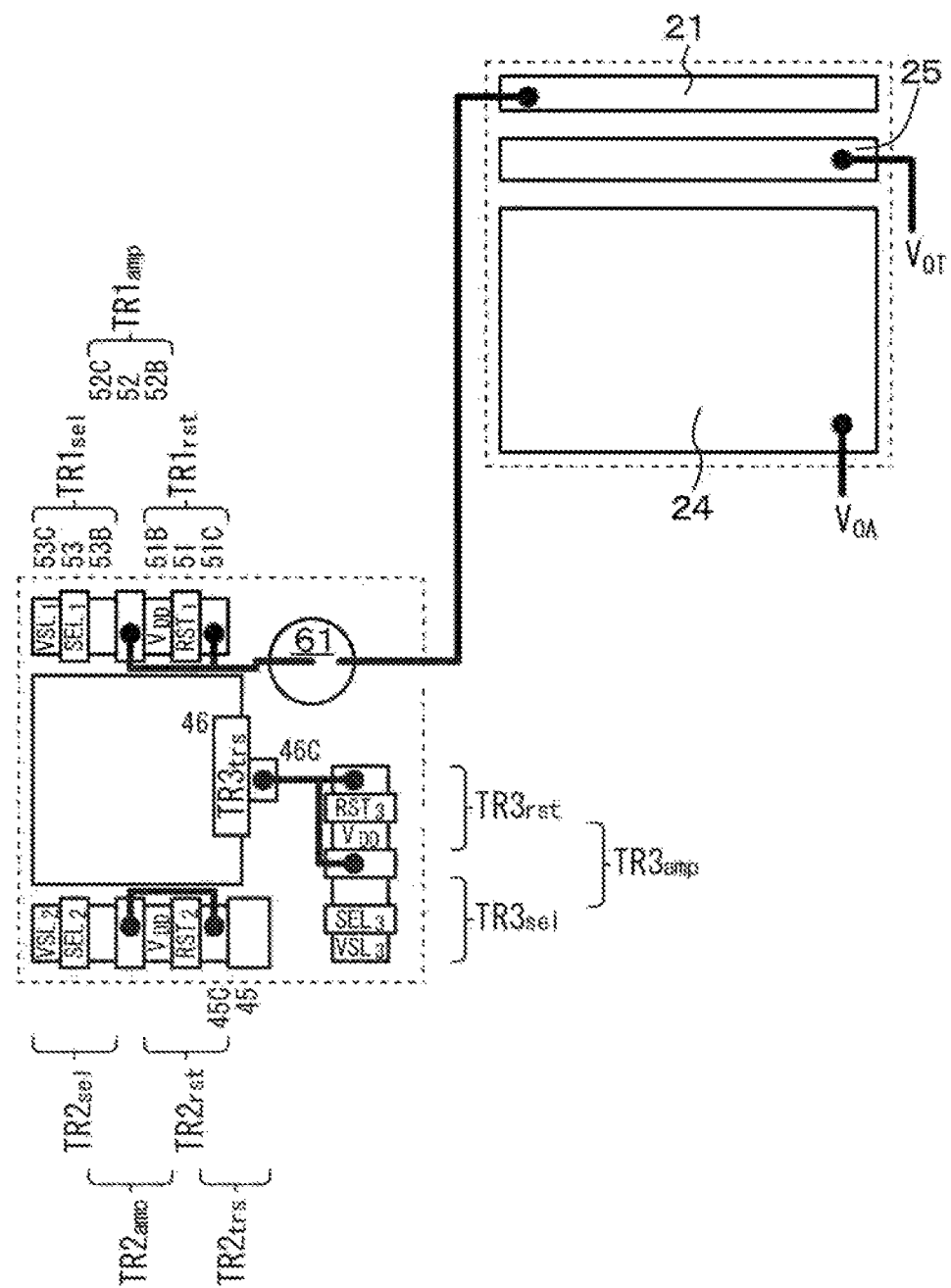
FIG. 19 is a schematic layout drawing of the first electrode, a transfer control electrode, the charge storage electrode, and the transistors of the control unit included in the imaging element of Embodiment 4.
Figure 22:
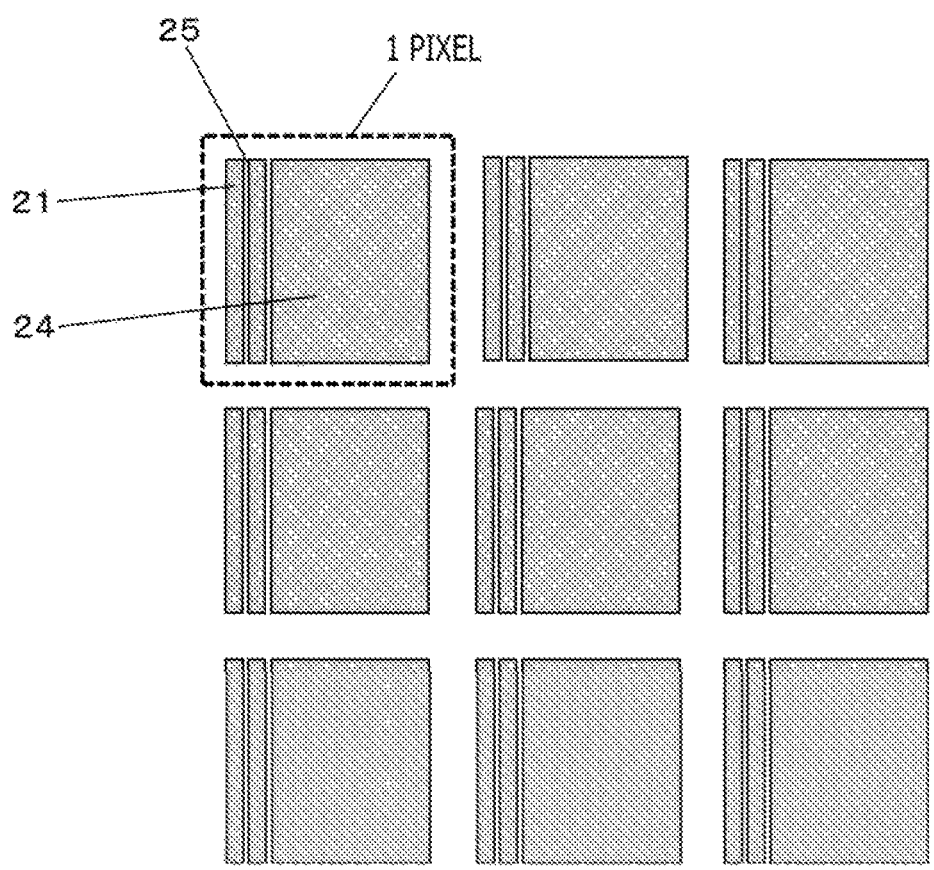
FIG. 22 is a schematic layout drawing of the first electrode, the transfer control electrode, and the charge storage electrode included in the imaging element of Embodiment 4.
Figure 23:
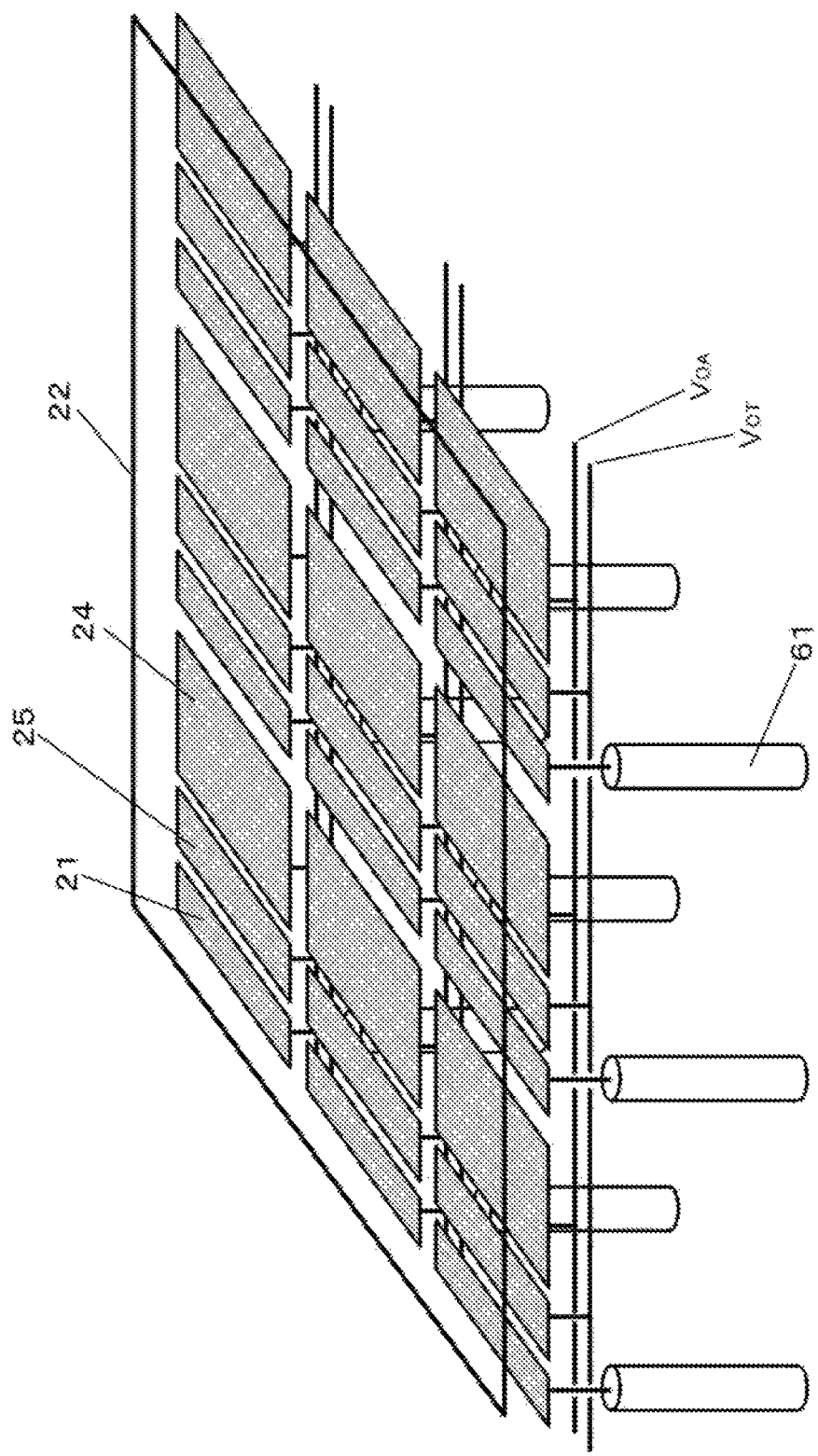
FIG. 23 is a schematic perspective view of the first electrode, the transfer control electrode, the charge storage electrode, the second electrode, and the contact hole portion included in the imaging element of Embodiment 4.

Embodiment 4 is a modification of Embodiments 1 to 3, and Embodiment 4 relates to an imaging element and the like including a transfer control electrode (charge transfer electrode) of the present disclosure. FIG. 16 illustrates a schematic partial cross-sectional view of part of the imaging element of Embodiment 4. FIGS. 17 and 18 illustrate equivalent circuit diagrams of the imaging element of Embodiment 4. FIG. 19 illustrates a schematic layout drawing of the first electrode, the transfer control electrode, and the charge storage electrode included in the photoelectric conversion unit and the transistors of the control unit included in the imaging element of Embodiment 4. FIGS. 20 and 21 schematically illustrate the state of potential in each section during operation of the imaging element of Embodiment 4. FIG. 6B illustrates an equivalent circuit diagram for describing each section of the imaging element of Embodiment 4. In addition, FIG. 22 illustrates a schematic layout drawing of the first electrode, the transfer control electrode, and the charge storage electrode included in the photoelectric conversion unit of the imaging element of Embodiment 4. FIG. 23 illustrates a schematic perspective view of the first electrode, the transfer control electrode, the charge storage electrode, the second electrode, and the contact hole portion.

The imaging element of Embodiment 4 further includes a transfer control electrode (charge transfer electrode) 25 arranged between the first electrode 21 and the charge storage electrode 24, arranged apart from the first electrode 21 and the charge storage electrode 24, and arranged to face the inorganic oxide semiconductor material layer 23B through the insulating layer 82. The transfer control electrode 25 is connected to the pixel drive circuit included in the drive circuit through a connection hole 68B and a pad portion 68A provided in the interlayer insulating layer 81 and through the wire $V_{CT}$. Note that various constituent elements of the imaging element positioned on the lower side of the interlayer insulating layer 81 are collectively indicated by reference number 13 for convenience in order to simplify the drawings.

Hereinafter, an operation of the imaging element (first imaging element) of Embodiment 4 will be described with reference to FIGS. 20 and 21. Note that the values of the potential applied to the charge storage electrode 24 and the potential at the point $P_D$ particularly vary between FIGS. 20 and 21.

In the charge storage period, the drive circuit applies the potential $V_{11}$ to the first electrode 21, applies the potential $V_{12}$ to the charge storage electrode 24, and applies a potential $V_{13}$ to the transfer control electrode 25. The light incident on the photoelectric conversion layer 23A causes photoelectric conversion in the photoelectric conversion layer 23A. The electron holes generated by the photoelectric conversion are sent from the second electrode 22 to the drive circuit through the wire $V_{OU}$. On the other hand, the potential of the first electrode 21 is higher than the potential of the second electrode 22. That is, for example, a positive potential is applied to the first electrode 21, and a negative potential is applied to the second electrode 22. Therefore, the potentials are set so that $V_{12}>V_{13}$ (for example, $V_{12}>V_{11}>V_{13}$ or $V_{11}>V_{12}>V_{13}$) holds. As a result, the electrons generated by the photoelectric conversion are attracted to the charge storage electrode 24, and the electrons stop in the region of the inorganic oxide semiconductor material layer 23B and the like facing the charge storage electrode 24. That is, the charge is stored in the inorganic oxide semiconductor material layer 23B and the like. $V_{12}$ is greater than $V_{13}$, and this can certainly prevent the movement of the electrons generated inside of the photoelectric conversion layer 23A toward the first electrode 21. In the time course of the photoelectric conversion, the potential in the region of the inorganic oxide semiconductor material layer 23B and the like facing the charge storage electrode 24 becomes a more negative value.

The reset operation is performed later in the charge storage period. This resets the potential of the first floating diffusion layer $FD_1$, and the potential of the first floating diffusion layer $FD_1$ shifts to the potential $V_{DD}$ of the power source.

After the completion of the reset operation, the charge is read out. That is, in the charge transfer period, the drive circuit applies the potential $V_{21}$ to the first electrode 21, applies the potential $V_{22}$ to the charge storage electrode 24, and applies a potential $V_{23}$ to the transfer control electrode 25. Here, the potentials are set so that $V_{22}\geq V_{23}\geq V_{21}$ (preferably, $V_{22}<V_{23}<V_{21}$) holds. In a case where the potential $V_{13}$ is applied to the transfer control electrode 25, the potentials are only required to be set so that $V_{22}\geq V_{13}\geq V_{21}$ (preferably, $V_{22}<V_{13}<V_{21}$) holds. As a result, the electrons stopped in the region of the inorganic oxide semiconductor material layer 23B and the like facing the charge storage electrode 24 are certainly read out to the first electrode 21 and further to the first floating diffusion layer $FD_1$. That is, the charge stored in the inorganic oxide semiconductor material layer 23B and the lake is read out to the control unit.

This completes the series of operations including the charge storage, the reset operation, and the charge transfer.

The operations of the amplification transistor $TR1_{amp}$ and the selection transistor $TR1_{sel}$ after the electrons are read out to the first floating diffusion layer $FD_1$ are the same as the operations of transistors in the past. In addition, for example, the series of operations including the charge storage, the reset operation, and the charge transfer of the second imaging element and the third imaging element are similar to the series of operations including the charge storage, the reset operation, and the charge transfer in the past.

Figure 24:
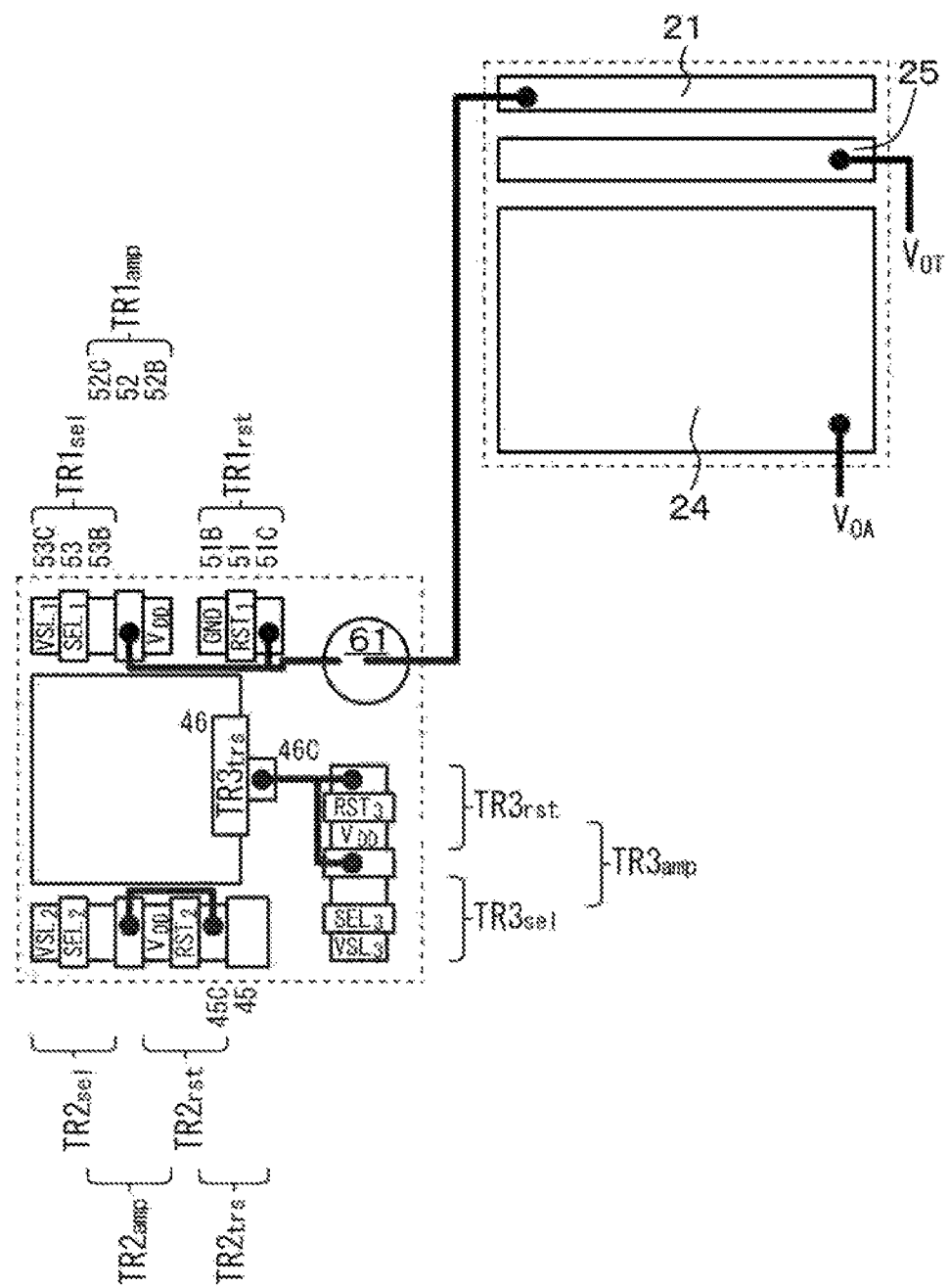
FIG. 24 is a schematic layout drawing of the first electrode, the transfer control electrode, the charge storage electrode, and the transistors of the control unit included is a modified example of the imaging element of Embodiment 4.

As in FIG. 24 illustrating a schematic layout drawing of the first electrode, the charge storage electrode, and the transistors of the control unit included in the modified example of the imaging element of Embodiment 4, the other source/drain region 51B of the reset transistor $TR1_{rst}$ may be grounded, instead of connecting the other source/drain region 51B to the power source $V_{DD}$.

Embodiment 5

Figure 25:
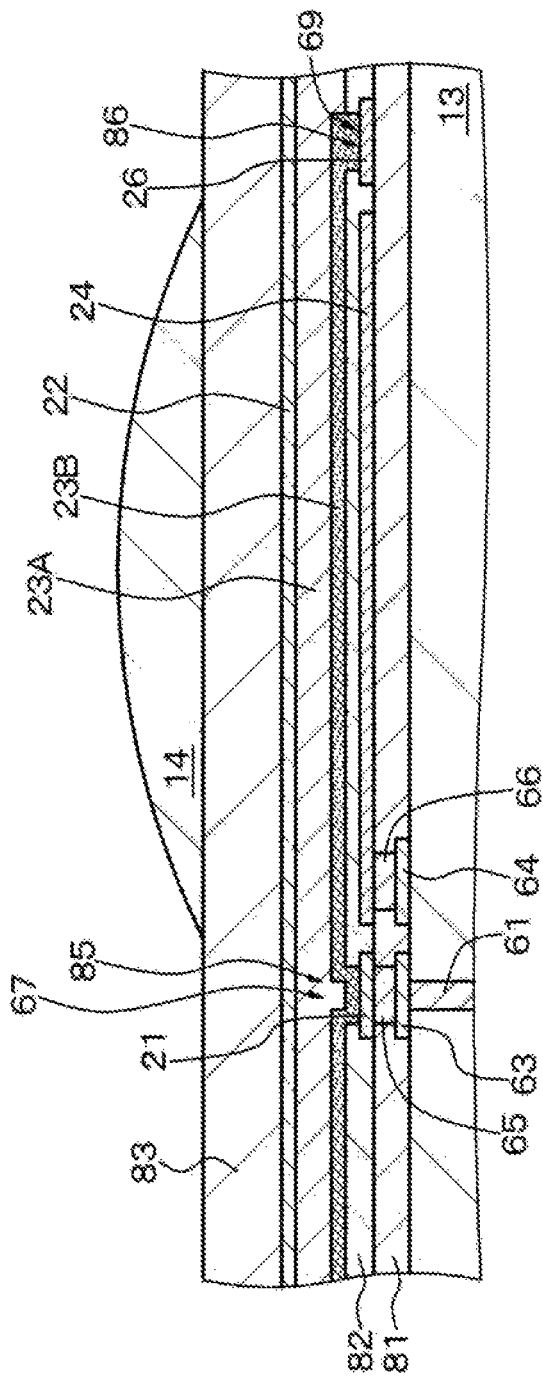
FIG. 25 is a schematic partial cross-sectional view of part of an imaging element of Embodiment 5.
Figure 26:
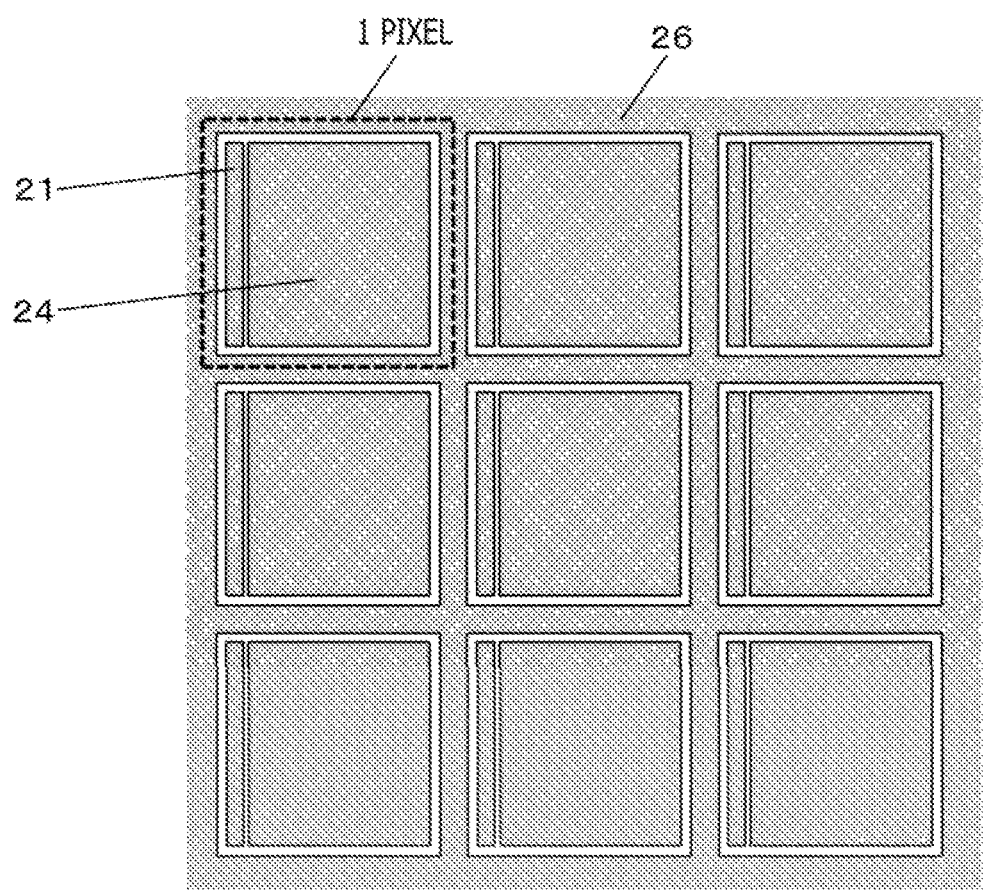
FIG. 26 is a schematic layout drawing of the first electrode, the charge storage electrode, and a discharge electrode included in the imaging element of Embodiment 5.
Figure 27:
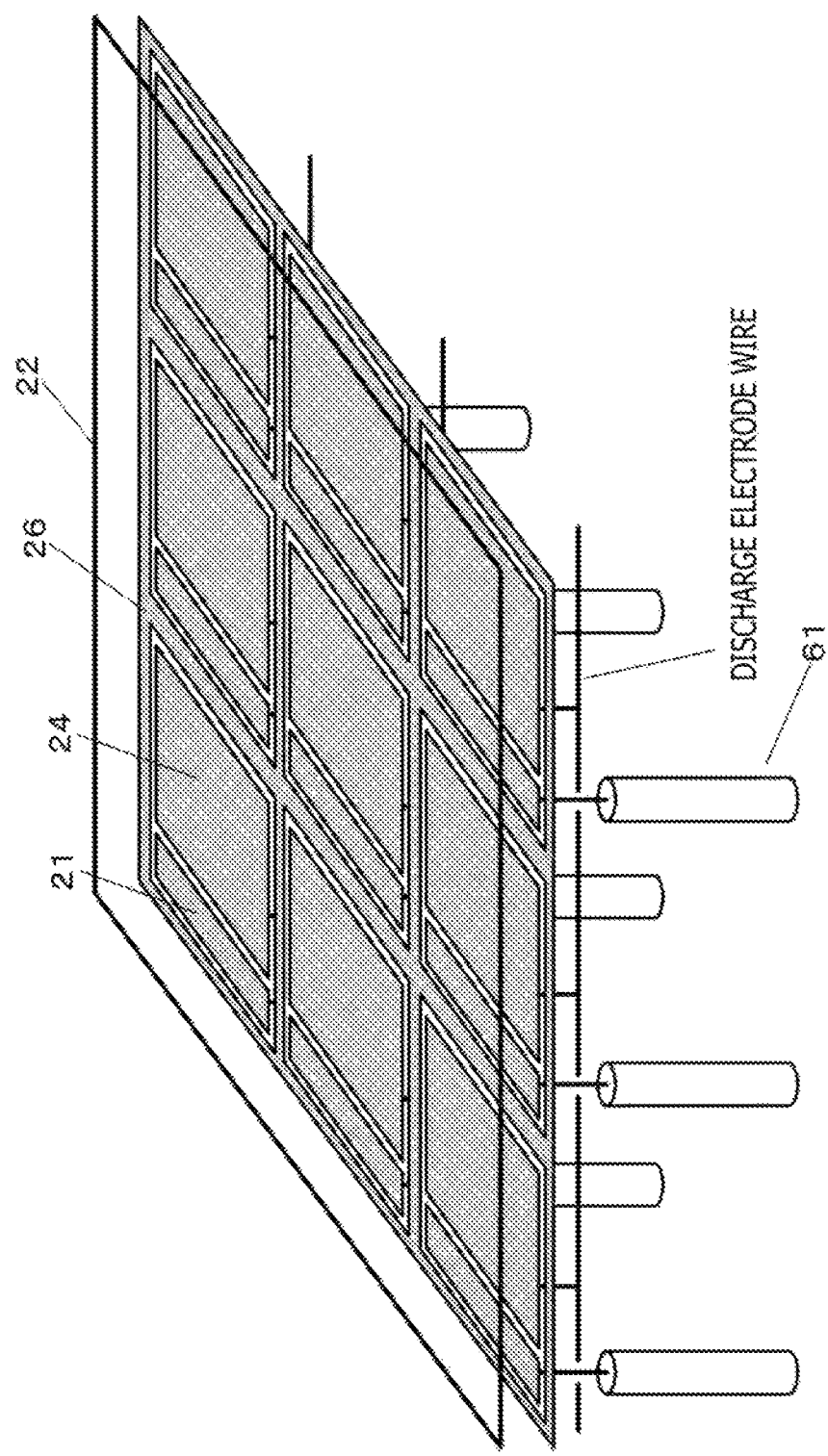
FIG. 27 is a schematic perspective view of the first electrode, the charge storage electrode, the discharge electrode, the second electrode, and the contact hole portion included is the imaging element of Embodiment 5.

Embodiment 5 is a modification of Embodiments 1 to 4, and Embodiment 5 relates to an imaging element and the like including a discharge electrode of the present disclosure. FIG. 25 illustrates a schematic partial cross-sectional view of part of the imaging element of Embodiment 5. FIG. 26 illustrates a schematic layout drawing of the first electrode, the charge storage electrode, and the discharge electrode included in the photoelectric conversion unit including the charge storage electrode of the imaging element of Embodiment 5. FIG. 27 illustrates a schematic perspective view of the first electrode, the charge storage electrode, the discharge electrode, the second electrode, and the contact hole portion.

The imaging element of Embodiment 5 further includes a discharge electrode 26 connected to the inorganic oxide semiconductor material layer 23B through a connection portion 69 and arranged apart from the first electrode 21 and the charge storage electrode 24. Here, the discharge electrode 26 is arranged to surround the first electrode 21 and the charge storage electrode 24 (that is, in a frame shape). The discharge electrode 26 is connected to the pixel drive circuit included in the drive circuit. The inorganic oxide semiconductor material layer 23B extends in the connection portion 69. That is, the inorganic oxide semiconductor material layer 23B extends in a second opening portion 86 provided in the insulating layer 82 and is connected to the discharge electrode 26. The discharge electrode 26 is shared (standardized) by a plurality of imaging elements.

In Embodiment 5, the drive circuit applies the potential $V_{11}$ to the first electrode 21, applies the potential $V_{12}$ to the charge storage electrode 24, and applies a potential $V_{14}$ to the discharge electrode 26 in the charge storage period. The charge is stored in the inorganic oxide semiconductor material layer 23B and the like. The light incident on the photoelectric conversion layer 23A causes photoelectric conversion in the photoelectric conversion layer 23A. The electron holes generated by the photoelectric conversion are sent from the second electrode 22 to the drive circuit through the wire $V_{OU}$. On the other hand, the potential of the first electrode 21 is higher than the potential of the second electrode 22. That is, for example, a positive potential is applied to the first electrode 21, and a negative potential is applied to the second electrode 22. Therefore, the potentials are set so that $V_{14} > V_{11}$ (for example, $V_{12} > V_{14} > V_{10}$ holds. As a result, the electrons generated by the photoelectric conversion are attracted to the charge storage electrode 24, and the electrons stop in the region of the inorganic oxide semiconductor material layer 23B and the like facing the charge storage electrode 24. This can certainly prevent the movement of the electrons toward the first electrode 21. However, the electrons not sufficiently attracted to the charge storage electrode 24, or the electrons not completely stored in the inorganic oxide semiconductor material layer 23B and the like (so-called overflown electrons) are sent to the drive circuit through the discharge electrode 26.

The reset operation is performed later in the charge storage period. This resets the potential of the first floating diffusion layer $FD_1$, and the potential of the first floating diffusion layer $FD_1$ shifts to the potential $V_{DD}$ of the power source.

After the completion of the reset operation, the charge is read out. That is, in the charge transfer period, the drive circuit applies the potential $V_{21}$ to the first electrode 21, applies the potential $V_{22}$ to the charge storage electrode 24, and applies a potential $V_{24}$ to the discharge electrode 26. Here, the potentials are set so that $V_{24} < V_{21}$ (for example, $V_{24} < V_{22} < V_{21}$) holds. As a result, the electrons stopped in the region of the inorganic oxide semiconductor material layer 23B and the like facing the charge storage electrode 24 are certainly read out to the first electrode 21 and further to the first floating diffusion layer $FD_1$. That is, the charge stored in the inorganic oxide semiconductor material layer 23B and the like is read out to the control unit.

This completes the series of operations including the charge storage, the reset operation, and the charge transfer. The operations of the amplification transistor $TR1_{amp}$ and the selection transistor $TP1_{sel}$ after the electrons are read out to the first floating diffusion layer $FD_1$ are the same as the operations of transistors in the past. In addition, for example, the series of operations including the charge storage, the reset operation, and the charge transfer of the second imaging element and the third imaging element are similar to the series of operations including the charge storage, the reset operation, and the charge transfer in the past.

In Embodiment 5, the so-called overflown electrons are sent to the drive circuit through the discharge electrode 26. Therefore, leakage of the electrons to charge storage portions of adjacent pixels can be suppressed, and blooming can be suppressed. This can also improve the imaging performance of the imaging element.

Embodiment 6

Embodiment 6 is a modification of Embodiments 1 to 5, and Embodiment 6 relates to an imaging element and the like including a plurality of charge storage electrode segments of the present disclosure.

Figure 6C:
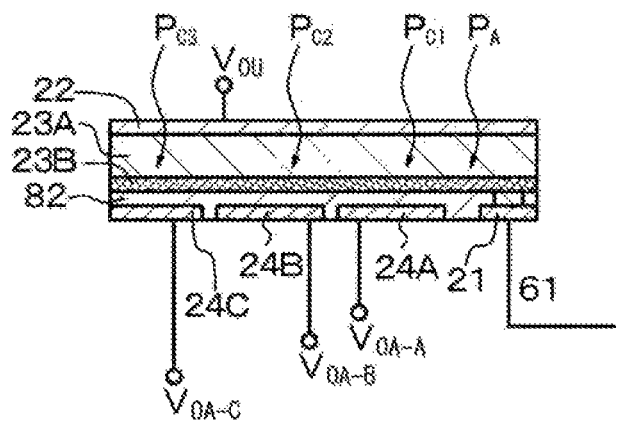
Figure 28:
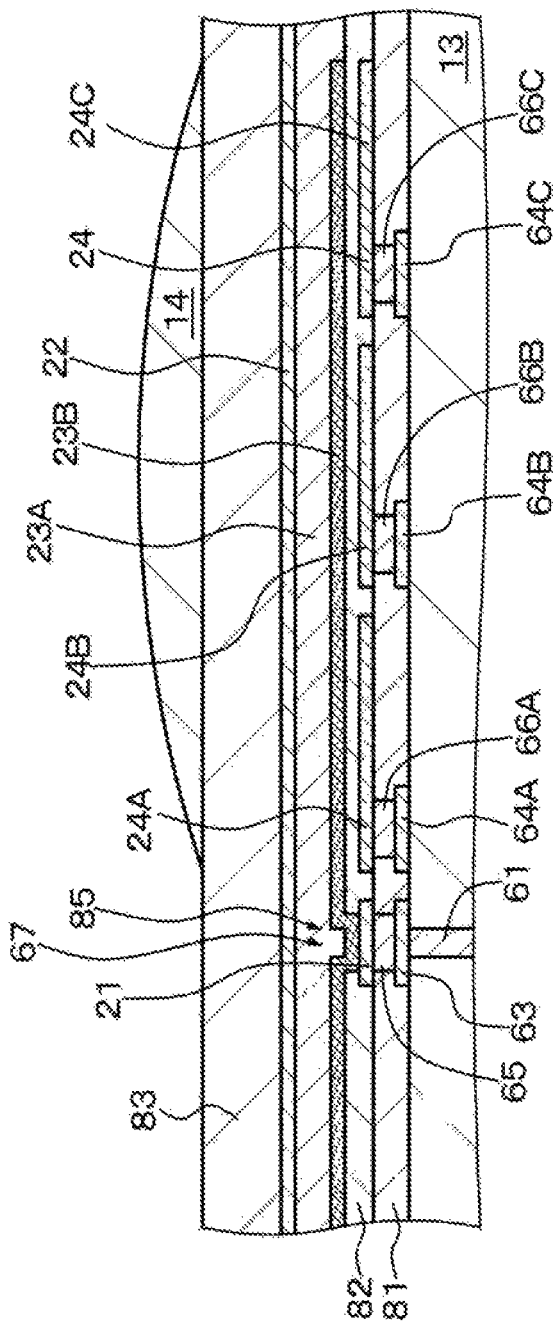
FIG. 28 is a schematic partial cross-sectional view of the imaging element of Embodiment 6.
Figure 29:
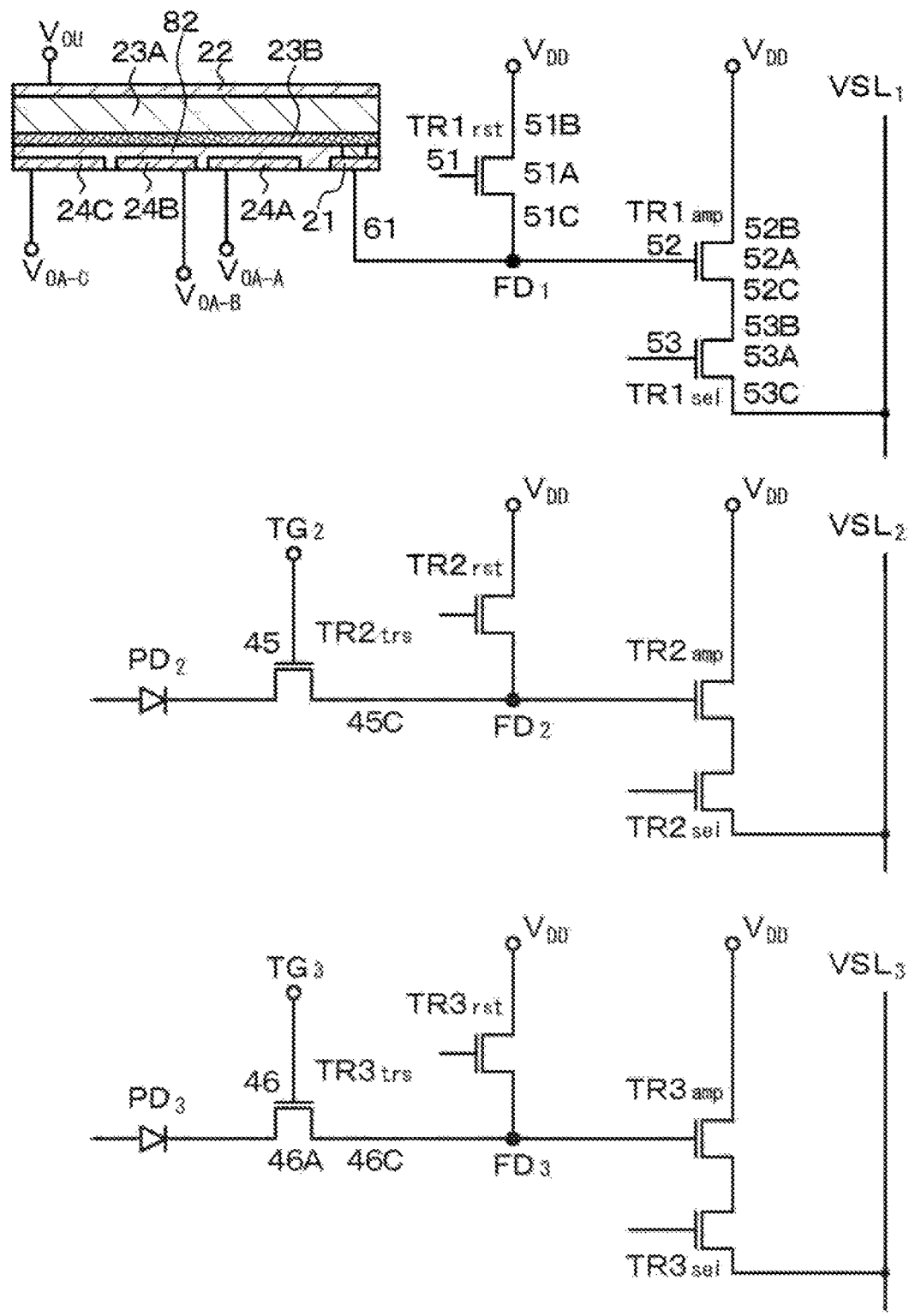
FIG. 29 is an equivalent circuit diagram of the imaging element of Embodiment 6.
Figure 30:
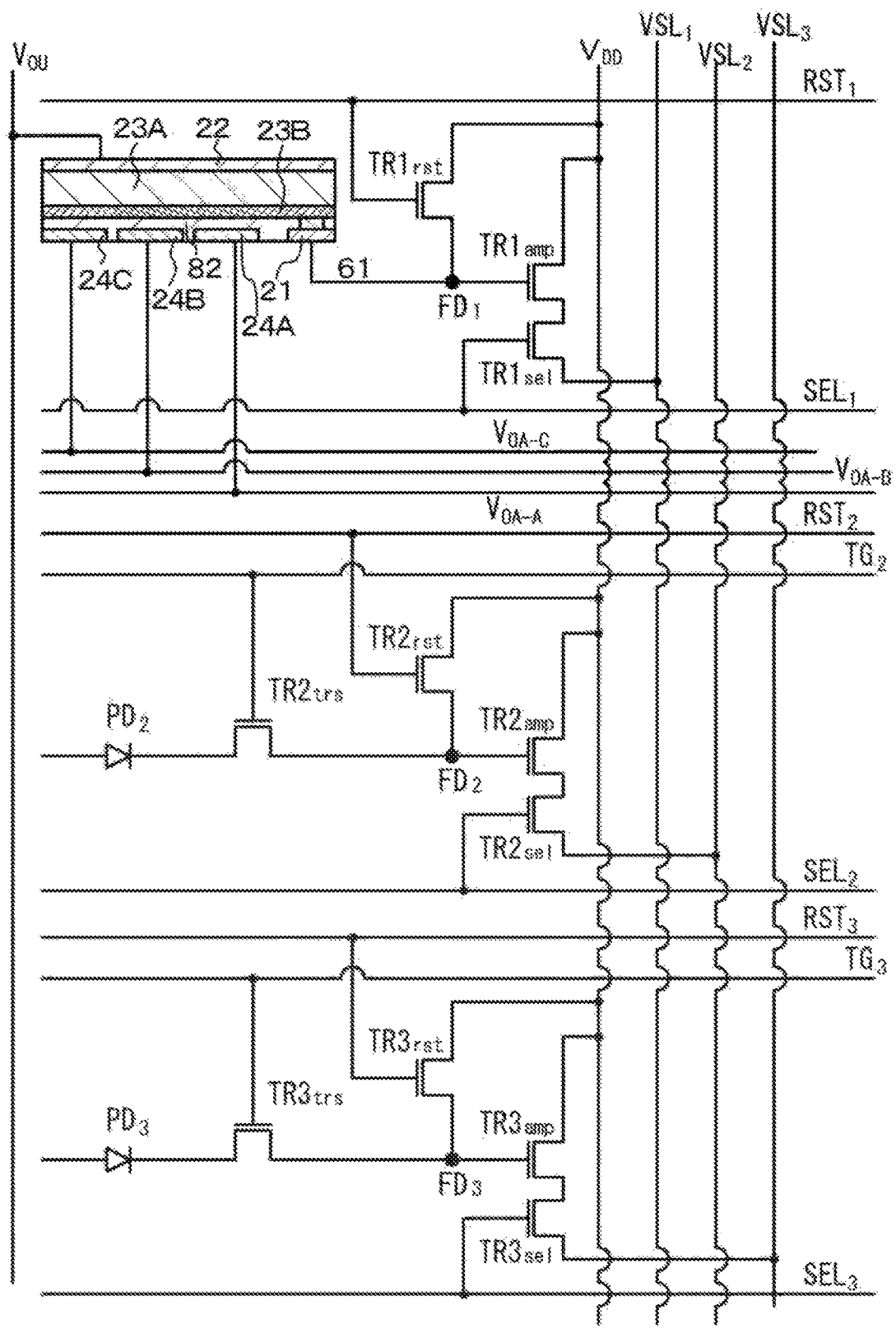
FIG. 30 is an equivalent circuit diagram of the imaging element of Embodiment 6.
Figure 31:
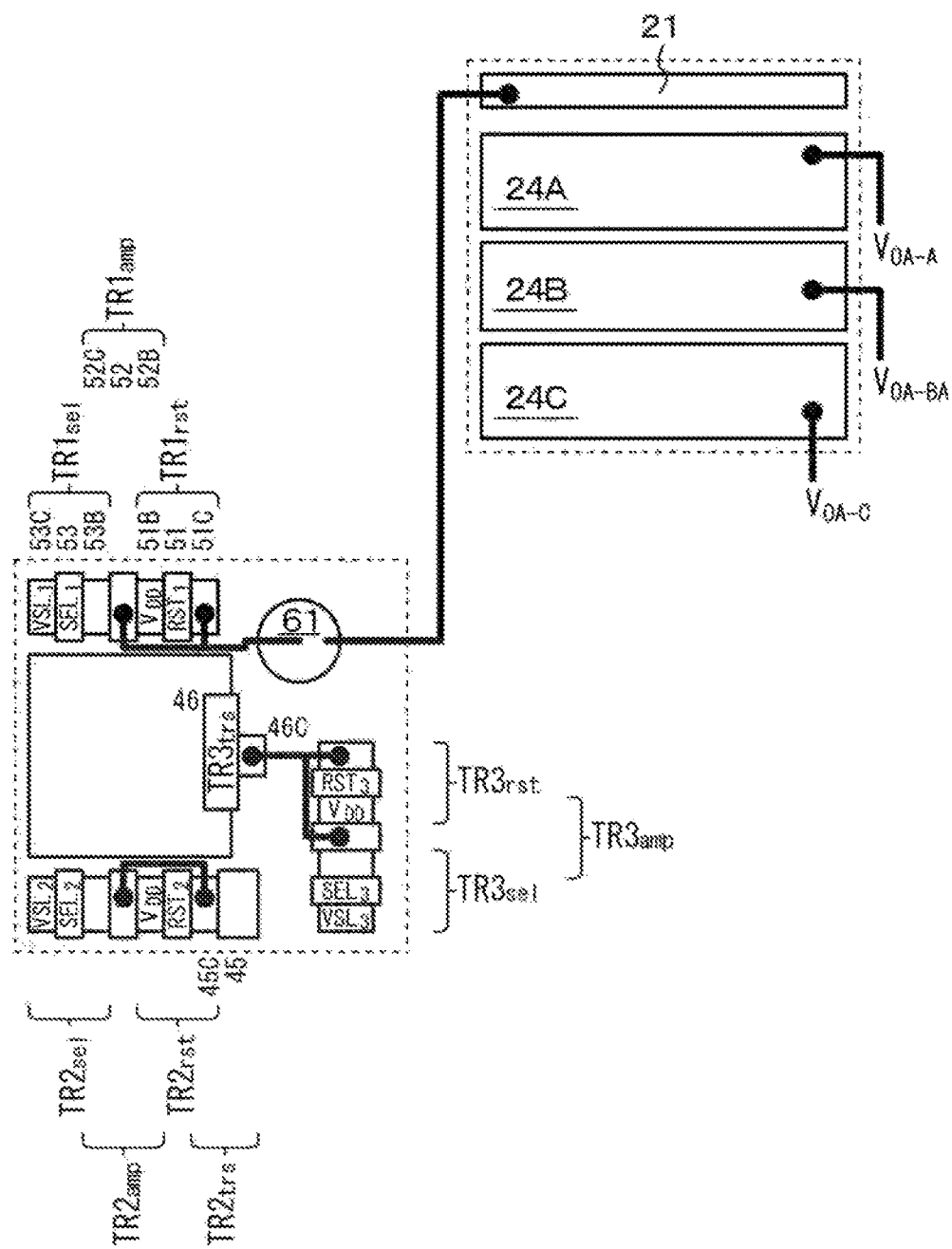
FIG. 31 is a schematic layout drawing of the first electrode, the charge storage electrode, and the transistors of the control unit included in the imaging element of Embodiment 6.
Figure 33:
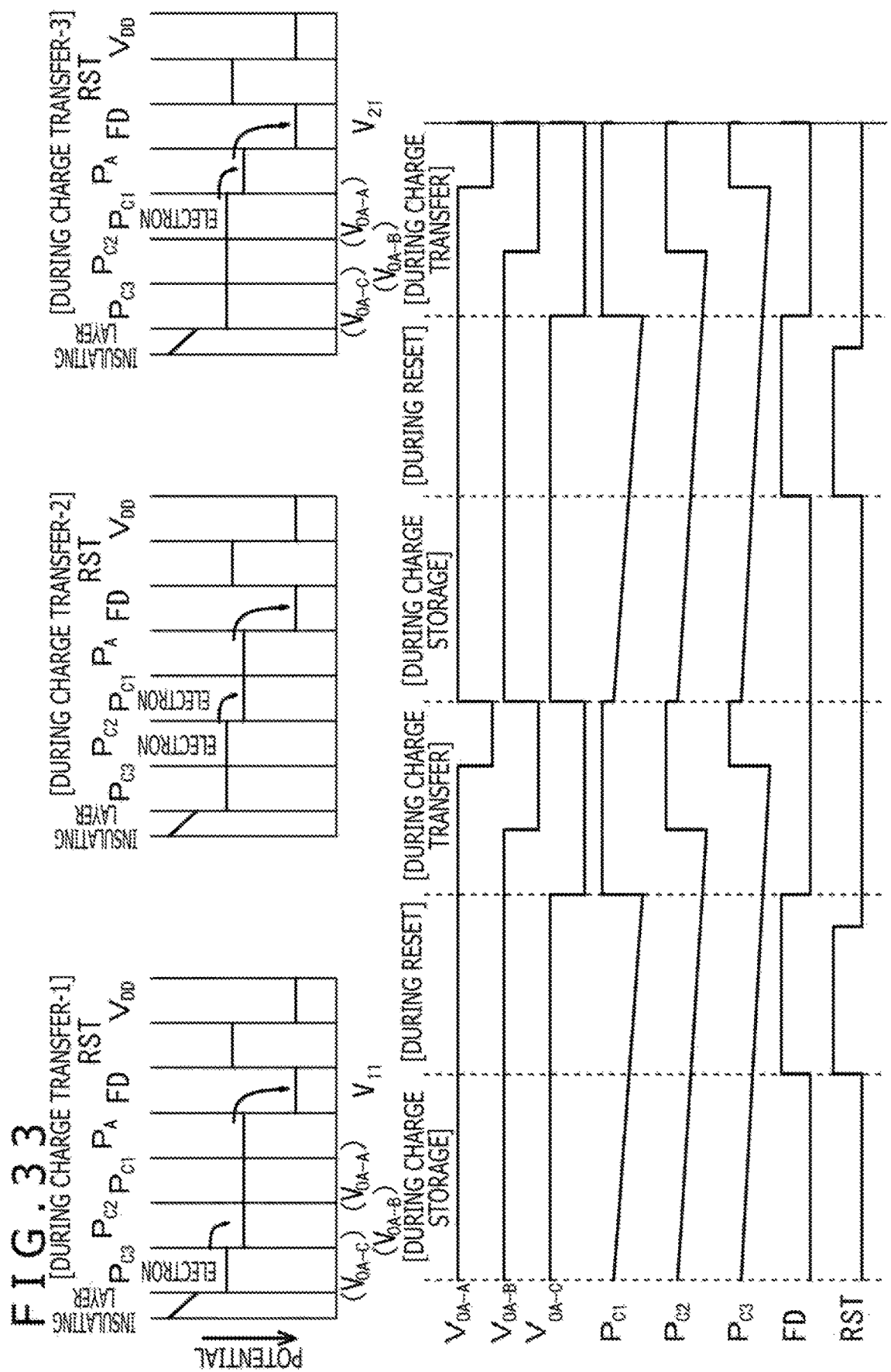
FIG. 33 is a diagram schematically illustrating a state of potential in each section during another operation (during transfer) of the imaging element of Embodiment 6.
Figure 34:
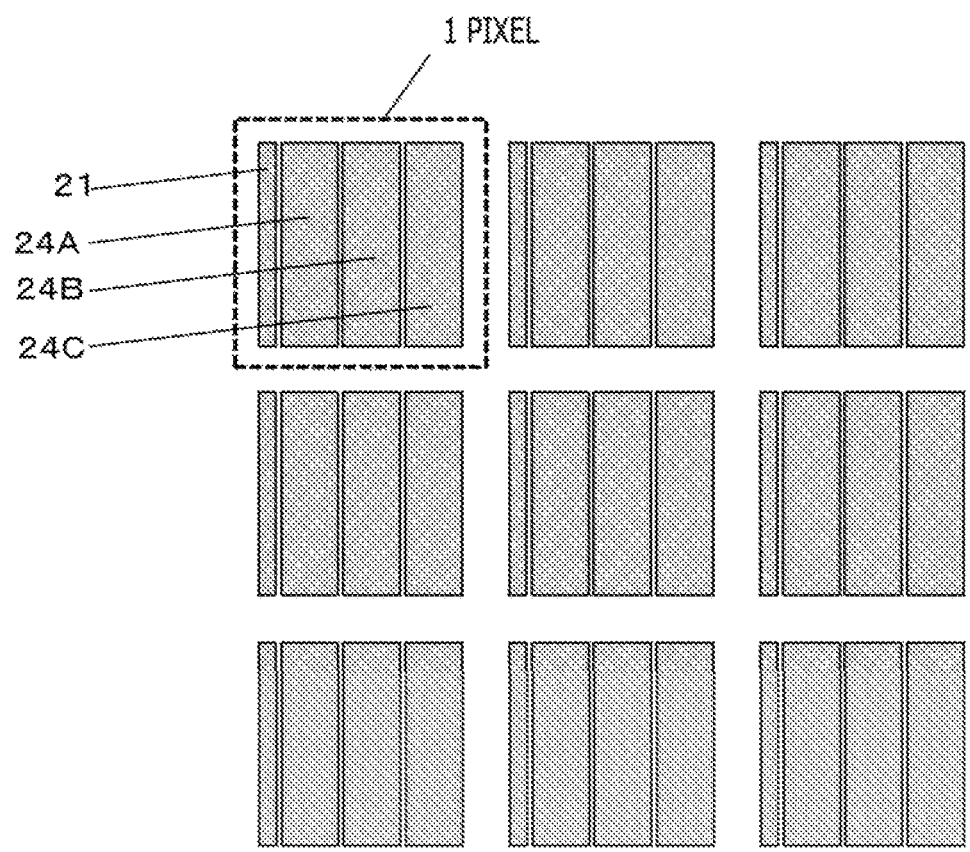
FIG. 34 is a schematic layout drawing of the first electrode and the charge storage electrode included in the imaging element of Embodiment 6.
Figure 35:
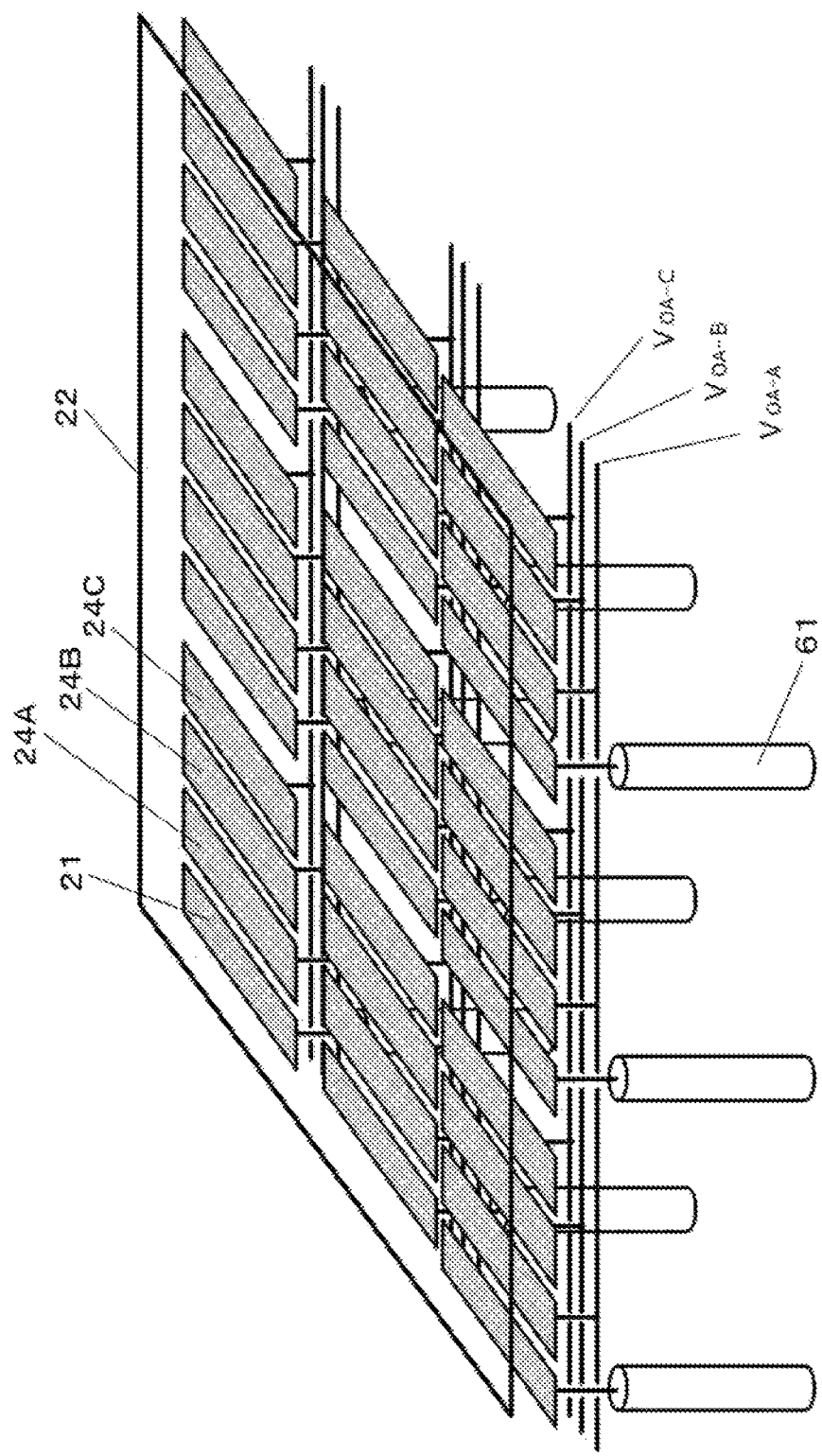
FIG. 35 is a schematic perspective view of the first electrode, the charge storage electrode, the second electrode, and the contact hole portion included in the imaging element of Embodiment 6.

FIG. 28 illustrate a schematic partial cross-sectional view of part of the imaging element of Embodiment 6. FIGS. 29 and 30 illustrate an equivalent circuit diagram of the imaging element of Embodiment 6. FIG. 31 illustrates a schematic layout drawing of the first electrode and the charge storage electrode included in the photoelectric conversion unit including the charge storage electrode and the transistors of the control unit included in the imaging element of Embodiment 6. FIGS. 32 and 33 schematically illustrate the state of potential in each section during operation of the imaging element of Embodiment 6. FIG. 6C illustrates an equivalent circuit diagram for describing each section of the imaging element of Embodiment 6. In addition, FIG. 34 illustrates a schematic layout drawing of the first electrode and the charge storage electrode included in the photoelectric conversion unit including the charge storage electrode of the imaging element of Embodiment 6. FIG. 35 illustrates a schematic perspective view of the first electrode, the charge storage electrode, the second electrode, and the contact hole portion.

In Embodiment 6, the charge storage electrode 24 includes the plurality of charge storage electrode segments 24A, 24B, and 24C. The number of charge storage electrode segments can be equal to or greater than 2, and the number is "3" in embodiment 6. In addition, the potential of the first electrode 21 is higher than the potential of the second electrode 22 in the imaging element of Embodiment 6. That is, for example, a positive potential is applied to the first electrode 21, and a negative potential is applied to the second electrode 22. Furthermore, in the charge transfer period, the potential applied to the charge storage electrode segment 24A positioned at a place closest to the first electrode 21 is higher than the potential applied to the charge storage electrode segment 24C positioned at a place farthest from the first electrode 21. In this way, a potential gradient is provided to the charge storage electrode 24. That is, the electrons stopped in the region of the inorganic oxide semiconductor material layer 23B and the like facing the charge storage electrode 24 are more certainly read out to the first electrode 21 and further to the first floating diffusion layer $FD_1$. That is, the charge stored in the inorganic oxide semiconductor material layer 231B and the like is read out to the control unit.

Figure 32:
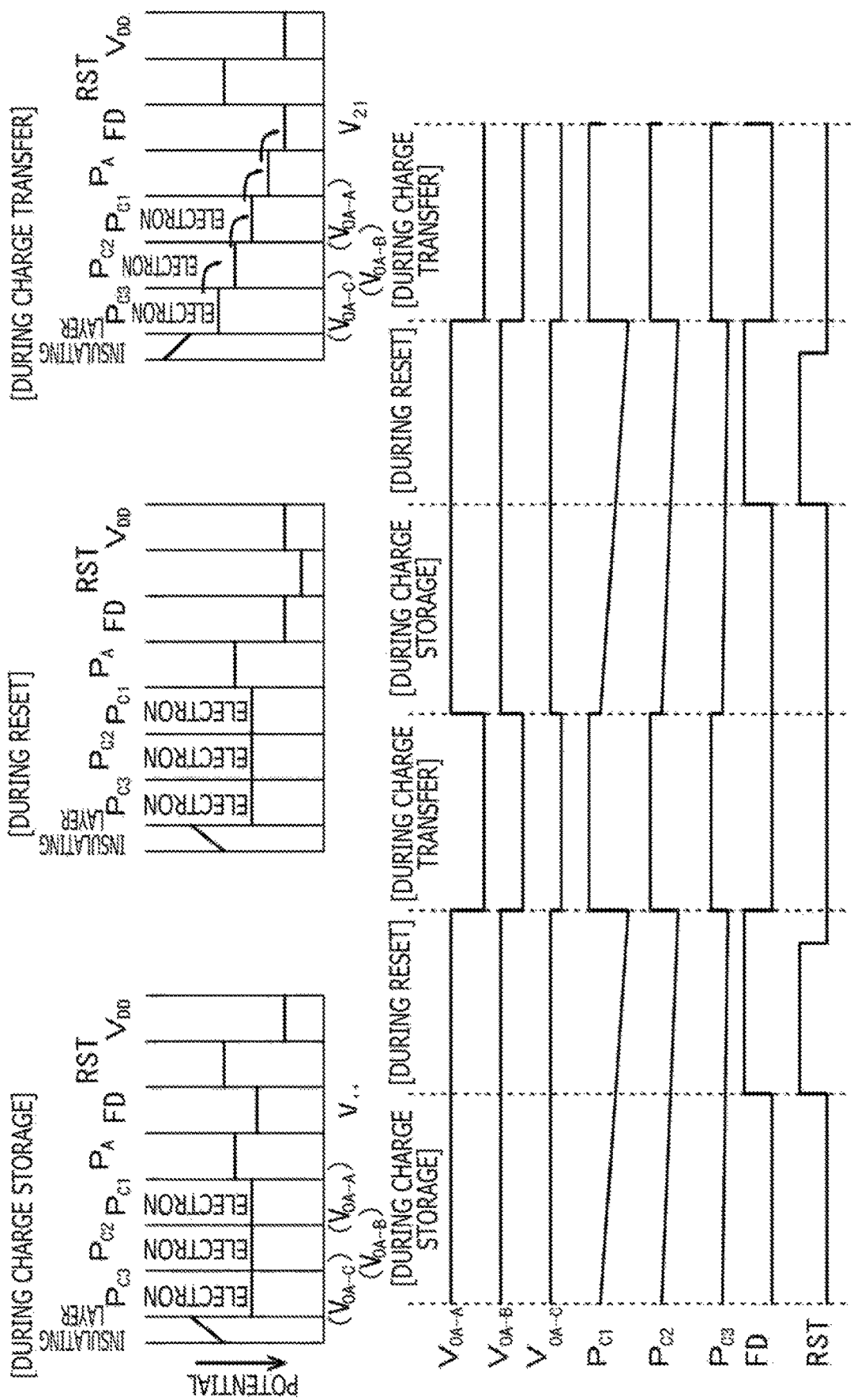
FIG. 32 is a diagram schematically illustrating a state of potential in each section during operation of the imaging element of Embodiment 6.

In the example illustrated in FIG. 32, the potential of the charge storage electrode segment 24C<the potential of the charge storage electrode segment 24B<the potential of the charge storage electrode segment. 24A holds in the charge transfer period. In this way, the electrons stopped in the region of the inorganic oxide semiconductor material layer 23B and the like are read out to the first floating diffusion layer $FD_1$ all at once. On the other hand, in the example illustrated in FIG. 33, the potential of the charge storage electrode segment 240, the potential of the charge storage electrode segment 24B, and the potential of the charge storage electrode segment 24A are gradually changed (that is, changed step-wise or in a slope shape) in the charge transfer period. In this way, the electrons stopped in the region of the inorganic oxide semiconductor material layer 23B and the like facing the charge storage electrode segment 240 are moved to the region of the inorganic oxide semiconductor material layer 23B and the like facing the charge storage electrode segment 24B. Then, the electrons stopped in the region of the inorganic oxide semiconductor material layer 23B and the like facing the charge storage electrode segment 241B are moved to the region of the inorganic oxide semiconductor material layer 23B and the like facing the charge storage electrode segment 24A. Then, the electrons stopped in the region of the inorganic oxide semiconductor material layer 23B and the like facing the charge storage electrode segment 24A are certainly read out to the first floating diffusion layer $FD_1$.

Figure 36:
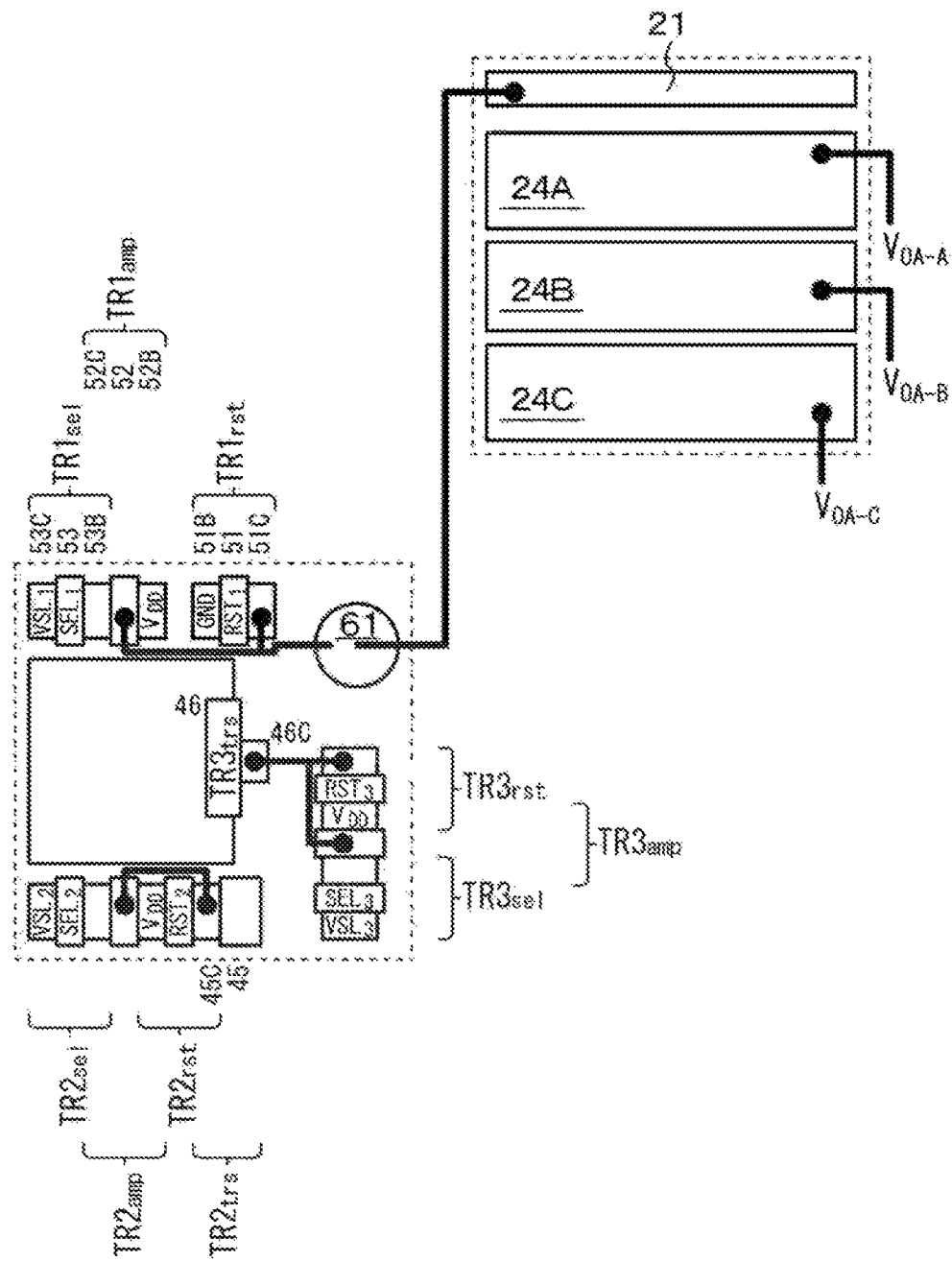
FIG. 36 is a schematic layout drawing of the first electrode and the charge storage electrode included in a modified example of the imaging element of Embodiment 6.

As in FIG. 36 illustrating a schematic layout drawing of the first electrode, the charge storage electrode, and the transistors of the control unit included in the modified example of the imaging element of Embodiment 6, the other source/drain region 51B of the reset transistor $TR1_{rst}$ may be grounded, instead of connecting the other source/drain region 51B to the power source $V_{DD}$.

Embodiment 7

Embodiment 7 is a modification of Embodiments 1 to 6, and Embodiment 7 relates to the imaging elements of the first configuration and the sixth configuration.

Figure 37:
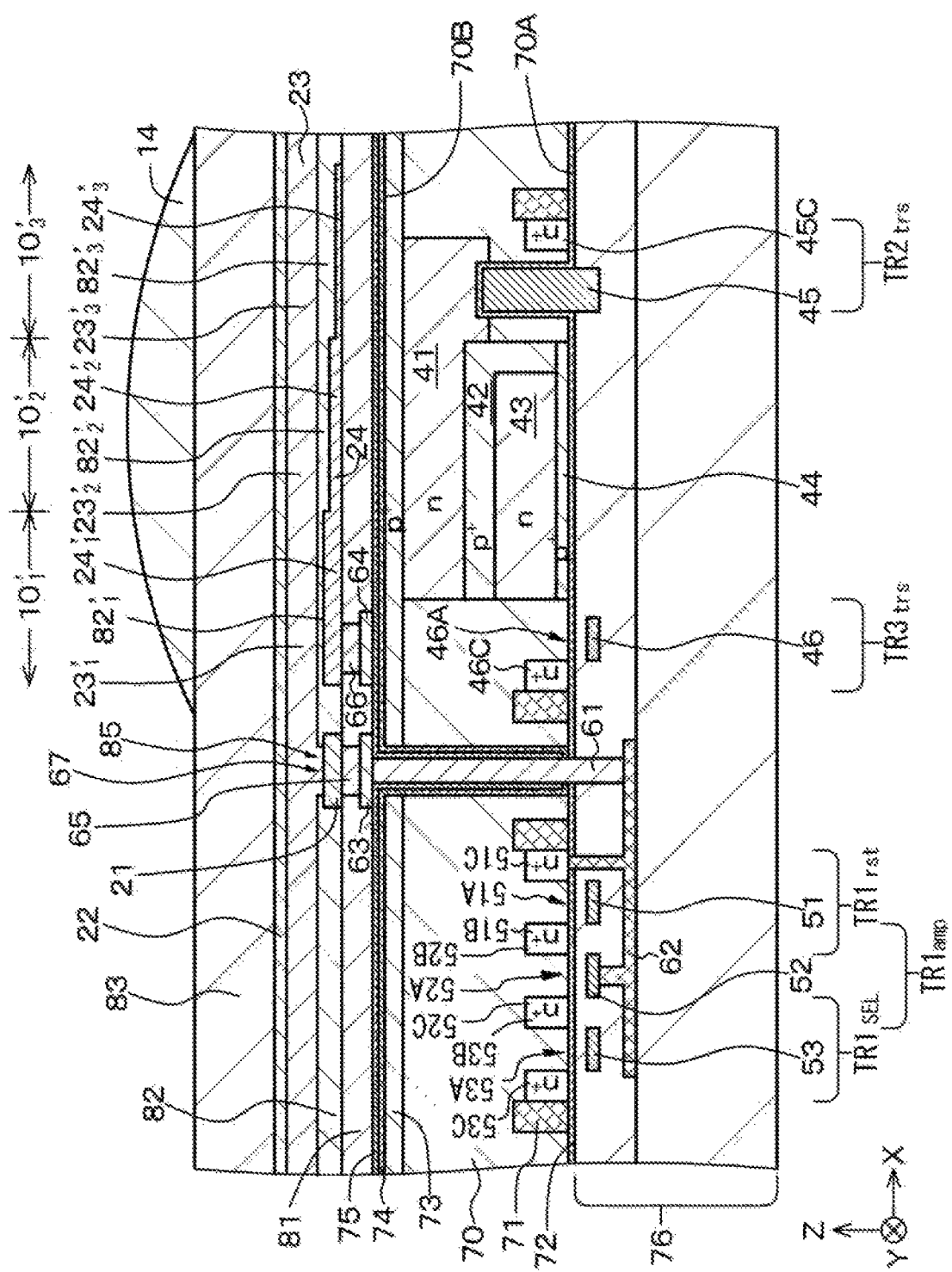
FIG. 37 is a schematic partial cross-sectional view of an imaging element of Embodiment 7.
Figure 38:
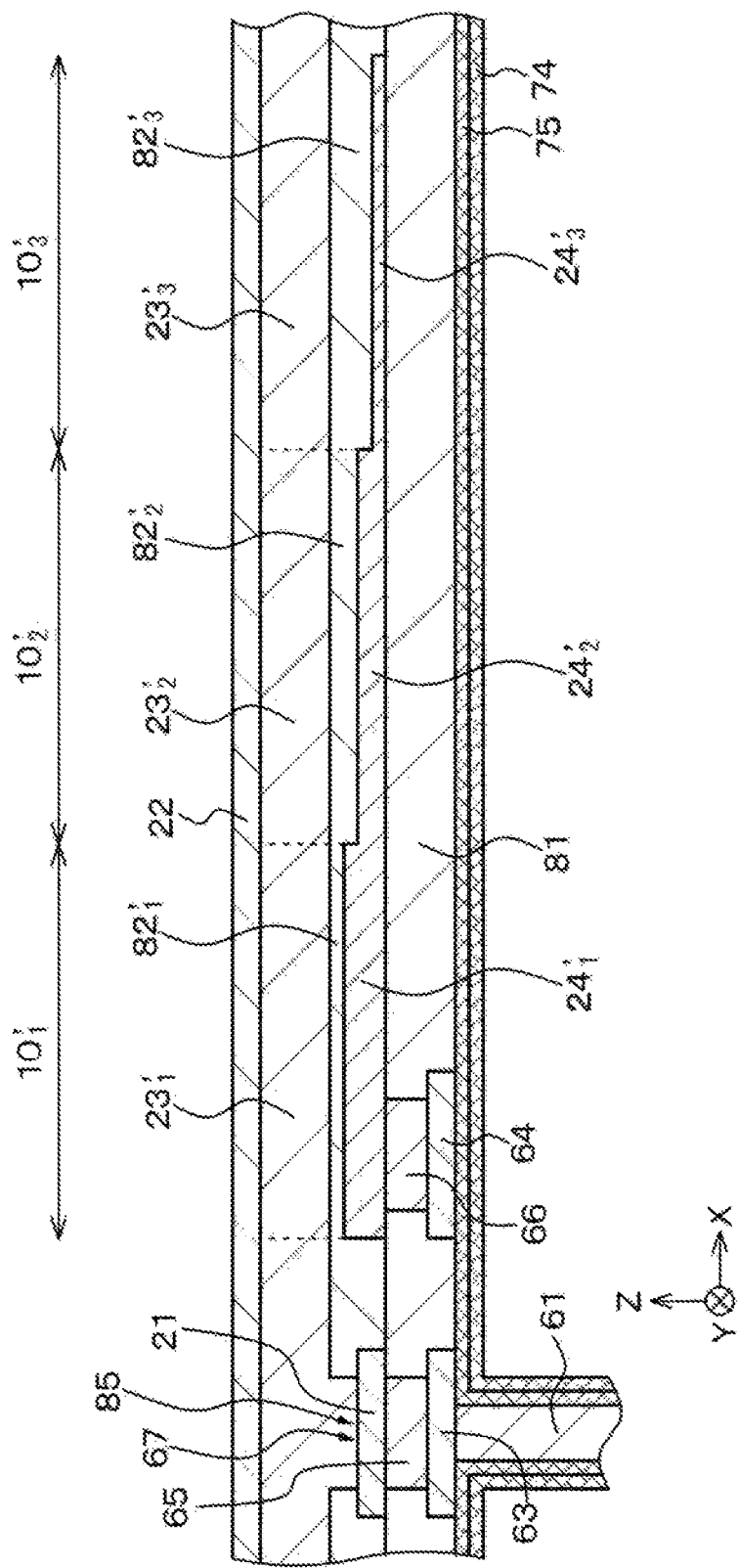
FIG. 38 is an enlarged schematic partial cross-sectional view of a stacked part of the charge storage electrode, a photoelectric conversion layer, and the second electrode in the imaging element of Embodiment 7.

FIG. 37 illustrates a schematic partial cross-sectional view of the imaging element of Embodiment 7. FIG. 38 illustrates an enlarged schematic partial cross-sectional view of the part where the charge storage electrode, the inorganic oxide semiconductor material layer, the photoelectric conversion layer, and the second electrode are stacked. The equivalent circuit diagram of the imaging element of Embodiment 7 is similar to the equivalent circuit diagram of the imaging element of Embodiment 1 described in FIGS. 2 and 3. The schematic layout drawing of the first electrode and the charge storage electrode included in the photoelectric conversion unit including the charge storage electrode and the transistors of the control unit included in the imaging element of Embodiment 7 is similar to the imaging element of Embodiment 1 described in FIG. 4. Furthermore, the operation of the imaging element (first imaging element) of Embodiment 7 is substantially similar to the operation of the imaging element of Embodiment 1.

Here, in the imaging element of Embodiment 7 or imaging elements of Embodiments 8 to 12 described later, the photoelectric conversion unit includes N (where N≥2) photoelectric conversion unit segments (specifically, three photoelectric conversion unit segments $10'_1$, $10'_2$, and $10'_3$), the inorganic oxide semiconductor material layer 23B and the photoelectric conversion layer 23A include N photoelectric conversion layer segments (specifically, three photoelectric conversion layer segments $23'_1$, $23'_2$, and $23'_3$) and the insulating layer 82 includes N insulating layer segments (specifically, three insulating layer segments $82'_1$, $82'_2$, and $82'_3$).

In Embodiments 7 to 9, the charge storage electrode 24 includes N charge storage electrode segments (specifically, three charge storage electrode segments $24'_3$, $24'_2$, and $24'_3$ in each Embodiment).

In Embodiments 10 and 11 and in Embodiment 9 depending on the case, the charge storage electrode 24 includes N charge storage electrode segments (specifically, three charge storage electrode segments $24'_1$, $24'_2$, and $24'_3$) arranged apart from each other, an nth (where, n=1, 2, 3 . . . N) photoelectric conversion unit segment $10'_n$ includes an nth charge storage electrode segment $24'_n$, an nth insulating layer segment $82'_n$, and an nth photoelectric conversion layer segment $23'_n$, and the larger the value of n of the photoelectric conversion unit segment, the farther the position of the photoelectric conversion unit segment from the first electrode 21. Here, the photoelectric conversion layer segments $23'_1$, $23'_2$, and $23'_3$ denote segments in which the photoelectric conversion layers and the inorganic oxide semiconductor material layers are stacked, and in the drawings, the segment is expressed by one layer for the simplification of the drawings. This similarly applies to the following description.

Note that in the photoelectric conversion layer segment, the thickness of the part of the photoelectric conversion layer may be changed, and the thickness of the part of the inorganic oxide semiconductor material layer may be maintained to change the thickness of the photoelectric conversion layer segment. The thickness of the part of the photoelectric conversion layer may be maintained, and the thickness of the part of the inorganic oxide semiconductor material layer may be changed to change the thickness of the photoelectric conversion layer segment. The thickness of the part of the photoelectric conversion layer may be changed, and the thickness of the part of the inorganic oxide semiconductor material layer may be changed to change the thickness of the photoelectric conversion layer segment.

Alternatively, the imaging element of Embodiment 7 or the imaging elements of Embodiments 8 and 11 described later include a photoelectric conversion unit including the first electrode 21, the inorganic oxide semiconductor material layer 23B, the photoelectric conversion layer 23A, and the second electrode 22 that are stacked, in which the photoelectric conversion unit further includes the charge storage electrode 24 arranged apart from the first electrode 21 and arranged to face the inorganic oxide semiconductor material layer 23B through the insulating layer 82, and the cross-sectional area of the stacked part of the charge storage electrode 24, the insulating layer 82, the inorganic oxide semiconductor material layer 23B, and the photoelectric conversion layer 23A when the stacked part is cut in a YZ virtual plane changes in accordance with the distance from the first electrode, where a Z direction is the stacking direction of the charge storage electrode 24, the insulating layer 82, the inorganic oxide semiconductor material layer 23B, and the photoelectric conversion layer 23A, and an X direction is a direction away from the first electrode 21.

Furthermore, in the imaging element of Embodiment 7, the thicknesses of the insulating layer segments gradually change from the first photoelectric conversion unit segment $10'_1$ to an Nth photoelectric conversion unit segment $10'_N$. Specifically, the thicknesses of the insulating layer segments gradually increase. Alternatively, in the imaging element of Embodiment 7, the width of the cross section of the stacked part is constant, and the thickness of the cross section of the stacked part, specifically, the thickness of the insulating layer segment, gradually increases in accordance with the distance from the first electrode 21. Note that the thicknesses of the insulating layer segments increase step-wise. The thickness of the insulating layer segment $82'_n$ in the nth photoelectric conversion unit segment $10'_n$ is constant. Assuming that the thickness of the insulating layer segment $82'_n$ in the nth photoelectric conversion unit segment $10'_n$ is "1," the thickness of an insulating layer segment $82'_{(n+1)}$ in an (n+1)th photoelectric conversion unit segment $10'_{(n+1)}$ can be 2 to 10. However, the values are not limited to these, in Embodiment 7, the thicknesses of the charge storage electrode segments $24'_1$, $24'_2$, and $24'_3$ are gradually reduced to gradually increase the thicknesses of the insulating layer segments $82'_1$, $82'_2$, and $82'_3$. The thicknesses of the photoelectric conversion layer segments $23'_1$, $23'_2$, and $23'_3$ are constant.

Hereinafter, an operation of the imaging element of Embodiment 7 will be described.

In the charge storage period, the drive circuit applies the potential $V_{11}$ to the first electrode 21 and applies the potential $V_{12}$ to the charge storage electrode 24. The light incident on the photoelectric conversion layer 23A causes photoelectric conversion in the photoelectric conversion layer 23A. The electron holes generated by the photoelectric conversion are sent from the second electrode 22 to the drive circuit through the wire $V_{OU}$. On the other hand, the potential of the first electrode 21 is higher than the potential of the second electrode 22. That is, for example, a positive potential is applied to the first electrode 21, and a negative potential is applied to the second electrode 22. Therefore, the potentials are set so that $V_{12} \geq V_{11}$, preferably, $V_{12} > V_{11}$, holds. As a result, the electrons generated by the photoelectric conversion are attracted to the charge storage electrode 24, and the electrons stop in the region of the inorganic oxide semiconductor material layer 23B and the like facing the charge storage electrode 24. That is, the charge is stored in the inorganic oxide semiconductor material layer 23B and the like. $V_{12}$ is greater than $V_{11}$, and therefore, the electrons generated inside of the photoelectric conversion layer 232 do not move toward the first electrode 21. In the time course of the photoelectric conversion, the potential in the region of the inorganic oxide semiconductor material layer 23B and the like facing the charge storage electrode 24 becomes a more negative value.

In the configuration adopted in the imaging element of Embodiment 7, the thicknesses of the insulating layer segments gradually increase. Therefore, when the state shifts to $V_{12} > V_{11}$ in the charge storage period, the nth photoelectric conversion unit segment. 10'$_n$ can store more charge than the (n+1)th photoelectric conversion unit segment 10'$_{(n+1)}$. A strong electric field is also applied, and the flow of charge from the first photoelectric conversion unit segment 10'$_1$ to the first electrode 21 can be certainly prevented.

The reset operation is performed later in the charge storage period. This resets the potential of the first floating diffusion layer $FD_1$, and the potential of the first floating diffusion layer $FD_1$ shifts to the potential $V_{DD}$ of the power source.

After the completion of the reset operation, the charge is read out. That is, in the charge transfer period, the drive circuit applies the potential 21 to the first electrode 21 and applies the potential $V_{22}$ to the charge storage electrode 24. Here, the potentials are set so that $V_{21} > V_{22}$ holds. As a result, the electrons stopped in the region of the inorganic oxide semiconductor material layer 23B and the like facing the charge storage electrode 24 are read out to the first electrode 21 and further to the first floating diffusion layer $FD_1$. That is, the charge stored in the inorganic oxide semiconductor material layer 23B and the like is read out to the control unit.

More specifically, when the state shifts to $V_{21} > V_{22}$ in the charge transfer period, the flow of charge from the first photoelectric conversion unit segment 10'$_1$ to the first electrode 21 and the flow of charge from the (n+1)th photoelectric conversion unit segment 10'$_{(n+1)}$ to the nth photoelectric conversion unit segment 10'$_n$ can be certainly secured.

This completes the series of operations including the charge storage, the reset operation, and the charge transfer.

In the imaging element of Embodiment 7, the thicknesses of the insulating layer segments gradually change from the first photoelectric conversion unit segment to the Nth photoelectric conversion unit segment. Alternatively, the cross-sectional area of the stacked part of the charge storage electrode, the insulating layer, the inorganic oxide semiconductor material layer, and the photoelectric conversion layer when the stacked part is cut in the YZ virtual plane changes in accordance with the distance from the first electrode. Therefore, a kind of charge transfer gradient is formed, and the charge generated by the photoelectric conversion can be more easily and certainly transferred.

The imaging element of Embodiment 7 can be produced by a method substantially similar to the imaging element of Embodiment 1, and the details will not be described.

Note that in forming the first electrode 21, the charge storage electrode 24, and the insulating layer 82 in the imaging element of Embodiment 7, a conductive material layer for forming the charge storage electrode 24'$_3$ is deposited on the interlayer insulating layer 81 first. The conductive material layer is patterned, and the conductive material layer is left is the region where the photoelectric conversion unit segments 10'$_1$, 10'$_2$, and 10'$_3$ and the first electrode 21 are to be formed. In this way, part of the first electrode 21 and the charge storage electrode 24'$_3$ can be obtained. Next, an insulating layer for forming the insulating layer segment 82'$_3$ is deposited on the entire surface. The insulating layer is patterned, and a planarization process is executed. In this way, the insulating layer segment 82'$_3$ can be obtained. Next, a conductive material layer for forming the charge storage electrode 24'$_2$ is deposited on the entire surface, and the conductive material layer is patterned. The conductive material layer is left in the region where the photoelectric conversion unit segments 10'$_1$ and 10'$_2$ and the first electrode 21 are to be formed. In this way, part of the first electrode 21 and the charge storage electrode 24'$_2$ can be obtained. Next, an insulating layer for forming the insulating layer segment 82'$_2$ is deposited on the entire surface. The insulating layer is patterned, and a planarization process is executed. In this way, the insulating layer segment 82'$_2$ can be obtained. Next, a conductive material layer for forming the charge storage electrode 24'$_1$ is deposited on the entire surface. The conductive material layer is patterned, and the conductive material layer is left in the region where the photoelectric conversion unit segment 10'$_1$ and the first electrode 21 are to be formed. In this way, the first electrode 21 and the charge storage electrode 24'$_1$ can be obtained. Next, as insulating layer is deposited on the entire surface, and a planarization process is executed. In this way, the insulating layer segment 82'$_1$ (insulating layer 82) can be obtained. Furthermore, the inorganic oxide semiconductor material layer 23B and the photoelectric conversion layer 23A are formed on the insulating layer 82. In this way, the photoelectric conversion unit segments 10'$_1$, 10'$_2$, and 10'$_3$ can be obtained.

Figure 39:
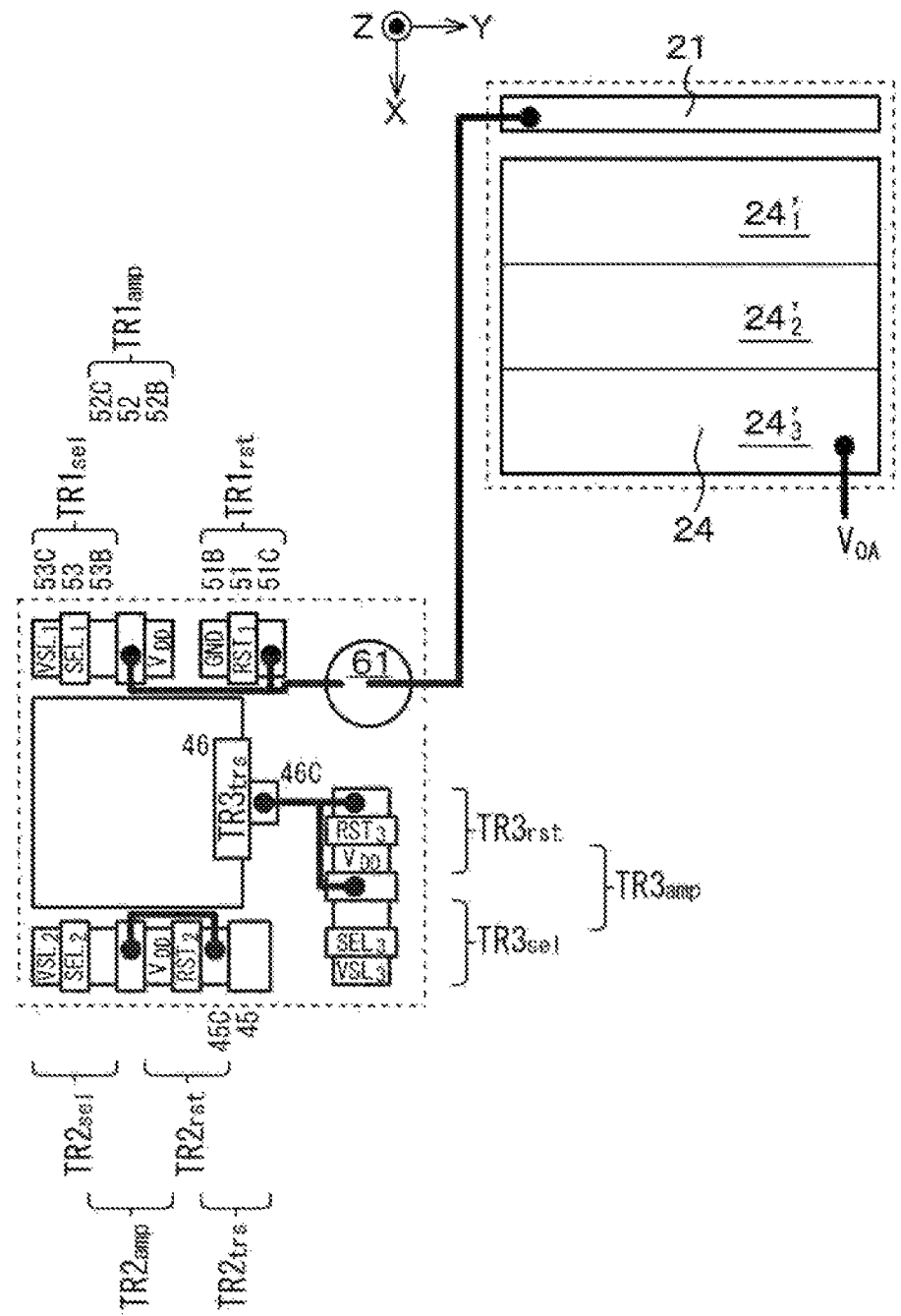
FIG. 39 is a schematic layout drawing of the first electrode, the charge storage electrode, and the transistors of the control unit in a modified example of the imaging element of Embodiment 7.

As in FIG. 39 illustrating a schematic layout drawing of the first electrode, the charge storage electrode, and the transistors of the control unit included in the modified example of the imaging element of Embodiment 7, the other source/drain region 51B of the reset transistor TR1$_{rst}$ may be grounded, instead of connecting the other source/drain region 51B to the power source $V_{DD}$.

Embodiment 8

Figure 40:
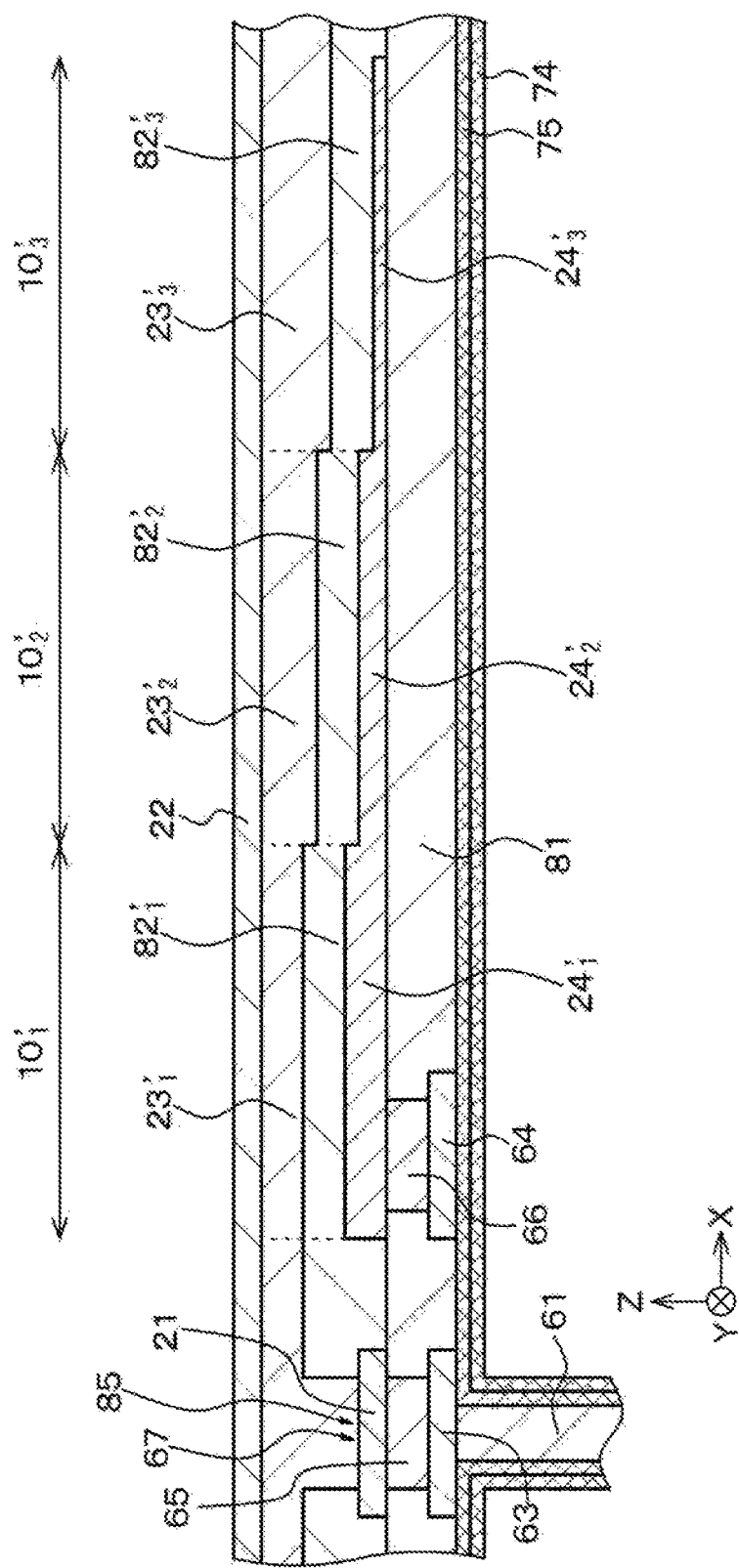
FIG. 40 is an enlarged schematic partial cross-sectional view of a stacked part of the charge storage electrode, the photoelectric conversion layer, and the second electrode in an imaging element of Embodiment 8.

An imaging element of Embodiment 8 relates to the imaging elements of the second configuration and the sixth configuration of the present disclosure. As in FIG. 40 illustrating an enlarged schematic partial cross-sectional view of the part in which the charge storage electrode, the inorganic oxide semiconductor material layer, the photoelectric conversion layer, and the second electrode are stacked, the thicknesses of the photoelectric conversion layer segments gradually change from the first photoelectric conversion unit segment 10'$_1$ to the Nth photoelectric conversion unit segment $10'_N$ in the imaging element of Embodiment 8. Alternatively, in the imaging element of Embodiment 8, the widths of the cross sections of the stacked parts are constant, and the thicknesses of the cross sections of the stacked parts, specifically, the thicknesses of the photoelectric conversion layer segments, gradually increase in accordance with the distance from the first electrode 21. More specifically, the thicknesses of the photoelectric conversion layer segments gradually increase. Note that the thicknesses of the photoelectric conversion layer segments increase step-wise. The thickness of the photoelectric conversion layer segment $23'_n$ in the nth photoelectric conversion unit segment $10'_n$ is constant. Assuming that the thickness of the photoelectric conversion layer segment $23'_n$ in the nth photoelectric conversion unit segment $10'_n$ is "1," the thickness of a photoelectric conversion layer segment $23_{(n+1)}$ in the (n+1)th photoelectric conversion unit segment $10'_{(n+1)}$ can be 2 to 10. However, the values are not limited to these. In Embodiment 8, the thicknesses of the charge storage electrode segments $24'_1$, $24'_2$, and $24'_3$ are gradually reduced to gradually increase the thicknesses of the photoelectric conversion layer segments $23'_1$, $23'_2$, and $23'_3$. The thicknesses of the insulating layer segments $82'_1$, $82'_2$, and $82'_3$ are constant. Furthermore, in the photoelectric conversion layer segment, the thickness of the part of the inorganic oxide semiconductor material layer can be maintained, and the thickness of the part of the photoelectric conversion layer can be changed to change the thickness of the photoelectric conversion layer segment, for example.

In the imaging element of Embodiment 8, the thicknesses of the photoelectric conversion layer segments gradually increase. Therefore, when the state shifts to $V_{12} \geq V_{11}$ in the charge storage period, a stronger electric field is applied to the nth photoelectric conversion unit segment $10'_n$ than to the (n+1)th photoelectric conversion unit segment $10'_{(n+1)}$. This can certainly prevent the flow of charge from the first photoelectric conversion unit segment $10'_1$ to the first electrode 21. Furthermore, when the state shifts to $V_{22} < V_{21}$ in the charge transfer period, the flow of charge from the first photoelectric conversion unit segment $10'_1$ to the first electrode 21 and the flow of charge from the (n+1)th photoelectric conversion unit segment $10'_{(n+1)}$ to the nth photoelectric conversion unit segment $10'_n$ can be certainly secured.

In this way, in the imaging element of Embodiment 8, the thicknesses of the photoelectric conversion layer segments gradually change from the first photoelectric conversion unit segment to the Nth photoelectric conversion unit segment. Alternatively, the cross-sectional area of the stacked part of the charge storage electrode, the insulating layer, the inorganic oxide semiconductor material layer, and the photoelectric conversion layer when the stacked part is cut in the YZ virtual plane changes in accordance with the distance from the first electrode. Therefore, a kind of charge transfer gradient is formed, and the charge generated by the photoelectric conversion can be more easily and certainly transferred.

In for the first electrode 21, the charge storage electrode 24, the insulating layer 82, the inorganic oxide semiconductor material layer 23B, and the photoelectric conversion layer 23A in the imaging element of Embodiment 8, a conductive material layer for forming the charge storage electrode $24'_3$ is deposited on the interlayer insulating layer 81 first. The conductive material layer is patterned, and the conductive material layer is left in the region where the photoelectric conversion unit segments $10'_1$, $10'_2$, and $10'_3$ and the first electrode 21 are to be formed. In this way, part of the first electrode 21 and the charge storage electrode $24'_3$ can be obtained. Next, a conductive material layer for forming the charge storage electrode $24'_2$ is deposited on the entire surface, and the conductive material layer is patterned. The conductive material layer is left in the region where the photoelectric conversion unit segments $10\alpha_1$ and $10'_2$ and the first electrode 21 are to be formed. In this way, part of the first electrode 21 and the charge storage electrode $24'_2$ can be obtained. Next, a conductive material layer for forming the charge storage electrode $24'_1$ is deposited on the entire surface, and the conductive material layer is patterned. The conductive material layer is left in the region where the photoelectric conversion unit segment $10'_1$ and the first electrode 21 are to be formed. In this way, the first electrode 21 and the charge storage electrode $24\alpha_1$ can be obtained. Next, the insulating layer 82 is conformally deposited on the entire surface. Furthermore, the inorganic oxide semiconductor material layer 23B and the photoelectric conversion layer 23A are formed on the insulating layer 82, and a planarization process is applied to the photoelectric conversion layer 23A. In this way, the photoelectric conversion unit segments $10\alpha_1$, $10'_2$, and $10'_3$ can be obtained.

Embodiment 9

Figure 41:
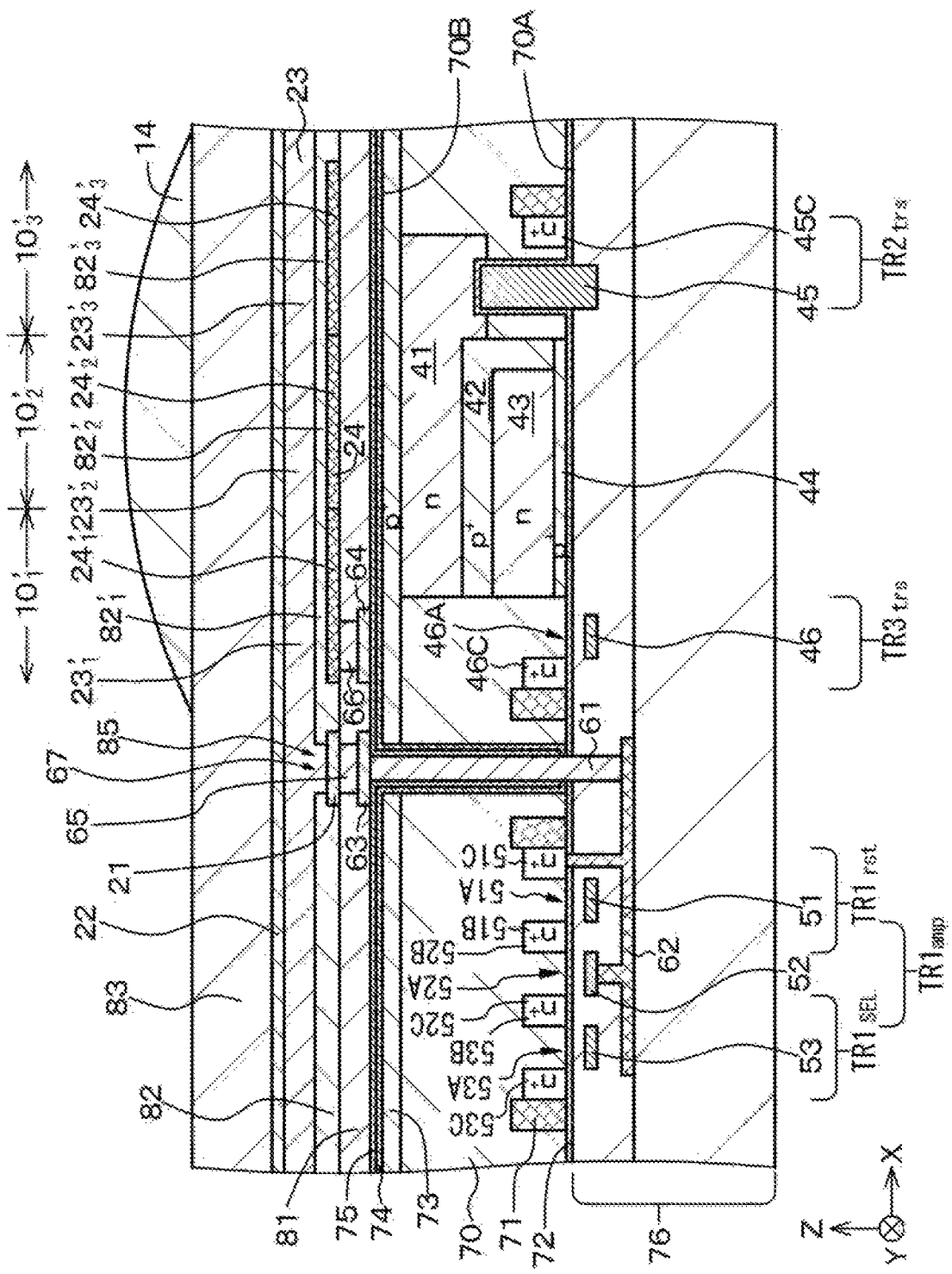
FIG. 41 is a schematic partial cross-sectional view of an imaging element of Embodiment 9.

Embodiment 9 relates to the imaging element of the third configuration. FIG. 41 illustrates a schematic partial cross-sectional view of the imaging element of Embodiment 9. In the imaging element of Embodiment 9, the materials included in the insulating layer segments vary between adjacent photoelectric conversion unit segments. Here, the values of dielectric constant of the materials included in the insulating layer segments are gradually reduced from the first photoelectric conversion unit segment $10\alpha_1$ to the Nth photoelectric conversion unit segment $10'_N$. In the imaging element of Embodiment 9, the same potential may be applied to all of the N charge storage electrode segments, or a different potential may be applied to each of the N charge storage electrode segments in the latter case, the charge storage electrode segments $24'_1$, $24'_2$, and $24'_3$ arranged apart from each other is only required to be connected to the vertical drive circuit 112 included in the drive circuit through pad portions $64_1$, $64_2$, and $64_3$ as described in Embodiment 10.

In addition, by adopting the configuration, a kind of charge transfer gradient is formed. When the state shifts to $V_{12} \geq V_{11}$ in the charge storage period, the nth photoelectric conversion unit segment can store more charge than the (n+1)th photoelectric conversion unit segment. Furthermore, when the state shifts to $V_{22} < V_{21}$ in the charge transfer period, the flow of charge from the first photoelectric conversion unit segment to the first electrode and the flow of charge from the (n+1)th photoelectric conversion unit segment to the nth photoelectric conversion unit segment can be certainly secured.

Embodiment 10

Figure 42:
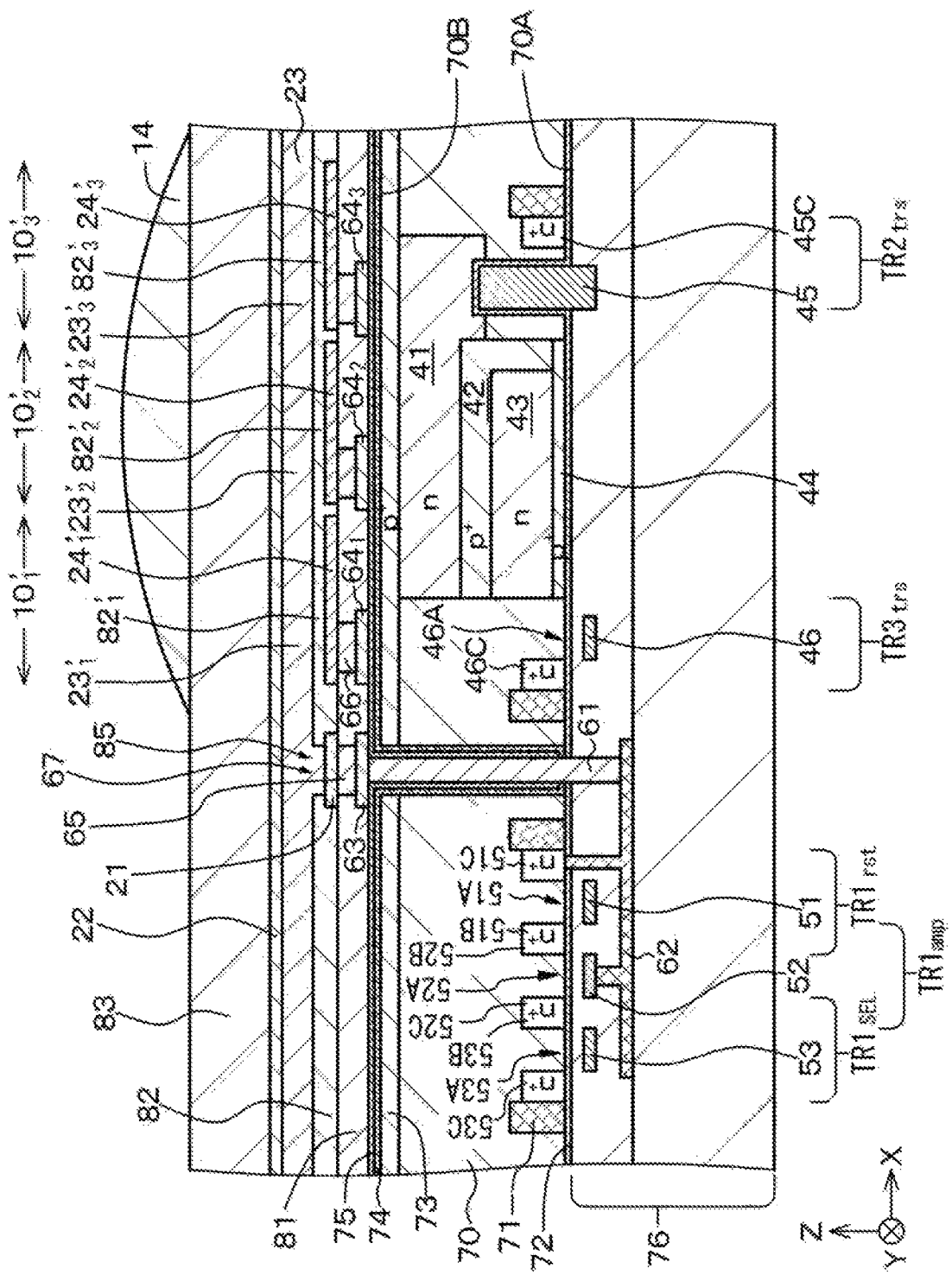
FIG. 42 is a schematic partial cross-sectional view of imaging elements of Embodiment 10 and Embodiment 11.
Figure 43A:
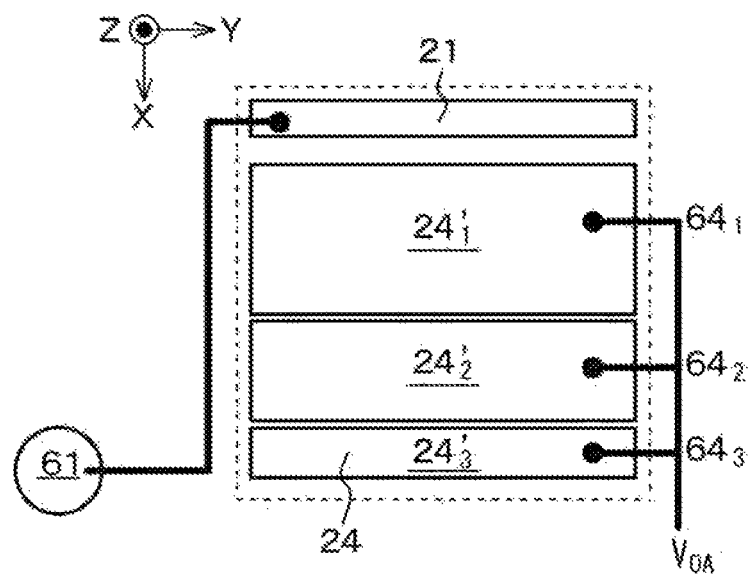
FIGS. 43A and 43B are schematic plan views of charge storage electrode segments in Embodiment 11.
Figure 43B:
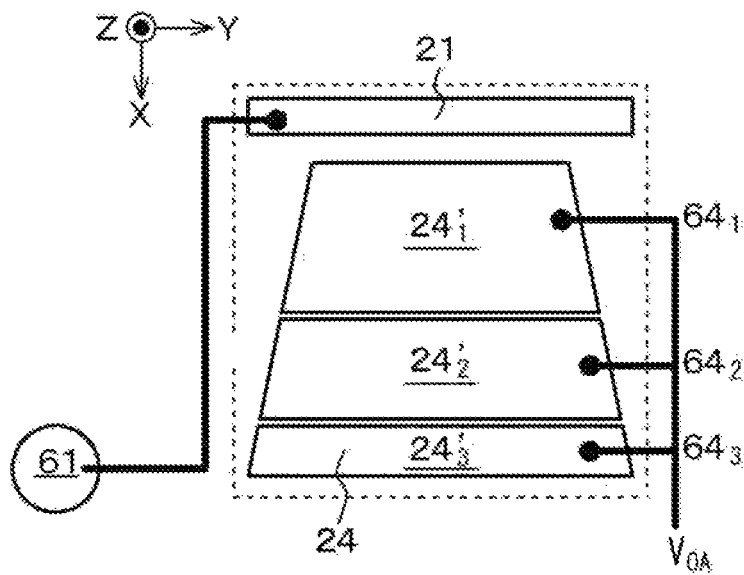
Figure 44A:
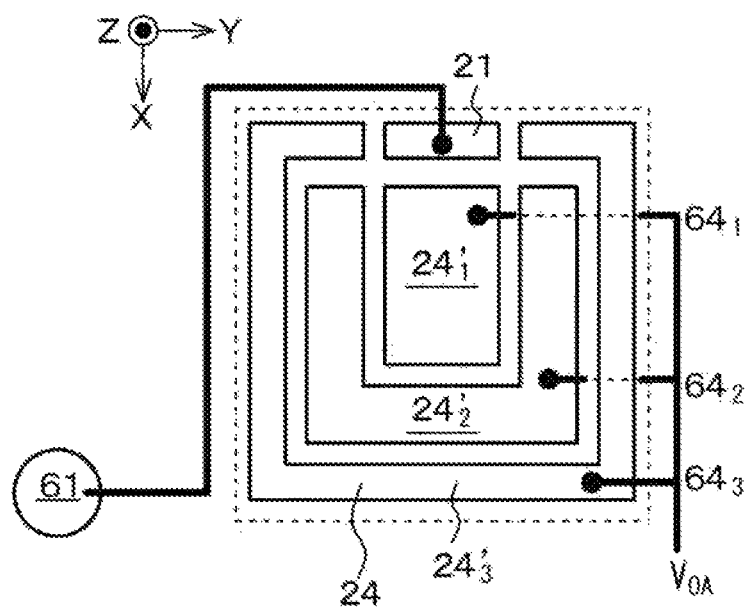
FIGS. 44A and 44B are schematic plan views of the charge storage electrode segments in Embodiment 11.
Figure 44B:
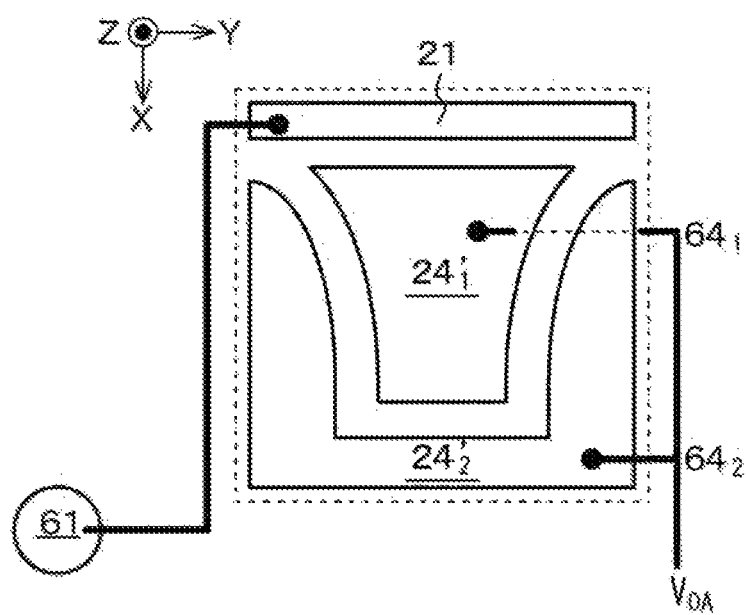

Embodiment 10 relates to the imaging element of the fourth configuration. FIG. 42 illustrates a schematic partial cross-sectional view of the imaging element of Embodiment 10. In the imaging element of Embodiment 10, the materials included in the charge storage electrode segments vary between adjacent photoelectric conversion unit segments. Here, the values of work function of the materials included in the insulating layer segments are gradually increased from the first photoelectric conversion unit segment $10\alpha_1$ to the Nth photoelectric conversion unit segment $10'_N$. In the imaging element of Embodiment 10, the same potential may be applied to all of the N charge storage electrode segments, or a different potential may be applied to each of the N charge storage electrode segments. In the latter case, the charge storage electrode segments $24'_1$, $24'_2$, and $24'_3$ can be connected to the vertical drive circuit 112 included in the drive circuit through the pad portions $64_1$, $64_2$, and $64_3$.

Embodiment 11

Figure 45:
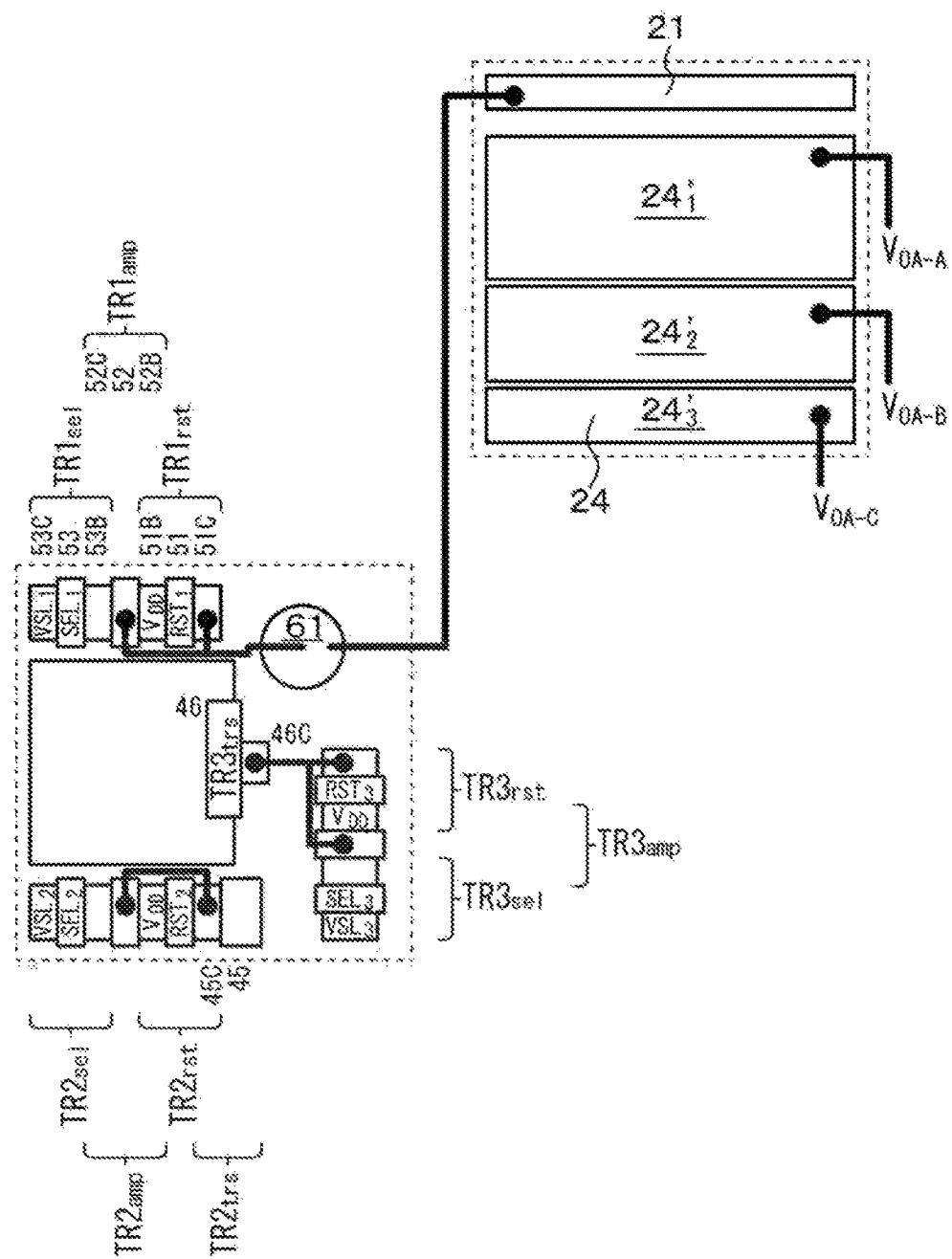
FIG. 45 is a schematic layout drawing of the first electrode, the charge storage electrode, and the transistors of the control unit included in the imaging element of Embodiment 11.

An imaging element of Embodiment 11 relates to the imaging element of the fifth configuration. FIGS. 43A, 43B, 44A, and 44B illustrate schematic plan views of the charge storage electrode segments in Embodiment 11. FIG. 45 illustrates a schematic layout drawing of the first electrode and the charge storage electrode included in the photoelectric conversion unit including the charge storage electrode and the transistors of the control unit included in the imaging element of Embodiment 11. The schematic partial cross-sectional view of the imaging element of Embodiment 11 is similar to the schematic partial cross-sectional view illustrated in FIG. 42 or 47. In the imaging element of Embodiment 11, the areas of the charge storage electrode segments gradually decrease from the first photoelectric conversion unit segment $10\alpha_1$ to the Nth photoelectric conversion unit segment $10'_N$. In the imaging element of Embodiment 11, the same potential may be applied to all of the N charge storage electrode segments, or a different potential may be applied to each of the N charge storage electrode segments. Specifically, as described in Embodiment 10, the charge storage electrode segments $24'_1$, $24'_2$, and $24'_3$ arranged apart from each other is only required to be connected to the vertical drive circuit 112 included in the drive circuit through the pad portions $64_1$, $64_2$, and $64_3$.

In Embodiment 11, the charge storage electrode 24 includes the plurality of charge storage electrode segments $24'_1$, $24'_2$, and $24'_3$. The number of charge storage electrode segments can be equal to or greater than 2, and the number is "3" in embodiment 11. In addition, the potential of the first electrode 21 is higher than the potential of the second electrode 22 in the imaging element of Embodiment 11. That is, for example, a positive potential is applied to the first electrode 21, and a negative potential is applied to the second electrode 22. Therefore, in the charge transfer period, the potential applied to the charge storage electrode segment $24'_1$ positioned at a place closest to the first electrode 21 is higher than the potential applied to the charge storage electrode segment $24'_3$ positioned at a place farthest from the first electrode 21. In this way, a potential gradient is provided to the charge storage electrode 24. Therefore, the electrons stopped in the region of the inorganic oxide semiconductor material layer 235 and the like facing the charge storage electrode 24 are more certainly read out to the first electrode 21 and further to the first floating diffusion layer $FD_1$. That is, the charge stored in the inorganic oxide semiconductor material layer 235 and the like is read out to the control unit.

Furthermore, in the charge transfer period, the potential of the charge storage electrode segment $24'_3$<the potential of the charge storage electrode segment $24'_2$<the potential of the charge storage electrode segment $24'_1$ holds. In this way, the electrons stopped in the region of the inorganic oxide semiconductor material layer 23B and the like can be read out to the first floating diffusion layer $FD_1$ all at once. Alternatively, in the charge transfer period, the potential of the charge storage electrode segment $24'_3$, the potential of the charge storage electrode segment $24'_2$, and the potential of the charge storage electrode segment $24'_1$ are gradually changed (that is, changed step-wise or in a slope shape). In this way, the electrons stopped in the region of the inorganic oxide semiconductor material layer 23B and the like facing the charge storage electrode segment $24'_3$ are moved to the region of the inorganic oxide semiconductor material layer 23B and the like facing the charge storage electrode segment $24'_2$. Then, the electrons stopped in the region of the inorganic oxide semiconductor material layer 23B and the like facing the charge storage electrode segment $24'_2$ are moved to the region of the inorganic oxide semiconductor material layer 23B and the like facing the charge storage electrode segment $24'_1$. Then, the electrons stopped in the region of the inorganic oxide semiconductor material layer 23B and the like facing the charge storage electrode segment $24\alpha_1$ can be certainly read out to the first floating diffusion layer $FD_1$.

Figure 46:
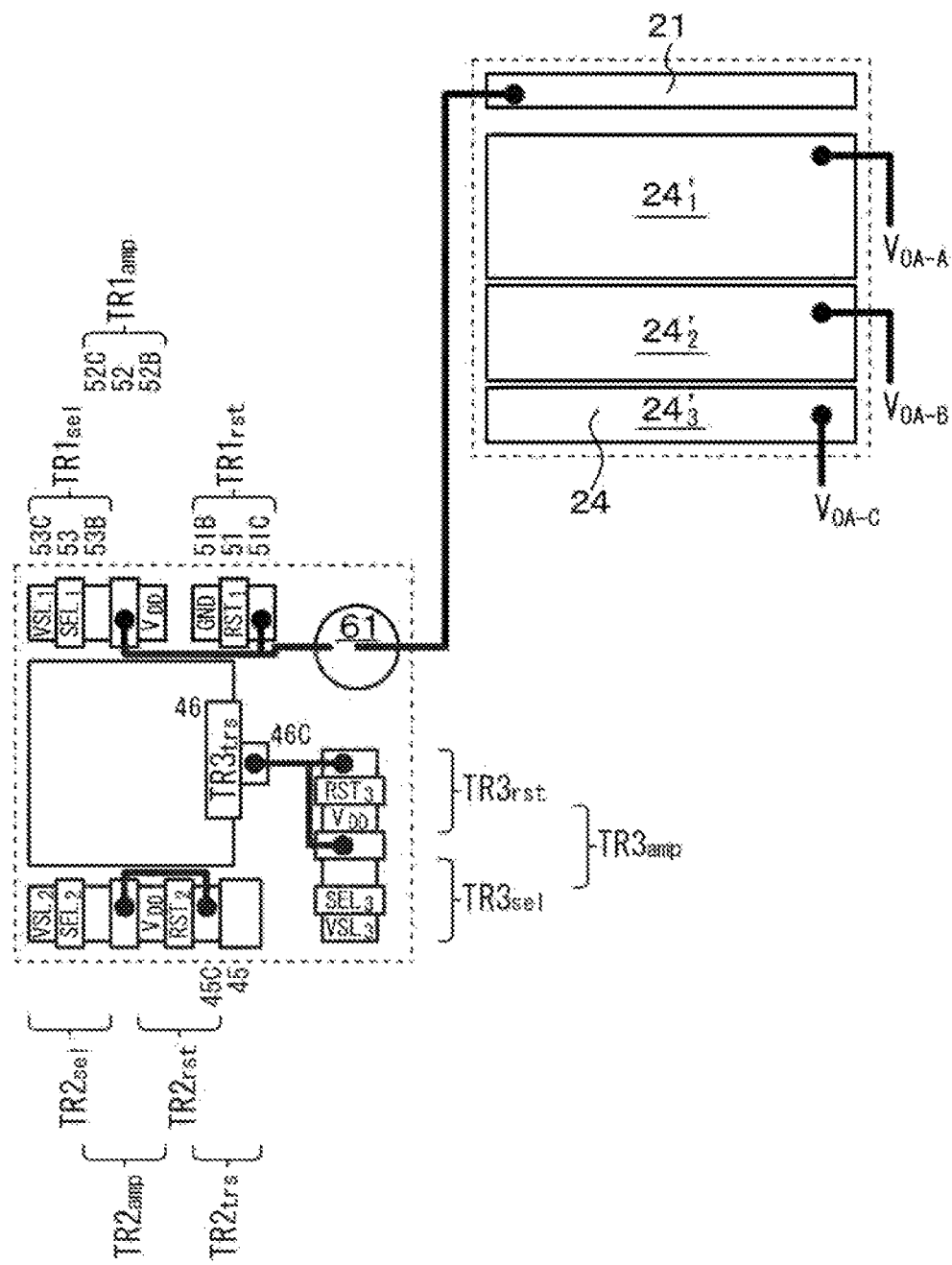
FIG. 46 is a schematic layout drawing of the first electrode and the charge storage electrode included in a modified example of the imaging element of Embodiment 11.

As in FIG. 46 illustrating a schematic layout drawing of the first electrode, the charge storage electrode, and the transistors of the control unit included in the modified example of the imaging element of Embodiment 11, the other source/drain region 51B of the reset transistor $TR3_{rst}$ may be grounded, instead of connecting the other source/drain region 51B to the power source $V_{DD}$.

In the imaging element of Embodiment 11, a kind of charge transfer gradient is also formed by adopting the configuration. That is, the areas of the charge storage electrode segments gradually decrease from the first photoelectric conversion unit segment $10'_1$ to the Nth photoelectric conversion unit segment $10'_N$. Therefore, when the state shifts to $V_{12} \geq V_{11}$ in the charge storage period, the nth photoelectric conversion unit segment can store more charge than the (n+1)th photoelectric conversion unit segment. Further ore, when the state shifts to $V_{22}<V_{21}$ in the charge transfer period, the flow of charge from the first photoelectric conversion unit segment to the first electrode and the flow of charge from the (n+1)th photoelectric conversion unit segment to the nth photoelectric conversion unit segment can be certainly secured.

Embodiment 12

Figure 47:
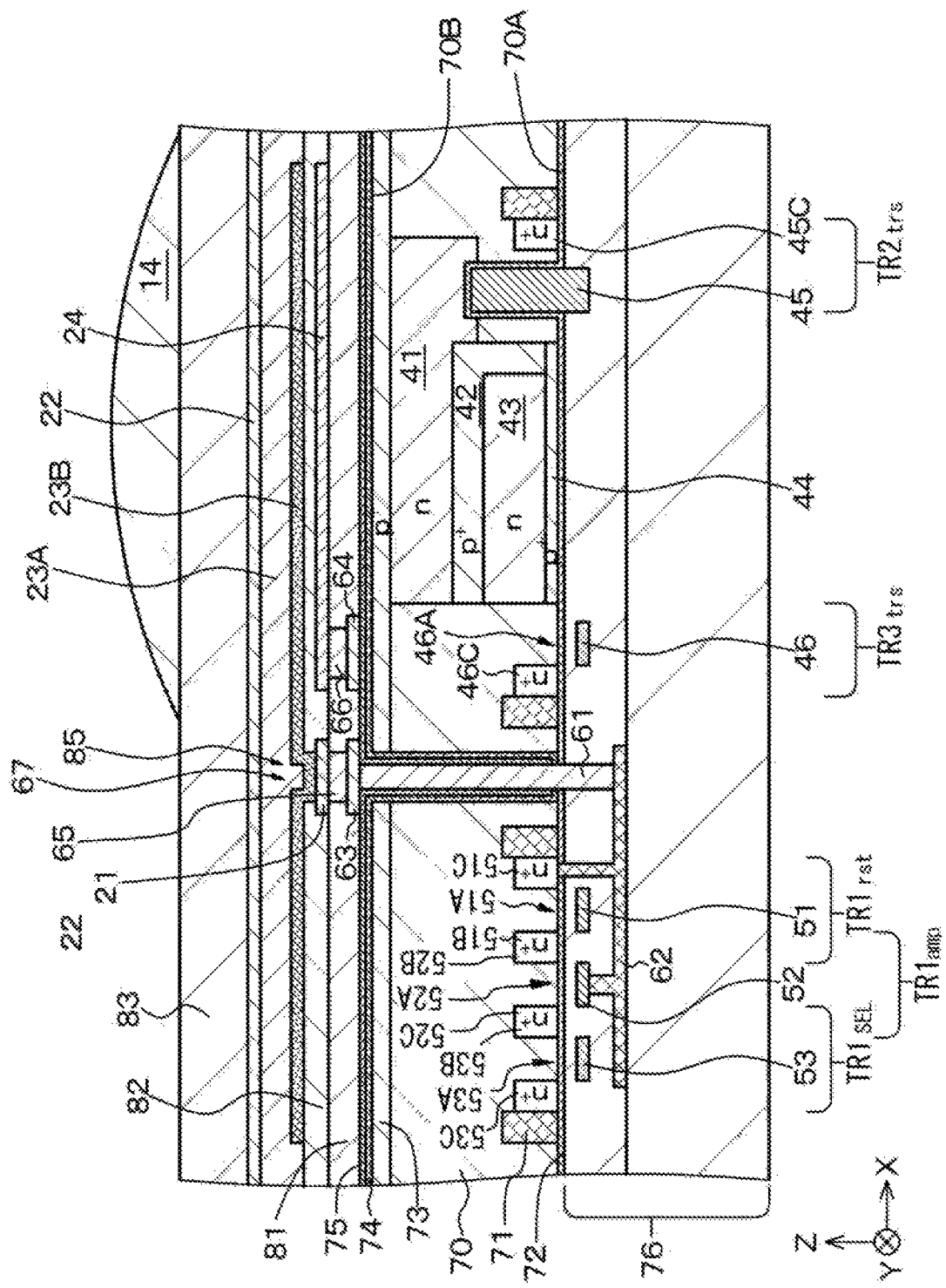
FIG. 47 is a schematic partial cross-sectional view of imaging elements of Embodiment 12 and Embodiment 11.
Figure 48A:
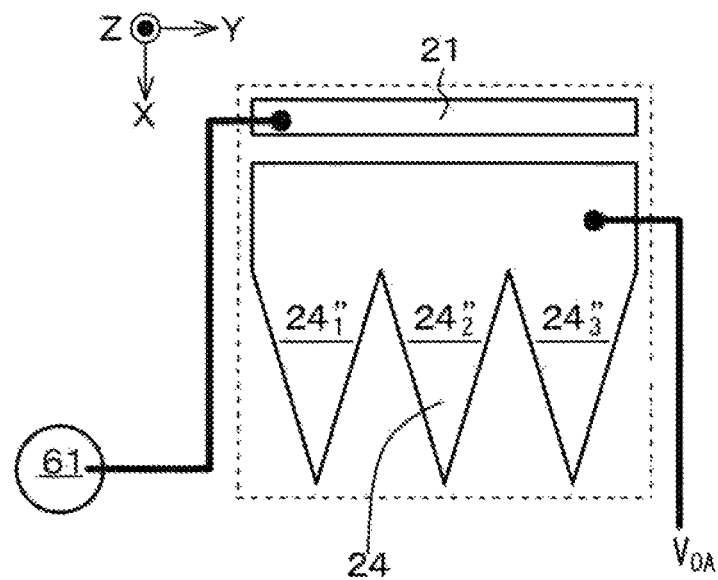
FIGS. 48A and 48B are schematic plan views of charge storage electrode segments in Embodiment 12.
Figure 48B:
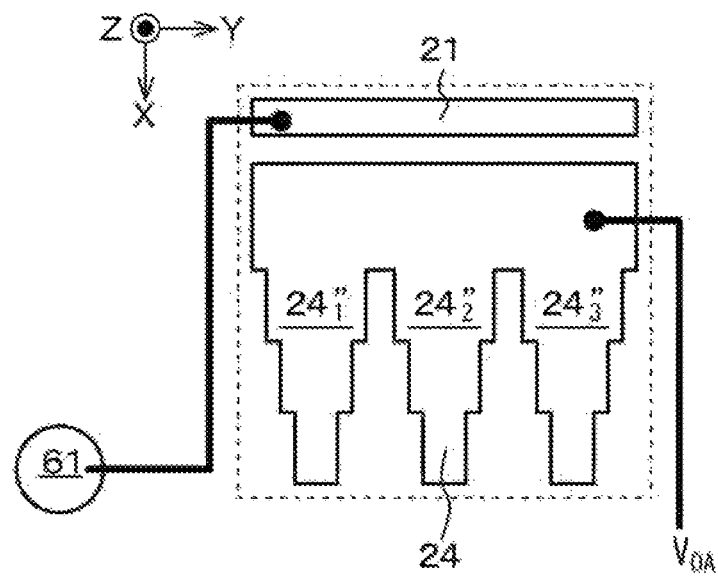

Embodiment 12 relates to the imaging element of the sixth configuration. FIG. 47 illustrates a schematic partial cross-sectional view of the imaging element of Embodiment 12. In addition, FIGS. 48A and 48B illustrate schematic plan views of the charge storage electrode segments in Embodiment 12. The imaging element of Embodiment 12 includes the photoelectric conversion unit including the first electrode 21, the inorganic oxide semiconductor material layer 23B, the photoelectric conversion layer 23A, and the second electrode 22 that are stacked. The photoelectric conversion unit further includes the charge storage electrodes 24 ($24''_1$, $24''_2$, and $24''_3$) arranged apart from the first electrode 21 and arranged to face the inorganic oxide semiconductor material layer 23B through the insulating layer 82. The cross-sectional area of the stacked part of the charge storage electrodes 24 ($24''_1$, $24''_2$, and $24''_3$), the insulating layer 82, the inorganic oxide semiconductor material layer 23B, and the photoelectric conversion layer 23A when the stacked part is out in the YZ virtual plane changes in accordance with the distance from the first electrode 21, where the Z direction is the stacking direction of the charge storage electrodes 24 ($24''_1$, $24''_2$, and $24''_3$), the insulating layer 82, the inorganic oxide semiconductor material layer 23B, and the photoelectric conversion layer 23A, and the X direction is the direction away from the first electrode 21.

Specifically, in the imaging element of Embodiment 12, the thickness of the cross section of the stacked part is constant, and the width of the cross section of the stacked part decreases with an increase in the distance from the first electrode 21. Rote that the width may continuously decrease (see FIG. 48A) or may decrease step-wise (see FIG. 48B).

In this way, in the imaging element of Embodiment 12, the cross-sectional area of the stacked part of the charge storage electrodes 24 ($24''_1$, $24''_2$, and $24''_3$), the insulating layer 82, and the photoelectric conversion layer 23A when the stacked part is cut in the YZ virtual plane changes in accordance with the distance from the first electrode. Therefore, a kind of charge transfer gradient is formed, and the charge generated by the photoelectric conversion can be more easily and certainly transferred.

Embodiment 13

Embodiment 13 relates to the solid-state imaging apparatuses of the first configuration and the second configuration.

The solid-state imaging apparatus of Embodiment 13 includes a photoelectric conversion unit including the first electrode 21, the inorganic oxide semiconductor material layer 23B, the photoelectric conversion layer 23A, and the second electrode 22 that are stacked, in which the photoelectric conversion unit further includes a plurality of imaging elements including the charge storage electrodes 24 arranged apart from the first electrodes 21 and arranged to face the inorganic oxide semiconductor material layer 23B through the insulating layer 82, a plurality of imaging elements are included in an imaging block, and the first electrode 21 is shared by the plurality of imaging elements included in an imaging element block.

Alternatively, the solid-state imaging apparatus of Embodiment 13 includes a plurality of imaging elements described in Embodiments 1 to 12.

In Embodiment 13, one floating diffusion layer is provided for the plurality of imaging elements. In addition, the timing of the charge transfer period can be appropriately controlled to allow the plurality of imaging elements to share one floating diffusion layer. Furthermore, in this case, the plurality of imaging elements can share one contact hole portion.

Note that the solid-state imaging apparatus of Embodiment 13 has a configuration and a structure substantially similar to the solid-state imaging apparatuses described in Embodiments 1 to 12, except that the plurality of imaging elements included in the imaging element block share the first electrode 21.

Figure 49:
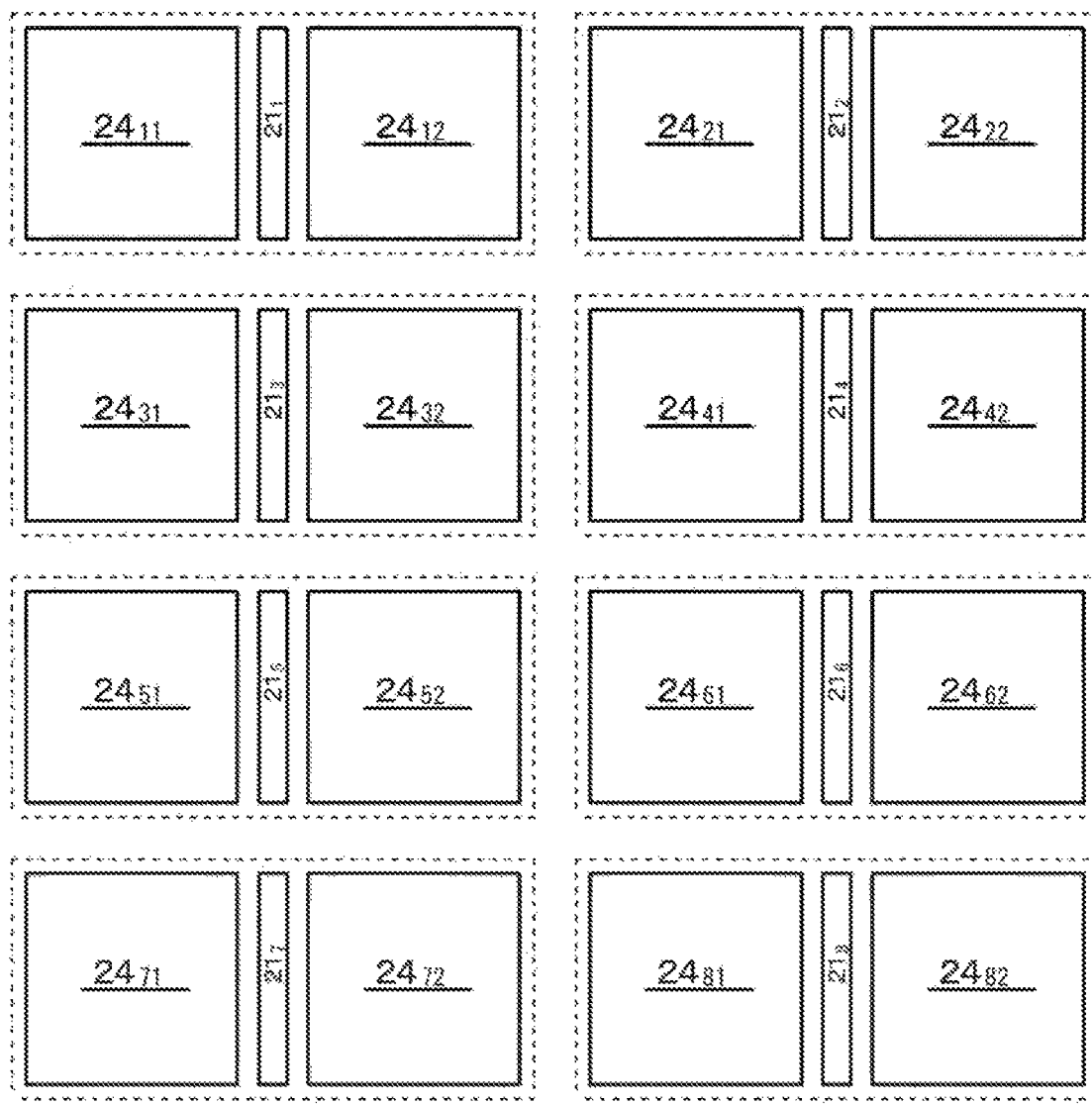
FIG. 49 is a schematic plan view of the first electrodes and the charge storage electrode segments in a solid-date imaging apparatus of Embodiment 13.
Figure 50:
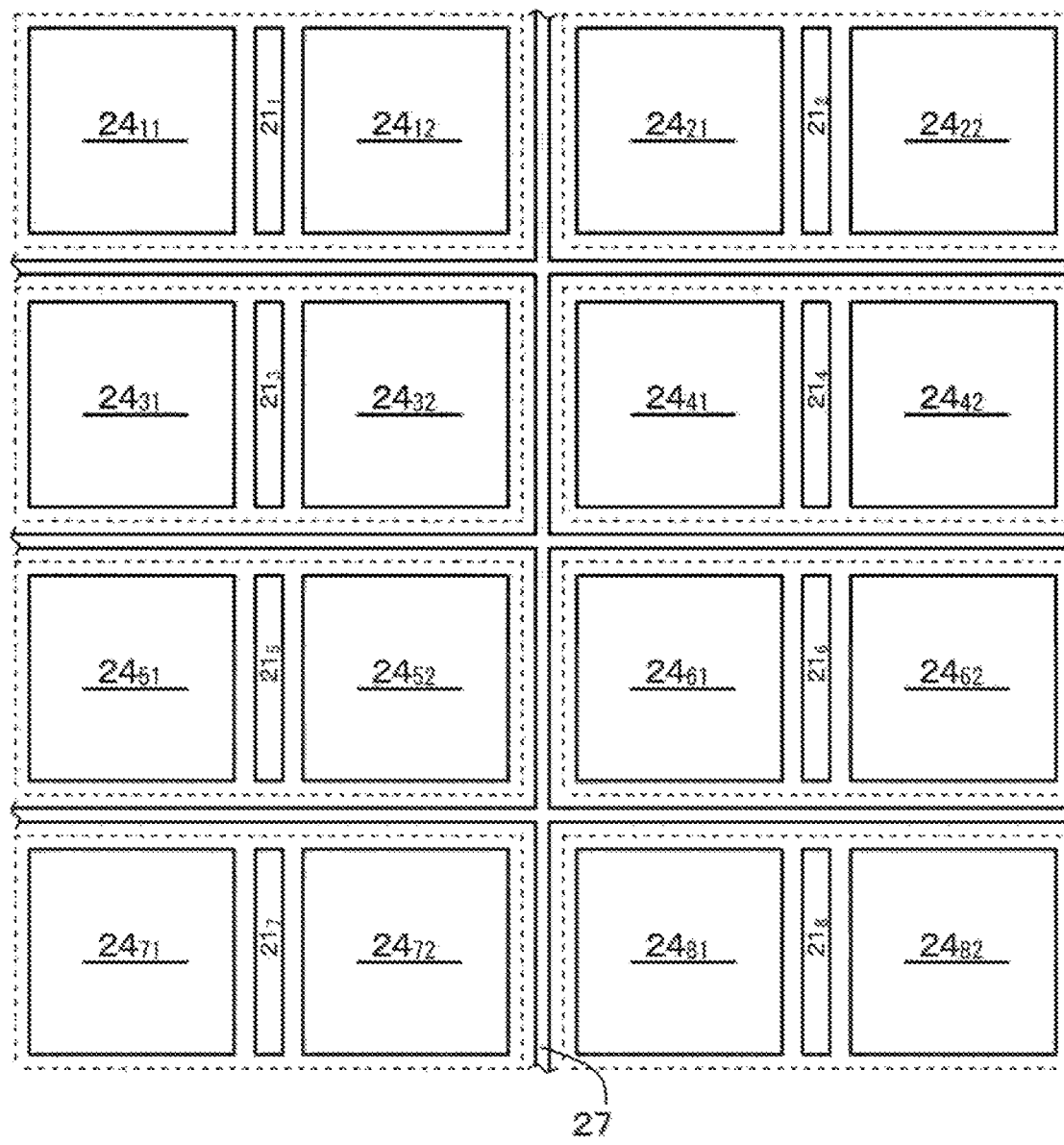
FIG. 50 is a schematic plan view of the first electrodes and the charge storage electrode segments in a first modified example of the solid-state imaging apparatus of Embodiment 13.
Figure 51:
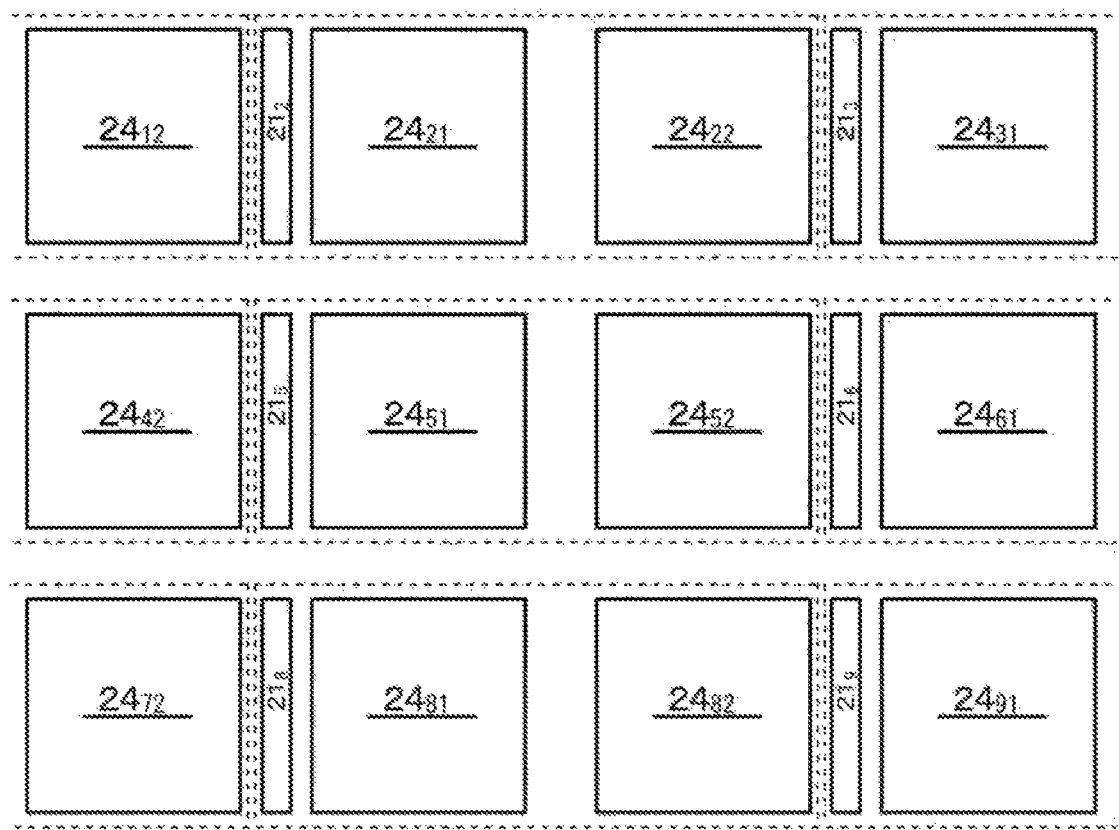
FIG. 51 is a schematic plan view of the first electrodes and the charge storage electrode segments in a second modified example of the solid-state imaging apparatus of Embodiment 13.
Figure 52:
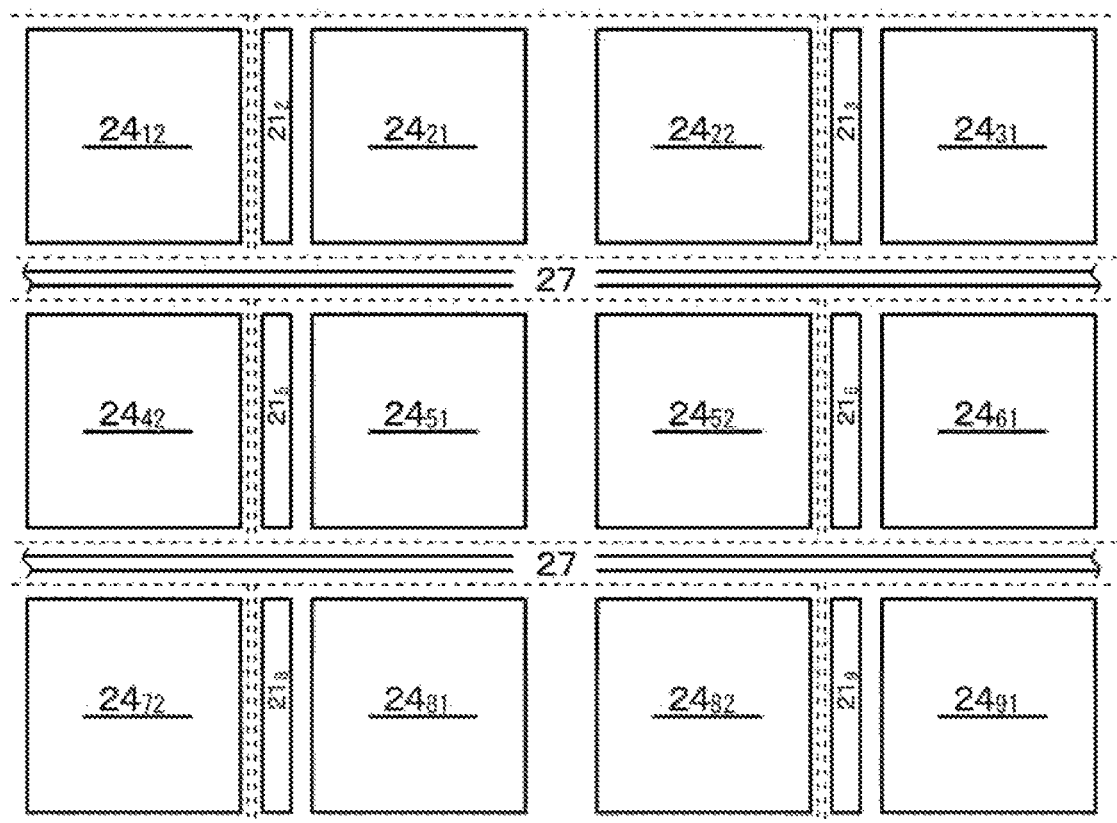
FIG. 52 is a schematic plan view of the first electrodes and the charge storage electrode segments in a third modified example of the solid-state imaging apparatus of Embodiment 13.
Figure 53:
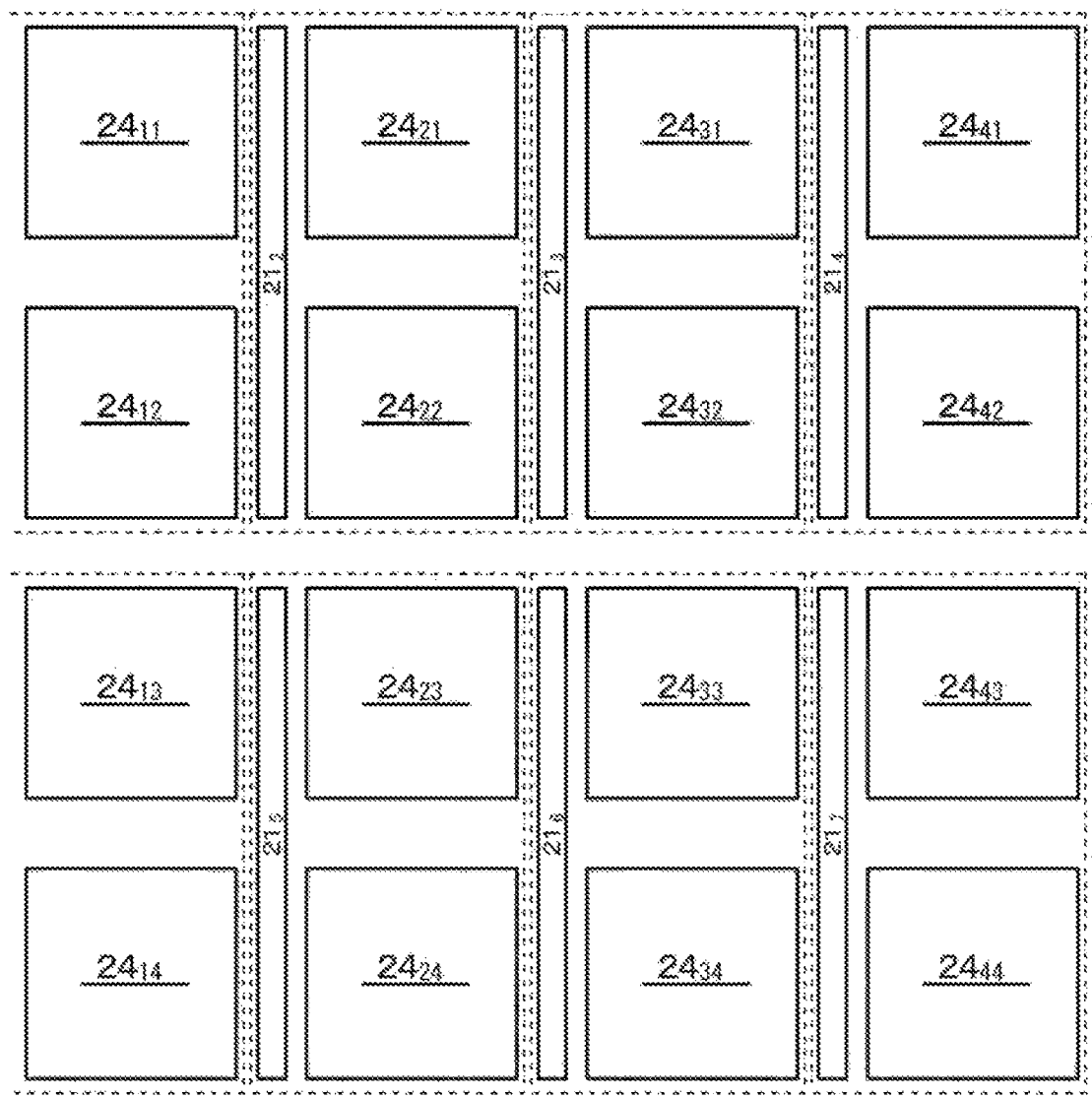
FIG. 53 is a schematic plan view of the first electrodes and the charge storage electrode segments in a fourth modified example of the solid-state imaging apparatus of Embodiment 13.
Figure 54:
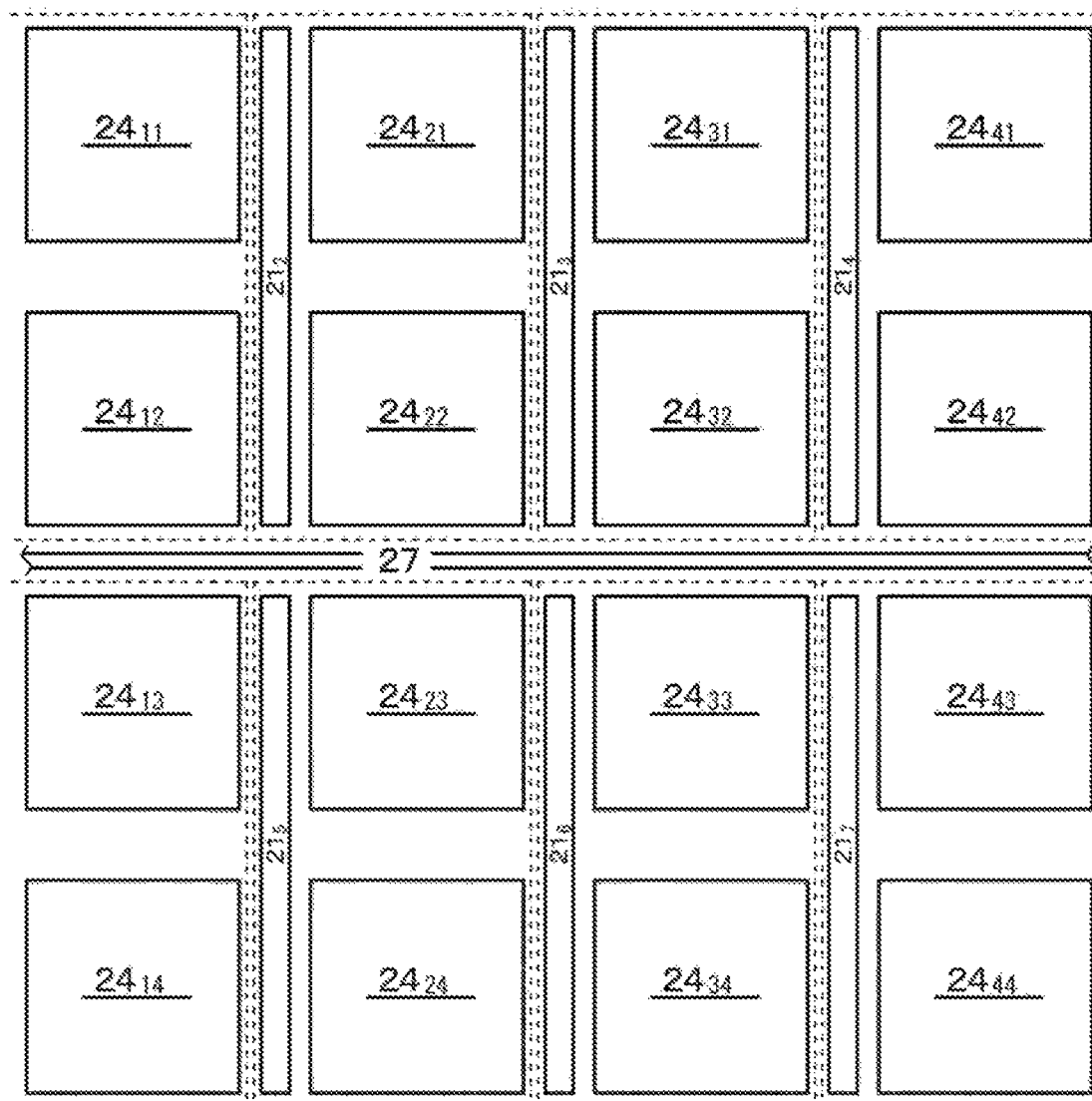
FIG. 54 is a schematic plan view of the first electrodes and the charge storage electrode segments in a fifth modified example of the solid-state imaging apparatus of Embodiment 13.

FIG. 49 (Embodiment 13), FIG. 50 (first modified example of Embodiment 13), FIG. 51 (second modified example of Embodiment 13), FIG. 52 (third modified example of Embodiment 13), and FIG. 53 (fourth modified example of Embodiment 13) schematically illustrate arrangement states of the first electrodes 21 and the charge storage electrodes 24 in the solid-state imaging apparatus of Embodiment 13. FIGS. 49, 50, 53, and 54 illustrate sixteen imaging elements, and FIGS. 51 and 52 illustrate twelve imaging elements. In addition, two imaging elements are included in the imaging element block. The imaging element blocks are surrounded and illustrated by dotted lines. Subscripts attached to the first electrodes 21 and the charge storage electrodes 24 are for distinction of the first electrodes 21 and the charge storage electrodes 24. This similarly applies to the following description. Furthermore, one on-chip micro lens (not illustrated in FIGS. 49 to 58) is arranged on the upper side of one imaging element. Furthermore, in one imaging element block, two charge storage electrodes 24 are arranged across the first electrode 21 (see FIGS. 49 and 50). Alternative one first electrode 21 is arranged to face two charge storage electrodes 24 arranged side by side (see FIGS. 53 and 54). That is, the first electrode is arranged adjacent to the charge storage electrode of each imaging element. Alternatively, the first electrodes are arranged adjacent to the charge storage electrodes of part of the plurality of imaging elements and are not arranged adjacent to the charge storage electrodes of the rest of the plurality of imaging elements (see FIGS. 51 and 52). In this case, the movement of charge from the rest of the plurality of imaging elements to the first electrodes is movement through the part of the plurality of imaging elements. It is preferable that a distance A between the charge storage electrode included in the imaging element and the charge storage electrode included in the imaging element be longer than a distance B between the first electrode and the charge storage electrode in the imaging element adjacent to the first electrode in order to certainly move the charge from each imaging element to the first electrode. In addition, it is preferable that the farther the position of the imaging element from the first electrode, the larger the value of the distance A. Furthermore, in the examples illustrated in FIGS. 50, 52, and 54, charge movement control electrodes 27 are arranged between the plurality of imaging elements included in the imaging element blocks. Arranging the charge movement control electrodes 27 can certainly suppress the movement of charge in the imaging element blocks positioned across the charge movement control electrodes 27. Note that the potentials is only required to be set so that $V_{12}>V_{17}$ holds, where $V_{17}$ is the potential applied to the charge movement control electrodes 27.

The charge movement control electrodes 27 may be formed in the same level as the first electrodes 21 or the charge storage electrodes 24 or may be formed in a different level (specifically, level on the lower side of the first electrodes 21 or the charge storage electrodes 24) on the first electrode side. In the former case, the distance between the charge movement control electrode 27 and the photoelectric conversion layer can be reduced, and the potential can be easily controlled. On the other hand, in the latter case, the distance between the charge movement control electrode 27 and the charge storage electrode 24 can be reduced, and this is advantageous for miniaturization.

Hereinafter, an operation of the imaging element block including the first electrode $21_2$ and two two charge storage electrodes $24_{21}$ and $24_{22}$ will be described.

In the charge storage period, the drive circuit applies a potential $V_a$ to the first electrode $21_2$ and applies a potential $V_A$ to the charge storage electrodes $24_{21}$ and $24_{22}$. The light incident on the photoelectric conversion layer 23A causes photoelectric conversion is the photoelectric conversion layer 23A. The electron holes generated by the photoelectric conversion are sent from the second electrode 22 to the drive circuit through the wire $V_{OU}$. On the other hand, the potential of the first electrode $21_2$ is higher than the potential of the second electrode 22. That is, for example, a positive potential is applied to the first electrode $21_2$, and a negative potential is applied to the second electrode 22. Therefore, the potentials are set so that $V_A \geq V_a$, preferably, $V_A > V_a$, holds. As a result, the electrons generated by the photoelectric conversion are attracted to the charge storage electrodes $24_{21}$ and $24_{22}$ and the electrons stop in the region of the inorganic oxide semiconductor material layer 23B and the like facing the charge storage electrodes $24_{21}$ and $24_{22}$. That is, the charge is stored in the inorganic oxide semiconductor material layer 23B and the like. $V_A$ is equal to or greater than $V_a$, and therefore, the electrons generated inside of the photoelectric conversion layer 23A do not move toward the first electrode $21_2$. In the time course of the photoelectric conversion, the potential in the region of the inorganic oxide semiconductor material layer 23B and the like facing the charge storage electrodes $24_{21}$ and $24_{22}$ becomes a more negative value.

The reset operation is performed later in the charge storage period. This resets the potential of the first floating diffusion layer, and the potential of the first floating diffusion layer shifts to the potential $V_{DD}$ of the power source.

After the completion of the reset operation, the charge is read out. That is, in the charge transfer period, the drive circuit applies a potential $V_b$ to the first electrode $21_2$, applies a potential $V_{21-B}$ to the charge storage electrode $24_{21}$, and applies a potential $V_{22-B}$ to the charge storage electrode $24_{22}$. Here, the potentials are set so that $V_{21-B} < V_b < V_{22-B}$ holds. As a result, the electrons stopped in the region of the inorganic oxide semiconductor material layer 23B and the like facing the charge storage electrode $24_{21}$ are read out to the first electrode $21_2$ and further to the first floating diffusion layer. That is, the charge stored in the region of the inorganic oxide semiconductor material layer 23B and the like facing the charge storage electrode $24_{21}$ is read out to the control unit. Once the reading is completed, the potentials are set so that $V_{22-B} \le V_{21-B} < V_b$ holds. Note that in the examples illustrated in FIGS. 53 and 54, the potentials may be set so that $V_{22-B} < V_b < V_{21-B}$ holds. As a result, the electrons stopped in the region of the inorganic oxide semiconductor material layer 23B and the like facing the charge storage electrode $24_{22}$ are read out to the first electrode $21_2$ and further to the first floating diffusion layer. Furthermore, in the examples illustrated in FIGS. 51 and 52, the electrons stopped in the region of the inorganic oxide semiconductor material layer 23B and the like facing the charge storage electrode $24_{22}$ may be read out to the first floating diffusion layer through the first electrode $21_3$ adjacent to the charge storage electrode $24_{22}$. In this way, the charge stored in the region of the inorganic oxide semiconductor material layer 23B and the like facing the charge storage electrode $24_{22}$ is read out to the control unit. Note that when the readout of the charge stored in the region of the inorganic oxide semiconductor material layer 23B and the like facing the charge storage electrode $24_{21}$ to the control unit is completed, the potential of the first floating diffusion layer may be reset.

Figure 59A:
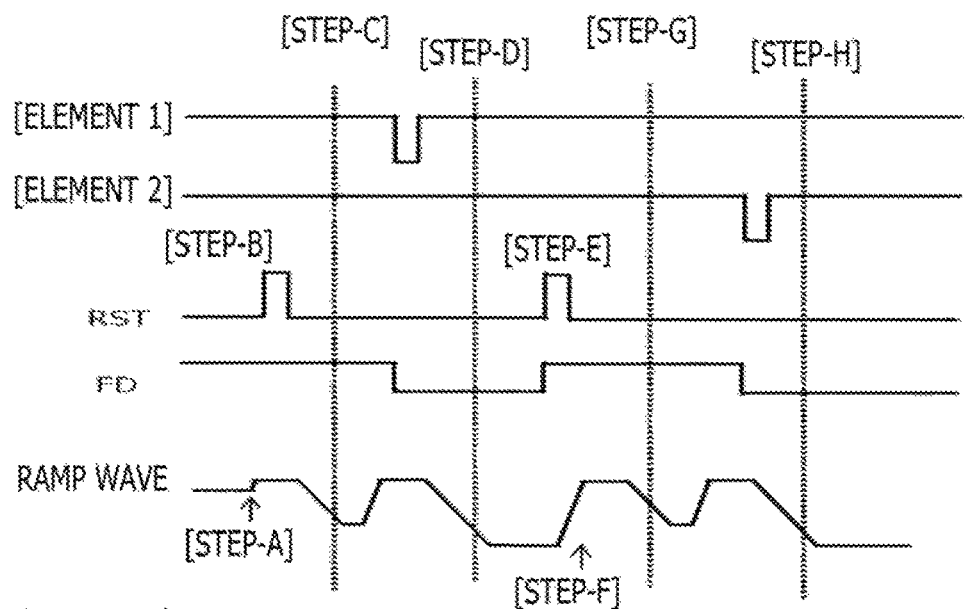
FIGS. 59A, 59B, and 59C are charts illustrating examples of reading and driving is an imaging element block of Embodiment 13.

FIG. 59A illustrates an example of reading and driving in the imaging element block of Embodiment 13.

[Step-A]
Input of auto zero signal into comparator

[Step-B]
Reset operation of one shared floating diffusion layer

[Step-C]
Reading of P phase is imaging element corresponding to charge storage electrode $24_{21}$ and movement of charge to first electrode $21_2$

[Step-D]
Reading of D phase in imaging element corresponding to charge storage electrode $24_{21}$ and movement of charge to first electrode $21_2$

[Step-E]
Reset operation of one shared floating diffusion layer

[Step-F]
Input of auto zero signal into comparator

[Step-G]
Reading of P phase in imaging element corresponding to charge storage electrode $24_{22}$ and movement of charge to first electrode $21_2$

[Step-H]
Reading of D phase in imaging element corresponding to charge storage electrode $24_{21}$ and movement of charge to first electrode $21_2$ The signals from two imaging elements corresponding to the charge storage electrode $24_{21}$ and the charge storage electrode $24_{22}$ are read in this flow. Based on the correlated double sampling (CDS) process, the difference between the reading of the P phase in [step-C] and the reading of the D phase in [step-D] is the signal from the imaging element corresponding to the charge storage electrode $24_{21}$. The difference between the reading of the P phase in [step-G] and the reading of the D phase in [step-H] is the signal from the imaging element corresponding to the charge storage electrode $24_{22}$.

Figure 59B:
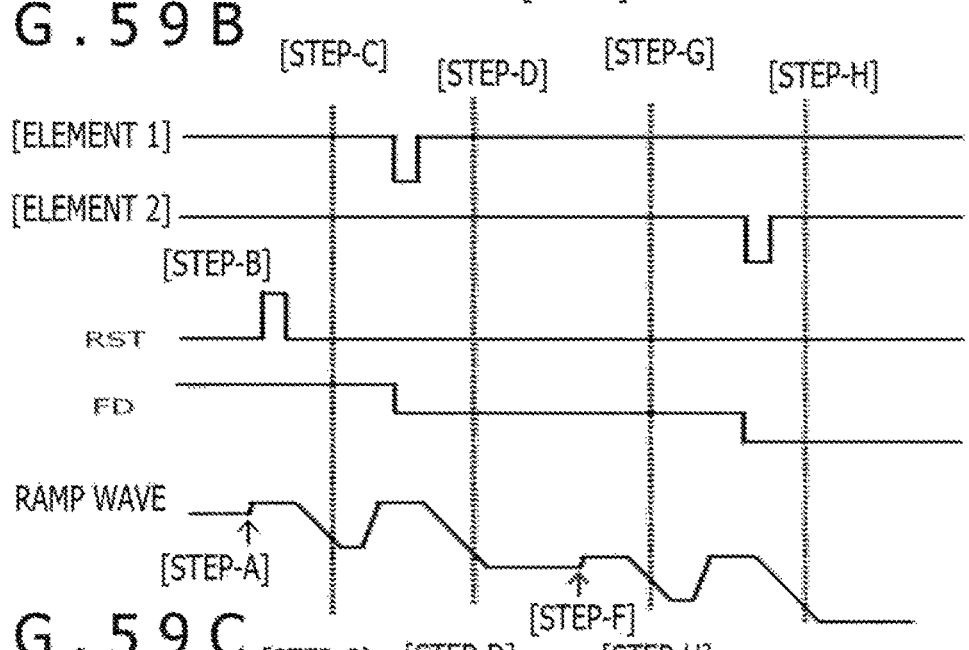
Figure 59C:
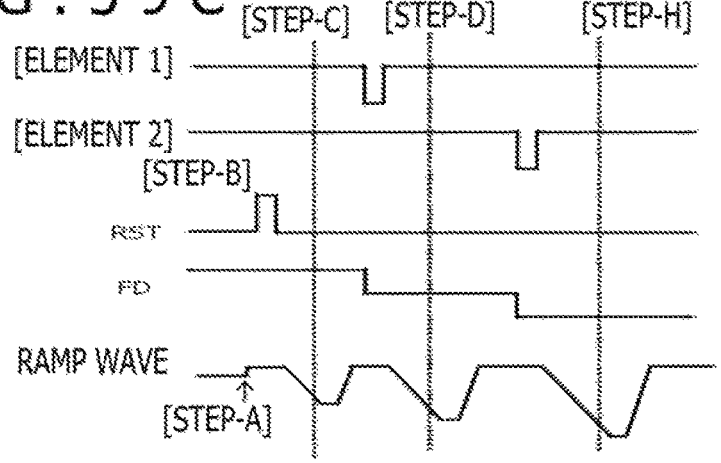
Figure 60:
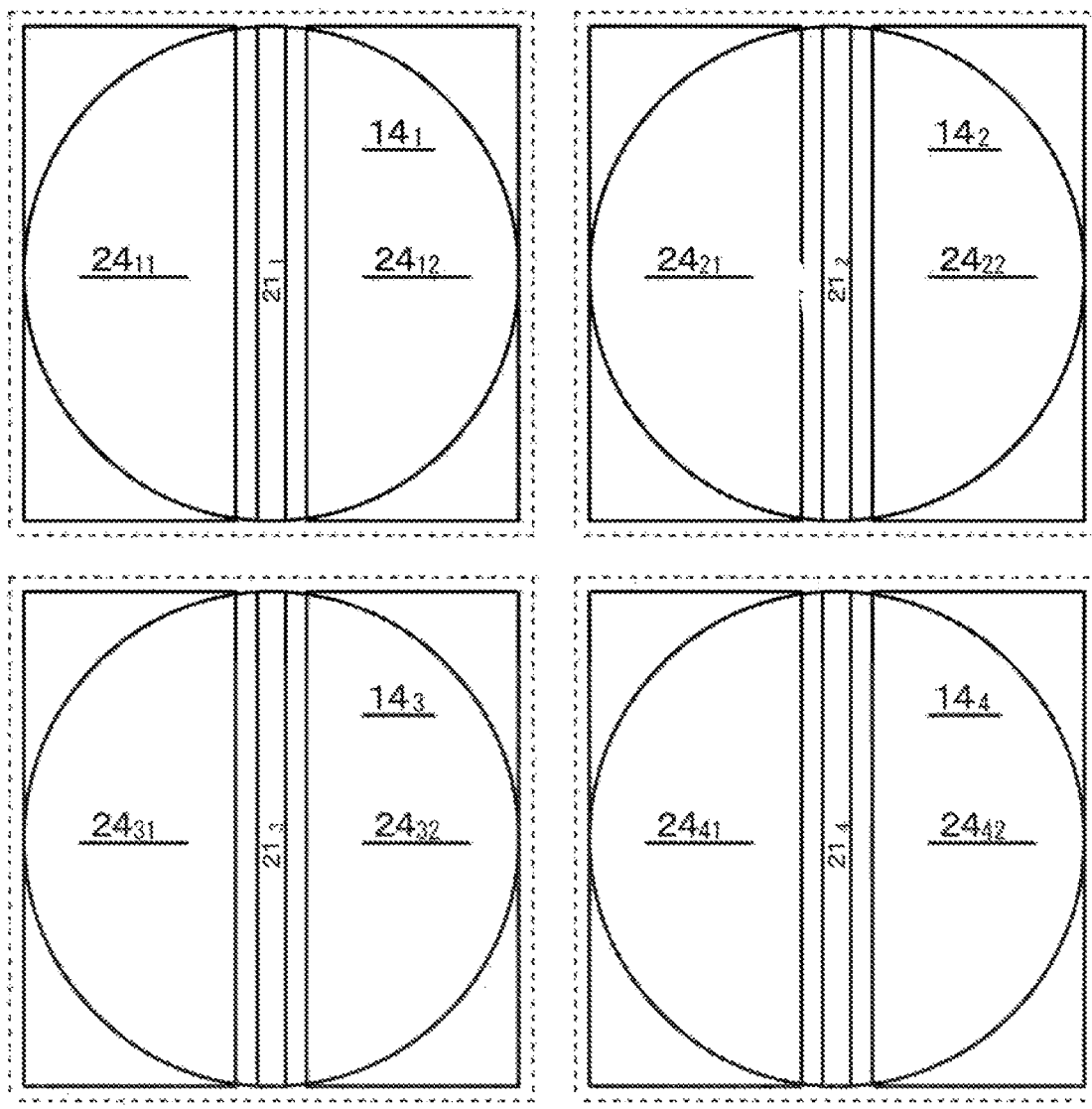
FIG. 60 is a schematic plan view of the first electrodes and the charge storage electrode segments in a solid-state imaging apparatus of Embodiment 14.
Figure 61:
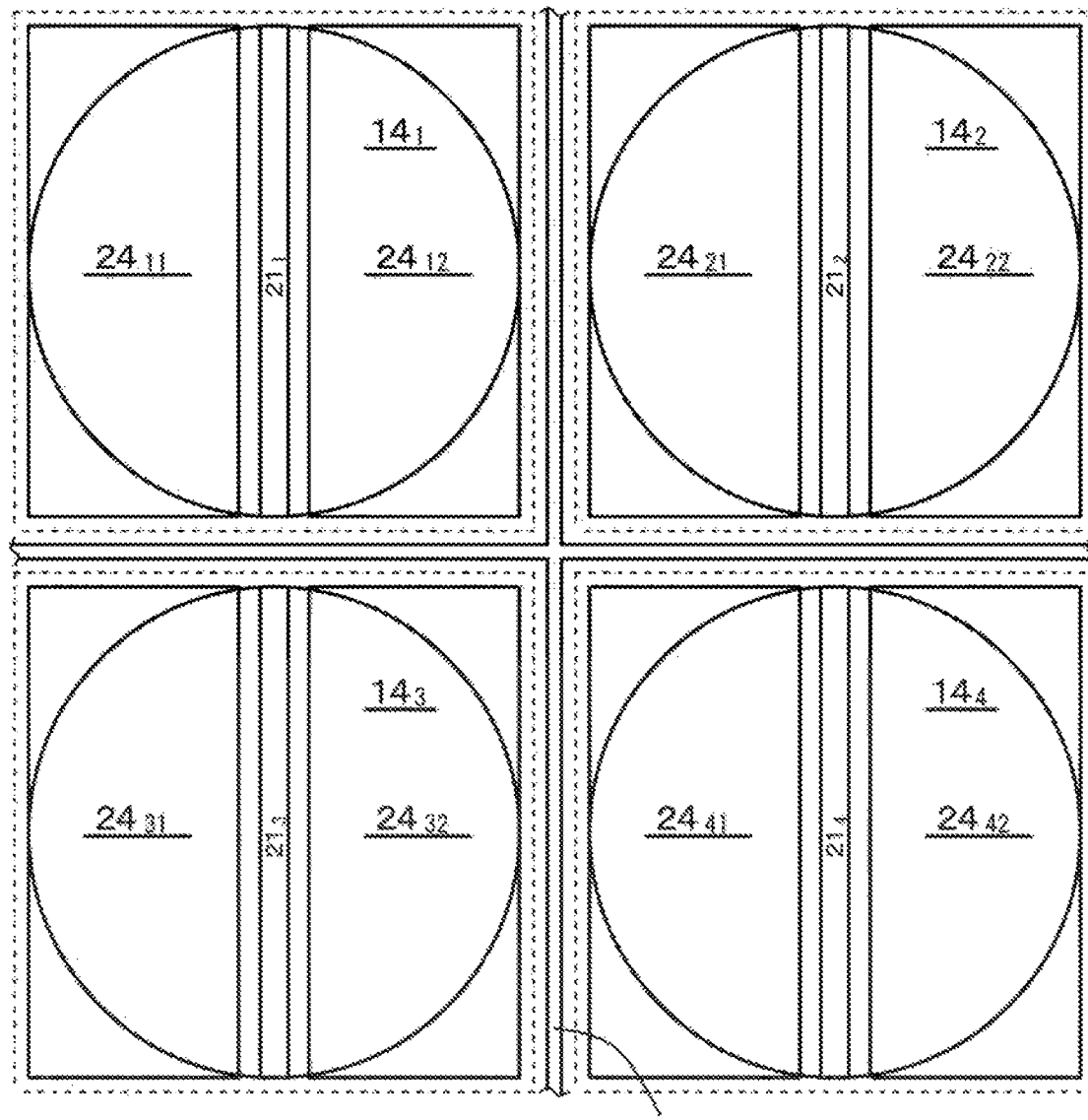
FIG. 61 is a schematic plan view of the first electrodes and the charge storage electrode segments in a modified example of the solid-state imaging apparatus of Embodiment 14.
Figure 62:
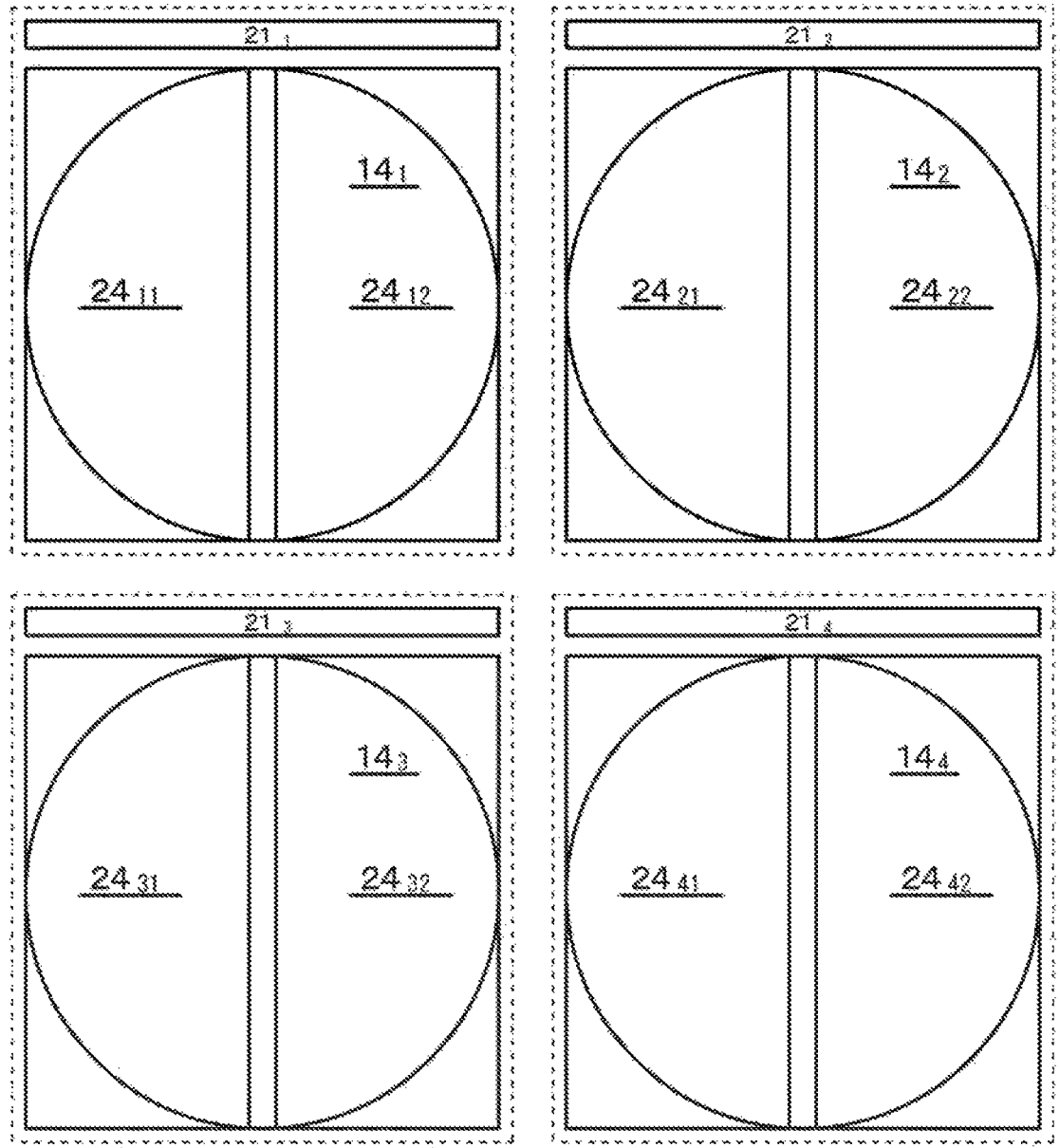
FIG. 62 is a schematic plan view of the first electrodes and the charge storage electrode segments in the modified example of the solid-state imaging apparatus of Embodiment 14.
Figure 63:
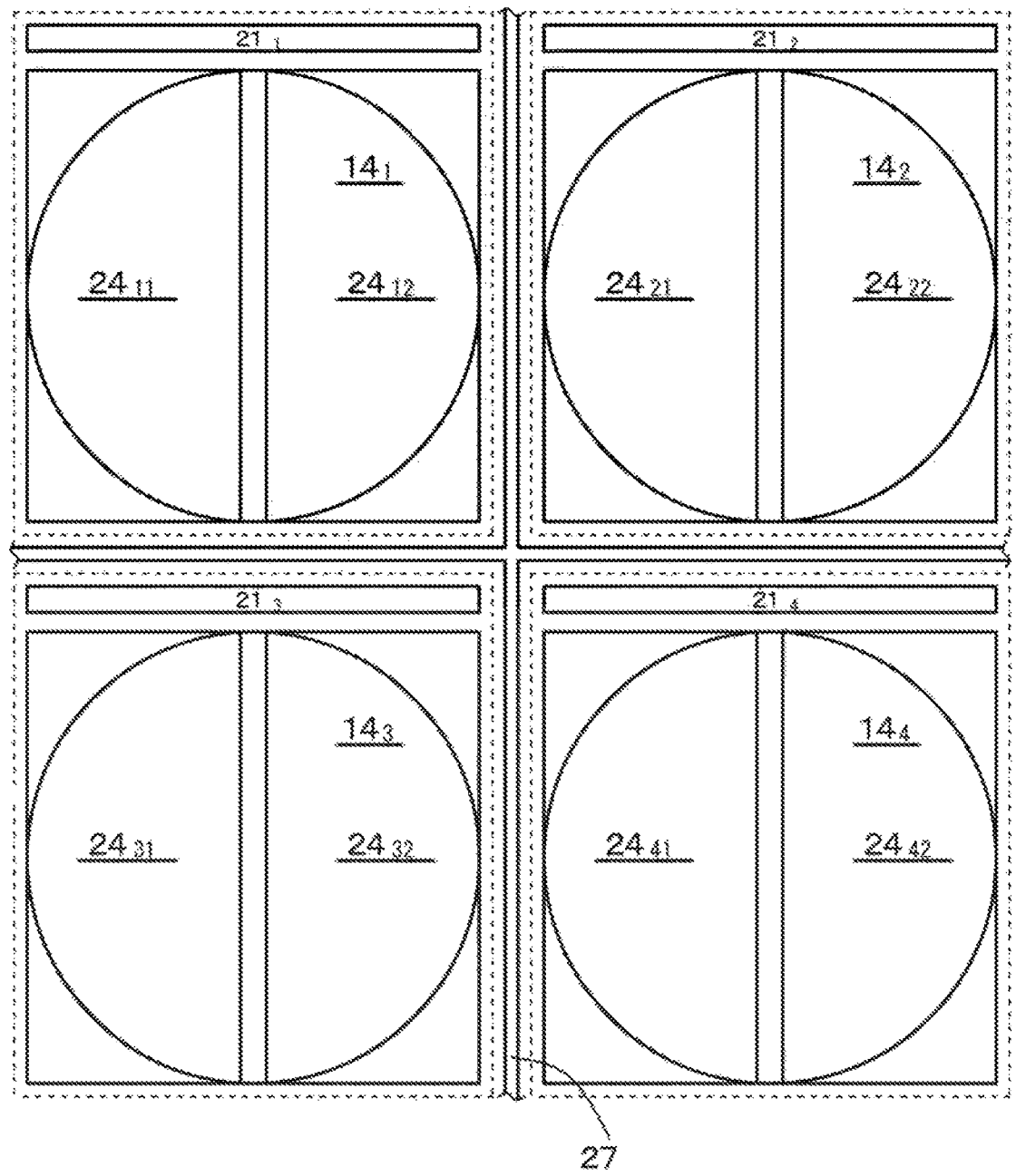
FIG. 63 is a schematic plan view of the first electrodes and the charge storage electrode segments in the modified example of the solid-state imaging apparatus of Embodiment 14.

Note that the operation of [step-E] may be skipped (see FIG. 59B), In addition, the operation of [step-F] may be skipped, and in this case, [step-G] can be further skipped (see FIG. 59C). The difference between the reading of the P phase in [step-C] and the reading of the D phase in [step-D] is the signal from the imaging element corresponding to the charge storage electrode $24_{21}$. The difference between the reading of the D phase in [step-D] and the reading of the D phase in [step-H] is the signal from the imaging element corresponding to the charge storage electrode $24_{22}$.

Figure 55:
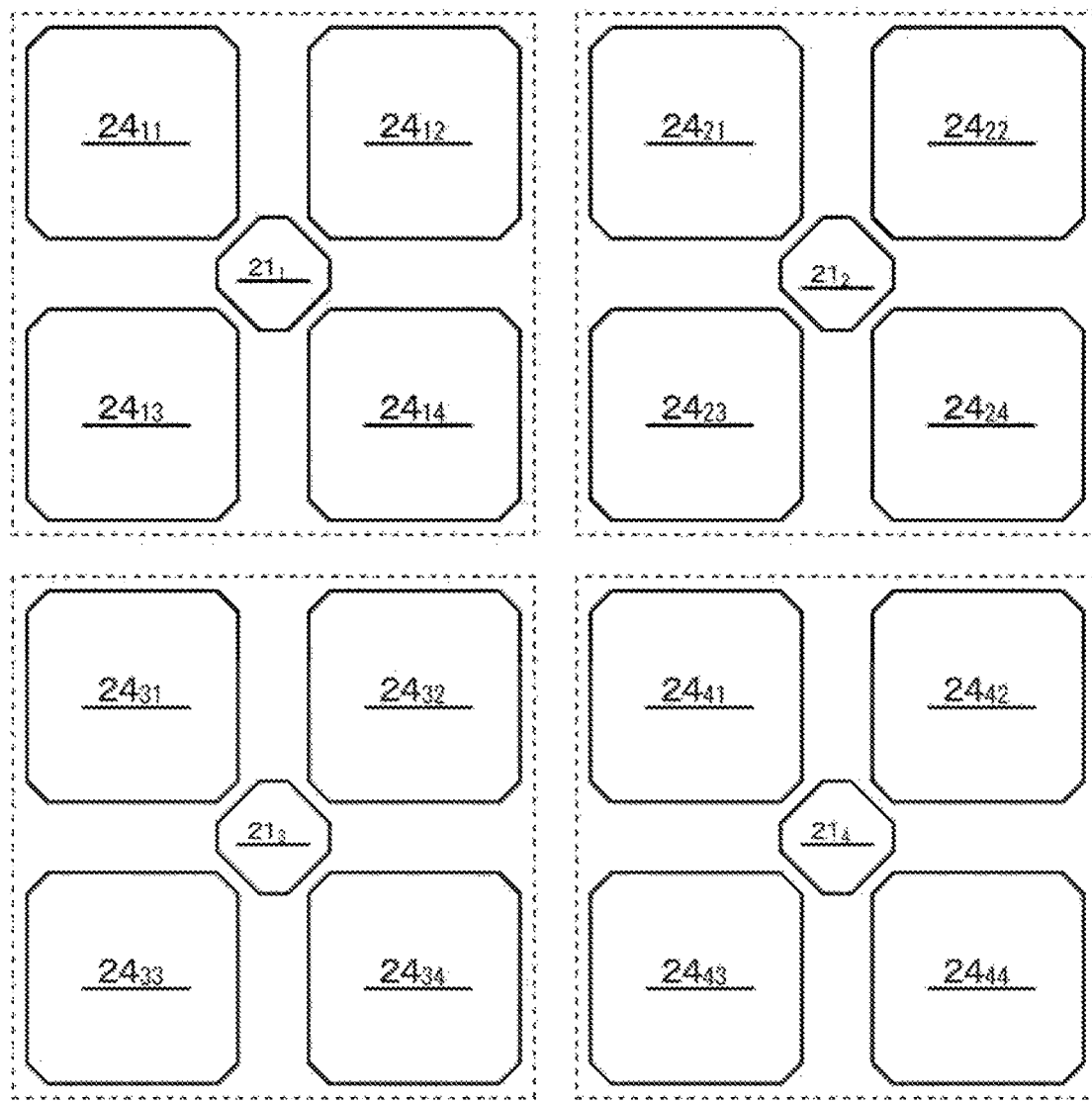
FIG. 55 is a schematic plan view of the first electrodes and the charge storage electrode segments in a sixth modified example of the solid-state imaging apparatus of Embodiment 13.
Figure 56:
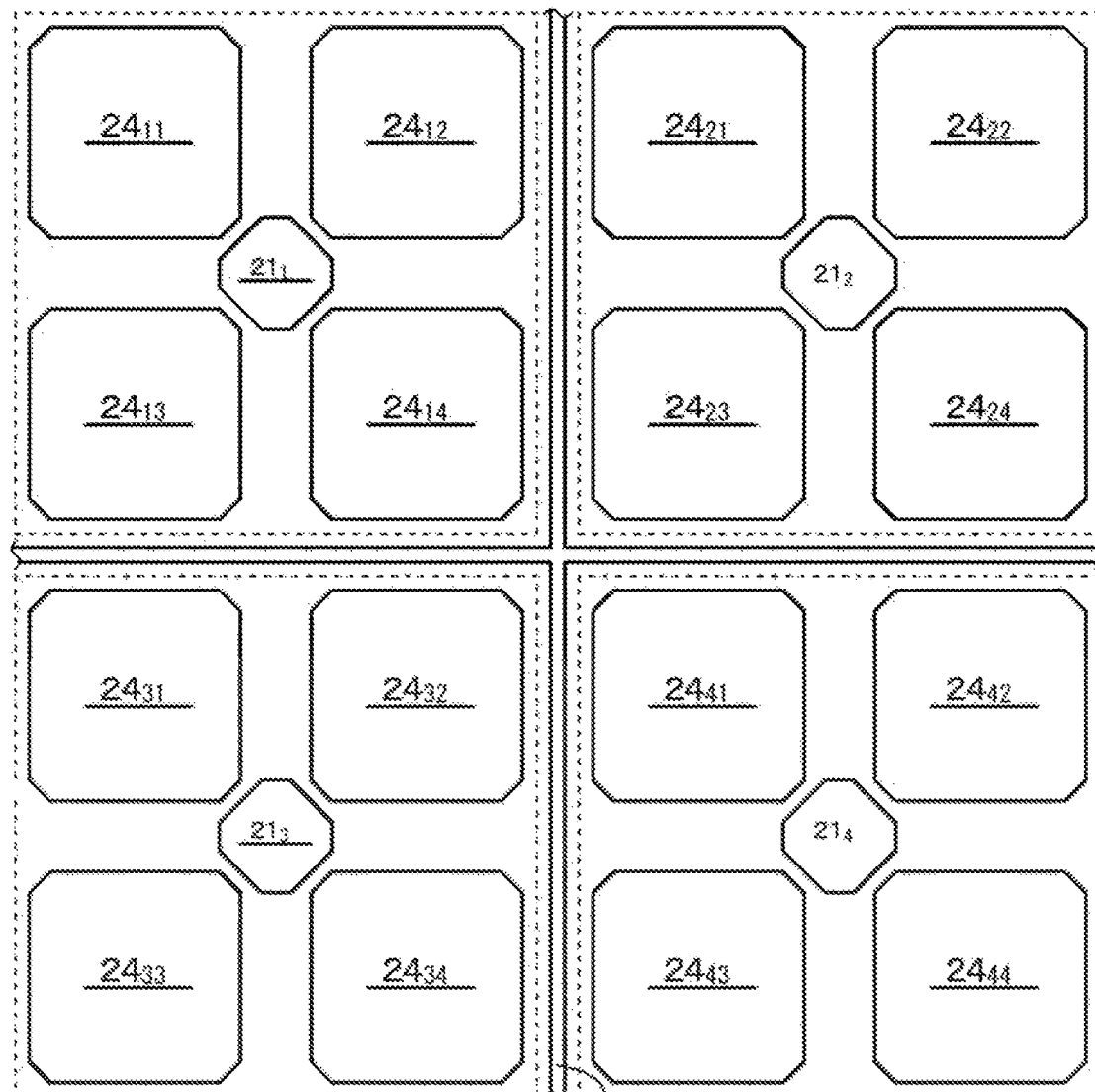
FIG. 56 is a schematic plan view of the first electrodes and the charge storage electrode segments in a seventh modified example of the solid-state imaging apparatus of Embodiment 13.

In modified examples of FIG. 55 (sixth modified example of Embodiment 13) and FIG. 56 (seventh modified example of Embodiment 13) schematically illustrating arrangement states of the first electrodes 21 and the charge storage electrodes 24, four imaging elements are included in the imaging element block. The operations of the solid-state imaging apparatuses can be substantially similar to the operations of the solid-state imaging apparatuses illustrated in FIGS. 49 to 54.

Figure 57:
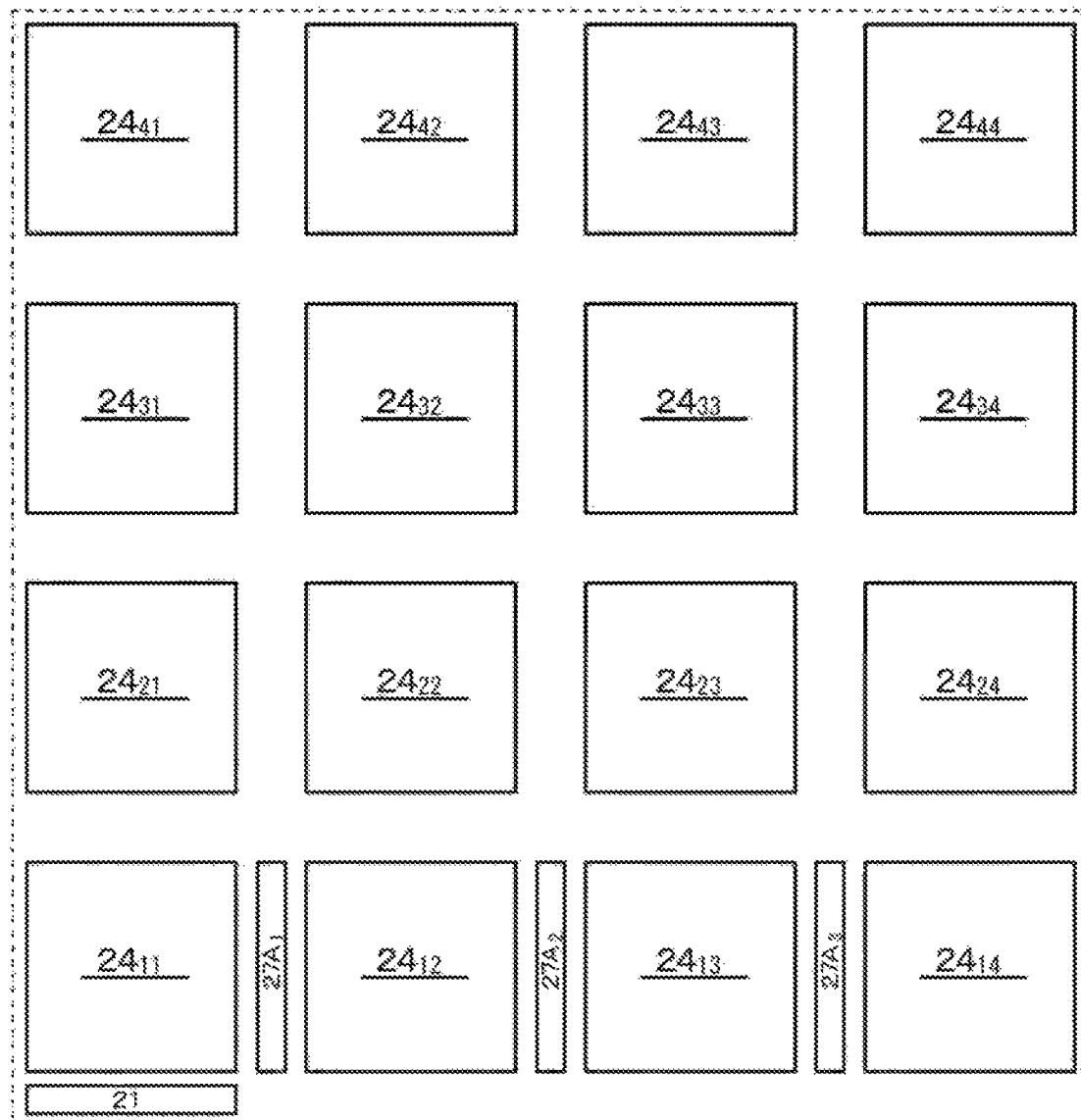
FIG. 57 is a schematic plan view of the first electrodes and the charge storage electrode segments in an eighth modified example of the solid-state imaging apparatus of Embodiment 13.
Figure 58:
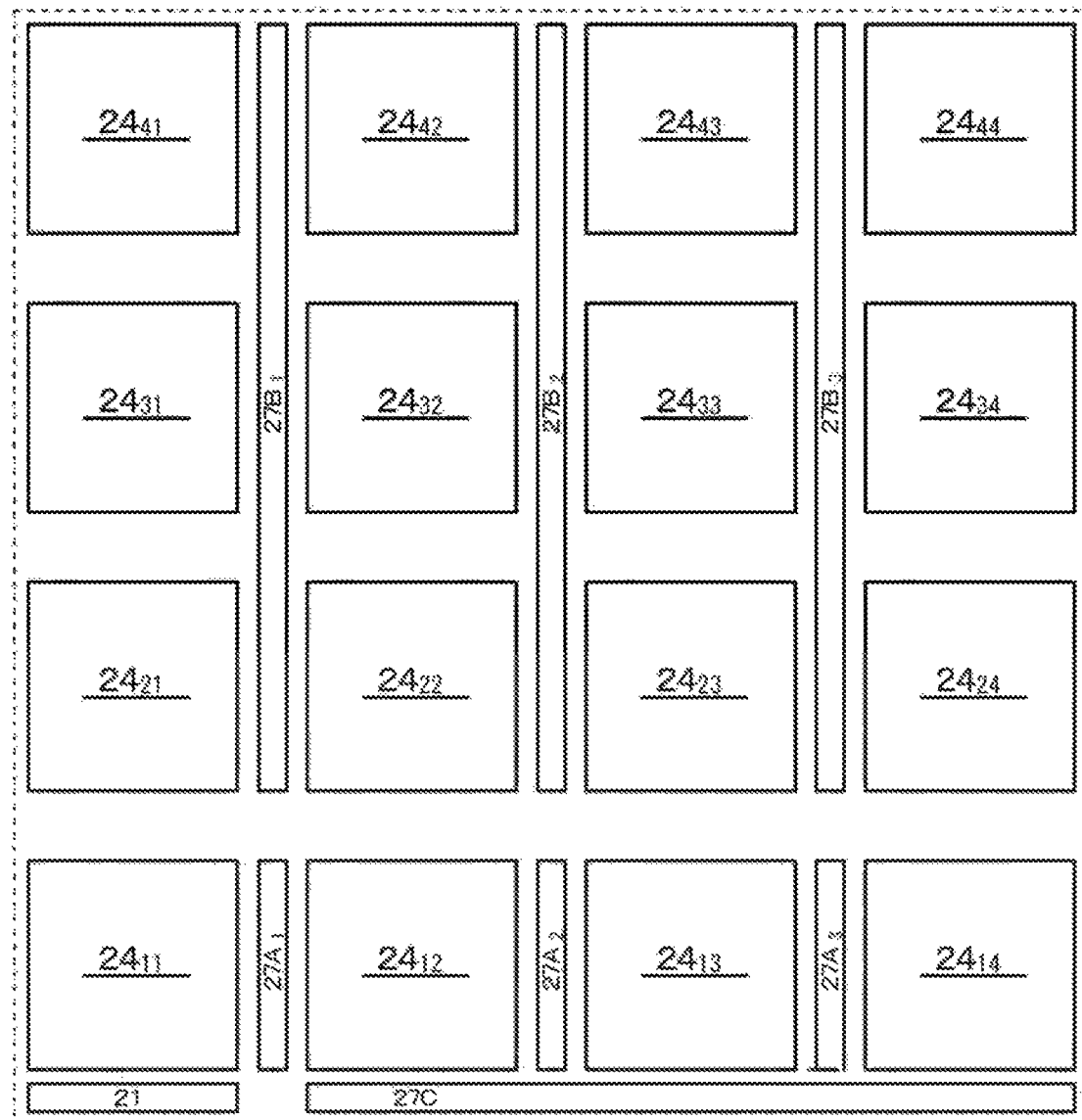
FIG. 58 is a schematic plan view of the first electrodes and the charge storage electrode segments in a ninth modified example of the solid-state imaging apparatus of Embodiment 13.

In an eighth modified example and a ninth modified example of FIGS. 57 and 58 schematically illustrating arrangement states of the first electrodes 21 and the charge storage electrodes 24, sixteen imaging elements are included in the imaging element block. As illustrated in FIGS. 57 and 58, charge movement control electrodes $27A_1$, $27A_2$, and $27A_3$ are arranged between the charge storage electrode $24_{21}$ and the charge storage electrode $24_{12}$, between the charge storage electrode $24_{12}$ and the charge storage electrode $24_{13}$, and between the charge storage electrode $24_{13}$ and the charge storage electrode $24_{14}$. In addition, as illustrated in FIG. 58, charge movement control electrodes $27B_2$, $27B_2$, and $27B_3$ are arranged between the charge storage electrodes $24_{22}$, $24_{32}$, and $24_{41}$ and the charge storage electrodes $24_{22}$, $24_{32}$, and $24_{42}$, between the charge storage electrodes $24_{22}$, $24_{32}$, and $24_{42}$ and the charge storage electrodes $24_{23}$, $24_{33}$, and $24_{43}$, and between the charge storage electrodes $24_{23}$, $24_{33}$, and $24_{43}$ and the charge storage electrodes $24_{24}$, $24_{34}$, and $24_{44}$. Furthermore, a charge movement control electrode 27C is arranged between an imaging element block and an imaging element block. Furthermore, in each of the solid-state imaging apparatuses, the sixteen charge storage electrodes 24 can be controlled to read the charge stored in the inorganic oxide semiconductor material layer 23B from the first electrode 21.

[Step 10]
Specifically, the charge stored in the region of the inorganic oxide semiconductor material layer 23B and the like facing the charge storage electrode $24_{11}$ is read from the first electrode 21 first Next, the charge stored in the region of the inorganic oxide semiconductor material layer 23B and the like facing the charge storage electrode $24_{12}$ is read from the first electrode 21 through the region of the inorganic oxide semiconductor material layer 23B and the like facing the charge storage electrode $24_{11}$. Next, the charge stored in the region of the inorganic oxide semiconductor material layer 23B and the like facing the charge storage electrode $24_{13}$ is read from the first electrode 21 through the region of the inorganic oxide semiconductor material layer 23B and the like facing the charge storage electrode $24_{12}$ and the charge storage electrode $24_{11}$.

[Step-20]

Subsequently, the charge stored in the region of the inorganic oxide semiconductor material layer 23B and the like facing the charge storage electrode $24_{21}$ is moved to the region of the inorganic oxide semiconductor material layer 23B and the like facing the charge storage electrode $24_{11}$. The charge stored in the region of the inorganic oxide semiconductor material layer 23B and the like facing the charge storage electrode $24_{22}$ is moved to the region of the inorganic oxide semiconductor material layer 23B and the like facing the charge storage electrode $24_{12}$. The charge stored in the region of the inorganic oxide semiconductor material layer 23B and the like facing the charge storage electrode $24_{23}$ is moved to the region of the inorganic oxide semiconductor material layer 23B and the like facing the charge storage electrode $24_{13}$. The charge stored in the region of the inorganic oxide semiconductor material layer 23B and the like facing the charge storage electrode $24_{24}$ is moved to the region of the inorganic oxide semiconductor material layer 23B and the like facing the charge storage electrode $24_{14}$.

[Step-21]

The charge stored in the region of the inorganic oxide semiconductor material layer 23B and the like facing the charge storage electrode $24_{31}$ is moved to the region of the inorganic oxide semiconductor material layer 23B and the like facing the charge storage electrode $24_{21}$. The charge stored in the region of the inorganic oxide semiconductor material layer 23B and the like facing the charge storage electrode $24_{32}$ is moved to the region of the inorganic oxide semiconductor material layer 23B and the like facing the charge storage electrode $24_{22}$. The charge stored in the region of the inorganic oxide semiconductor material layer 23B and the like facing the charge storage electrode $24_{33}$ is moved to the region of the inorganic oxide semiconductor material layer 23B and the like facing the charge storage electrode $24_{23}$. The charge stored in the region of the inorganic oxide semiconductor material layer 23B and the like facing the charge storage electrode $24_{34}$ is moved to the region of the inorganic oxide semiconductor material layer 23B and the like facing the charge storage electrode $24_{24}$.

[Step-22]

The charge stored in the region of the inorganic oxide semiconductor material layer 23B and the like facing the charge storage electrode $24_{22}$ is moved to the region of the inorganic oxide semiconductor material layer 23B and the like facing the charge storage electrode $24_{11}$. The charge stored in the region of the inorganic oxide semiconductor material layer 23B and the like facing the charge storage electrode $24_{42}$ is moved to the region of the inorganic oxide semiconductor material layer 23B and the like facing the charge storage electrode $24_{32}$. The charge stored in the region of the inorganic oxide semiconductor material layer 23B and the like facing the charge storage electrode $24_{43}$ is moved to the region of the inorganic oxide semiconductor material layer 23B and the like facing the charge storage electrode $24_{33}$. The charge stored in the region of the inorganic oxide semiconductor material layer 23B and the like facing the charge storage electrode $24_{44}$ is moved to the region of the inorganic oxide semiconductor material layer 23B and the like facing the charge storage electrode $24_{34}$.

[Step-30]

Furthermore, [step-10] can be executed again to read the charge stored in the region of the inorganic oxide semiconductor material layer 23B and the like facing the charge storage electrode $24_{21}$, the charge stored in the region of the inorganic oxide semiconductor material layer 23B and the like facing the charge storage electrode $24_{22}$, the charge stored in the region of the inorganic oxide semiconductor material layer 23B and the like facing the charge storage electrode $24_{23}$, and the charge stored in the region of the inorganic oxide semiconductor material layer 23B and the like facing the charge storage electrode $24_{24}$ through the first electrode 21.

[Step-40]

Subsequently, the charge stored in the region of the inorganic oxide semiconductor material layer 23B and the like facing the charge storage electrode $24_{21}$ is moved to the region of the inorganic oxide semiconductor material layer 23B and the like facing the charge storage electrode $24_{11}$. The charge stored in the region of the inorganic oxide semiconductor material layer 23B and the like facing the charge storage electrode $24_{22}$ is moved to the region of the inorganic oxide semiconductor material layer 23B and the like facing the charge storage electrode $24_{12}$. The charge stored in the region of the inorganic oxide semiconductor material layer 23B and the like facing the charge storage electrode $24_{23}$ is moved to the region of the inorganic oxide semiconductor material layer 23B and the like facing the charge storage electrode $24_{13}$. The charge stored in the region of the inorganic oxide semiconductor material layer 23B and the like facing the charge storage electrode $24_{24}$ is moved to the region of the inorganic oxide semiconductor material layer 23B and the like facing the charge storage electrode $24_{14}$.

[Step-41]

The charge stored in the region of the inorganic oxide semiconductor material layer 23B and the like facing the charge storage electrode $24_{31}$ is moved to the region of the inorganic oxide semiconductor material layer 23B and the like facing the charge storage electrode $24_{21}$. The charge stored in the region of the inorganic oxide semiconductor material layer 23B and the like facing the charge storage electrode $24_{32}$ is moved to the region of the inorganic oxide semiconductor material layer 23B and the like facing the charge storage electrode $24_{22}$. The charge stored in the region of the inorganic oxide semiconductor material layer 23B and the like facing the charge storage electrode $24_{33}$ is moved to the region of the inorganic oxide semiconductor material layer 23B and the like facing the charge storage electrode $24_{23}$. The charge stored in the region of the inorganic oxide semiconductor material layer 23B and the like facing the charge storage electrode $24_{34}$ is moved to the region of the inorganic oxide semiconductor material layer 23B and the like facing the charge storage electrode $24_{24}$.

[Step-50]

Furthermore, [step-10] can be executed again to read the charge stored in the region of the inorganic oxide semiconductor material layer 23B and the like facing the charge storage electrode $24_{31}$, the charge stored in the region of the inorganic oxide semiconductor material layer 23B and the like facing the charge storage electrode $24_{32}$, the charge stored in the region of the inorganic oxide semiconductor material layer 23B and the like facing the charge storage electrode $24_{33}$, and the charge stored in the region of the inorganic oxide semiconductor material layer 23B and the like facing the charge storage electrode $24_{34}$ through the first electrode 21.

[Step-60]

Subsequently, the charge stored in the region of the inorganic oxide semiconductor material layer 23B and the like facing the charge storage electrode $24_{21}$ is moved to the region of the inorganic oxide semiconductor material layer 23B and the like facing the charge storage electrode $24_{11}$. The charge stored. In the region of the inorganic oxide semiconductor material layer 23B and the like facing the charge storage electrode $24_{22}$ is moved to the region of the inorganic oxide semiconductor material layer 23B and the like facing the charge storage electrode $24_{12}$. The charge stored is the region of the inorganic oxide semiconductor material layer 23B and the like facing the charge storage electrode $24_{23}$ is moved to the region of the inorganic oxide semiconductor material layer 23B and the like facing the charge storage electrode $24_{13}$. The charge stored in the region of the inorganic oxide semiconductor material layer 23B and the like facing the charge storage electrode $24_{24}$ is moved to the region of the inorganic oxide semiconductor material layer 23B and the like facing the charge storage electrode $24_{14}$.

[Step-70]

Furthermore, [step-10] can be executed again to read the charge stored in the region of the inorganic oxide semiconductor material layer 23B and the like facing the charge storage electrode $24_{41}$, the charge stored in the region of the inorganic oxide semiconductor material layer 23B and the like facing the charge storage electrode $24_{42}$, the charge stored in the region of the inorganic oxide semiconductor material layer 23B and the like facing the charge storage electrode $24_{43}$, and the charge stored in the region of the inorganic oxide semiconductor material layer 23B and the like facing the charge storage electrode $24_{44}$ through the first electrode 21.

In the solid-state imaging apparatus of Embodiment 13, the first electrode is shared by the plurality of imaging elements included in the imaging element block. This can simplify and miniaturize the configuration and the structure in the pixel region in which the plurality of imaging elements are arrayed. Note that the plurality of imaging elements provided for one floating diffusion layer may include a plurality of imaging elements of first type or may include at least one imaging element of first type and one or two or more imaging elements of second type.

Embodiment 14

Embodiment 14 is a modification of Embodiment 13. In a solid-state imaging apparatus of Embodiment 14 in FIGS. 60, 61, 62, and 63 schematically illustrating arrangement states of the first electrode 21 and the charge storage electrodes 24, two imaging elements are included in the imaging element block. In addition, one on-chip micro lens 14 is arranged. On the upper side of the imaging element block. Note that in the examples illustrated in FIGS. 61 and 63, the charge movement control electrode 27 is arranged between a plurality of imaging elements included in the imaging element block.

For example, the photoelectric conversion layers corresponding to the charge storage electrodes $24_{11}$, $24_{21}$, $24_{31}$, and $24_{41}$ included in the imaging element blocks are highly sensitive to the incident light from the upper right in the drawings. In addition, the photoelectric conversion layers corresponding to the charge storage electrodes $24_{12}$, $24_{22}$, $24_{32}$, and $24_{42}$ included in the imaging element blocks are highly sensitive to the incident light from the upper left in the drawings. Therefore, for example, the imaging element including the charge storage electrode $24_{11}$ and the imaging element including the charge storage electrode $24_{12}$ can be combined to acquire an image plane phase difference signal. In addition, the signal from the imaging element including the charge storage electrode $24_{11}$ and the signal from the imaging element including the charge storage electrode $24_{12}$ can be added, and the combination of the imaging elements can provide one imaging element. Although the first electrode $21_1$ is arranged between the charge storage electrode $24_{11}$ and the charge storage electrode $24_{12}$ in the example illustrated in FIG. 60, one first electrode $21_1$ can be arranged to face two charge storage electrodes $24_{11}$ and $24_{12}$ arranged side by side as in the example illustrated in FIG. 62 to thereby further improve the sensitivity.

Although the present disclosure has been described based on preferred. Embodiments, the present disclosure is not limited to these Embodiments. The structures, the configurations, the manufacturing conditions, the manufacturing methods, and the used materials of the stacked imaging elements, the imaging elements, and the solid-state imaging apparatuses described in Embodiments are illustrative and can be appropriately changed. The imaging elements of Embodiments can be appropriately combined. For example, the imaging element of Embodiment 7, the imaging element of Embodiment 8, the imaging element of Embodiment 9, the imaging element of Embodiment 10, and the imaging element of Embodiment 11 can be arbitrarily combined, and the imaging element of Embodiment 7, the imaging element of Embodiment 8, the imaging element of Embodiment 9, the imaging element of Embodiment 10, and the imaging element of Embodiment 12 can be arbitrarily combined.

The floating diffusion layers $FD_1$, $FD_2$, $FD_3$, 51C, 45C, and 46C can also be shared depending on the case.

Figure 64:
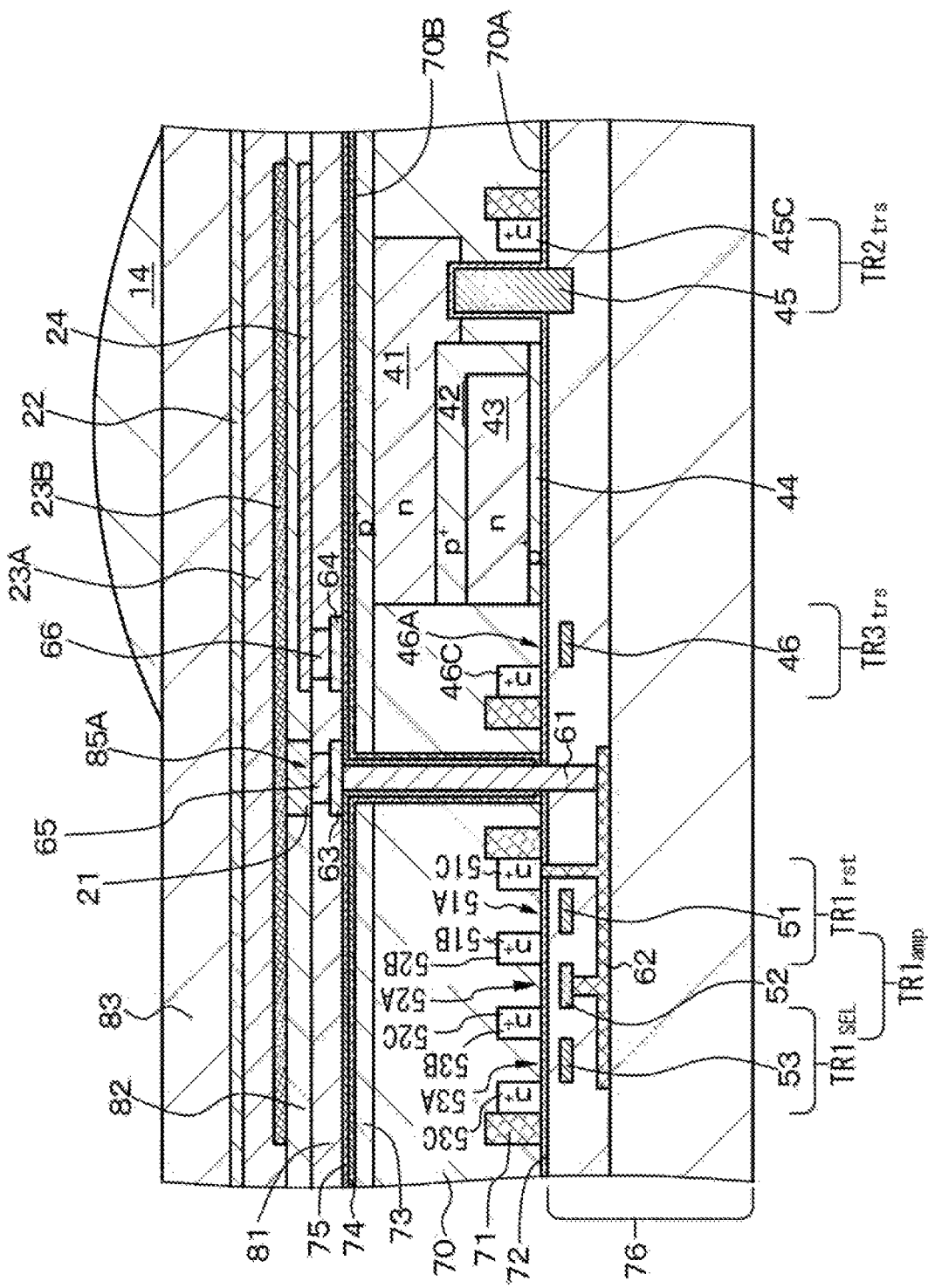
FIG. 64 is a schematic partial cross-sectional view of another modified example of the imaging element in Embodiment 1.

As in a modified example of the imaging element described in Embodiment 1 illustrated for example in FIG. 64, the first electrode 21 may extend in an opening portion 85A provided in the insulating layer 82, and the first electrode 21 may be connected to the inorganic oxide semiconductor material layer 23B.

Figure 65:
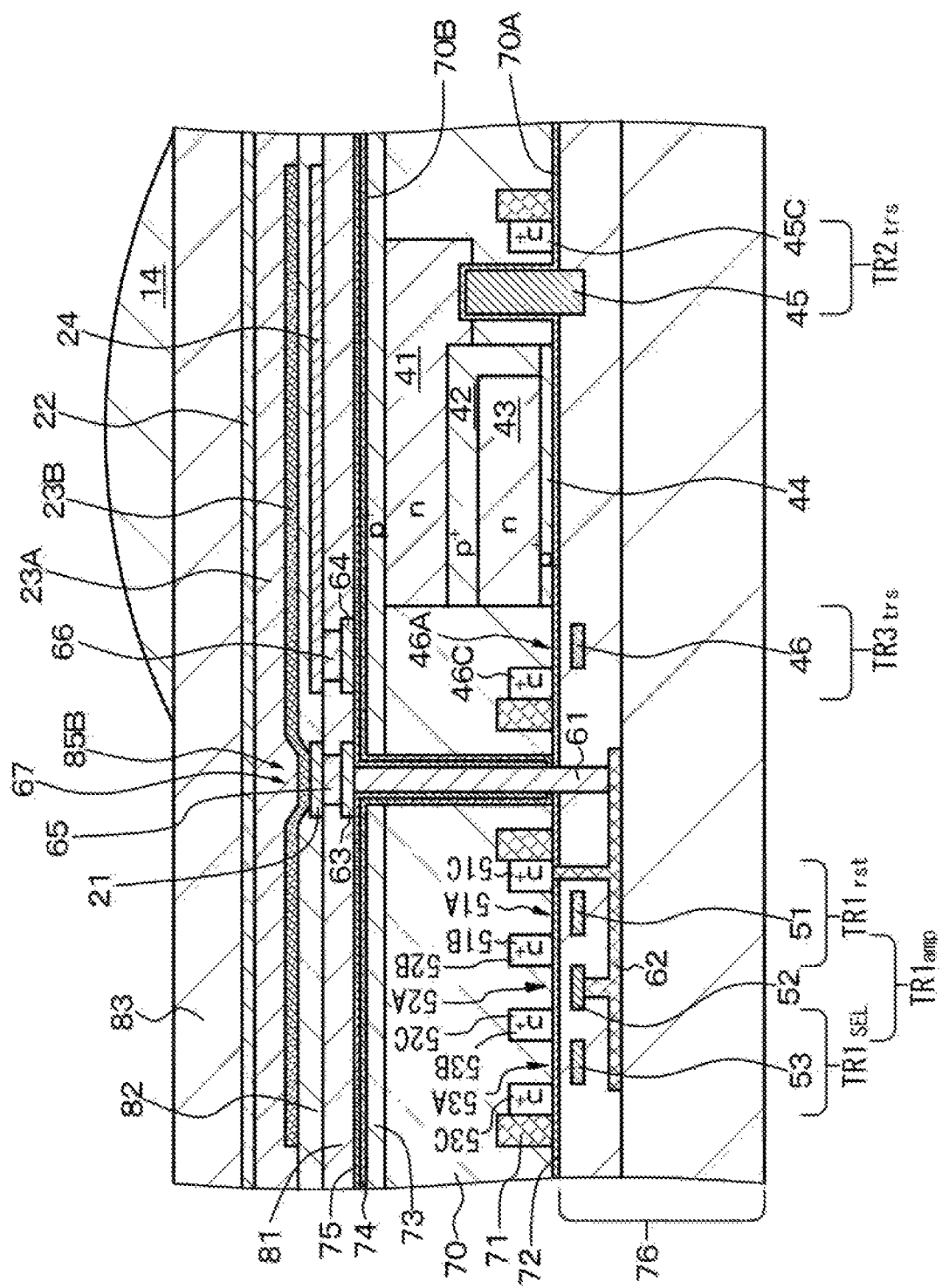
FIG. 65 is a schematic partial cross-sectional view of yet another modified example of the imaging element in Embodiment 1.
Figure 66A:
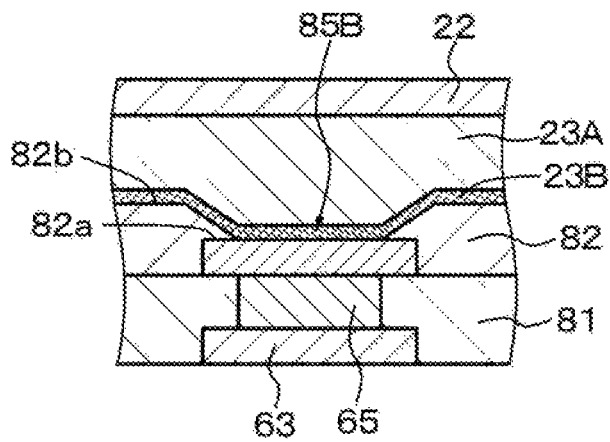
FIGS. 66A, 66B, and 66C are enlarged schematic partial cross-sectional views of the part of the first electrode and the like in yet another modified example of the imaging element of Embodiment 1.
Figure 66B:
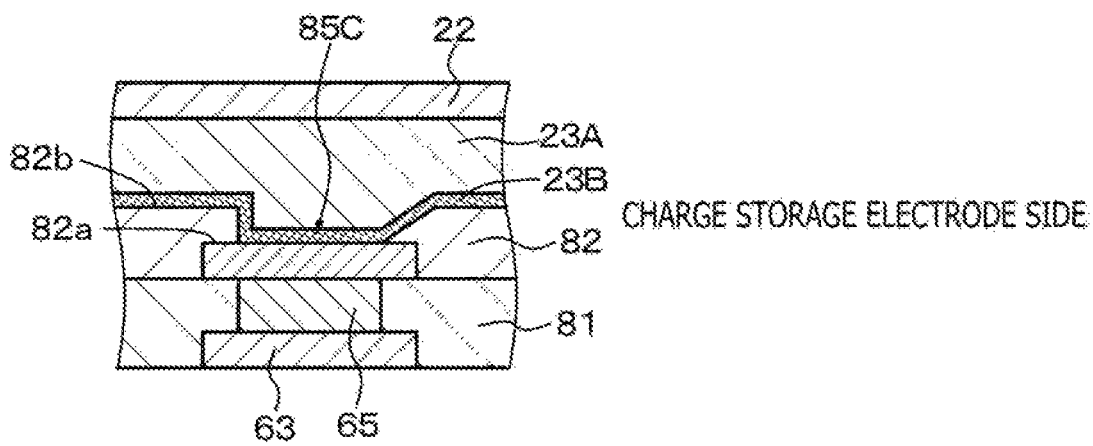
Figure 66C:
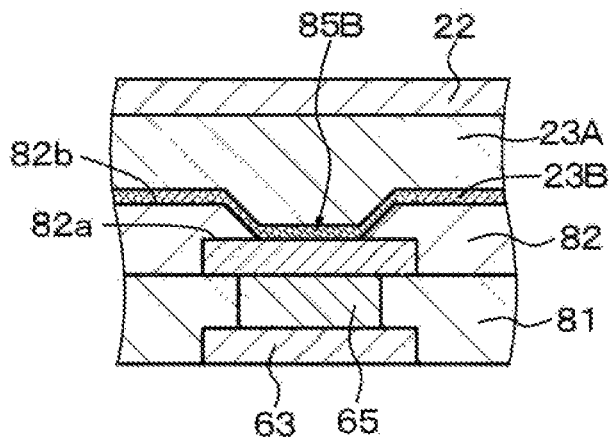

Alternatively, as in a modified example of the imaging element described in Embodiment 1 illustrated for example in FIG. 65 and as in an enlarged schematic partial cross-sectional view of the part and the like of the first electrode illustrated in FIG. 66A, the edge portion of the top surface of the first electrode 21 is covered by the insulating layer 82, and the first electrode 21 is exposed on the bottom surface of an opening portion 85B. The side surface of the opening portion 85B has a slope extending from a first surface 82a toward a second surface 82b, in which the first surface 82a is a surface of the insulating layer 82 in contact with the top surface of the first electrode 21, and the second surface 82b is a surface of the insulating layer 82 in contact with the part of the inorganic oxide semiconductor material layer 23B facing the charge storage electrode 24. In this was, the side surface of the opening potion 85B is sloped, and the charge more smoothly moves from the inorganic oxide semiconductor material layer 23B to the first electrode 21. Note that although the side surface of the opening portion 85B has rotational symmetry with respect to the axis of the opening portion 85B in the example illustrated in FIG. 66A, an opening portion 85C may be provided such that the side surface of the opening portion 85C sloped to extend from the first surface 82*a* toward the second surface 82*b* is positioned closer to the charge storage electrode 24 as illustrated in FIG. 66B. This makes the movement of charge difficult from the part of the inorganic oxide semiconductor material layer 23E on the opposite side of the charge storage electrode 24 with respect to the opening portion 85C. In addition, although the side surface of the opening portion 85B is sloped to extend from the first surface 82*a* toward the second surface 82*b*, the edge portion of the side surface of the opening portion 85B in the second surface 82*b* may be positioned outside of the edge portion of the first electrode 21 as illustrated in FIG. 66A or may be positioned inside of the edge portion of the first electrode 21 as illustrated in FIG. 66C. The former configuration can be adopted to more easily transfer the charge, and the latter configuration can be adopted to reduce the variations in the shape during the formation of the opening portions.

A reflow of an etching mask including a resist material formed to form the opening portion in the insulating layer based on an etching method can slope the opening side surface of the etching mask, and the etching mask can be used to etch the insulating layer 82 to form the opening portions 85B and 85G.

Figure 67:
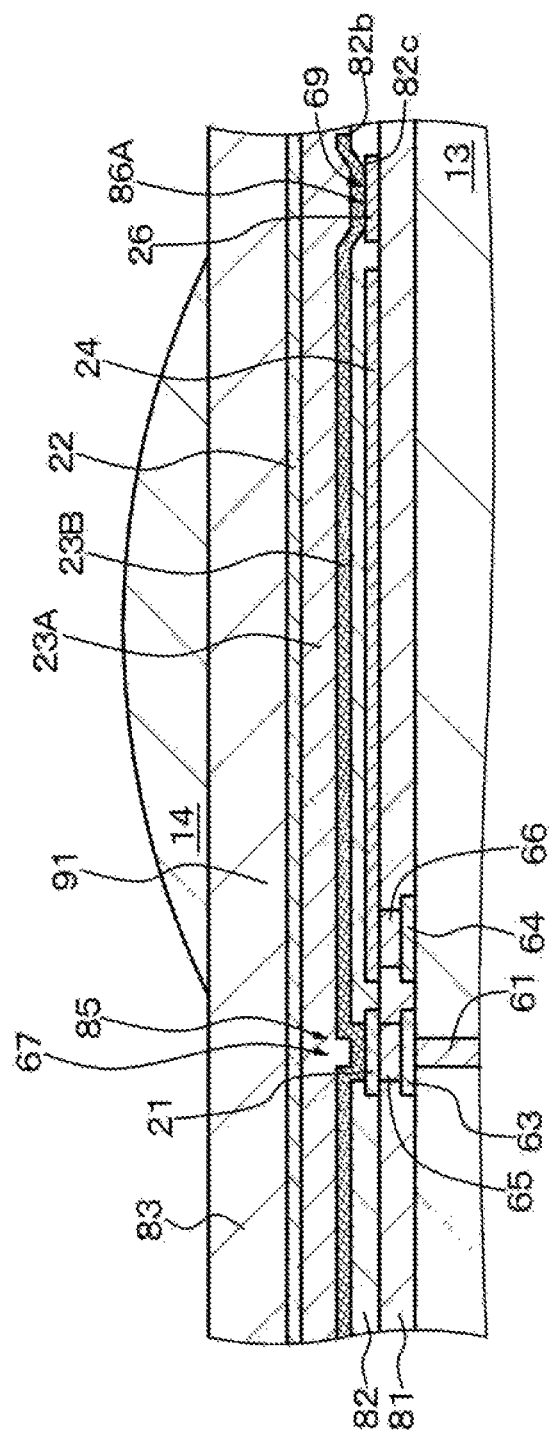
FIG. 67 is an enlarged schematic partial cross-sectional view of the part of the discharge electrode and the like in another modified example of the imaging element of Embodiment 5.

Alternatively, regarding the discharge electrode 26 described in Embodiment 5, the inorganic oxide semiconductor material layer 23B can extend in a second opening portion 86A provided in the insulating layer 82 and can be connected to the discharge electrode 26 as illustrated in FIG. 67. The edge portion of the top surface of the discharge electrode 26 can be covered by the insulating layer 82, and the discharge electrode 26 can be exposed on the bottom surface of the second opening portion 86A. The side surface of the second opening portion 86A can be sloped to extend from a third surface 82*c* toward the second surface 82*b*, in which the third surface 82*c* is a surface of the insulating layer 82 in contact with the top surface of the discharge electrode 26, and the second surface 82*b* is a surface of the insulating layer 82 in contact with the part of the inorganic oxide semiconductor material layer 23B facing the charge storage electrode 24.

Figure 68:
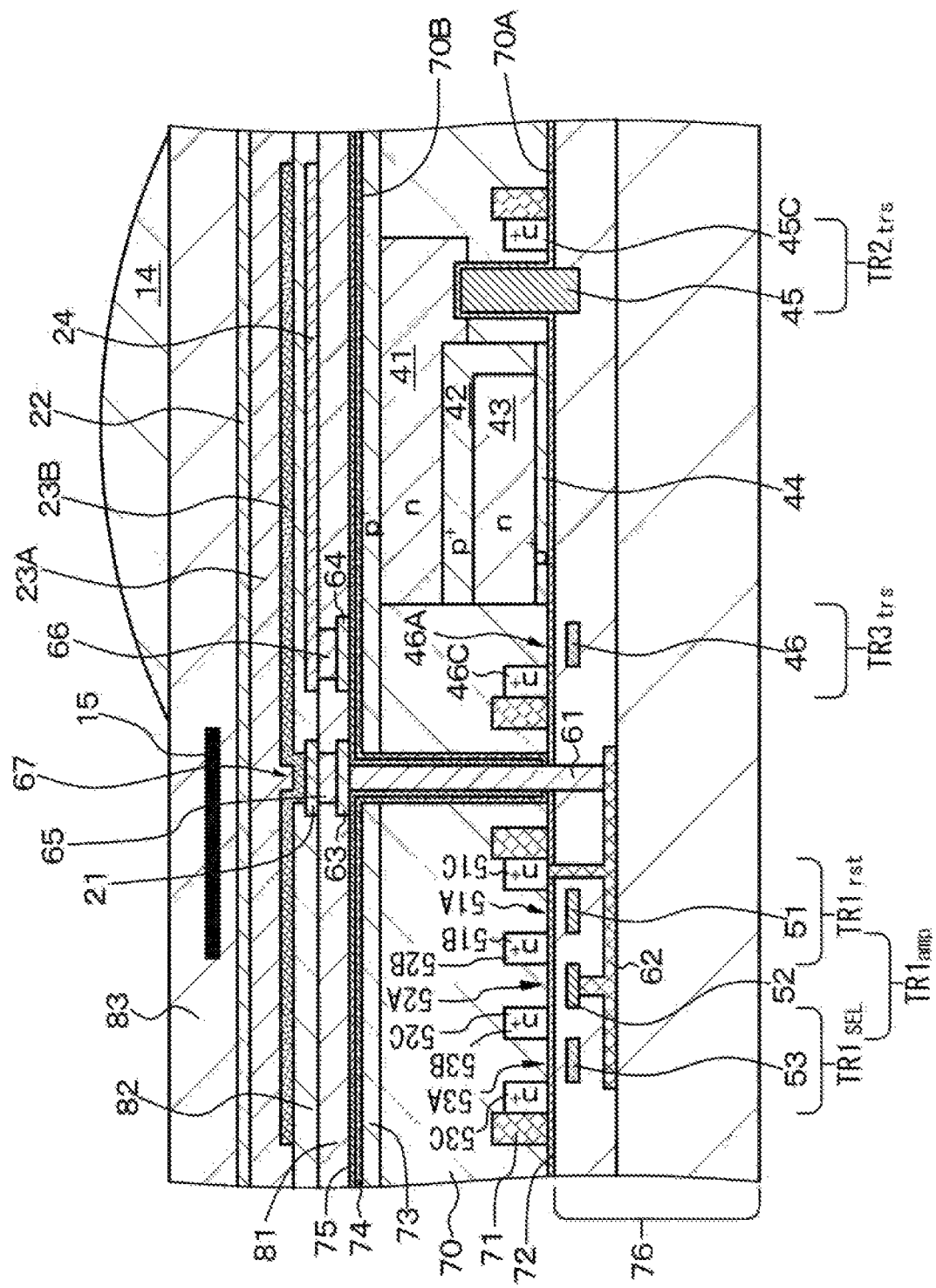
FIG. 68 is a schematic partial cross-sectional view of yet another modified example of the imaging element in Embodiment 1.

In addition, as in a modified example of the imaging element described in Embodiment 1 illustrated for example in FIG. 68, the light may be incident from the second electrode 22 side, and a light shielding layer 15 may be formed on the light incident side closer to the second electrode 22. Note that various wires provided on the light incident side with respect to the photoelectric conversion layer may also function as a light shielding layer.

Figure 69:
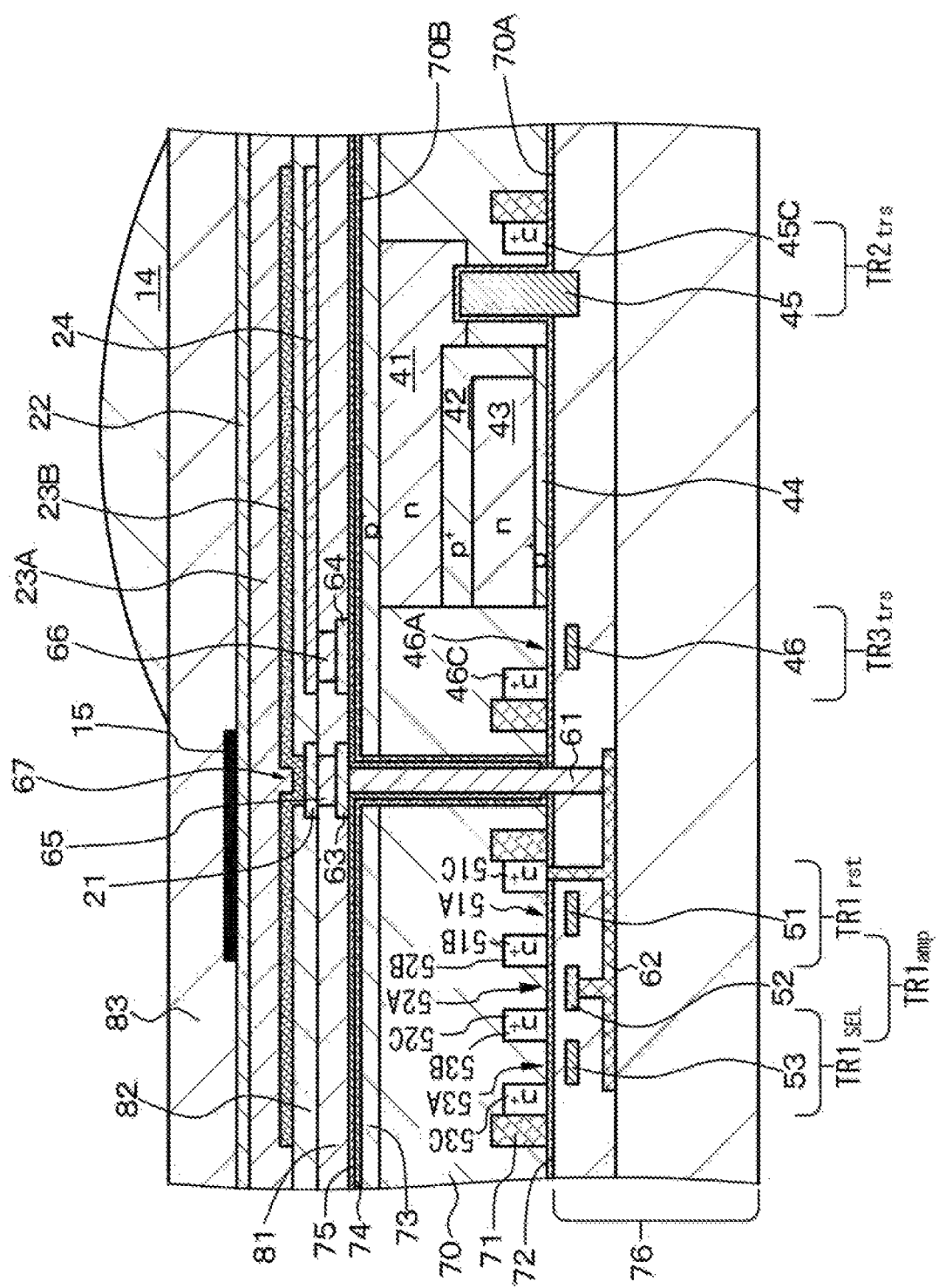
FIG. 69 is a schematic partial cross-sectional view of yet another modified example of the imaging element in Embodiment 1.
Figure 70:
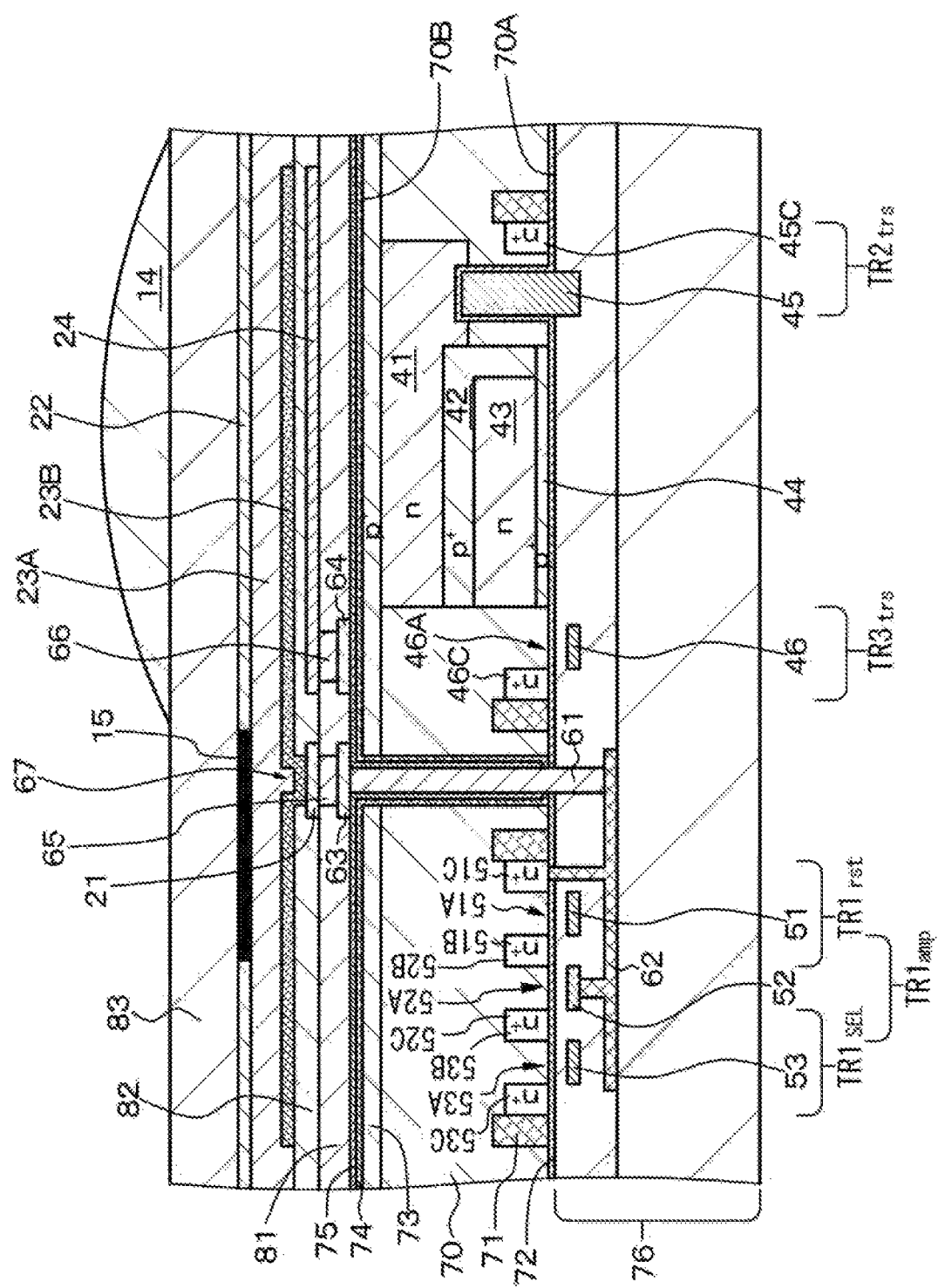
FIG. 70 is a schematic partial cross-sectional view of yet another modified example of the imaging element in Embodiment 1.

Note that although the light shielding layer 15 is formed on the upper side of the second electrode 22 in the example illustrated in FIG. 68, that is, although the light shielding layer 15 is formed on the light incident side closer to the second electrode 22 and on the upper side of the first electrode 21, the light shielding layer 15 may be arranged on the surface of the light incident side of the second electrode 22 as illustrated in FIG. 69. In addition, the light shielding layer 15 may be formed on the second electrode 22 as illustrated in FIG. 70 depending on the case.

Figure 71:
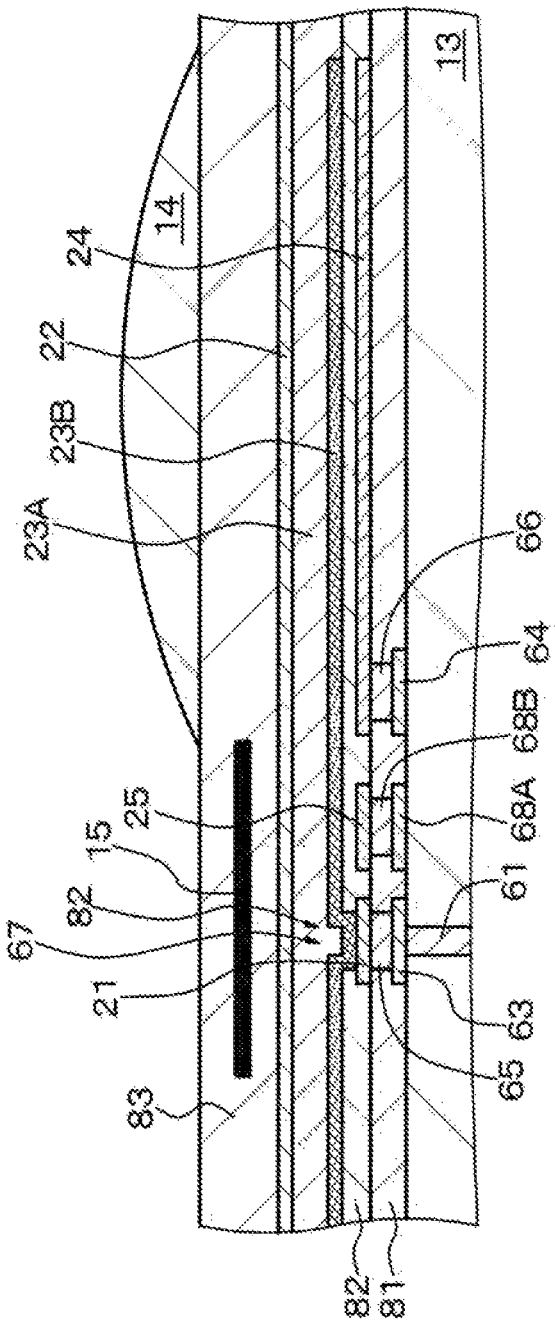
FIG. 71 is a schematic partial cross-sectional view of another modified example of the imaging element in Embodiment 4.
Figure 72:
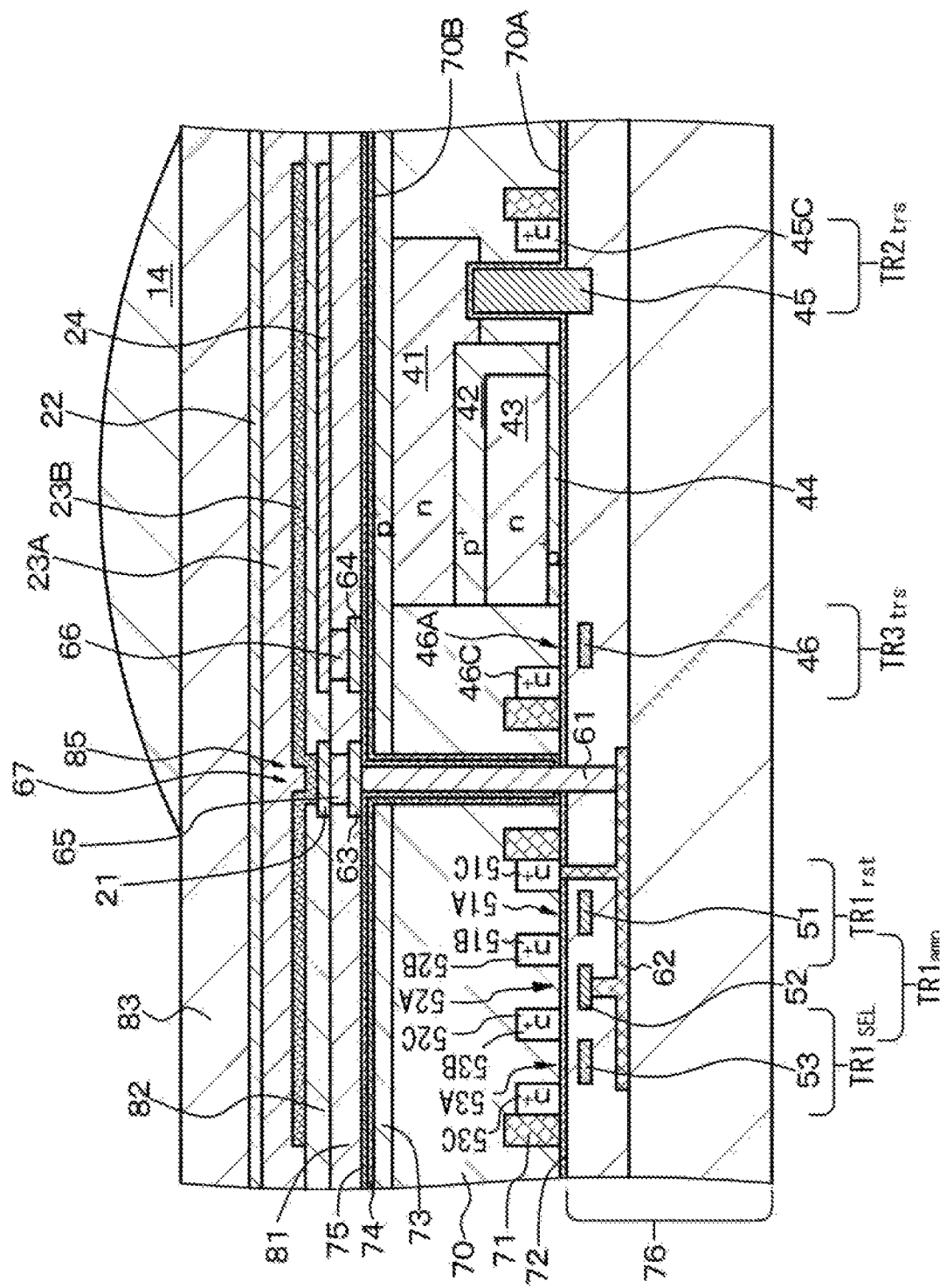
FIG. 72 is a schematic partial cross-sectional view of yet another modified example of the imaging element in Embodiment 1.

Alternatively, the light may be incident from the second electrode 22 side, and the light may not be incident on the first electrode 21. Specifically, as illustrated in FIG. 68, the light shielding layer 15 is formed on the light incident side closer to the second electrode 22 and on the upper side of the first electrode 21. Alternatively, as illustrated in FIG. 72, the on-chip micro lens 14 may be provided on the upper side of the charge storage electrode 24 and the second electrode 22. The light incident on the on-chip micro lens 14 may be collected by the charge storage electrode 24, and the light may not reach the first electrode 21. Note that in a case where the transfer control electrode 25 is provided as described in Embodiment 4, the light may not be incident on the first electrode 21 and the transfer control electrode 25. Specifically, as illustrated in FIG. 71, the light shielding layer 15 may be formed on the upper side of the first electrode 21 and the transfer control electrode 25. Alternatively, the light incident on the on-chip micro lens 14 may not reach the first electrode 21 or the first electrode 21 and the transfer control electrode 25.

The configurations and the structures can be adopted. Alternatively, the light shielding layer 15 can be provided so that the light is incident on only the part of the photoelectric conversion layer 23A positioned on the upper side of the charge storage electrode 24, Alternatively, the on-chip micro lens 14 can be designed. In this way, the part of the photoelectric conversion layer 23A positioned on the upper side of the first electrode 21 (or the upper side of the first electrode 21 and the transfer control electrode 25) does not contribute to the photoelectric conversion. Therefore, all of the pixels can be more certainly reset all at once, and the global shutter function can be more easily realized. That is, in a driving method of the solid-state imaging apparatus including a plurality of imaging elements with the configurations and the structures, the following steps are repeated:

releasing the charge in the first electrodes 21 all at once to the outside of the system while storing the charge in the inorganic oxide semiconductor material layers 23B and the like in all of the imaging elements; and then transferring the charge stored in the inorganic oxide semiconductor material layers 23B and the like all at once to the first electrodes 21 in all of the imaging elements, and after the completion of the transfer, the imaging elements sequentially read the charge transferred to the first electrodes 21.

In the driving method of the solid-state imaging apparatus, the light incident from the second electrode side is not incident on the first electrode in each imaging element. The charge in the first electrodes is released all at once to the outside of the system while the charge is stored in the inorganic oxide semiconductor material layers and the like in all of the imaging elements. Therefore, the first electrodes can be certainly reset at the same time in all of the imaging elements. In addition, subsequently, the charge stored in the inorganic oxide semiconductor material layers and the like is transferred to the first electrodes all at once in all of the imaging elements. After the completion of the transfer, the imaging elements sequentially read the charge transferred to the first electrodes. Therefore, the so-called global shutter function can be easily realized.

Figure 73:
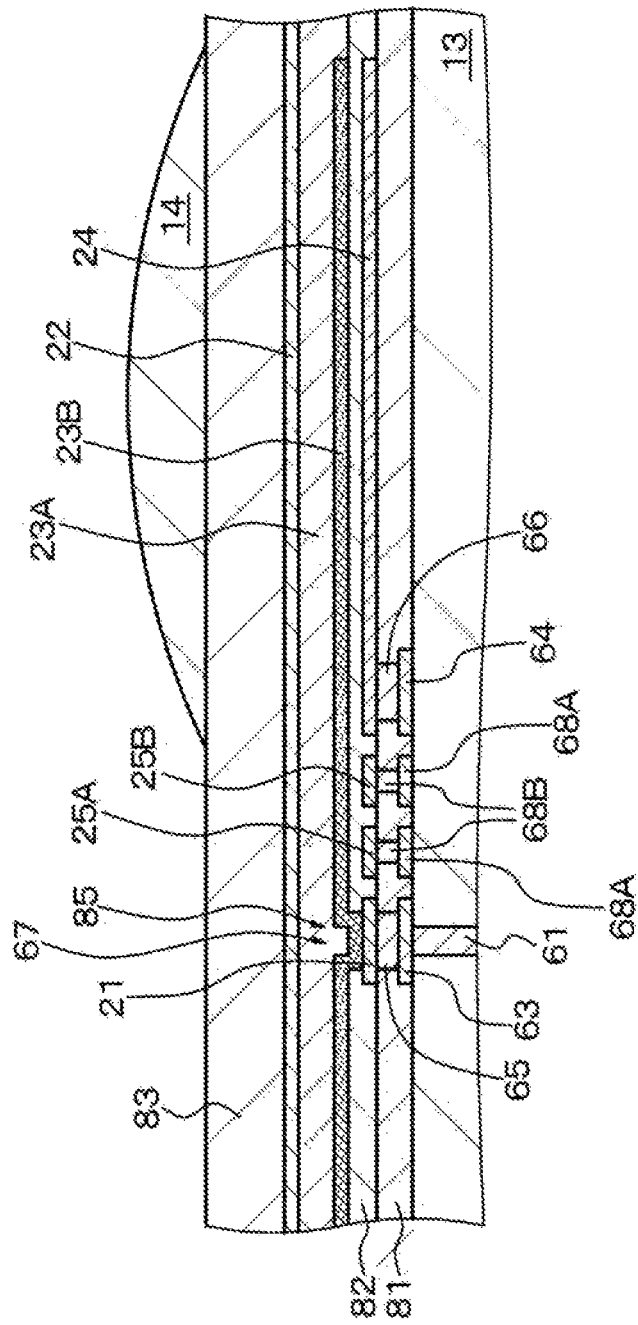
FIG. 73 is a schematic partial cross-sectional view of yet another modified example of the imaging element in Embodiment 4.

Furthermore, in a modified example of Embodiment 4, a plurality of transfer control electrodes may be provided from positions closest to the first electrode 21 toward the charge storage electrode 24 as illustrated in FIG. 13. Note that FIG. 73 illustrates an example of providing two transfer control electrodes 25A and 25B. Furthermore, the on-chip micro lens 14 may be provided on the upper side of the charge storage electrode 24 and the second electrode 22. The light incident on the on-chip micro lens 14 may be collected by the charge storage electrode 24, and the light may not reach the first electrode 21 and the transfer control electrodes 25A and 25B.

Figure 74:
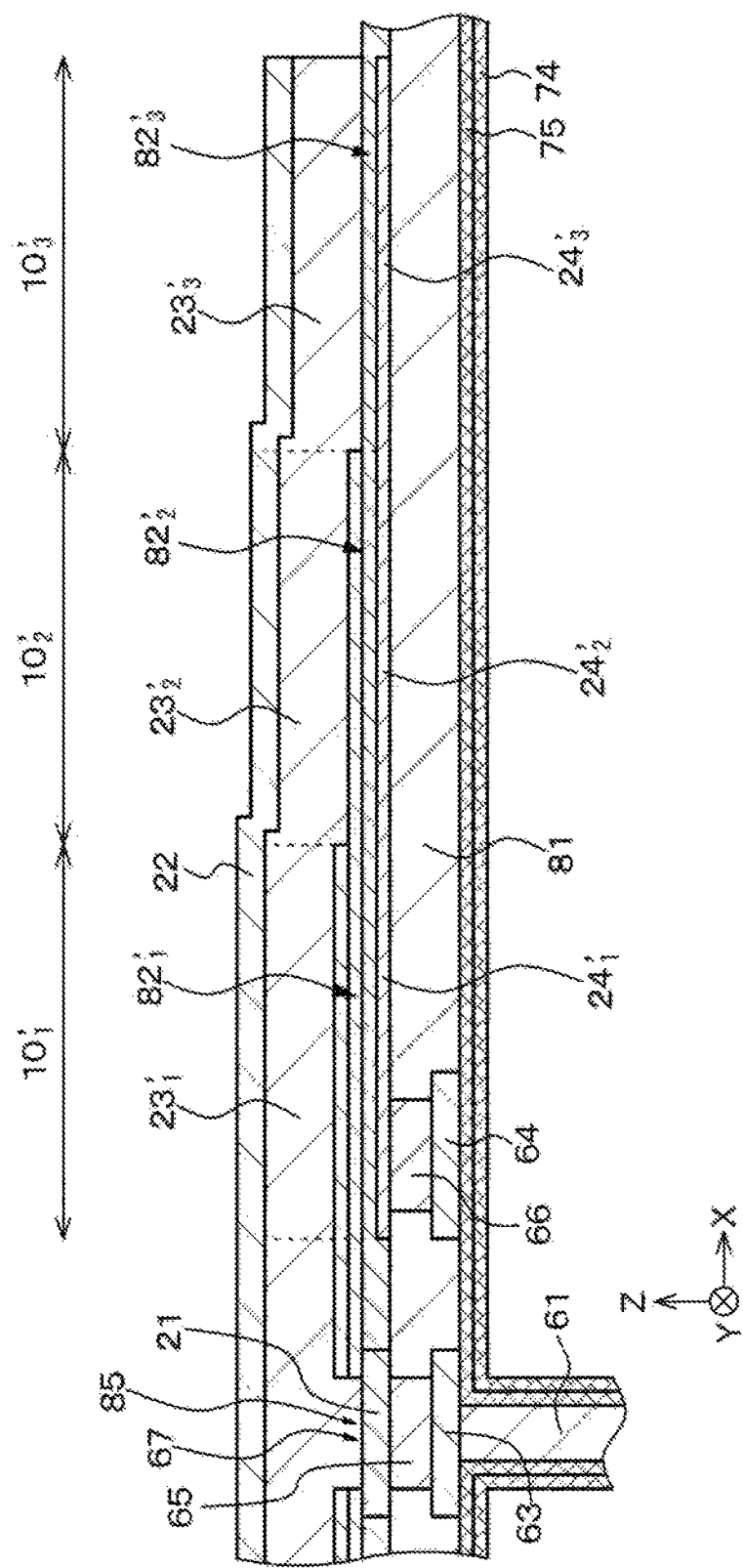
FIG. 74 is an enlarged schematic partial cross-sectional view of the stacked part of the charge storage electrode, the photoelectric conversion layer, and the second electrode in a modified example of the imaging element of Embodiment 7.

In Embodiment 7 illustrated. In FIGS. 37 and 38, the thicknesses of the charge storage electrode segments $24'_1$, $24'_2$, and $24'_3$ are gradually reduced to gradually increase the thicknesses of the insulating layer segments $82'2$, $82'_2$, and $82'_3$. On the other hand, as in FIG. 74 illustrating an enlarged schematic partial cross-sectional view of the stacked part of the charge storage electrode, the inorganic oxide semiconductor material layer, the photoelectric conversion layer, and the second electrode in a modified example of Embodiment 7, the thicknesses of the charge storage electrode segments $24'_1$, $24'_2$, and $24'_3$ may be constant, and the thicknesses of the insulating layer segments $82'_1$, $82'_2$, and $82'_3$ may be gradually increased. Note that the thicknesses of the photoelectric conversion layer segments $23'_1$, $23'_2$, and $23'_3$ are constant.

Figure 75:
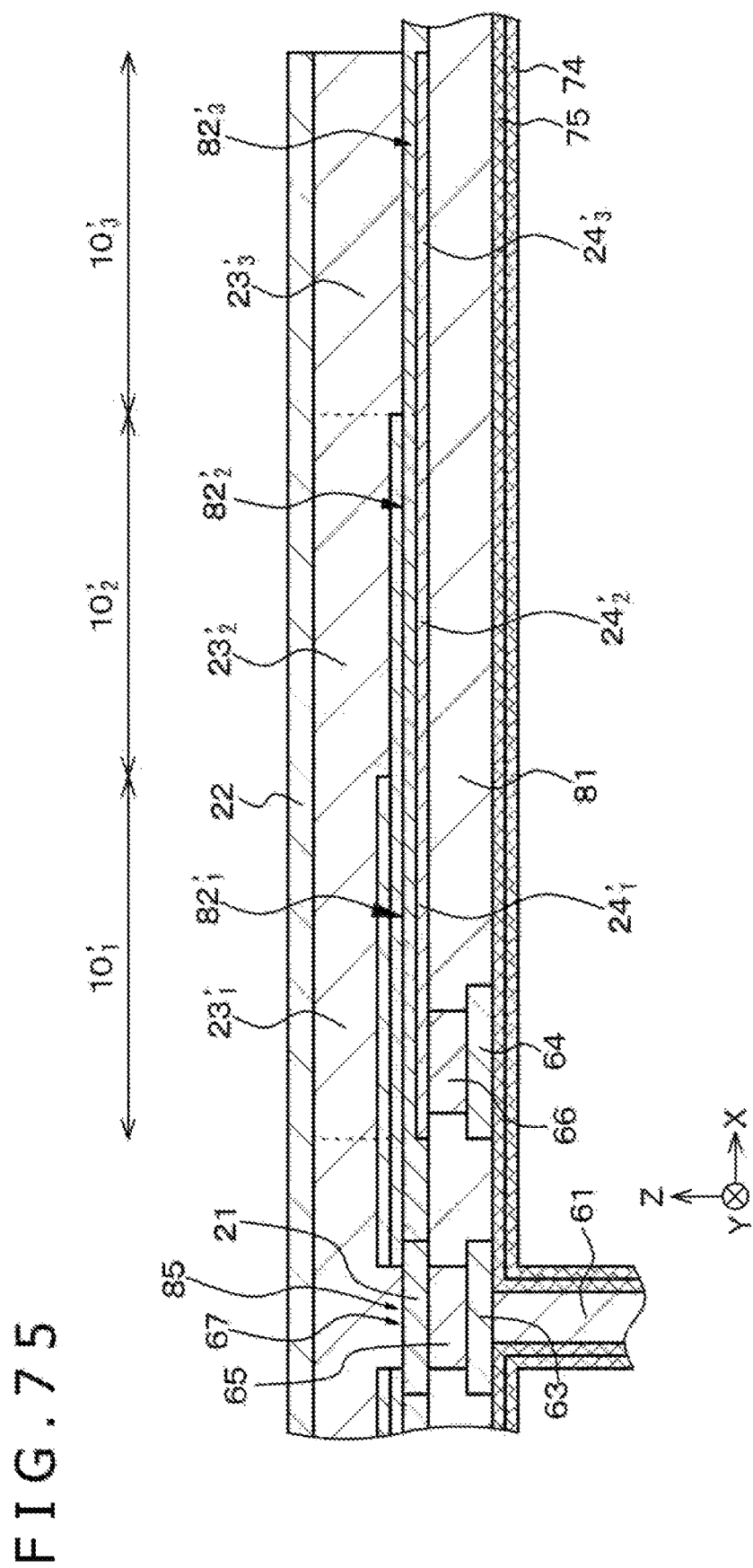
FIG. 75 is an enlarged schematic partial cross-sectional view of the stacked part of the charge storage electrode, the photoelectric conversion layer, and the second electrode in a modified example of the imaging element of Embodiment 8.

Further ore, in Embodiment 8 illustrated in FIG. 40, the thicknesses of the charge storage segments $24'_1$, $24'_2$, and $24'_3$ are gradually reduced to gradually increase the thicknesses of the photoelectric conversion layer segments $23'_1$, $23'_2$, and $23'_3$. On the other hand, as in FIG. 75 illustrating an enlarged schematic partial cross-sectional view of the stacked part of the charge storage electrode, the photoelectric conversion layer, and the second electrode in a modified example of Embodiment 8, the thicknesses of the charge storage electrode segments $24'_1$, $24'_2$, and $24'_3$ may be constant, and the thicknesses of the insulating layer segments $82'_1$, $82'_2$, and $82'_3$ may be gradually reduced to gradually increase the thicknesses of the photoelectric conversion layer segments $23'_1$, $23'_2$, and $23'_3$.

It is obvious that various modified examples described above can also be applied to Embodiments 2 to 14.

In the examples described above, Embodiments are applied to the CMOS solid-state imaging apparatus, in which the unit pixels that detect the signal charge as a physical quantity according to the incident light amount are arranged in a matrix. However, Embodiments are not limited to the application to the CMOS solid-state imaging apparatus, and Embodiments can also be applied to the CCD solid-state imaging apparatus. In the latter case, a vertical transfer register of CCD structure transfers the signal charge in the vertical direction, and a horizontal transfer register transfers the signal charge in the horizontal direction. The charge is amplified, and a pixel signal (image signal) is output. In addition, Embodiments are not limited to the column-type solid-state imaging apparatuses in general, in which the pixels are formed in a two-dimensional matrix, and a column signal processing circuit is arranged for each pixel column. Furthermore, the selection transistor may not be included depending on the case.

Furthermore, the imaging element of the present disclosure is not limited to the application to the solid-state imaging apparatus that detects the distribution of the incident light amount of visible light to obtain an image of the distribution. The imaging element can also be applied to a solid-state imaging apparatus that takes an image of the distribution of the incident amount of infrared rays, X rays, particles, or the like. Furthermore, in a broad sense, the imaging element can be applied to solid-state imaging apparatuses (physical quantity distribution detection apparatuses) in general, such as a fingerprint detection sensor, that detects the distribution of another physical quantity, such as pressure and capacitance, to obtain an image of the distribution.

Furthermore, the imaging element is not limited to the solid-state imaging apparatus that sequentially scans the unit pixels of the imaging region row-by-row to read the pixel signals from the unit pixels. The imaging element can also be applied to an X-Y address type solid-state imaging apparatus that selects arbitrary pixels pixel-by-pixel and that reads the pixel signals pixel-by-pixel from the selected pixels. The solid-state imaging apparatus may be formed as one chip or may be in a form of a module with an imaging function in which the imaging region and the drive circuit or the optical system are packaged together.

In addition, the imaging element is not limited to the application to the sold-state imaging apparatus, and the imaging element can also be applied to an imaging apparatus. Here, the imaging apparatus denotes a camera system, such as a digital still camera and a video camera, or an electronic device with an imaging function, such as a cell phone. The imaging apparatus is in a form of a module mounted on the electronic device, that is, a camera module, in some cases.

Figure 80:
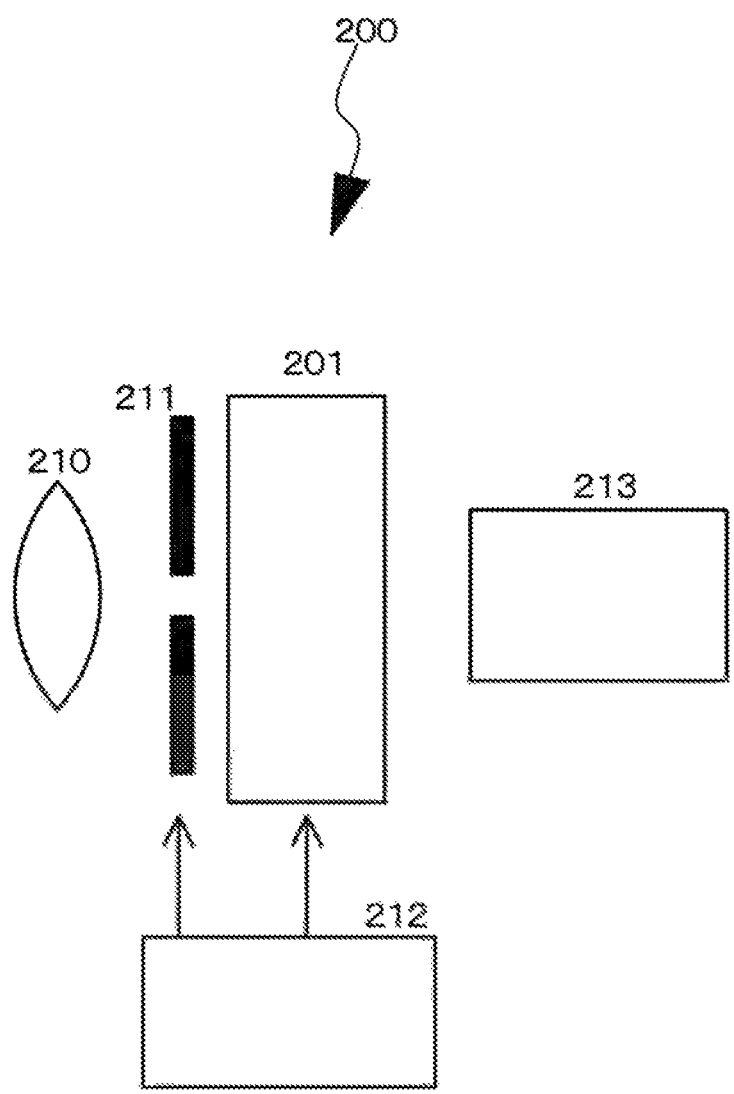
FIG. 80 is a conceptual diagram of an example in which the solid-state imaging apparatus including the imaging element and the like of the present disclosure is used in an electronic device (camera).

FIG. 80 illustrates a conceptual diagram of an example in which a solid-state imaging apparatus 201 including the imaging element of the present disclosure is used in an electronic device (camera) 200. The electronic device 200 includes the solid-state imaging apparatus 201, an optical lens 210, a shutter apparatus 211, a drive circuit 212, and a signal processing circuit 213. The optical lens 210 uses image light (incident light) from an object to form an image on the imaging surface of the solid-state imaging apparatus 201. As a result, signal charge is stored in the solid-state imaging apparatus 201 for a certain period. The shutter apparatus 211 controls a light application period and a light shielding period for the solid-state imaging apparatus 201. The drive circuit 212 supplies drive signals for controlling a transfer operation and the like of the solid-state imaging apparatus 201 and a shutter operation of the shutter apparatus 211. The signal of the solid-state imaging apparatus 201 is transferred based on the drive signal (timing signal) supplied from the drive circuit 212. The signal processing circuit 213 executes various types of signal processing. The video signal after the signal processing is stored in a storage medium, such as a memory, or output to a monitor. In the electronic device 200, the pixel size in the solid-state imaging apparatus 201 can be miniaturized, and the transfer efficiency can be improved. Therefore, the pixel characteristics can be improved in the electronic device 200. The electronic device 200 to which the solid-state imaging apparatus 201 can be applied is not limited to the camera. The solid-state imaging apparatus 201 can be applied to a digital still camera, a camera module for mobile device, such as a cell phone, and other imaging apparatuses.

Note that the present disclosure can also be configured as follows.

[A01]<<Imaging Element: First Aspect>

An imaging element including:

a photoelectric conversion unit including a first electrode, a photoelectric conversion layer, and a second electrode that are stacked, in which an inorganic oxide semiconductor material layer is formed between the first electrode and the photoelectric conversion layer, and the inorganic oxide semiconductor material layer includes at least two types of elements selected from the group consisting of indium, tungsten, tin, and zinc.

[A02]

The imaging element according to [A01], in which the photoelectric conversion unit further includes an insulating layer and a charge storage electrode arranged apart from the first electrode and arranged to face the inorganic oxide semiconductor material layer through the insulating layer.

The imaging element according to [A01] or [A02], in which the inorganic oxide semiconductor material layer does not contain gallium atoms.

[A04]

The imaging element according to [A01] or [A02], in which
the inorganic oxide semiconductor material layer includes indium-tungsten oxide (IWO), indium-tungsten-zinc oxide (IWZO), indium-tin-zinc oxide (ITZO), or zinc-tin oxide (ZTO).

The imaging element according to [A01] or [A02], in which
the inorganic oxide semiconductor material layer includes indium-tungsten-zinc oxide (IWZO).

[A06]

The imaging element according to [A01] or [A02], in which
the inorganic oxide semiconductor material layer includes indium-tungsten oxide (IWO).

[A07]

The imaging element according to any one of [A01] to [A06], in which
a LUMO value $E_1$ of a material included in a part of the photoelectric conversion layer positioned near the inorganic oxide semiconductor material layer and a LUMO value $E_2$ of a material included in the inorganic oxide semiconductor material layer satisfy the following expression.

$$E_1-E_2<0.2 \text{ eV}$$

[A08]

The imaging element according to [A07], in which the LUMO value $E_1$ of the material included in the part of the photoelectric conversion layer positioned near the inorganic oxide semiconductor material layer and the LUMO value $E_2$ of the material included in the inorganic oxide semiconductor material layer satisfy the following expression.

$$E_1-E_2<0.1 \text{ eV}$$

[A09]

The imaging element according to any one of [A01] to [A08], in which
the mobility of the material included is the inorganic oxide semiconductor material layer is equal to or greater than 10 cm$^2$/V·s.

[10] <<Imaging Element: Second Aspect>>

An imaging element including:
a photoelectric conversion unit including a first electrode, a photoelectric conversion layer, and a second electrode that are stacked, in which
as inorganic oxide semiconductor material layer is formed between the first electrode and the photoelectric conversion layer, and
a LUMO value $E_1$ of a material included in a part of the photoelectric conversion layer positioned near the inorganic oxide semiconductor material layer and a LUMO value $E_2$ of a material included in the inorganic oxide semiconductor material layer satisfy the following expression.

$$E_1-E_2<0.2 \text{ eV}$$

The imaging element according to [A10], in which the LUMO value $E_1$ of the material included in the part of the photoelectric conversion layer positioned near the inorganic oxide semiconductor material layer and the LUMO value $E_2$ of the material included in the inorganic oxide semiconductor material layer satisfy the following expression.

$$E_1-E_2<0.1 \text{ eV}$$

[A12]

The imaging element according to [A10] or [A11], in which
the mobility of the material included in the inorganic oxide semiconductor material layer is equal to or greater than 10 cm$^2$/V·s.

[A13] <<Imaging Element: Third Aspect>>

An imaging element including
a photoelectric conversion unit including a first electrode, a photoelectric conversion layer, and a second electrode that are stacked, in which
an inorganic oxide semiconductor material layer is formed between the first electrode and the photoelectric conversion layer, and
the mobility of a material included in the inorganic oxide semiconductor material layer is equal to or greater than 10 cm$^2$/V·s.

[A14]

The imaging element according to any one of [A01] to [A11], in which
the inorganic oxide semiconductor material layer is amorphous.

[A15]

The imaging element according to any one of [A01] to [A14], in which
the thickness of the inorganic oxide semiconductor material layer is $1\times10^{-8}$ m to $1.5\times10^{-7}$ m.

[A16]

The imaging element according to any one of [A01] to [A15], in which
light is incident from the second electrode,
surface roughness Ra of the inorganic oxide semiconductor material layer in an interface between the photoelectric conversion layer and the inorganic oxide semiconductor material layer is equal to or smaller than 1.5 nm, and a value of root means square roughness Rq of the inorganic oxide semiconductor material layer is equal to or smaller than 2.5 nm.

[B01]

The imaging element according to any one of [A01] to [A16], in which
the photoelectric conversion unit further includes an insulating layer and a charge storage electrode arranged apart from the first electrode and arranged to face the inorganic oxide semiconductor material layer through the insulating layer.

[B02]

The imaging element according to [B01], further including
a semiconductor substrate, in which
the photoelectric conversion unit is arranged on an upper side of the semiconductor substrate.

[B03]

The imaging element according to [B01] or [B02], in which
the first electrode extends in an opening portion provided in the insulating layer and is connected to the inorganic oxide semiconductor material layer.

[B04]

The imaging element according to [B01] or [B02], in which
the inorganic oxide semiconductor material layer extends in an opening portion provided in the insulating layer and is connected to the first electrode.

[B05]

The imaging element according to [B04], in which an edge portion of a top surface of the first electrode is covered by the insulating layer, the first electrode is exposed on a bottom surface of the opening portion, and a side surface of the opening portion is sloped to extend from a first surface toward a second surface, where the first surface is a surface of the insulating layer in contact with the top surface of the first electrode, and the second surface is a surface of the insulating layer in contact with a part of the inorganic oxide semiconductor material layer facing the charge storage electrode.

[B06]

The imaging element according to [B05], in which the side surface of the opening portion sloped to extend from the first surface toward the second surface is positioned on a charge storage electrode side.

[B07] <<Control of Potentials of First Electrode and Charge Storage Electrode>>

The imaging element according to any one of [B01] to [B06]], further including:

a control unit provided on the semiconductor substrate and including a drive circuit, in which the first electrode and the charge storage electrode are connected to the drive circuit, in a charge storage period, the drive circuit applies a potential $V_{11}$ to the first electrode and applies a potential $V_{12}$ to the charge storage electrode, and charge is stored in the inorganic oxide semiconductor material layer, and in a charge transfer period, the drive circuit applies a potential $V_{21}$ to the first electrode and applies a potential $V_{22}$ to the charge storage electrode, and the charge stored is the inorganic oxide semiconductor material layer is read out to the control unit through the first electrode, where the potential of the first electrode is higher than the potential of the second electrode, and $V_{12} \geq V_{11}$ and $V_{22} < V_{21}$ hold.

[B08] <<Transfer Control Electrode>>

The imaging element according to any one of [B01] to [B06], further including:

a transfer control electrode arranged between the first electrode and the charge storage electrode, arranged apart from the first electrode and the charge storage electrode, and arranged to face the inorganic oxide semiconductor material layer through the insulating layer.

[B09] <<Control of Potentials of First Electrode, Charge Storage Electrode, and Transfer Control Electrode>>

The imaging element according to [B08], further including a control unit provided on the semiconductor substrate and including a drive circuit, in which the first electrode, the charge storage electrode, and the transfer control circuit are connected to the drive circuit, in a charge storage period, the drive circuit applies a potential $V_{11}$ to the first electrode, applies a potential $V_{12}$ to the charge storage electrode, and applies a potential $V_{13}$ to the transfer control electrode, and charge is stored in the inorganic oxide semiconductor material layer, and in a charge transfer period, the drive circuit applies a potential $V_{21}$ to the first electrode, applies a potential $V_{22}$ to the charge storage electrode, and applies a potential $V_{23}$ to the transfer control electrode, and the charge stored in the inorganic oxide semiconductor material layer is read out to the control unit through the first electrode, where the potential of the first electrode is higher than the potential of the second electrode, and $V_{12} > V_{13}$ and $V_{22} \leq V_{23} \leq V_{21}$ hold.

[B10] <<Discharge Electrode>>

The imaging element according to any one of [B01] to [B09], further including a discharge electrode connected to the inorganic oxide semiconductor material layer and arranged apart from the first electrode and the charge storage electrode.

[B11]

The imaging element according to [B10], in which the discharge electrode is arranged to surround the first electrode and the charge storage electrode.

[B12]

The imaging element according to [B10] or [B11], in which the inorganic oxide semiconductor material layer extends in a second opening portion provided on the insulating layer and is connected to the discharge electrode, an edge portion of a top surface of the discharge electrode is covered by the insulating layer, the discharge electrode is exposed on a bottom surface of the second opening, a side surface of the second opening portion is sloped to extend from a third surface toward a second surface, where the third surface is a surface of the insulating layer in contact with the top surface of the discharge electrode, and the second surface is a surface of the insulating layer in contact with a part of the inorganic oxide semiconductor material layer facing the charge storage electrode.

[B13] <<Control of Potentials of First Electrode, Charge Storage Electrode, and Discharge Electrode>>

The imaging element according to any one of [B10] to [B12], further including:

a control unit provided on the semiconductor substrate and including a drive circuit, in which the first electrode, the charge storage electrode, and the discharge electrode are connected to the drive circuit, in a charge storage period, the drive circuit applies a potential $V_{11}$ to the first electrode, applies a potential $V_{12}$ to the charge storage electrode, and applies a potential $V_{14}$ to the discharge electrode, and charge is stored in the inorganic oxide semiconductor material layer, and in a charge transfer period, the drive circuit applies a potential $V_{21}$ to the first electrode, applies a potential $V_{22}$ to the charge storage electrode, and applies a potential $V_{24}$ to the discharge electrode, and the charge stored in the inorganic oxide semiconductor material layer is read out to the control unit through the first electrode, where the potential of the first electrode is higher than the potential of the second electrode, and $V_{14} > V_{11}$ and $V_{24} < V_{21}$ hold.

[B14] <<Charge Storage Electrode Segment>>

The imaging element according to any one of [B01] to [B13], in which the charge storage electrode includes a plurality of charge storage electrode segments.

[B15]

The imaging element according to [B14], in which in a case where the potential of the first electrode is higher than the potential of the second electrode, a potential applied to a charge storage electrode segment positioned at a place closest to the first electrode is higher than a potential applied to a charge storage electrode segment positioned at a place farthest from the first electrode in the charge transfer period, and in a case where the potential of the first electrode is lower than the potential of the second electrode, the potential applied to the charge storage electrode segment positioned at the place closest to the first electrode is lower than the potential applied to the charge storage electrode segment positioned at the place farthest from the first electrode in the charge transfer period.

[B16]

The imaging element according to any one of [B01] to [B15], in which at least a floating diffusion layer and an amplification transistor included in the control unit are provided on the semiconductor substrate, and the first electrode is connected to the floating diffusion layer and a gate portion of the amplification transistor.

[B17]

The imaging element according to [B16], in which a reset transistor and a selection transistor included in the control unit are further provided on the semiconductor substrate, the floating diffusion layer is connected to one source/drain region of the reset transistor, one source/drain region of the amplification transistor is connected to one source/drain region of the selection transistor, and another source/drain region of the selection transistor is connected to a signal line.

[B18]

The imaging element according to any one of [B01] to [B17], in which the size of the charge storage electrode is larger than the first electrode.

[B19]

The imaging element according to any one of [B01] to [B18], in which light is incident from a second electrode side, and a light shielding layer is formed on a light incident side closer to the second electrode.

[B20]

The imaging element according to any one of [B01] to [B18], in which light is incident from a second electrode side, and the light is not incident on the first electrode.

[B21]

The imaging element according to [B20], in which a light shielding layer is formed on a light incident side closer to the second electrode, on an upper side of the first electrode.

[B22]

The imaging element according to [B20], in which an on-chip micro lens is provided on an upper side of the charge storage electrode and the second electrode, and light incident on the on-chip micro lens is collected by the charge storage electrode.

[B23] <<Imaging Element: First Configuration>>

The imaging element according to any one of [B01] to [B22], in which the photoelectric conversion unit includes N (where N≥2) photoelectric conversion unit segments, the inorganic oxide semiconductor material layer and the photoelectric conversion layer include N photoelectric conversion layer segments, the insulating layer includes N insulating layer segments, the charge storage electrode includes N charge storage electrode segments, an nth (where n=1, 2, 3, . . . N) photoelectric conversion unit segment includes an nth charge storage electrode segment, an nth insulating layer segment, and an nth photoelectric conversion layer segment, the larger the value of n of the photoelectric conversion unit segment, the farther the position of the photoelectric conversion unit segment from the first electrode, and the thicknesses of the insulating layer segments gradually change from the first photoelectric conversion unit segment to the Nth photoelectric conversion unit segment.

[B24] <<Imaging Element: Second Configuration>>

The imaging element according to any one of [B01] to [B22], in which the photoelectric conversion unit includes N (where N≥2) photoelectric conversion unit segments, the inorganic oxide semiconductor material layer and the photoelectric conversion layer include N photoelectric conversion layer segments, the insulating layer includes N insulating layer segments, the charge storage electrode includes N charge storage electrode segments, an nth (where n=1, 2, 3, . . . N) photoelectric conversion unit segment includes an nth charge storage electrode segment, as nth insulating layer segment, and an nth photoelectric conversion layer segment, the larger the value of n of the photoelectric conversion unit segment, the farther the position of the photoelectric conversion unit segment from the first electrode, and the thicknesses of the photoelectric conversion layer segments gradually change from the first photoelectric conversion unit segment to the Nth photoelectric conversion unit segment.

[B25] <<Imaging Element: Third Configuration>>

The imaging element according to any one of [B01] to [B22], in which the photoelectric conversion unit includes N (where N≥2) photoelectric conversion unit segments, the inorganic oxide semiconductor material layer and the photoelectric conversion layer include N photoelectric conversion layer segments, the insulating layer includes N insulating layer segments, the charge storage electrode includes N charge storage electrode segments, an nth (where n=1, 2, 3, . . . N) photoelectric conversion unit segment includes an nth charge storage electrode segment, an nth insulating layer segment, and an nth photoelectric conversion layer segment, the larger the value of n of the photoelectric conversion unit segment, the farther the position of the photoelectric conversion unit segment from the first electrode, and materials included in the insulating layer segments vary between adjacent photoelectric conversion unit segments.

[B26]<<Imaging Element: Fourth Configuration>>

The imaging element according to any one of [B01] to [B22], in which the photoelectric conversion unit includes N (where N≥2) photoelectric conversion unit segments, the inorganic oxide semiconductor material layer and the photoelectric conversion layer include N photoelectric conversion layer segments, the insulating layer includes N insulating layer segments, the charge storage electrode includes N charge storage electrode segments arranged apart from each other, an nth (where n=1, 2, 3, . . . N) photoelectric conversion unit segment includes an nth charge storage electrode segment, an nth insulating layer segment, and an nth photoelectric conversion layer segment, the larger the value of n of the photoelectric conversion unit segment, the farther the position of the photoelectric conversion unit segment from the first electrode, and materials included in the charge storage electrode segments vary between adjacent photoelectric conversion unit segments.

[B27] <<Imaging Element: Fifth Configuration>>

The imaging element according to any one of [B01] to [B22], in which the photoelectric conversion unit includes N (where N≥2) photoelectric conversion unit segments, the inorganic oxide semiconductor material layer and the photoelectric conversion layer include N photoelectric conversion layer segments, the insulating layer includes N insulating layer segments, the charge storage electrode includes N charge storage electrode segments arranged apart from each other, an nth (where n=1, 2, 3, ... N) photoelectric conversion unit segment includes an nth charge storage electrode segment, an nth insulating layer segment, and an nth photoelectric conversion layer segment, the larger the value of n of the photoelectric conversion unit segment, the farther the position of the photoelectric conversion unit segment from the first electrode, and the areas of the charge storage electrode segments gradually decrease from the first photoelectric conversion unit segment to the Nth photoelectric conversion unit segment.

[B28] <<Imaging Element: Sixth Configuration>>

The imaging element according to any one of [B01] to [B22], in which the cross-sectional area of a stacked part of the charge storage electrode, the insulating layer, the inorganic oxide semiconductor material layer, and the photoelectric conversion layer when the stacked part is cut in a YZ virtual plane changes in accordance with the distance from the first electrode, where a Z direction is a stacking direction of the charge storage electrode, the insulating layer, the inorganic oxide semiconductor material layer, and the photoelectric conversion layer, and an X direction is a direction away from the first electrode.

[C01] <<Stacked Imaging Element>>

A stacked imaging element including at least one imaging element according to any one of [A01] to [B28].

[D01] <<Solid-State Imaging Apparatus: First Aspect>>

A solid-state imaging apparatus including a plurality of imaging elements according to any one of [A01] to [B28].

[D02] <<Solid-State Imaging Apparatus: Second Aspect>>

A solid-state imaging apparatus including a plurality of stacked imaging elements according to [C01].

[E01] <<Solid-State Imaging Apparatus: First Configuration>>

A solid-state imaging apparatus including a photoelectric conversion unit including a first electrode, a photoelectric conversion layer, and a second electrode that are stacked, in which the photoelectric conversion unit includes a plurality of imaging elements according to any one of [A01] to [B28], a plurality of imaging elements are included in an imaging element block, and the first electrode is shared by the plurality of imaging elements included in the imaging element block.

[E02] <<Solid-State Imaging Apparatus: Second Configuration>>

A solid-state imaging apparatus including:

a plurality of imaging elements according to any one of [A01] to [B28], in which a plurality of imaging elements are included in an imaging element block, and the first electrode is shared by the plurality of imaging elements included in the imaging element block.

[E03]

The solid-state imaging apparatus according to [E01] or [E02], in which one on-chip micro lens is arranged on an upper side of one imaging element. [E04]

The solid-state imaging apparatus according to or [E02], in which two imaging elements are included in the imaging element block, and one on-chip micro lens is arranged on an upper side of the imaging element block.

[E05]

The solid-state imaging element according to any one of [E01] to [E04], in which one floating diffusion layer is provided for a plurality of imaging elements.

[E06]

The solid-state imaging apparatus according to any one of [E01] to [E05], in which the first electrode is arranged adjacent to the charge storage electrode of each imaging element.

[E07]

The solid-state imaging apparatus according to any one of [E01] to [E06], in which the first electrode is arranged adjacent to the charge storage electrodes of part of the plurality of imaging elements and is not arranged adjacent to the charge storage electrodes of the rest of the plurality of imaging elements.

[E08]

The solid-state imaging apparatus according to [E07], in which the distance between the charge storage electrode included in the imaging element and the charge storage electrode included in the imaging element is longer than the distance between the first electrode and the charge storage electrode in the imaging element adjacent to the first electrode.

[F01] <<Driving Method of Solid-State Imaging Apparatus>>

A driving method of a solid-state imaging apparatus including a plurality of imaging elements, each of the plurality of imaging elements including:

a photoelectric conversion unit including a first electrode, a photoelectric conversion layer, and a second electrode that are stacked, in which the photoelectric conversion unit further includes a charge storage electrode arranged apart from the first electrode and arranged to face the photoelectric conversion layer through an insulating layer, the plurality of imaging elements have a structure in which light is incident from a second electrode side, and the light is not incident on the first electrode, the driving method of the solid-state imaging apparatus repeating the steps of:

releasing charge in the first electrodes all at once to the outside of a system while storing the charge in the inorganic oxide semiconductor material layers in all of the imaging elements; and subsequently, transferring the charge stored in the inorganic oxide semiconductor material layers all at once to the first electrodes in all of the imaging elements, and after the completion of the transfer, sequentially reading the charge transferred to the first electrodes in the imaging elements.

REFERENCE SIGNS LIST $10'_1, 10'_2, 10'_3$ ... Photoelectric conversion unit segment, 13 ... various constituent elements of imaging element positioned on lower side of interlayer insulating layer, 14 ... On-chip micro lens (OCL), 15 ... Light shielding layer, 21 . . . First electrode, 22 . . . Second electrode, 23A . . . Photoelectric conversion layer, 23B . . . Inorganic oxide semiconductor material layer, 23'₁, 23'₂, 23'₃ . . . Photoelectric conversion layer segments, 24, 24"₁, 24"₂, 24", 24"₃ . . . Charge storage electrode, 24A, 24B, 24C, 24'₁, 24'₂, 24'₃ . . . Charge storage electrode segment, 25, 25A, 25B . . . Transfer control electrode (charge transfer electrode), 26 . . . Discharge electrode, 27, 27A₁, 27A₂, 27A₃, 27B₁, 27B₂, 27B₃, 27C . . . Charge movement control electrode, 41, 43 . . . n-type semiconductor region, 42, 44, 73 . . . p⁺ layer, 45, 46 . . . Gate portion of transfer transistor, 51 . . . Gate portion of reset transistor TR1$_{rst}$, 51A . . . Channel formation region of reset transistor TR1$_{rst}$, 51B, 51C . . . Source/drain region of reset transistor TR1$_{rst}$, 52 . . . Gate portion of amplification transistor TR1$_{amp}$, 52A . . . Channel formation region of amplification transistor TR1$_{amp}$, 52B, 52C . . . Source/drain region of amplification transistor TR1$_{amp}$, 53 . . . Gate portion of selection transistor TR1$_{sel}$, 53A . . . Channel formation region of selection transistor TR1$_{sel}$, 53B, 53C . . . Source/drain region of selection transistor TR1$_{sel}$, 61 . . . Contact hole portion, 62 . . . Wiring layer, 63, 64, 68A . . . Pad portion, 65, 68B . . . Connection hole, 66, 67, 69 . . . Connection portion, 70 . . . Semiconductor substrate, 70A . . . First surface (front surface) of semiconductor substrate, 70B . . . Second surface (back surface) of semiconductor substrate, 71 . . . Element separation region, 72 . . . Oxide film, 74 . . . HfO₂ film, 75 . . . Insulating material film, 76, 81 . . . Interlayer insulating layer, 82 . . . Insulating layer, 82'₁, 82'₂, 83'₃ . . . Insulating layer segment, 82a . . . First surface of insulating layer, 82b . . . Second surface of insulating layer, 82c . . . Third surface of insulating layer, 83 . . . insulating layer, 85, 85A, 85B, 85C . . . Opening portion, 86, 86A . . . Second opening portion, 100 . . . Solid-state imaging apparatus, 101 . . . Stacked imaging element, 111 . . . Imaging region, 112 . . . Vertical drive circuit, 113 . . . Column signal processing circuit, 114 . . . Horizontal drive circuit, 115 . . . Output circuit, 116 . . . Drive control circuit, 117 . . . Signal line (data output line), 118 . . . Horizontal signal line, 200 . . . Electronic device (camera), 201 . . . Solid-state imaging apparatus, 210 . . . Optical lens, 211 . . . Shutter apparatus, 212 . . . Drive circuit, 213 . . . Signal processing circuit, FD₁, FD₂, FD₃, 45C, 46C . . . Floating diffusion layer, TR1$_{trs}$, TR2$_{trs}$, TR3$_{trs}$ . . . Transfer transistor, TR1$_{rst}$, TR2$_{rst}$, TR3$_{rst}$ . . . Reset transistor, TR1$_{amp}$, TR2$_{amp}$, TR3$_{amp}$ . . . Amplification transistor, TR1$_{sel}$, TR3$_{sel}$, TR3$_{sel}$ . . . Selection transistor, V$_{DD}$ . . . Power source, TG₁, TG₂, TG₃ . . . Transfer gate line, RST₁, RST₂, RST₃ . . . Reset line, SEL₁, SEL₂, SEL₃ . . . Selection line, VSL, VSL₁, VSL₂, VSL₃ . . . Signal line (data output line), V$_{OA}$, V$_{OU}$ . . . Wire

What is claimed is:

1. An imaging element comprising:
a photoelectric conversion unit including a first electrode, a photoelectric conversion layer, and a second electrode that are stacked, wherein
the photoelectric conversion unit further includes an insulating layer and a charge storage electrode in the insulating layer; and
an inorganic oxide semiconductor material layer is formed between the first electrode and the photoelectric conversion layer, wherein the inorganic oxide semiconductor material layer penetrates the insulating layer to contact the first electrode, and
wherein the inorganic oxide semiconductor material layer includes at least two types of elements selected from a group consisting of indium, tungsten, tin, and zinc.

2. The imaging element according to claim 1, wherein the charge storage electrode is arranged apart from the first electrode and arranged to face the inorganic oxide semiconductor material layer through the insulating layer.

3. The imaging element according to claim 1, wherein the inorganic oxide semiconductor material layer does not contain gallium atoms.

4. The imaging element according to claim 1, wherein the inorganic oxide semiconductor material layer includes indium-tungsten oxide (IWO), indium-tungsten-zinc oxide (IWZO), indium-tin-zinc oxide (ITZO), or zinc-tin oxide (ZTO).

5. The imaging element according to claim 1, wherein the inorganic oxide semiconductor material layer includes indium-tungsten-zinc oxide (IWZO).

6. The imaging element according to claim 1, wherein the inorganic oxide semiconductor material layer includes indium-tungsten oxide (IWO).

7. The imaging element according to claim 1, wherein a LUMO value $E_1$ of a material included in a part of the photoelectric conversion layer positioned near the inorganic oxide semiconductor material layer and a LUMO value $E_2$ of a material included in the inorganic oxide semiconductor material layer satisfy the following expression $E_1 - E_2 < 0.2$ eV.

8. The imaging element according to claim 7, wherein the LUMO value $E_1$ of the material included in the part of the photoelectric conversion layer positioned near the inorganic oxide semiconductor material layer and the LUMO value $E_2$ of the material included in the inorganic oxide semiconductor material layer satisfy the following expression $E_1 - E_2 < 0.1$ eV.

9. The imaging element according to claim 1, wherein a mobility of a material included in the inorganic oxide semiconductor material layer is equal to or greater than 10 cm²/V·s.

10. An imaging element comprising:
a photoelectric conversion unit including a first electrode, a photoelectric conversion layer, and a second electrode that are stacked, wherein
the photoelectric conversion unit further includes an insulating layer and a charge storage electrode in the insulating layer; and
an inorganic oxide semiconductor material layer is formed between the first electrode and the photoelectric conversion layer, wherein the inorganic oxide semiconductor material layer penetrates the insulating layer to contact the first electrode, and
wherein a LUMO value $E_1$ of a material included in a part of the photoelectric conversion layer positioned near the inorganic oxide semiconductor material layer and a LUMO value $E_2$ of a material included in the inorganic oxide semiconductor material layer satisfy the following expression $E_1 - E_2 < 0.2$ eV.

11. The imaging element according to claim 10, wherein the LUMO value $E_1$ of the material included in the part of the photoelectric conversion layer positioned near the inorganic oxide semiconductor material layer and the LUMO value $E_2$ of the material included in the inorganic oxide semiconductor material layer satisfy the following expression $E_1 - E_2 < 0.1$ eV.

12. The imaging element according to claim 10, wherein a mobility of the material included in the inorganic oxide semiconductor material layer is equal to or greater than 10 cm$^2$/V·s.

13. An imaging element comprising:

a photoelectric conversion unit including a first electrode, a photoelectric conversion layer, and a second electrode that are stacked, wherein the photoelectric conversion unit further includes an insulating layer and a charge storage electrode in the insulating layer; and an inorganic oxide semiconductor material layer is formed between the first electrode and the photoelectric conversion layer, wherein the inorganic oxide semiconductor material layer penetrates the insulating layer to contact the first electrode, and wherein a mobility of a material included in the inorganic oxide semiconductor material layer is equal to or greater than 10 cm$^2$/V·s.

14. The imaging element according to claim 1, wherein the inorganic oxide semiconductor material layer is amorphous.

15. The imaging element according to claim 1, wherein a thickness of the inorganic oxide semiconductor material layer is $1\times10^{-8}$ m to $1.5\times10^{-7}$ m.

16. The imaging element according to claim 1, wherein light is incident from the second electrode, surface roughness Ra of the inorganic oxide semiconductor material layer in an interface between the photoelectric conversion layer and the inorganic oxide semiconductor material layer is equal to or smaller than 1.5 nm, and a value of root means square roughness Rq of the inorganic oxide semiconductor material layer is equal to or smaller than 2.5 nm.

17. A stacked imaging element comprising:

at least one imaging element according to claim 1.

18. A solid-state imaging apparatus comprising:

a plurality of imaging elements according to claim 1.

19. A solid-state imaging apparatus comprising:

a plurality of stacked imaging elements according to claim 17.

* * * * *